(12) United States Patent
Kato et al.

(10) Patent No.: US 11,758,800 B2
(45) Date of Patent: *Sep. 12, 2023

(54) POLYMER MATERIAL, MATERIAL FOR ELECTROLUMINESCENCE DEVICE, LIQUID COMPOSITION, THIN FILM, AND ELECTROLUMINESCENCE DEVICE

(71) Applicant: SAMSUNG ELECTRONICS CO., LTD., Suwon-si (KR)

(72) Inventors: Fumiaki Kato, Yokohama (JP); Keigo Furuta, Yokohama (JP); Masashi Tsuji, Hwaseong-si (KR); Takahiro Fujiyama, Yokohama (JP); Takao Motoyama, Hwaseong-si (KR); Yusaku Konishi, Yokohama (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 385 days.

This patent is subject to a terminal disclaimer.

(21) Appl. No.: 16/898,065

(22) Filed: Jun. 10, 2020

(65) Prior Publication Data

US 2020/0388763 A1 Dec. 10, 2020

(30) Foreign Application Priority Data

Jun. 10, 2019 (JP) .................. 2019-108262

(51) Int. Cl.
*H10K 85/10* (2023.01)
*C08G 61/10* (2006.01)
(Continued)

(52) U.S. Cl.
CPC ............ *H10K 85/111* (2023.02); *C08G 61/10* (2013.01); *C08G 61/126* (2013.01); *C09K 11/02* (2013.01);
(Continued)

(58) Field of Classification Search
CPC ............... H01L 51/0043; H01L 51/502; H01L 51/5056; H01L 51/5072; H01L 51/0072;
(Continued)

(56) References Cited

U.S. PATENT DOCUMENTS 8,330,142 B2 12/2012 Cho et al.
8,440,325 B2 5/2013 McKiernan et al.
(Continued)

FOREIGN PATENT DOCUMENTS

EP 3512307 A1 7/2019
JP 2010196040 A 9/2010
(Continued)

OTHER PUBLICATIONS

Extended European Search Report dated Oct. 30, 2020, of the corresponding European Patent Application No. 20178942.7.

*Primary Examiner* — Shane Fang
(74) *Attorney, Agent, or Firm* — CANTOR COLBURN LLP

(57) ABSTRACT

A polymer material includes a segment of an alternating copolymer of a structural unit of a specific structure and has a glass transition temperature of greater than or equal to about 50° C. and less than or equal to about 250° C. The polymer material is capable of improving luminescence life-span of an electroluminescence device, particularly a quantum dot light emitting device.

15 Claims, 5 Drawing Sheets

(51) Int. Cl.
*C08G 61/12* (2006.01)
*C09K 11/02* (2006.01)
*C09K 11/08* (2006.01)
*C09K 11/88* (2006.01)
*H10K 50/115* (2023.01)

(52) U.S. Cl.
CPC ........ *C09K 11/0883* (2013.01); *C09K 11/883* (2013.01); *H10K 85/151* (2023.02); *C08G 2261/124* (2013.01); *C08G 2261/148* (2013.01); *C08G 2261/149* (2013.01); *C08G 2261/1412* (2013.01); *C08G 2261/1434* (2013.01); *C08G 2261/312* (2013.01); *C08G 2261/314* (2013.01); *C08G 2261/3142* (2013.01); *C08G 2261/3223* (2013.01); *C08G 2261/3247* (2013.01); *C08G 2261/512* (2013.01); *C08G 2261/95* (2013.01); *H10K 50/115* (2023.02)

(58) Field of Classification Search
CPC .. H01L 51/5012; C07D 403/04; C07D 403/10
See application file for complete search history.

(56) References Cited

U.S. PATENT DOCUMENTS

| | | |
|---|---|---|
| 9,882,134 B2 | 1/2018 | Fujiyama et al. |
| 10,038,143 B2 | 7/2018 | Ono et al. |
| 10,270,036 B2 | 4/2019 | Ito et al. |
| 2011/0284829 A1 | 11/2011 | Fukushima et al. |
| 2013/0313536 A1 | 11/2013 | Nishimura et al. |
| 2014/0151647 A1 | 6/2014 | Mizuki et al. |
| 2018/0182967 A1* | 6/2018 | Ito ................. H01L 51/0035 |
| 2019/0214566 A1 | 7/2019 | Takahiro et al. |

FOREIGN PATENT DOCUMENTS

| | | |
|---|---|---|
| JP | 2010199067 A | 9/2010 |
| JP | 2018104674 A | 7/2018 |
| KR | 1020080087007 A | 9/2008 |
| KR | 1020160009562 A | 1/2016 |
| KR | 20180076294 A | 7/2018 |
| WO | 2014042265 A1 | 3/2014 |
| WO | 2016167491 A1 | 10/2016 |

* cited by examiner

POLYMER MATERIAL, MATERIAL FOR ELECTROLUMINESCENCE DEVICE, LIQUID COMPOSITION, THIN FILM, AND ELECTROLUMINESCENCE DEVICE

CROSS-REFERENCE TO RELATED APPLICATION

This application claims priority to and the benefit of Japanese Patent Application No. 2019-108262 filed in the Japan Patent Office on Jun. 10, 2019, the entire contents of which are incorporated herein by reference.

BACKGROUND

1. Field

The present disclosure relates to a polymer material, material for an electroluminescence device, a liquid composition, a thin film, and an electroluminescence device.

2. Description of the Related Art

In recent years, displays having a wide color gamut have been developed, for use in an electroluminescence device (WO 2014042265). However, it is in principle difficult to obtain a sharp emission spectrum in a fluorescent light emitting material or a phosphorescent light emitting material, which is an organic light emitting material constituting a light emitting layer of an organic EL device.

As a material having a sharp emission spectrum, quantum dots are known, and quantum dot light emitting devices, which are electroluminescence devices using quantum dots as light emitting layers, have been developed (see, e.g., Japanese Patent Laid-Open Publication No. 2010-199067).

SUMMARY

However, there are remains a need for improved luminescence life-span in a quantum dot light emitting device.

In order to improve the luminescence life-span of the quantum dot light emitting device, the carrier balance needs to be adjusted.

Herein, in the organic EL device, since a hole injection material, an electron injection material, and a light emitting material are each organic materials, a hole injection material, an electron injection material, and a light emitting material have a small energy difference between energy levels, and thus an energy barrier is small when charges are injected into the light emitting layer.

On the other hand, quantum dots, in general, have a deep valence band (hereinafter referred to as VB), so that when injecting holes from the hole transport layer, which is an organic layer, a large energy barrier is one of causes of deterioration in luminescence life-span.

In view of this, an embodiment of the present disclosure provides a polymer material capable of improving luminescence life-span in an electroluminescence device, particularly in a quantum dot light emitting device.

An embodiment of the present disclosure provides a polymer material including a segment of an alternating copolymer of a structural unit represented by Formula (1) and having a glass transition temperature of greater than or equal to about 50° C. and less than or equal to about 250° C.

(1)

In Formula (1), X is at least one of groups represented by Formula (2-A) to Formula (2-D) and Y is a substituted or unsubstituted divalent aromatic hydrocarbon group having 6 to 60 ring-forming carbon atoms or a substituted or unsubstituted divalent aromatic heterocyclic group having 3 to 60 ring-forming atoms.

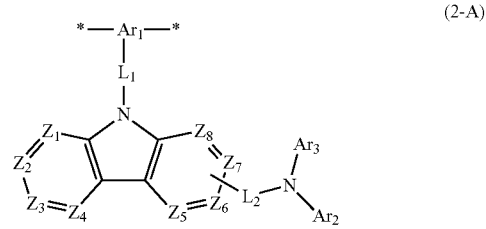
(2-A)

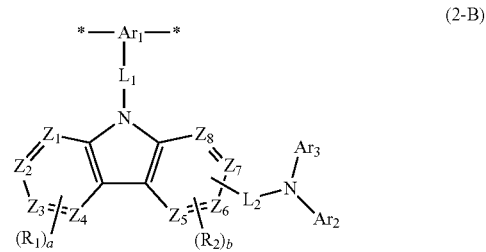
(2-B)

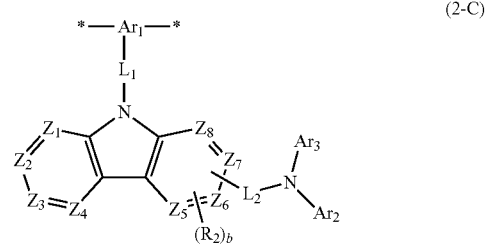
(2-C)

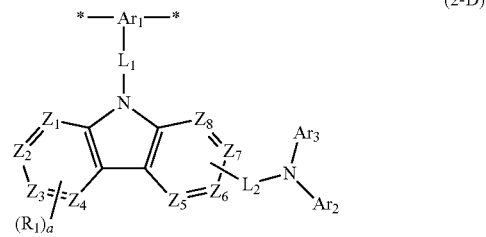
(2-D)

In Formula (2-A) to Formula (2-D), $Ar_1$ is a substituted or unsubstituted trivalent aromatic hydrocarbon group having 6 to 60 ring-forming carbon atoms or a substituted or unsubstituted trivalent aromatic heterocyclic group having 3 to 60 ring-forming atoms, $Ar_2$ and $Ar_3$ are independently a substituted or unsubstituted monovalent aromatic hydrocarbon group having 6 to 60 ring-forming carbon atoms or a substituted or unsubstituted monovalent aromatic heterocyclic group having 3 to 60 ring-forming atoms, $L_1$ and $L_2$ are independently a single bond, a substituted or unsubstituted divalent aromatic hydrocarbon group having 6 to 60 ring-forming carbon atoms, or a substituted or unsubstituted divalent aromatic heterocyclic group having 3 to 60 ring-forming atoms, $Z_1$ to $Z_8$ are independently N, C, or $C(R_3)$, wherein each occurrence of $R_3$ is independently hydrogen, a substituted or unsubstituted C1-C20 alkyl group, a substituted or unsubstituted C1-C20 alkoxy group, a substituted or unsubstituted monovalent aromatic hydrocarbon group having 6 to 60 ring-forming carbon atoms, or a substituted or unsubstituted monovalent aromatic heterocyclic group having 3 to 60 ring-forming atoms,

* indicates a binding site to a main chain, in Formula (2-B) to Formula (2-D), $R_1$ and $R_2$ are independently a substituted or unsubstituted C1 to C20 alkyl group, a substituted or unsubstituted C1 to C20 alkoxy group, a substituted or unsubstituted monovalent aromatic hydrocarbon group having ring-forming 6 to 60 carbon atoms, or a substituted or unsubstituted monovalent aromatic heterocyclic group having 3 to 60 ring-forming atoms, wherein $R_1$ and $R_2$ are optionally combined with each other to form a ring, a is an integer of 1 to 4, and b is an integer of 1 to 3.

According to embodiment of the present disclosure, the polymer material may improve luminescence life-span in an electroluminescence device, particularly in a quantum dot light emitting device.

DETAILED DESCRIPTION

Figure 1:
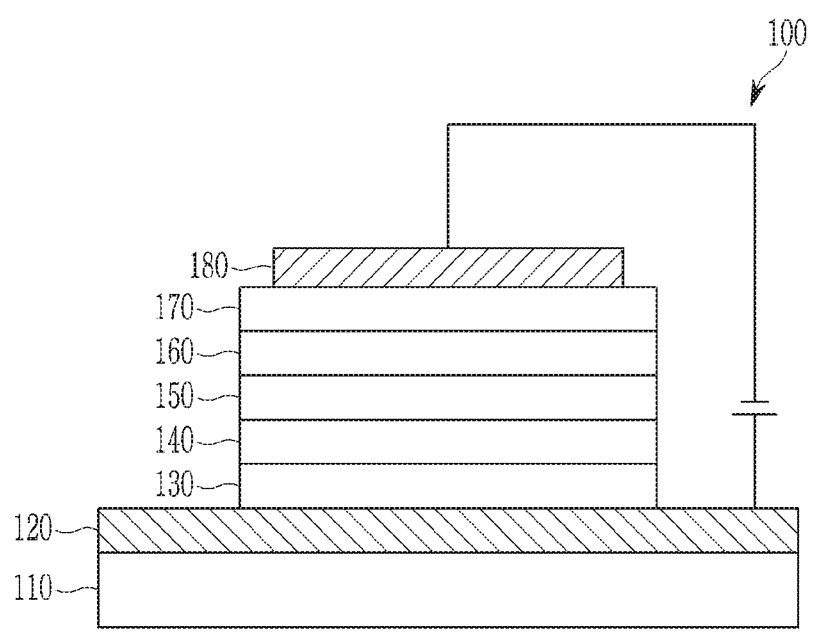
FIG. 1 is a schematic view showing an exemplary embodiment of a quantum dot light emitting device according to an embodiment.

Hereinafter, embodiments for implementing this invention are described. However, the present disclosure is not limited to the following embodiments.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

[Polymer Material]

The polymer material according to the present embodiment includes a segment of an alternating copolymer of a structural unit represented by Formula (1).

In Formula (1), X is a group represented by Formula (2-A) to Formula (2-D), and Y is a substituted or unsubstituted divalent aromatic hydrocarbon group having 6 to 60 ring-forming carbon atoms or a substituted or unsubstituted divalent aromatic heterocyclic group having 3 to 60 ring-forming atoms.

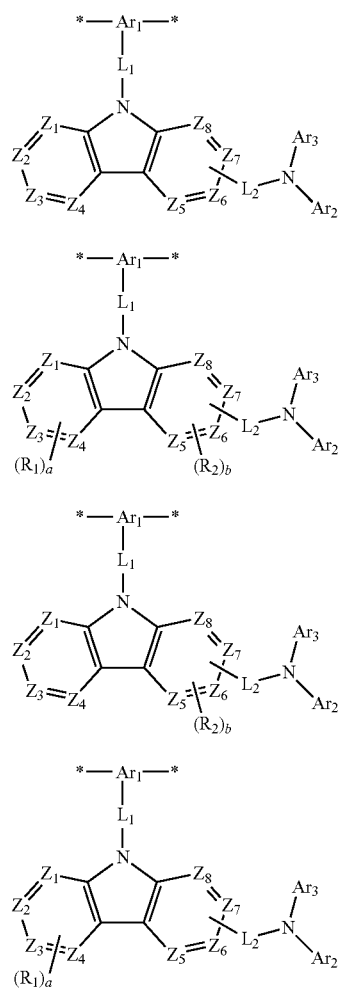

In Formula (2-A) to Formula (2-D), $Ar_1$ is a substituted or unsubstituted cyclic trivalent aromatic hydrocarbon group having 6 to 60 ring-forming carbon atoms or a substituted or unsubstituted trivalent aromatic heterocyclic group having 3 to 60 ring-forming atoms, $Ar_2$ and $Ar_3$ are independently a substituted or unsubstituted monovalent aromatic hydrocarbon group having 6 to 60 ring-forming carbon atoms or a substituted or unsubstituted monovalent aromatic heterocyclic group having 3 to 60 ring-forming atoms, $L_1$ and $L_2$ are independently a single bond, a substituted or unsubstituted divalent aromatic hydrocarbon group having 6 to 60 ring-forming carbon atoms, or a substituted or unsubstituted divalent aromatic heterocyclic group having 3 to 60 ring-forming atoms,

* indicates a site to a main chain, $Z_1$ to $Z_8$ are independently N, C, or $C(R_3)$, wherein each occurrence of $R_3$ is independently hydrogen, a substituted or unsubstituted C1-C20 alkyl group, a substituted or unsubstituted C1-C20 alkoxy group, a substituted or unsubstituted monovalent aromatic hydrocarbon group having 6 to 60 ring-forming carbon atoms, or a substituted or unsubstituted monovalent aromatic heterocyclic group having 3 to 60 ring-forming atoms, in Formula (2-B) to Formula (2-D), $R_1$ and $R_2$ are independently a substituted or unsubstituted C1 to C20 alkyl group, a substituted or unsubstituted C1 to C20 alkoxy group, a substituted or unsubstituted monovalent aromatic hydrocarbon group having 6 to 60 ring-forming carbon atoms, or a substituted or unsubstituted monovalent aromatic heterocyclic group having 3 to 60 ring-forming atoms, wherein $R_1$ and $R_2$ are optionally combined with each other to form a ring, a is an integer of 1 to 4, and b is an integer of 1 to 3.

The polymer material according to the present embodiment may include one or more structural units represented by Formula (1), and may further include one or more other structural units. Herein, since the polymer material according to the present embodiment includes the segment of the alternating copolymer in which X and Y are alternately bonded, reproducibility of production may be high. Moreover, since the polymer material according to the present embodiment has no maldistribution of X and Y, homogeneous properties may be obtained when used as a thin film.

[X]

The polymer material according to the present embodiment may include structural units of Formula (1) where X is the same for each structural unit of Formula (1) or different for each structural unit of Formula (1).

Since the polymer material according to the present embodiment includes a nitrogen-containing aromatic heterocyle (e.g., carbazole skeleton) in which X is substituted with an amino group, hole transportability may be improved.

In addition, in the polymer material according to the present embodiment, X is an aromatic group ($Ar_1$) in the main chain, a nitrogen-containing aromatic heterocycle is present in the pendant group, and an amino group (N ($Ar_2$)($Ar_3$)) is bound to the nitrogen-containing aromatic heterocycle of the pendant group. For this reason, in the polymer material according to the present embodiment, a HOMO level may be deepened, and as a result, luminescence life-span may be improved in an electroluminescence device, particularly in a quantum dot light emitting device. Further, high luminous efficiency and low driving voltage may be achieved.

In Formula (2-A) to Formula (2-D), $Ar_1$ is a substituted or unsubstituted trivalent aromatic hydrocarbon group having 6 to 60 ring-forming carbons atoms or a substituted or unsubstituted trivalent aromatic heterocyclic group having 3 to 60 ring-forming atoms.

Herein, when $Ar_1$ is a trivalent aromatic hydrocarbon group having 6 to 60 ring-forming carbons atoms, then the trivalent aromatic hydrocarbon group is derived from an aromatic hydrocarbon compound including one or more aromatic hydrocarbon rings. Herein, when an aromatic hydrocarbon group includes two or more aromatic hydrocarbon rings, two or more aromatic hydrocarbon rings may be condensed with each other. Moreover, the aromatic hydrocarbon group may be substituted with one or more substituents.

The aromatic hydrocarbon compound is not particularly limited, but may include benzene, pentalene, indene, naphthalene, anthracene, azulene, heptalene, acenaphthylene, phenalene, fluorene, phenanthrene, biphenyl, triphenylene, pyrene, chrysene, picene, perylene, pentaphene, pentacene, tetraphene (benzanthracene), hexaphene, hexacene, rubicene, trinaphthylene, heptaphene, pyranthrene, and the like.

In addition, when $Ar_1$ is a trivalent aromatic heterocyclic group having 3 to 60 ring-forming atoms, then the trivalent aromatic heterocyclic group is derived from an aromatic heterocyclic compound including one or more aromatic heterocyclic rings having one or more hetero atoms (for example, nitrogen atom (N), oxygen atom (O), phosphorus atom (P), sulfur atom (S)), and the remaining ring-forming atoms that are carbon atoms (C). Further, when an aromatic heterocyclic group includes two or more aromatic heterocyclic rings, two or more aromatic heterocyclic rings may be condensed with each other. Moreover, the aromatic heterocyclic group may be substituted with one or more substituents.

The aromatic heterocyclic compound is not particularly limited, but may be pyrazole, imidazole, oxazole, thiazole, triazole, tetrazole, oxadiazole, pyridine, pyridazine, pyrimidine, triazole, carbazole, azacarbazole, indole, azaindole, quinoline, isoquinoline, benzimidazole, imidazopyridine, imidazopyrimidine, imidazopyridazine, furan, pyrrole, benzofuran, dibenzofuran, azabenzofuran, azadibenzofuran, thiophene, benzothiophene, dibenzothiophene, azabenzothiophene, azadibenzothiophene, and the like.

Examples of the trivalent aromatic hydrocarbon group in $Ar_1$ include groups derived by removing any three hydrogen atoms from the aromatic hydrocarbon compound. Moreover, the trivalent aromatic heterocyclic group may be a group derived by removing three hydrogen atoms of the aromatic heterocyclic compound.

Among these, from the viewpoint of adjusting a HOMO level, $Ar_1$ may be a group shown below.

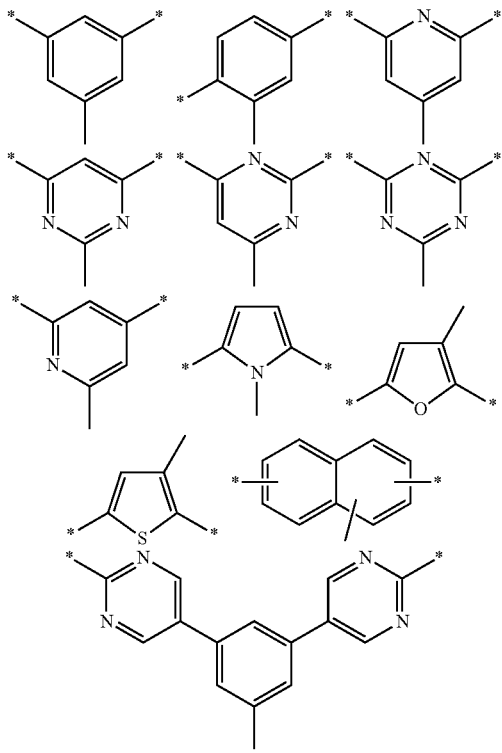

-continued

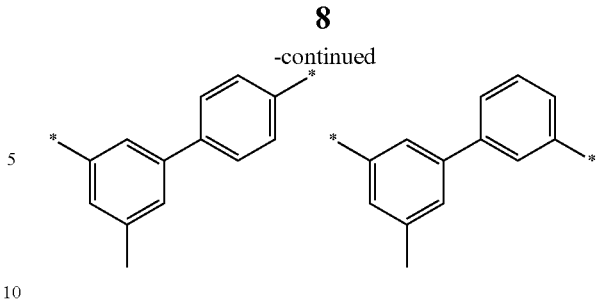

In the above formulas, * indicates a binding site to a main chain and the bond without a "*" indicates a binding site to $L_1$.

A substituent of the substituted trivalent aromatic hydrocarbon group or the substituted trivalent aromatic heterocyclic group is not particularly limited, and examples thereof may include a halogen atom, an alkyl group, an alkoxy group, an aromatic hydrocarbon group, and an aromatic heterocyclic group. Two or more substituents may be used in combination.

Herein, the halogen atom may be, for example, a fluorine atom, a chlorine atom, a bromine atom, and an iodine atom.

The alkyl group may be, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, isohexyl group, a 1,3-dimethylbutyl group, a 1-isopropylpropyl group, a 1,2-dimethylbutyl group, an n-heptyl group, a 1,4-dimethyl pentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, an n-tetracosyl group, and the like.

The alkyl group may be a C1 to C20 linear or branched alkyl group, for example a C1 to C8 linear or branched alkyl group.

The alkoxy group may include, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, and the like.

The alkoxy group may be a C1 to C20 linear or branched alkoxy group, for example a C1 to C8 linear or branched alkoxy group.

The trivalent aromatic heterocyclic group (or trivalent aromatic hydrocarbon group) may be, for example, groups obtained by removing any three hydrogen atoms of the aromatic heterocycle group (or aromatic hydrocarbon group).

Among these, $Ar_1$ may be an unsubstituted trivalent aromatic hydrocarbon group or an unsubstituted trivalent aromatic heterocyclic group. In an embodiment, $Ar_1$ may be an unsubstituted trivalent aromatic hydrocarbon group represented by Formula (AA) or Formula (AB). In an embodiment, $Ar_1$ may be a group represented by Formula (AA).

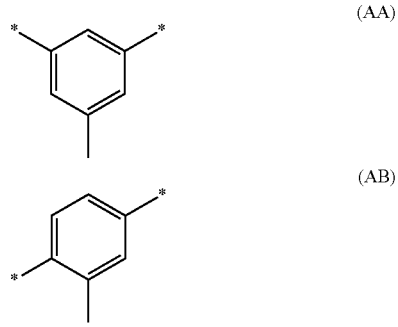

In the above formulas, * indicates a binding site to forming a main chain and the bond without a "*" indicates a binding site to $L_1$.

In Formula (2-A) to Formula (2-D), $Ar_2$ and $Ar_3$ are independently a substituted or unsubstituted monovalent aromatic hydrocarbon group having 6 to 60 ring-forming carbon atoms, or substituted or unsubstituted monovalent aromatic heterocyclic group having 3 to 60 ring-forming atoms.

Herein, the monovalent aromatic hydrocarbon group and the monovalent aromatic heterocyclic group are the same as $Ar_1$ of Formula (2-A) to Formula (2-D) except that the trivalent aromatic hydrocarbon group and the trivalent aromatic heterocyclic group are changed into monovalent groups, and thus the descriptions thereof are not repeated here. In addition, since the substituent in the case where the monovalent aromatic hydrocarbon group or the monovalent aromatic heterocyclic group is substituted is the same as the substituent in $Ar_1$ of Formula (2-A) to Formula (2-D), the descriptions thereof are not repeated here.

From the viewpoint of increasing a HOMO level, hole transportability, and hole injection property of the polymer material according to the present embodiment, the monovalent aromatic hydrocarbon group of $Ar_2$ and $Ar_3$ may be a phenyl group, a biphenyl group, a fluorenyl group, a naphthyl group, an anthracenyl group, a phenanthracenyl group, a naphthacenyl group, a pyrenyl group, a terphenyl group, a tolyl group, a t-butylphenyl group, or a (phenylpropyl) phenyl group. In an embodiment, the monovalent aromatic hydrocarbon group of $Ar_2$ and $Ar_3$ may be a phenyl group, a biphenyl group, a fluorenyl group, a naphthyl group, an anthracenyl group, a terphenyl group, or a tolyl group. In another embodiment, the monovalent aromatic hydrocarbon group of $Ar_2$ and $Ar_3$ may be a biphenyl group and a fluorenyl group.

In addition, from the viewpoint of increasing a HOMO level, hole transportability, and a hole injection property of the polymer material according to the present embodiment, the monovalent aromatic heterocyclic group of $Ar_2$ and $Ar_3$ may include a pyridinyl group, a bipyridinyl group, a pyrrolyl group, a pyrimidyl group, pyrazolyl group, a pyridazyl group, an indolyl group, a furanyl group, a benzofuranyl group, a dibenzofuranyl group, a quinolinyl group, an isoquinolinyl group, a quinoxalinyl group, a carbazolyl group, a phenanthridinyl group, an acridinyl group, a phenazinyl group, a phenothiazinyl group, a phenoxazinyl group, an oxazolyl group, an oxadiazolyl group, a thiophenyl group, an a benzothiophenyl group, or a dibenzothiophenyl group. In an embodiment, the monovalent aromatic heterocyclic group of $Ar_2$ and $Ar_3$ may be a pyridinyl group, a pyrrolyl group, a carbazolyl group, a dibenzofuranyl group, a dibenzothiophenyl group, or a bipyridinyl group.

A substituent of the substituted monovalent aromatic hydrocarbon group or the substituted monovalent aromatic heterocyclic group of $Ar_2$ and $Ar_3$ is not particularly limited, and examples thereof include a halogen atom, an alkyl group, an alkoxy group, an aromatic hydrocarbon group, and an aromatic heterocyclic group. Two or more substituents may be used in combination.

In addition, in view of improving a HOMO level, hole transportability, a hole injection property, solubility, or a coating property of the polymer material according to the present embodiment and improving a luminescence life-span, when the monovalent aromatic hydrocarbon group or the monovalent aromatic heterocyclic group of $Ar_2$ and $Ar_3$ is substituted, the substituent may be a C1 to C60 alkyl group, an alkoxy group, an alkyl thio group, an aryl group, an aryloxy group, an aryl thio group, an aryl alkyl group, an aryl alkoxy group, an arylalkyl thio group, an aryl alkenyl group, an aryl alkynyl group, an amino group, an amino group substituted with a substituent, a silyl group, a substituted silyl group, a halogen atom, an acyl group, an acyl oxy group, an imine group, an amide group, an acid imide group, a monovalent heterocyclic group, a carboxyl group, a carboxyl group substituted with a substituent, a cyano group, or a nitro group.

Among these, from the viewpoint of increasing a HOMO level, hole transportability, a hole injection property, solubility, and a coating property of the polymer material, a C1 to C8 alkyl group is preferred as a substituent of $Ar_2$ and $Ar_3$, and a C1 to C3 alkyl group is more preferred. Moreover, from a viewpoint of further improving luminescence lifespan, a C10 to 60 alkyl group may be preferred and a C12 to C60 alkyl group may be more preferred.

Herein, when the monovalent aromatic hydrocarbon group or monovalent aromatic heterocyclic group is substituted, as the substituent, the alkyl group may be linear, branched, or cyclic. In an embodiment, it may be linear or branched and in another embodiment, it may be linear.

In an embodiment, at least one substituent of the substituted monovalent aromatic hydrocarbon group in $Ar_2$ and $Ar_3$ may be a C1 to C60 alkyl group. Moreover, in an embodiment, the substituent may be a C12 to C60 alkyl group. In another embodiment, the substituent may be a C12 to C20 alkyl group.

In an embodiment, one of $Ar_2$ and $Ar_3$ is a monovalent aromatic hydrocarbon group having 6 to 60 ring-forming carbon atoms unsubstituted or substituted with a C1 to C3 alkyl group and the other of $Ar_2$ and $Ar_3$ is a monovalent aromatic hydrocarbon group having 6 to 60 ring-forming carbon atoms substituted with a C12 to C60 alkyl group.

Specific examples of $Ar_2$ and $Ar_3$ are shown below.

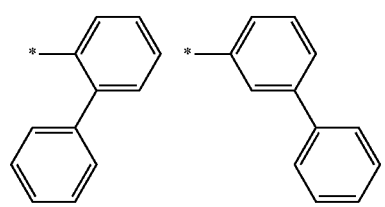

-continued
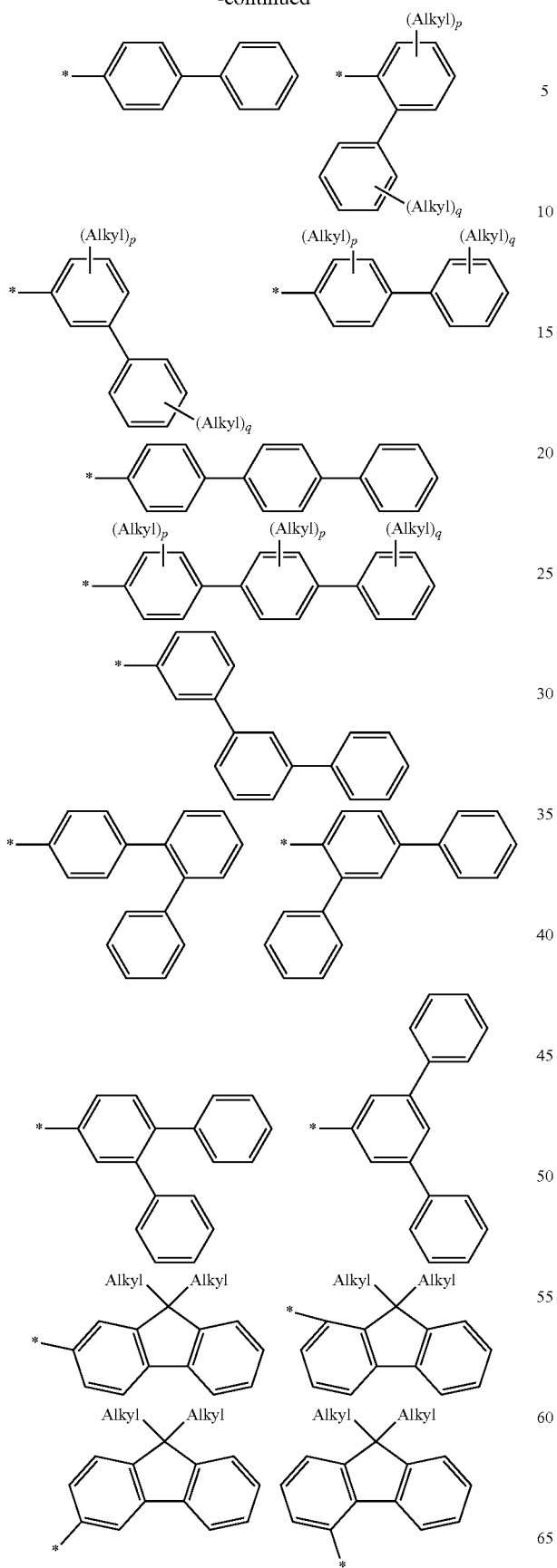
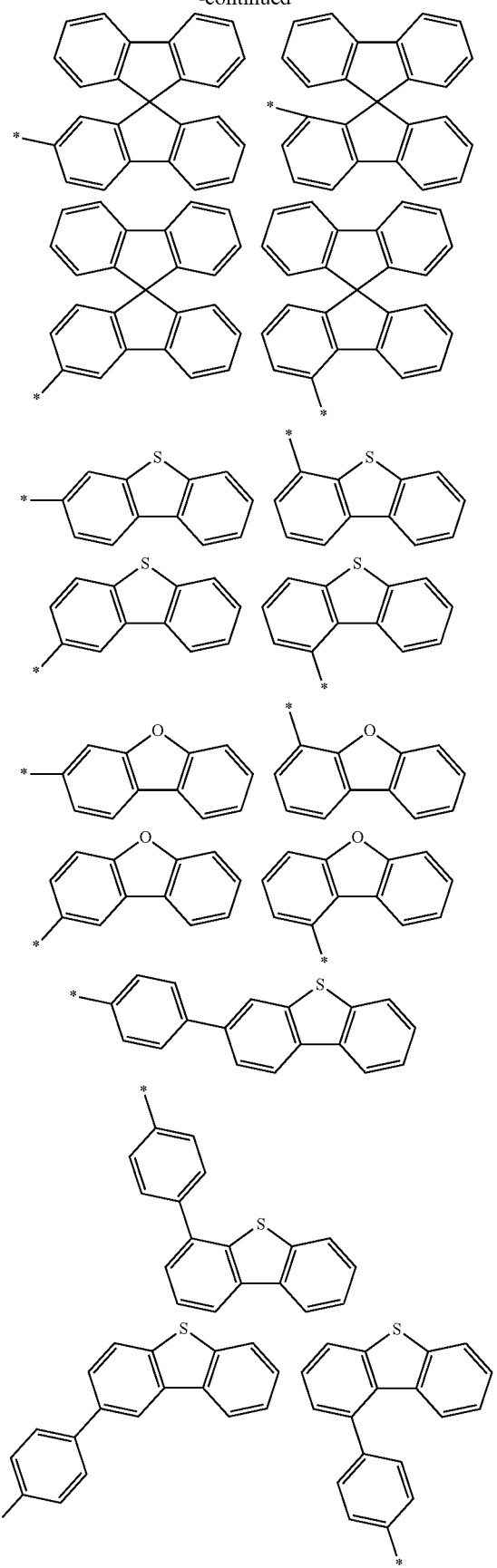

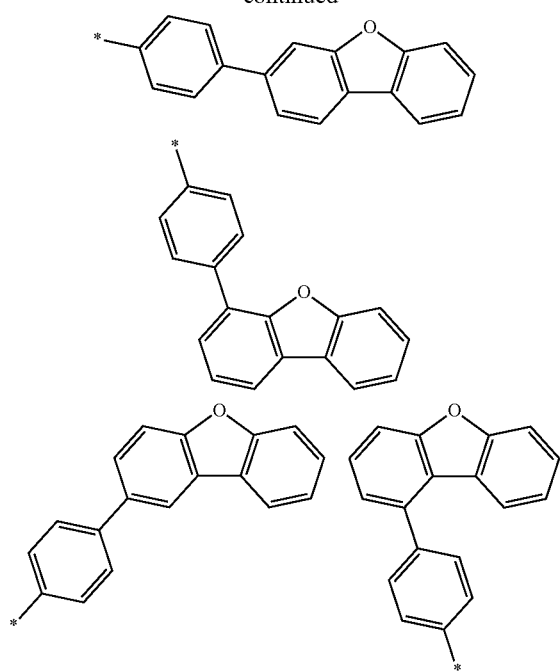
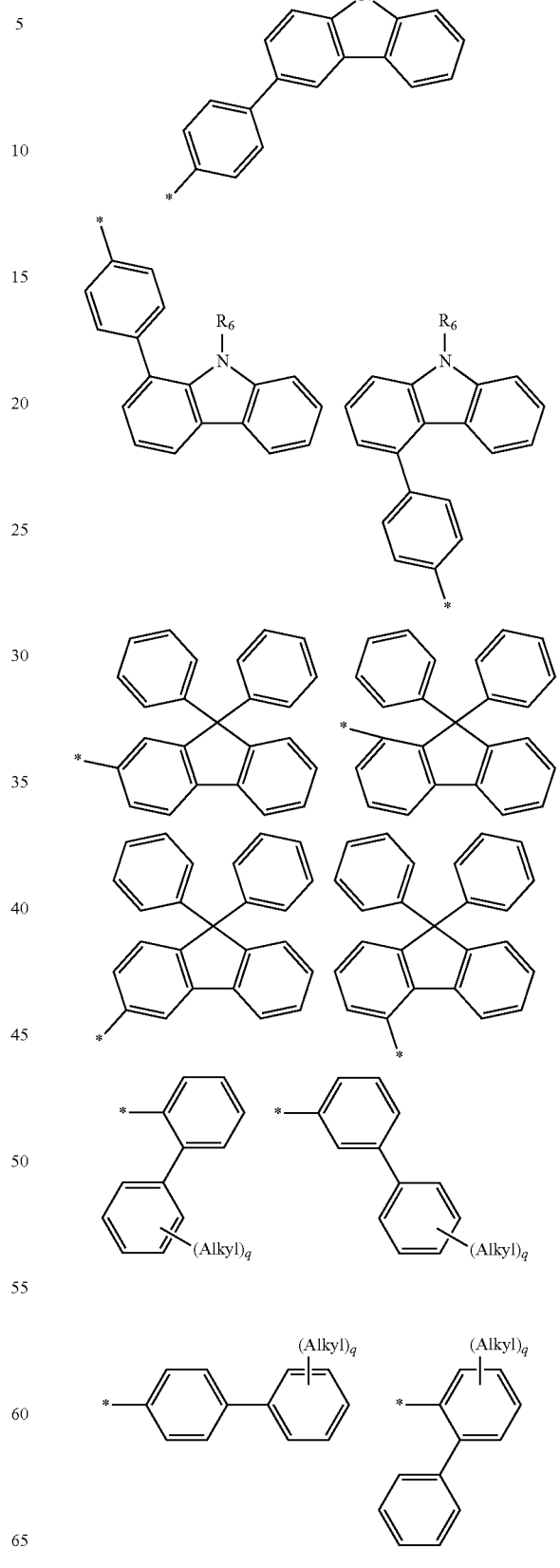

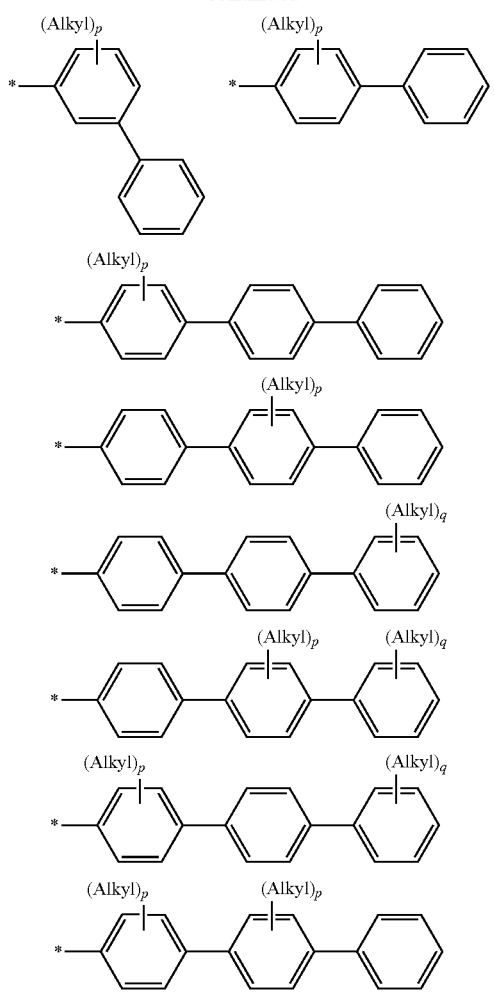

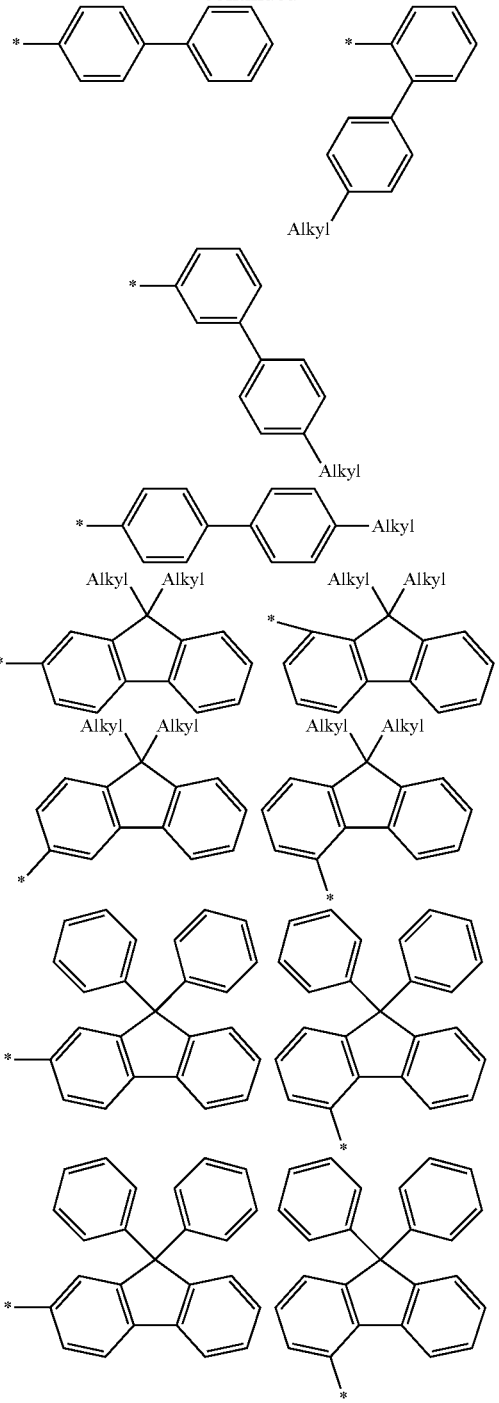

In the above formulas, each $R_6$ is independently a substituted or unsubstituted C1 to C60 alkyl group, a substituted or unsubstituted C1 to C20 alkoxy group, a substituted or unsubstituted monovalent aromatic hydrocarbon group having 6 to 60 ring-forming carbon atoms, or substituted or unsubstituted monovalent aromatic heterocyclic group having 3 to 60 ring-forming atoms. * indicates a binding site. "Alkyl" means substitution with an alkyl group. Each p is independently an integer of 1 to 4. Each q is an integer of 1 to 5.

Specific examples of $Ar_2$ and $Ar_3$ may be groups represented by the following formulas from the viewpoint of improving a HOMO level, hole transportability, a hole injection property, solubility, and a coating property of the polymer material and improving a luminescence life-span.

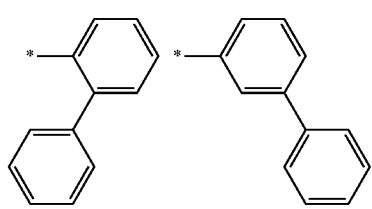

In the above formulas, "Alkyl" means substitution with an alkyl group.

On the other hand, preferred examples of an alkyl group in the specific examples of $Ar_2$ and $Ar_3$ are the same as the description of the alkyl group which is a substituent when $Ar_2$ and $Ar_3$ are a substituted monovalent aromatic hydrocarbon group or a substituted monovalent aromatic heterocyclic group.

In Formula (2-A) to Formula (2-D), $L_1$ and $L_2$ are independently a single bond, a substituted or unsubstituted divalent aromatic hydrocarbon group having 6 to 60 ring-forming carbon atoms, or a substituted or unsubstituted divalent aromatic heterocyclic group having 3 to 60 ring-forming atoms.

Herein, the divalent aromatic hydrocarbon group and the divalent aromatic heterocyclic group $L_1$ and $L_2$ are the same as $Ar_1$ of Formula (2-A) to Formula (2-D) except that the trivalent aromatic hydrocarbon group and the trivalent aromatic heterocyclic group are changed into divalent groups, and thus the descriptions thereof are not repeated here. In addition, since the substituent in the case where the divalent aromatic hydrocarbon group or the divalent aromatic heterocyclic group is substituted is the same as the substituent in $Ar_1$ of Formula (2-A) to Formula (2-D), the descriptions thereof are not repeated here.

From the viewpoint of improving a HOMO level, hole transportability, a hole injection property of the polymer material according to the present embodiment and improving luminescence life-span, the divalent aromatic hydrocarbon group of L and $L_2$ may be a phenylene group, a biphenylene group, a fluorenylene group, a naphthylene group, an anthracenylene group, a phenanthracenyl group, a naphthacenylene group, a pyrenylene group, a terphenylene group, a tolylene group, a t-butyl phenylene group, or a (phenylpropyl) phenylene group. In an embodiment, the divalent aromatic hydrocarbon group of $L_1$ and $L_2$ may be a phenylene group, a biphenylene group, a fluorene group. In another embodiment, the divalent aromatic hydrocarbon group of L and $L_2$ may be a phenylene group, a naphthylene group, an anthracenylene group, a terphenylene group, or a tolylene group.

In addition, from the viewpoint of improving a HOMO level, hole transportability, and a hole injection property of the polymer material according to the present embodiment, the divalent aromatic heterocyclic group of $L_1$ and $L_2$ may be a pyridinylene group, a bipyridinylene group, a pyrrolinylene group, a pyradizinylene group, a pyrazinylene group, a pyrimidinylene group, an indolinylene group, a benzimidazolylene group, a furanylene group, a benzofuranylene group, a dibenzofuranylene group, a quinolinylene group, isoquinolinylene group, a quinoxalinylene group, a carbazolylene group, a phenanthridinylene group, an acridinylene group, a phenazinylene group, a phenothiazinylene group, a phenoxazinylene group, an oxazolylene group, an oxadiazolylene group, a thiadiazolylene group, a thiophenylene group, a benzothiophenylene group, or a dibenzothiophenylene group. In an embodiment, the divalent aromatic heterocyclic group of $L_1$ and $L_2$ may be a pyridinylene group, a pyrrolinylene group, a carbazolylene group, a dibenzofuranylene group, a dibenzothiophenylene group, or a bipyridinylene group.

In addition, from the viewpoint of improving a HOMO level, hole transportability, a hole injection property, solubility, a coating property of the polymer material according to the present embodiment, and improving luminescence life-span, when the divalent aromatic hydrocarbon group or a divalent aromatic heterocyclic group of $L_1$ and $L_2$ is substituted, the substituent may be a C1 to C50 alkyl group, an alkoxy group, an alkyl thio group, an aryl group, an aryloxy group, an aryl thio group, an aryl alkyl group, an aryl alkoxy group, an arylalkyl thio group, an aryl alkenyl group, an aryl alkynyl group, an amino group, an amino group substituted with a substituent, a silyl group, a substituted silyl group, a halogen atom, an acyl group, an acyl oxy group, an imine group, an amide group, an acid imide group, a monovalent heterocyclic group, a carboxyl group, a carboxyl group substituted with a substituent, a cyano group, or a nitro group. In an embodiment, the substituent may be a C1 to C50 alkyl group.

Among these, $L_1$ and $L_2$ are independently a single bond, a phenylene group, a biphenylene group, a fluorenylene group, a naphthylene group, an anthracenylene group, a phenanthryl group, a naphthacenylene group, a pyrenylene group, or a terphenylene group. In an embodiment, $L_1$ and $L_2$ may be a tolylene group, a t-butyl phenylene group, or a (phenylpropyl) phenylene group. Among these, $L_1$ and $L_2$ may be a single bond, a phenylene group, a biphenylene group, a terphenylene group, or a fluorenylene group. In an embodiment, L and $L_2$ may be a single bond or a phenylene group. In another embodiment, L is a single bond and $L_2$ is a phenylene group.

In Formula (2-B) to Formula (2-D), $R_1$ and $R_2$ are substituents are attached to $Z_1$ to $Z_8$ when $Z_1$ to $Z_8$ are C. In some embodiments, $R_1$ and $R_2$ are independently a substituted or unsubstituted C1 to C20 alkyl group, a substituted or unsubstituted C1 to C20 alkoxy group, a substituted or unsubstituted monovalent aromatic hydrocarbon group having ring-forming 6 to 60 carbon atoms, or a substituted or unsubstituted monovalent aromatic heterocyclic group having 3 to 60 ring-forming atoms. Herein, $R_1$ and $R_2$ may be combined with each other to form a ring. $R_1$ and $R_2$ may be the same or different. In addition, when a is 2 to 4, a plurality of $R_1$ may be the same or different. Likewise, when b is 2 or 3, a plurality of $R_2$ may be the same or different.

Herein, the C1 to C20 alkyl group is not particularly limited, but may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-eicosyl group, and the like.

The C1 to C20 alkyl group may be a C1 to C20 linear or branched alkyl group, for example a C1 to C8 linear or branched alkyl group.

Herein, the C1 to C20 alkoxy group is not particularly limited, but may be a methoxy group, an ethoxy group, an n-propoxy group, an isopropoxy group, an n-butoxy group, an isobutoxy group, a sec-butoxy group, a tert-butoxy group, an n-pentoxy group, an isopentoxy group, a tert-pentoxy group, a neopentoxy group, a 1,2-dimethylpropoxy group, an n-hexyloxy group, an isohexyloxy group, a 1,3-dimethylbutoxy group, a 1-isopropyl propoxy group, a 1,2-dimethylbutoxy group, an n-heptyloxy group, a 1,4-dimethylpentyloxy group, a 3-ethylpentyloxy group, a 2-methyl-1-isopropyl propoxy group, a 1-ethyl-3-methylbutoxy group, an n-octyloxy group, a 2-ethylhexyloxy group, a 3-methyl-1-isopropylbutoxy group, a 2-methyl-1-isopropoxy group, a 1-tert-butyl-2-methyl propoxy group, an n-nonyloxy group, a 3,5,5-trimethylhexyloxy group, an n-decyloxy group, an isodecyloxy group, an n-undecyloxy group, a 1-methyldecyloxy group, an n-dodecyloxy group, an n-tridecyloxy group, an n-tetradecyloxy group, an n-pentadecyloxy group, an n-hexadecyloxy group, an n-heptadecyloxy group, an n-octadecyloxy group, and an n-eicosyloxy group.

The C1 to C20 alkoxy group may be a C1 to C20 linear or branched alkoxy group, for example a C1 to C8 linear or branched alkoxy group.

Herein, the monovalent aromatic hydrocarbon group having 6 to 60 ring-forming carbon atoms and the monovalent aromatic heterocyclic group having 3 to 60 ring-forming atoms are the same as $Ar_1$ of Formula (2-A) to Formula (2-D) except that the trivalent aromatic hydrocarbon group and the trivalent aromatic heterocyclic group are changed into monovalent groups, and thus the descriptions thereof are not repeated here. In addition, since the substituent in the case where the C1 to C20 alkyl group, the C1 to C20 alkoxy group, the monovalent aromatic hydrocarbon group having 6 to 60 ring-forming carbon atoms, or the monovalent aromatic heterocyclic group having 3 to 60 ring-forming atoms is substituted, is the same as the substituent in $Ar_1$ of Formula (2-A) to Formula (2-D), the descriptions thereof are not repeated here.

$R_1$ and $R_2$ may be a phenyl group or a fluorenyl group.

The designation a indicates the number of $R_1$ in Formula (2-B) to Formula (2-D). The designation a may preferably be an integer of 1 to 4, for example 1 or 2, or may be more preferably 1.

The b indicates the number of $R_2$ in Formula (2-B) to Formula (2-D), but the designation b may be an integer of 1 to 3, for example 1 or 2, or 1.

Among the groups represented by Formula (2-A) to Formula (2-D), a group represented by Formula (2-A), Formula (2-C) or Formula (2-D) is preferred, the group represented by Formula (2-A) or Formula (2-D) may be more preferred, and the group represented by Formula (2-A) is most preferred.

In Formula (2-A) to Formula (2-D), $Z_1$ to $Z_8$ constituting the nitrogen-containing aromatic heterocycle may independently be N, C, or $C(R_3)$.

The nitrogen-containing aromatic heterocycle may have a structure in which $Z_1$ to $Z_8$ constituting the nitrogen-containing aromatic heterocycle are C that is, in the structures shown below.

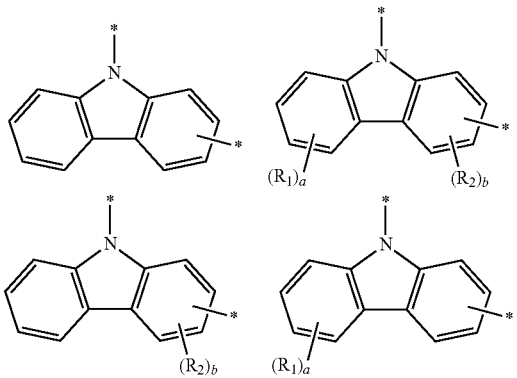

In the above formula, * indicates a binding sites to $L_1$ and $L_2$.

Moreover, the nitrogen-containing aromatic heterocycle may have a structure shown below.

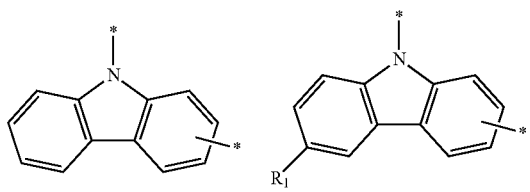

In the above formula, indicates a binding sites to $L_1$ and $L_2$.

Further, in the present embodiment, from the viewpoint of further improving a HOMO level and hole transportability, further lowering a driving voltage, and further improving luminescence life-span, X may be at least one of groups represented by Formula (2-E) to Formula (2-H). Moreover, it is more preferred that X is at least one of groups represented by Formula (2-I) to Formula (2-L), from the viewpoint of further improving luminescence life-span. Herein, it is preferred that $R_1$ and $R_2$ are not combined with each other to form a ring. Herein, each occurrence of X included in a plurality of structural units represented by Formula (1) may be same or different.

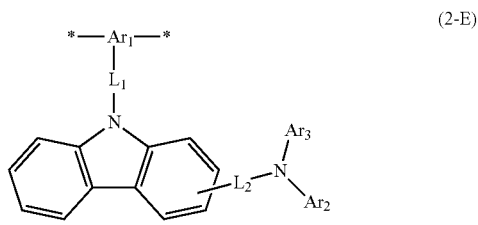

(2-E)

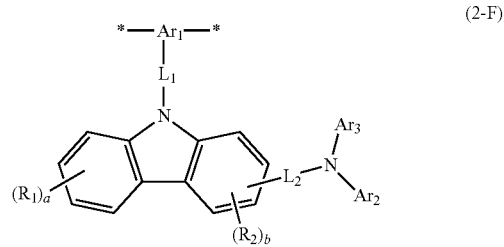

(2-F)

(2-G)

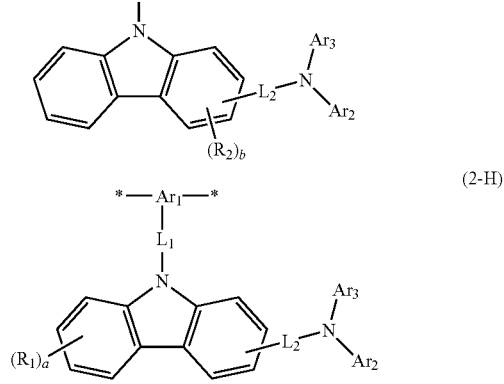

(2-H)

In (Formula (2-E) to Formula (2-H), $Ar_1$, $Ar_2$, $Ar_3$, $L_1$, $L_2$, $R_1$, $R_2$, a, b, and * are the same as in Formula (2-A) to Formula (2-D).

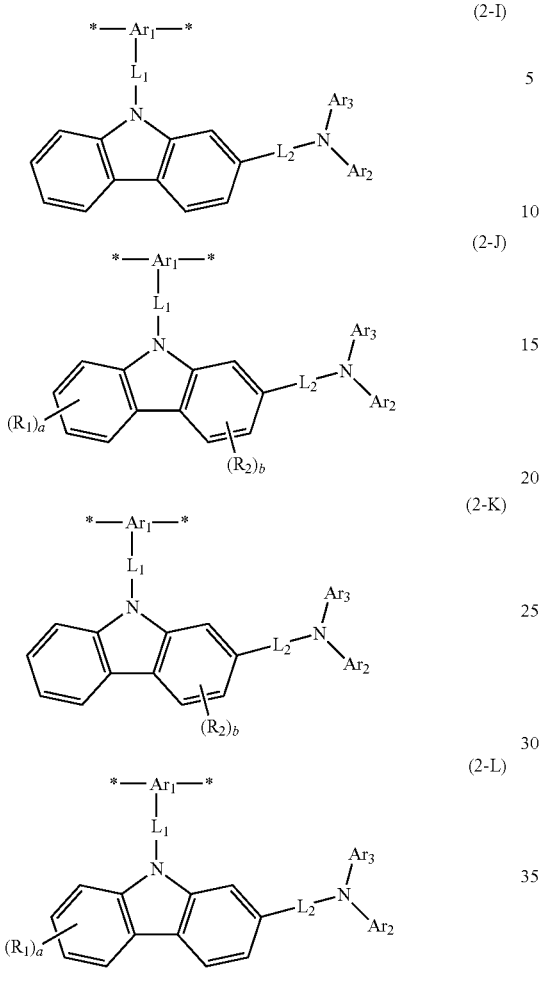

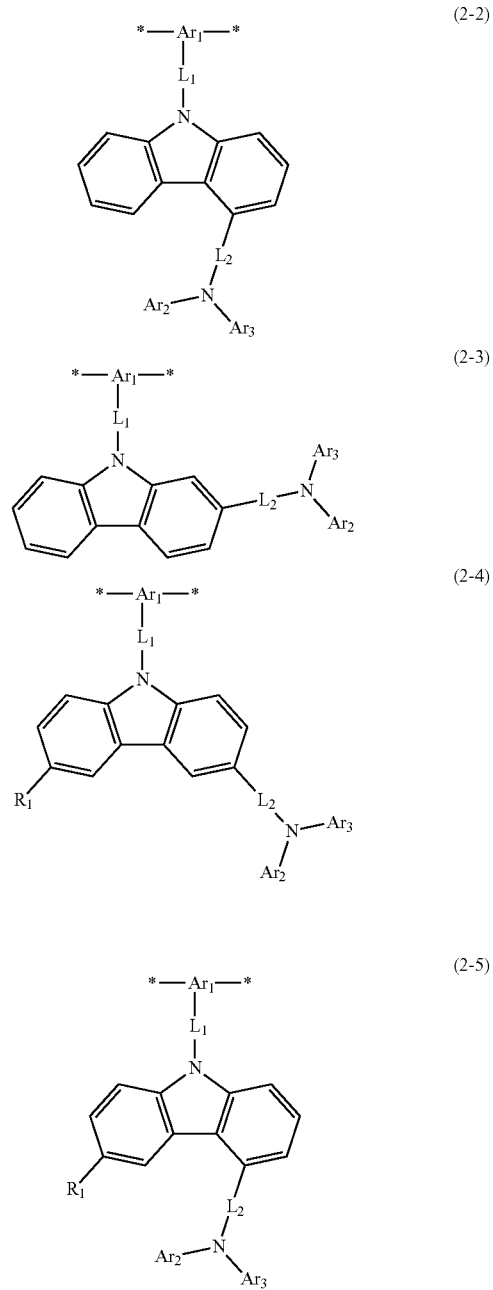

In (Formula (2-I) to Formula (2-L), $Ar_1$, $Ar_2$, $Ar_3$, $L_1$, $L_2$, $R_1$, $R_2$, a, b, and * are the same as in Formula (2-A) to Formula (2-D).

Moreover, among these, from the viewpoint of further improving a HOMO level and hole transportability, further lowering a driving voltage, and further improving luminescence life-span, X may be at least one of groups represented by Formulas (2-1) to (2-6). Herein, each occurrence of X included in a plurality of structural units represented by Formula (1) may be same or different.

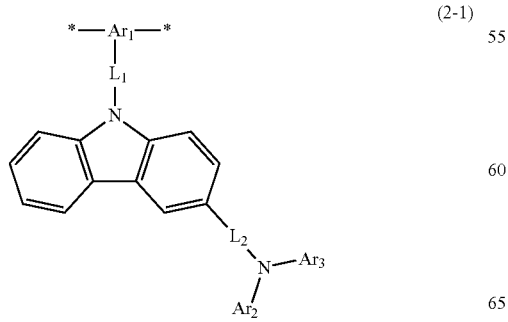

In Formula (2-1) to Formula (2-6), $Ar_1$, $Ar_2$, $Ar_3$, $L_1$, $L_2$, $R_1$, and * are the same as Formula (2-A) to the Formula (2-D).

Exemplary X groups are shown below.
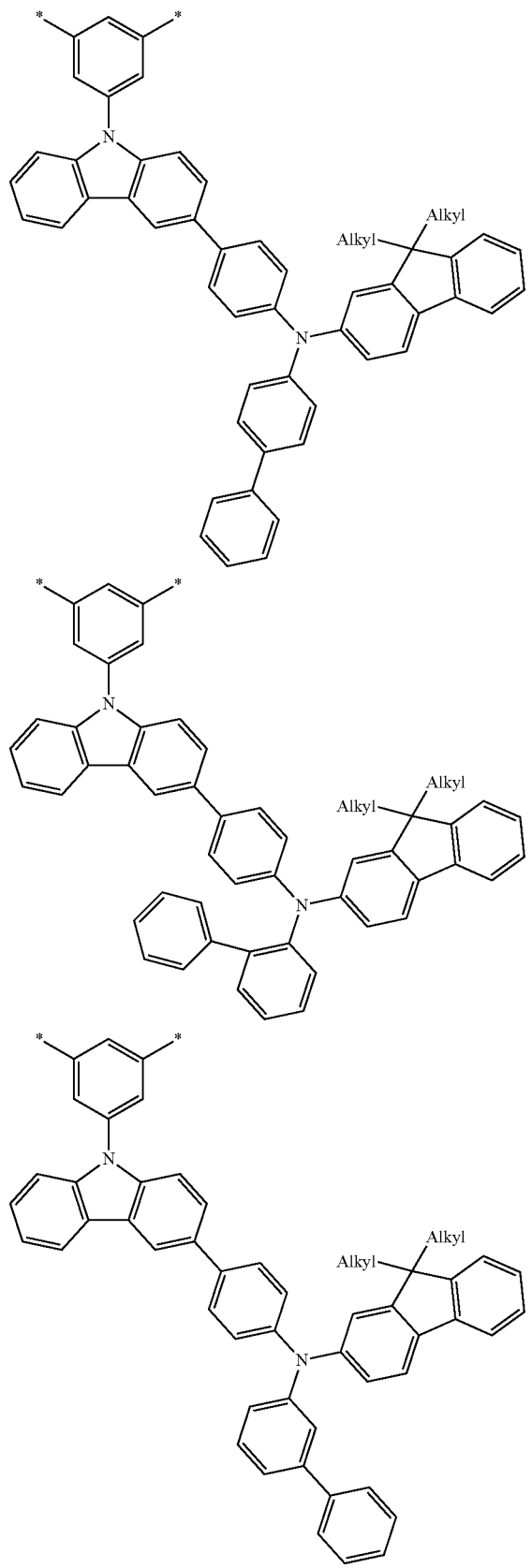

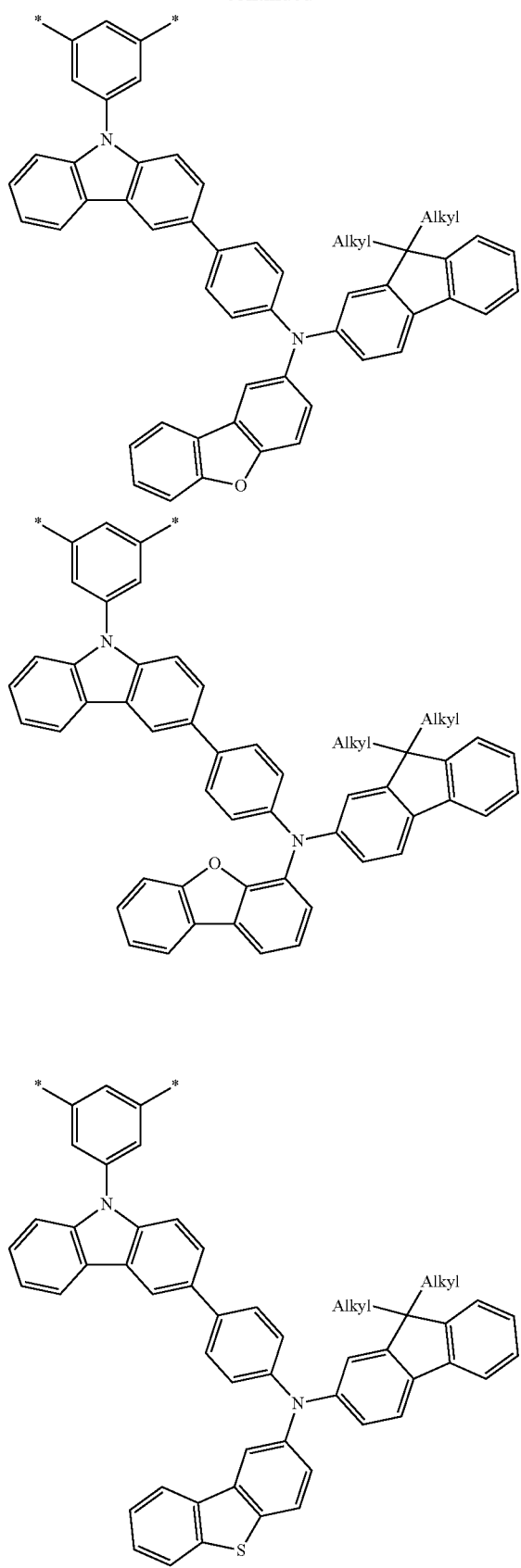
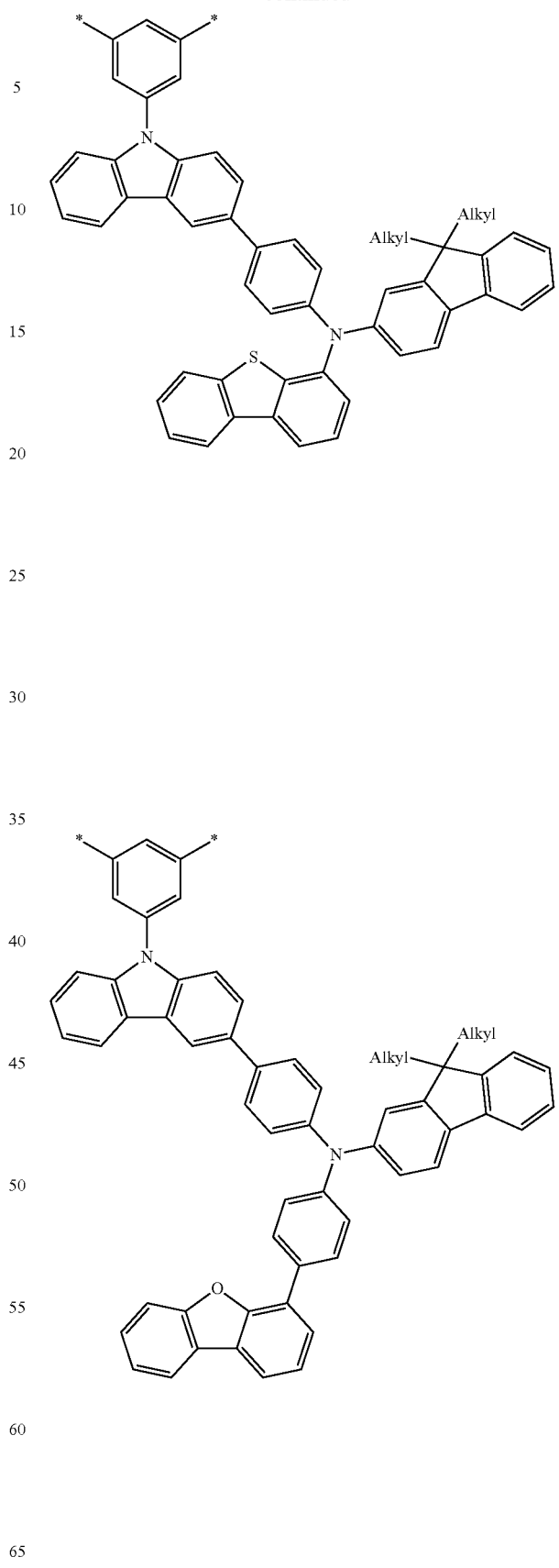

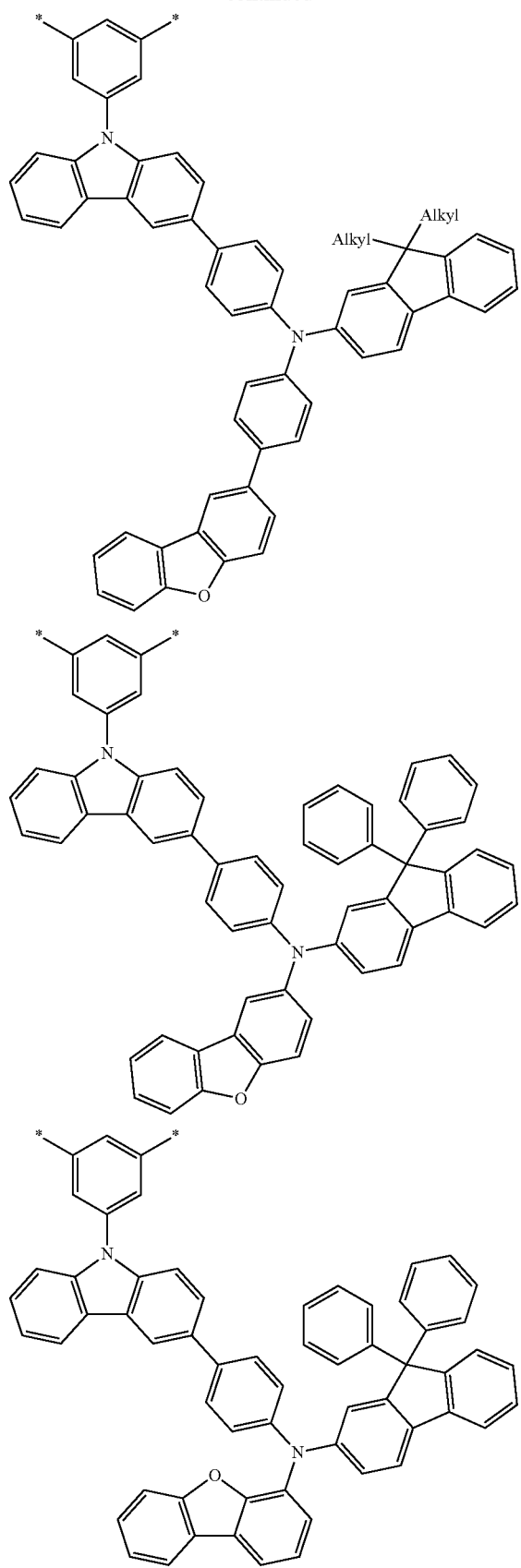
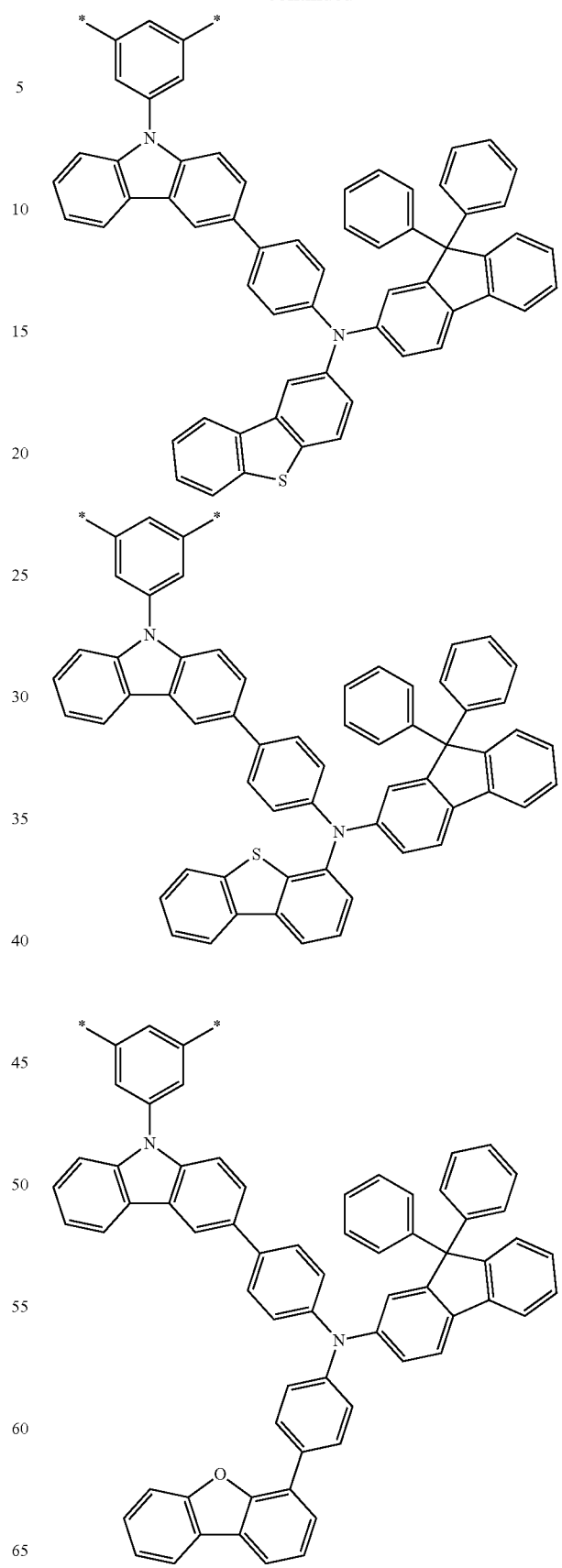

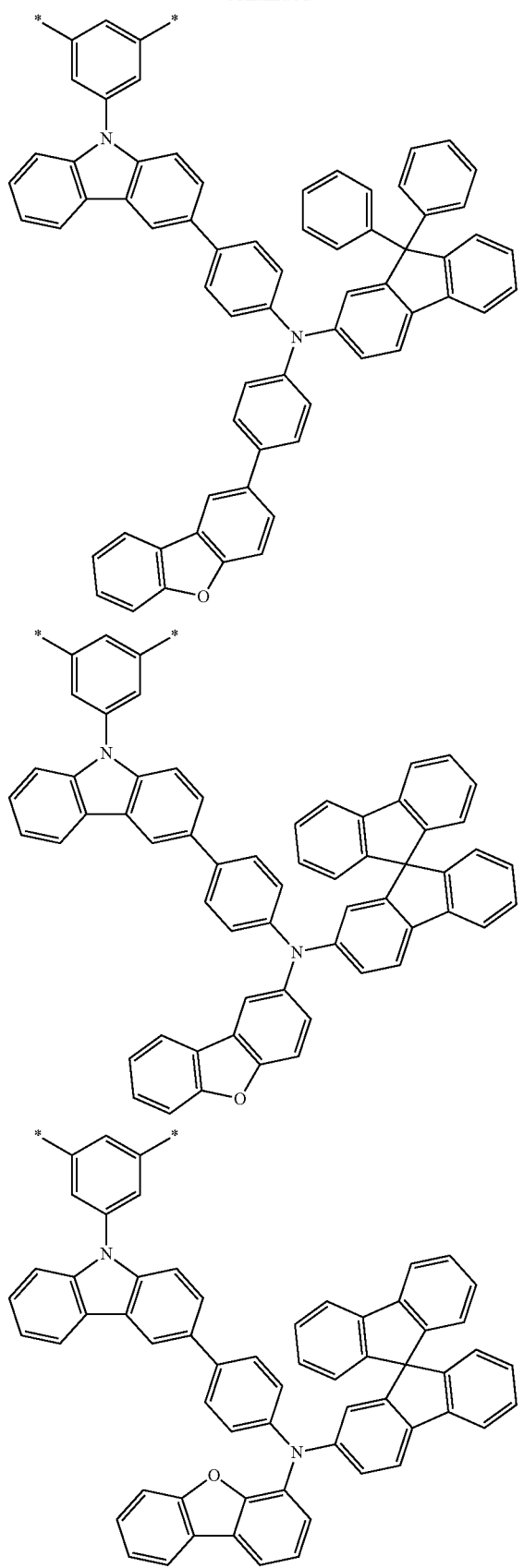
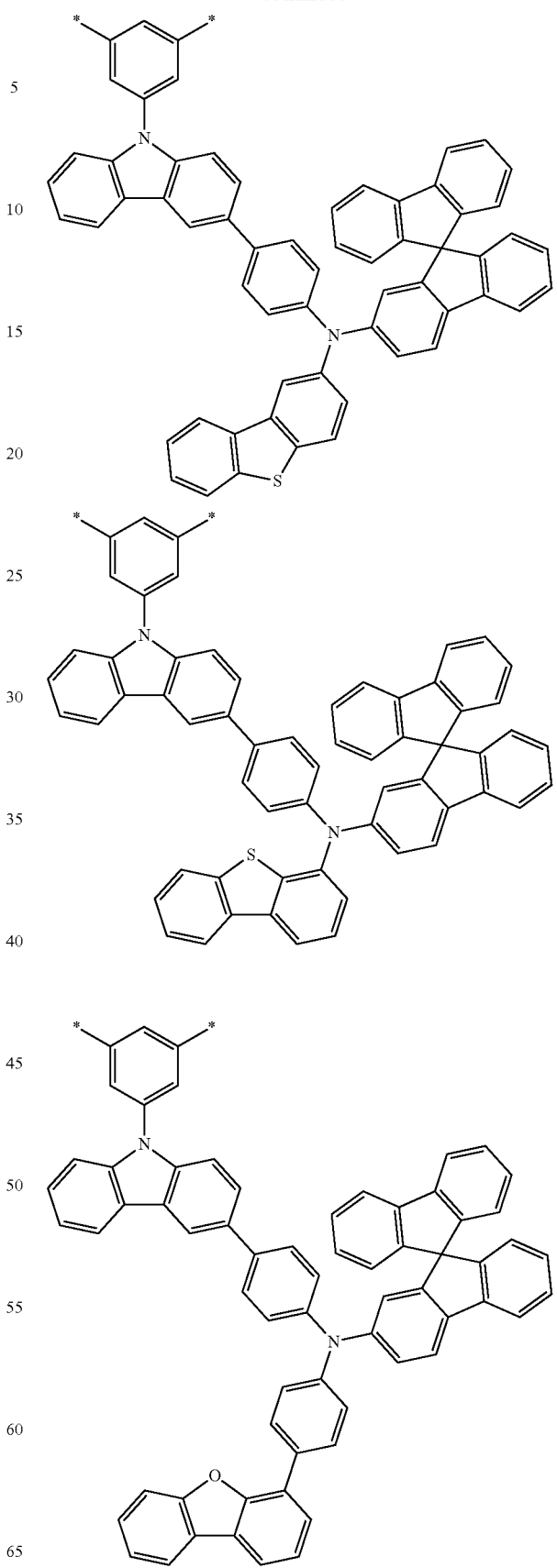

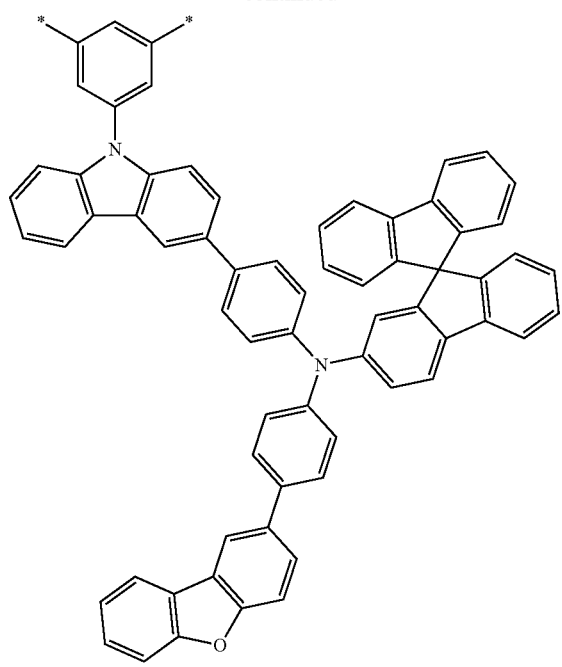
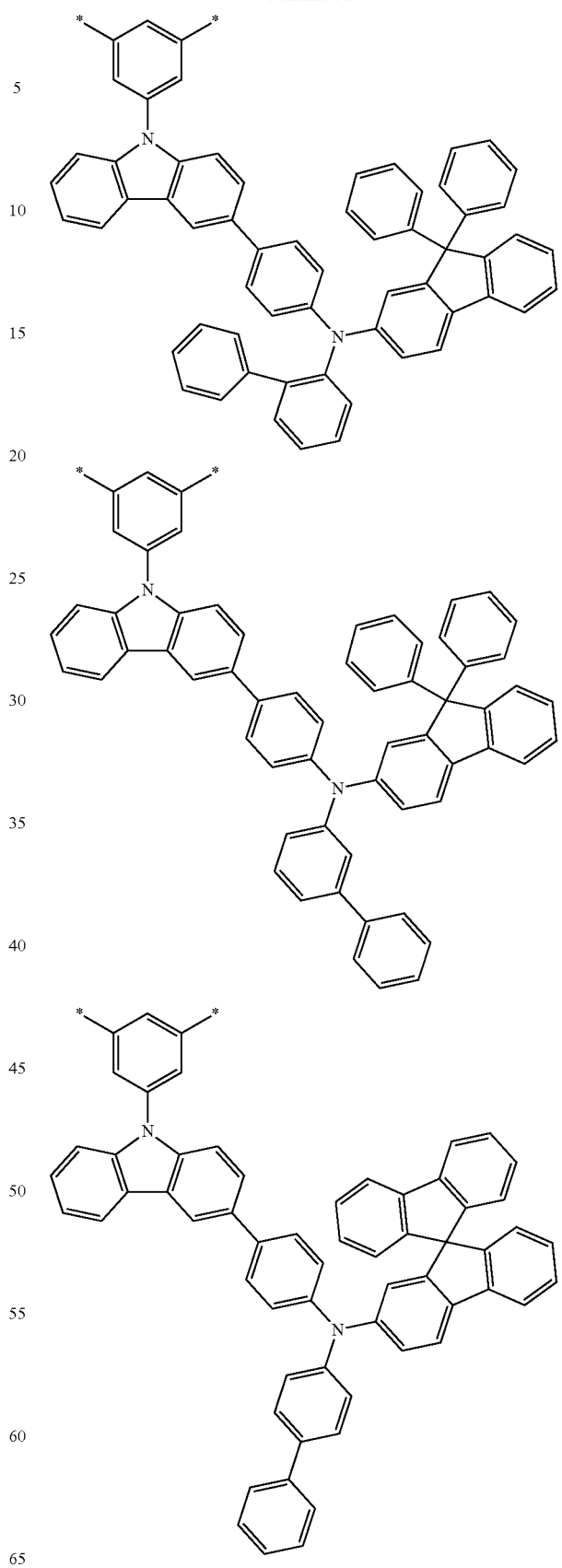

33
-continued
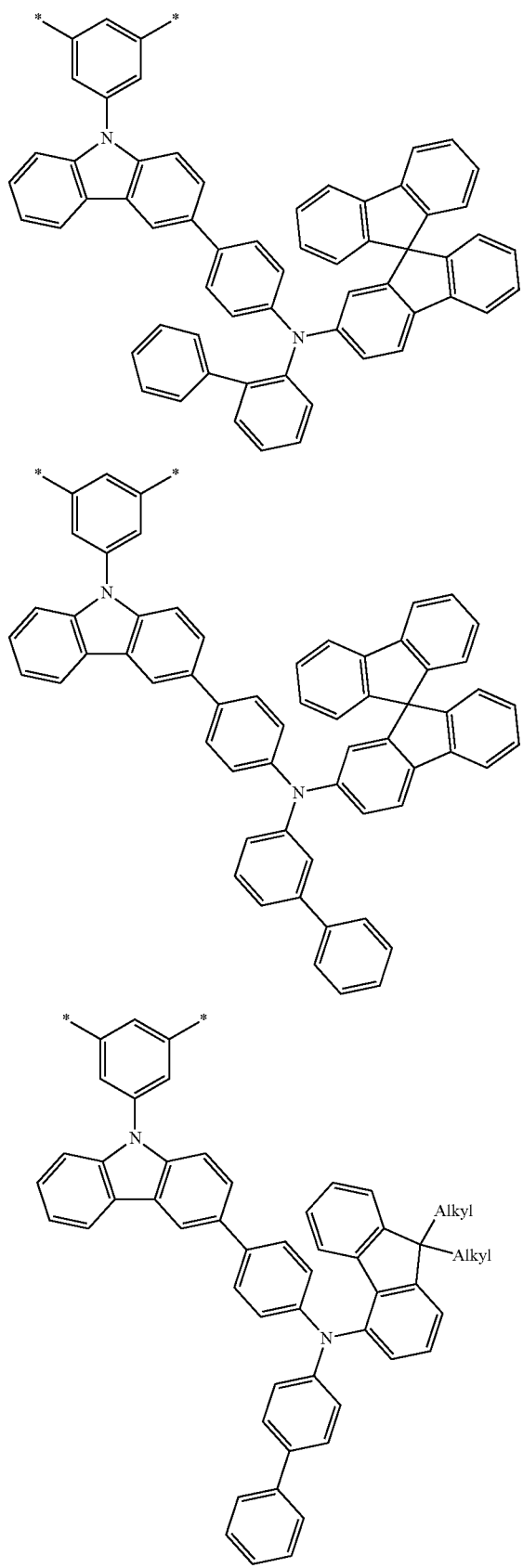
34
-continued
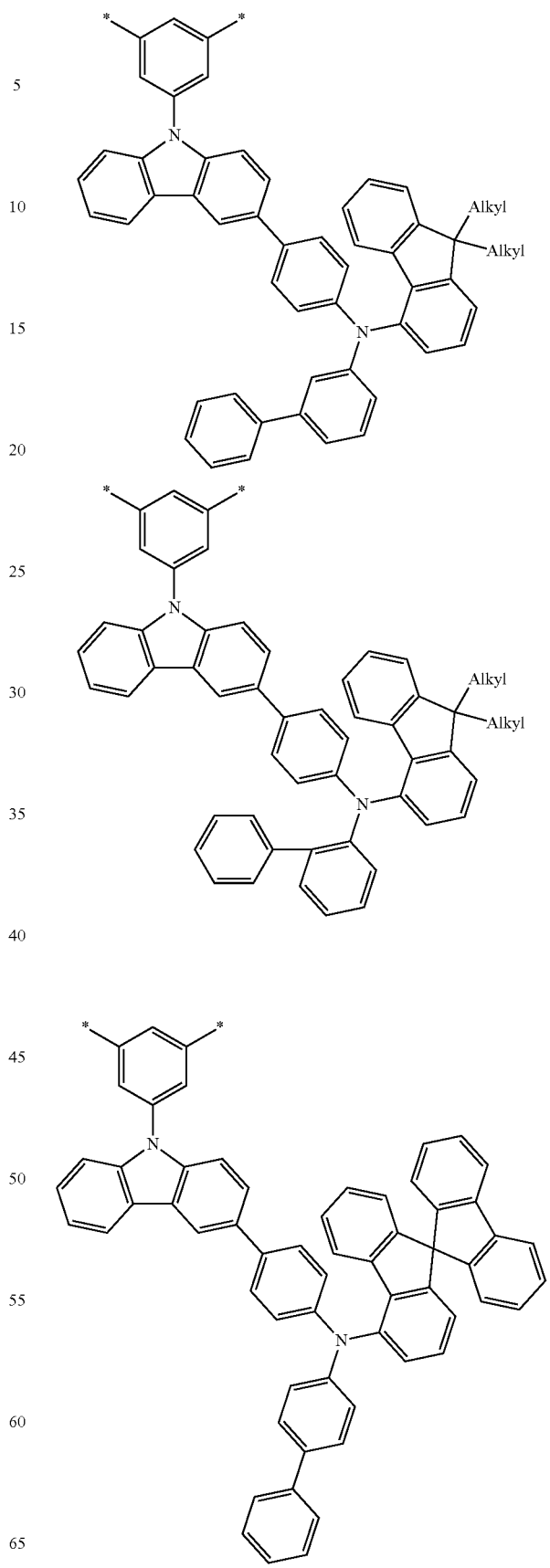

35
-continued
36
-continued
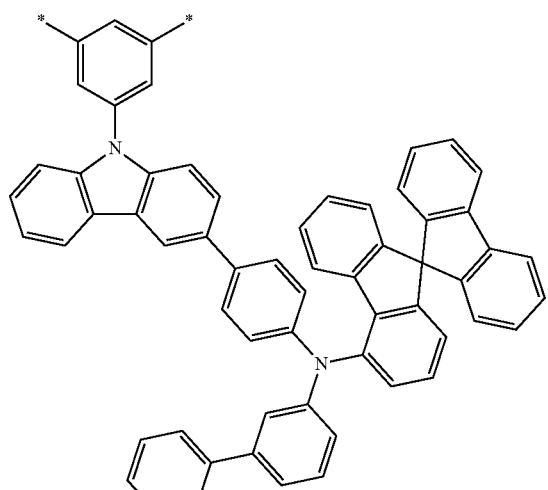
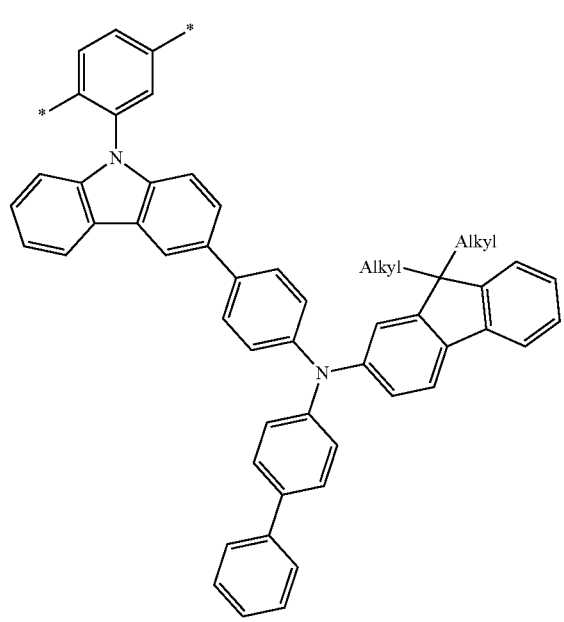

37
-continued
38
-continued
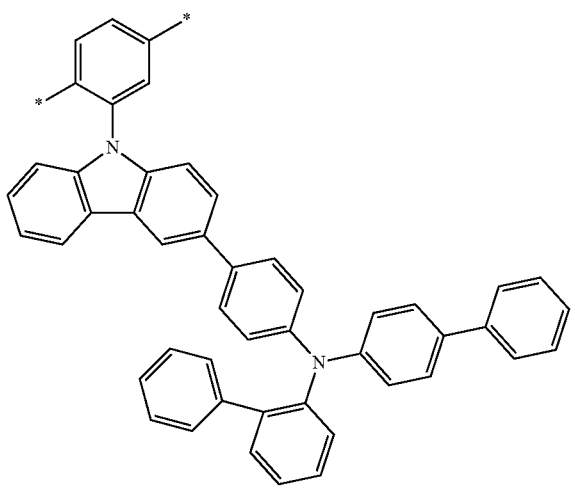
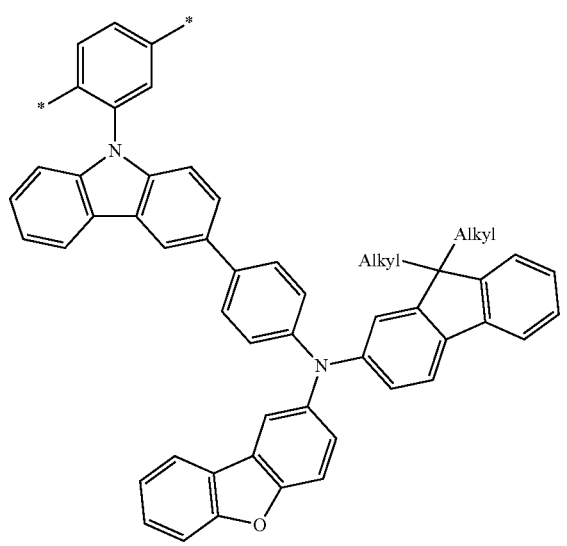

39
-continued
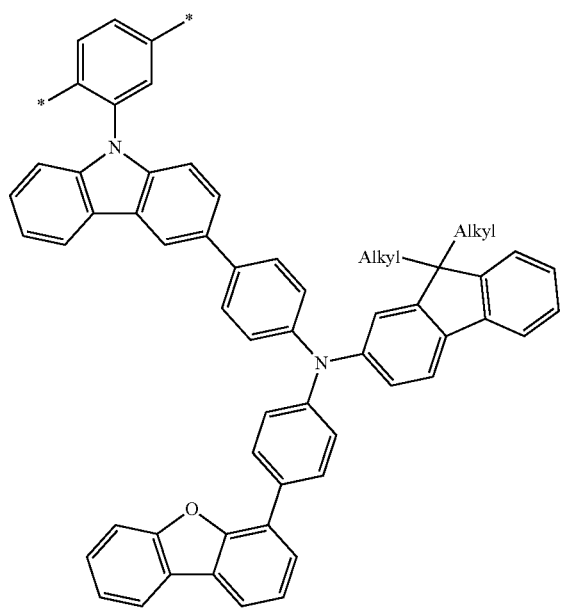
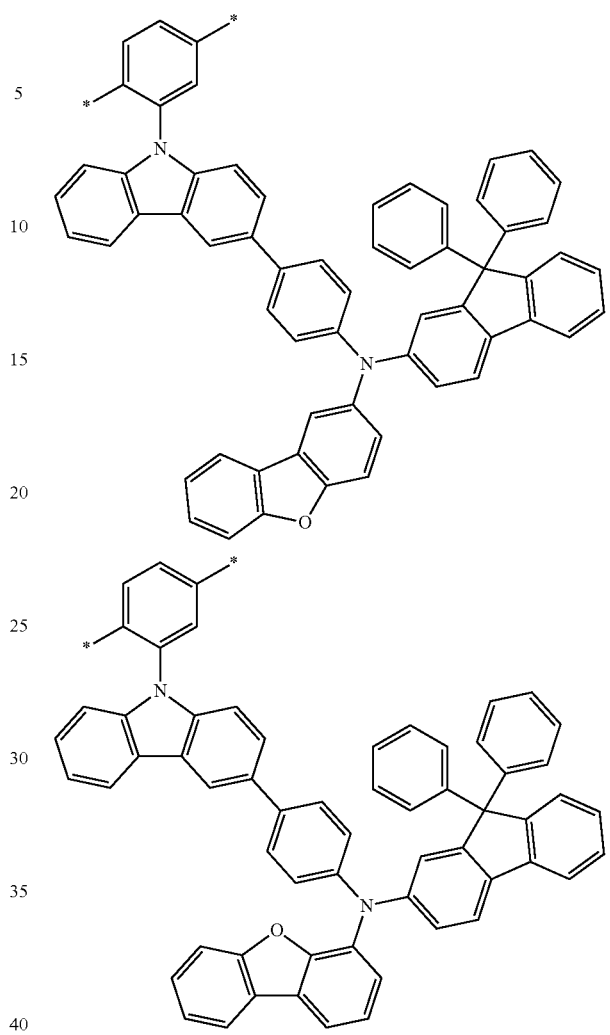
40
-continued
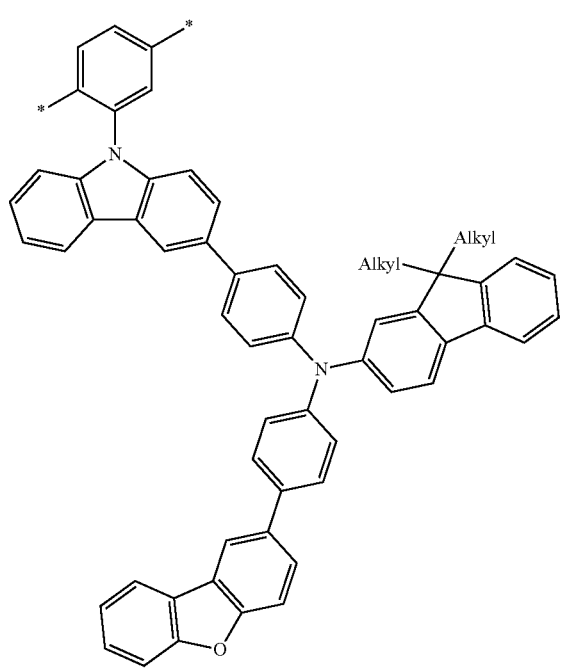

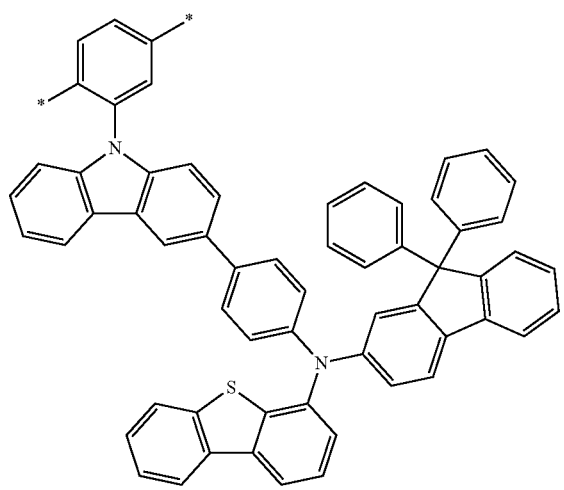
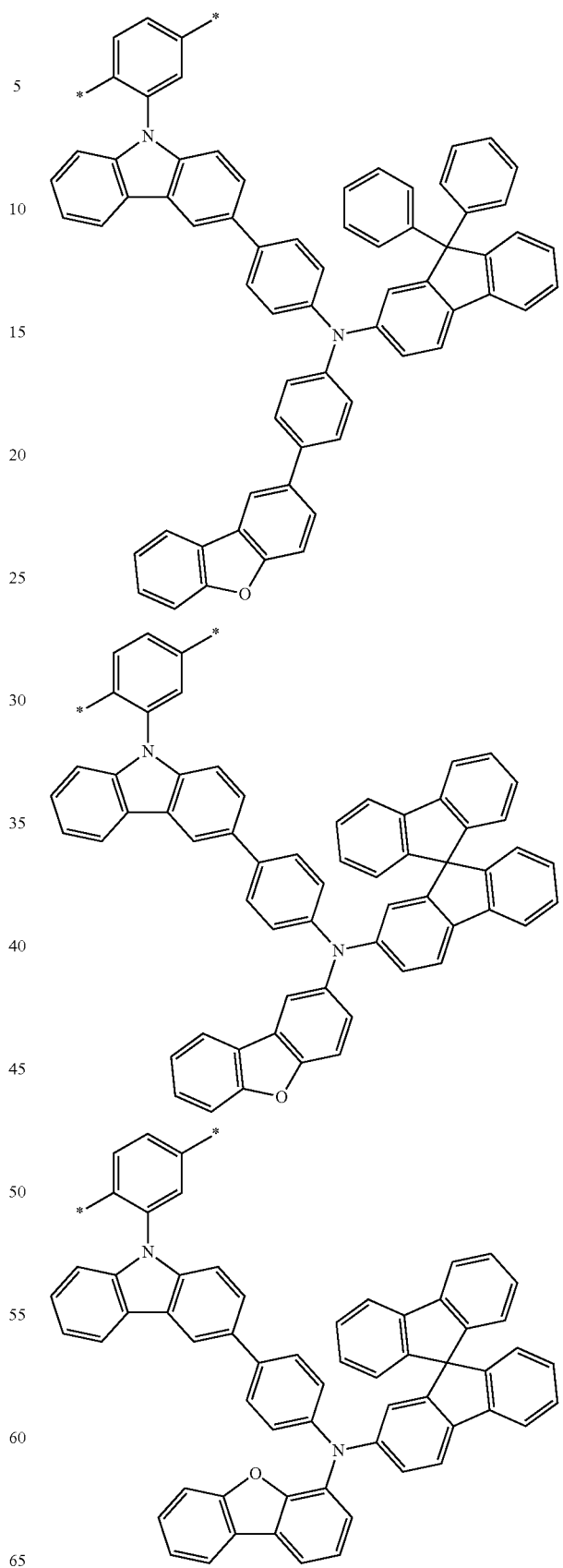

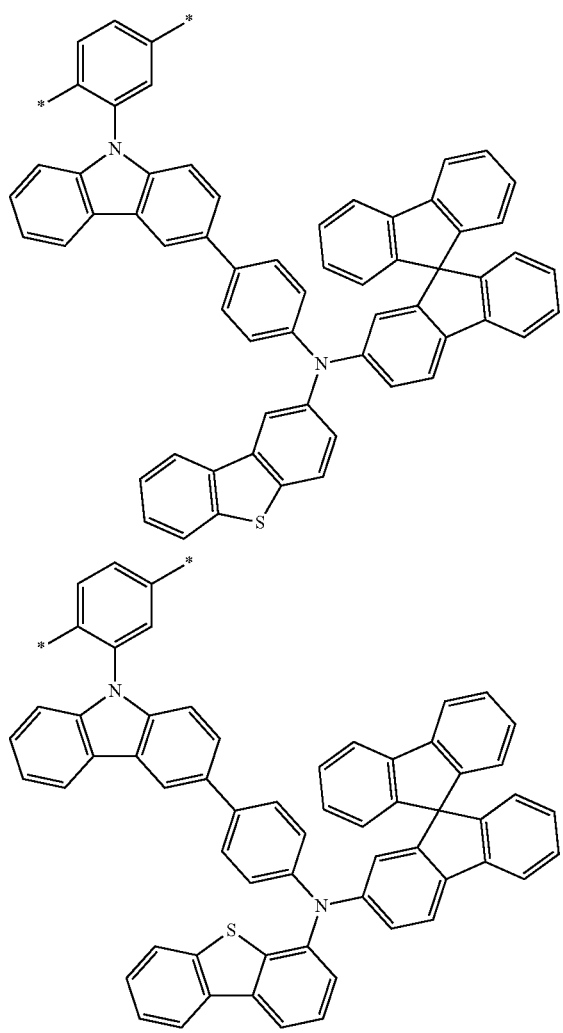
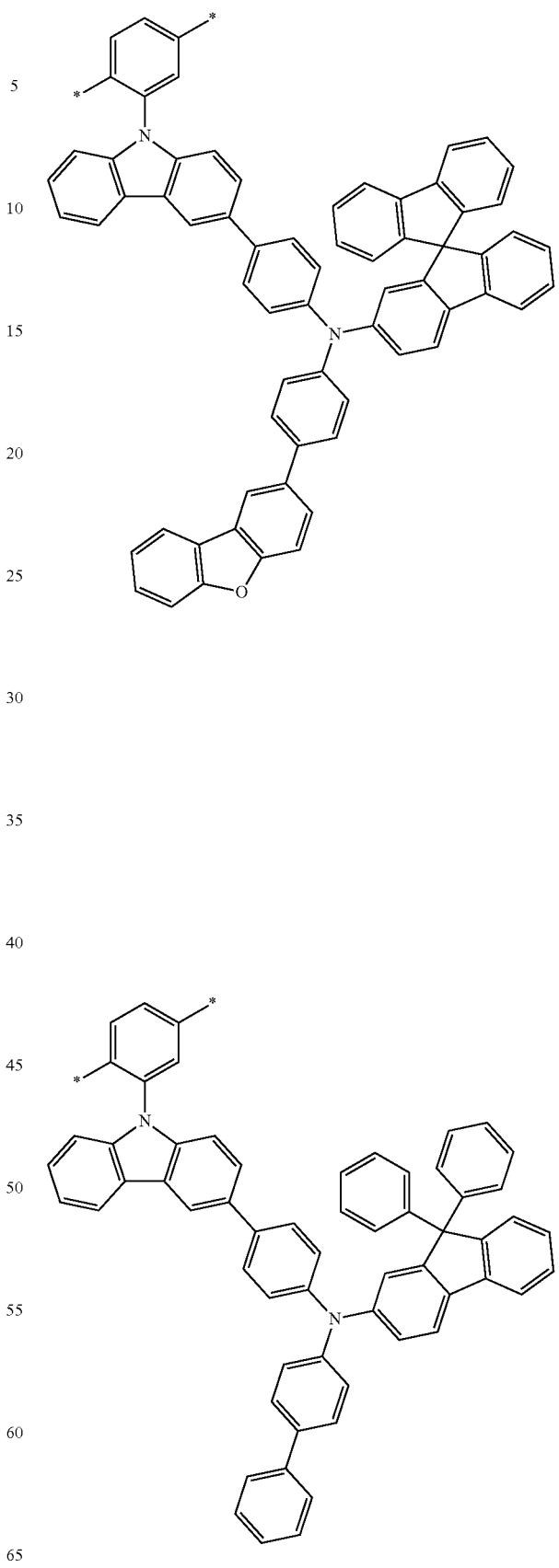

-continued
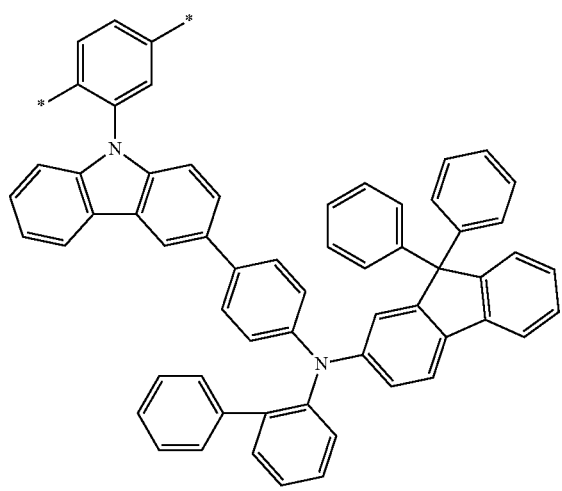
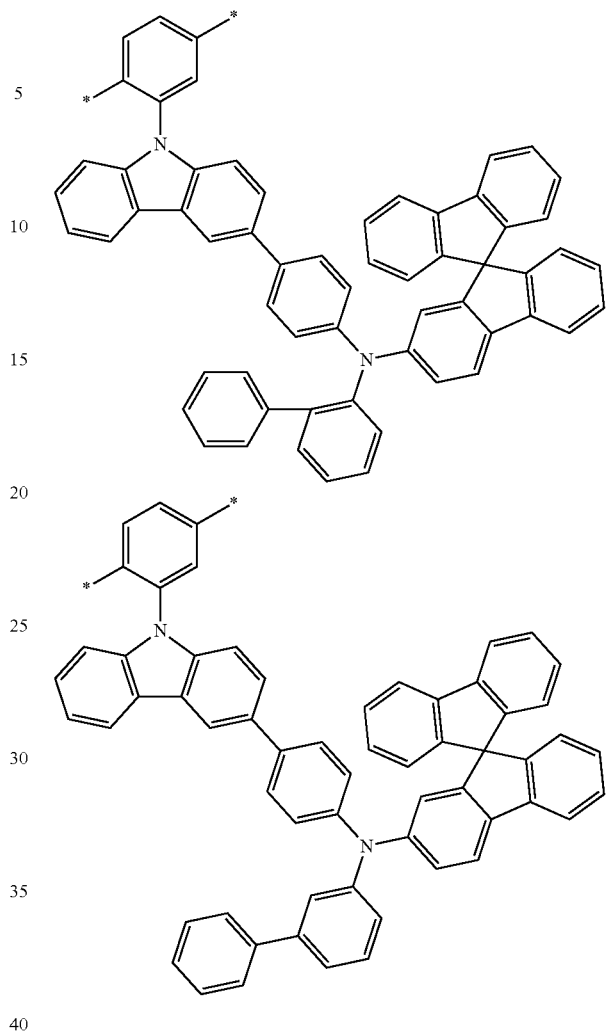
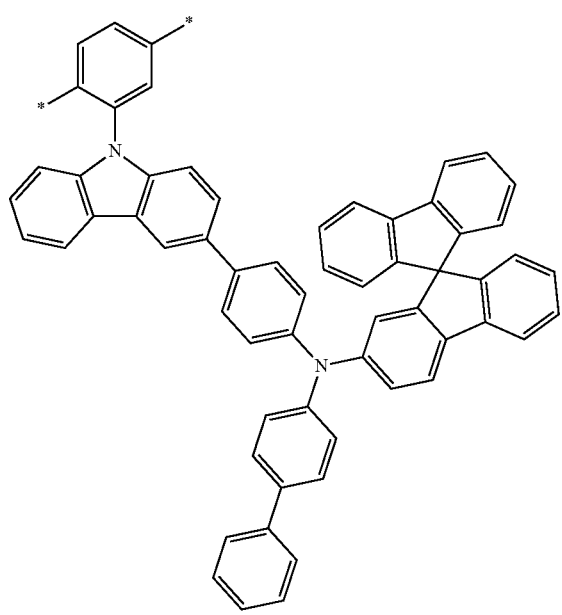
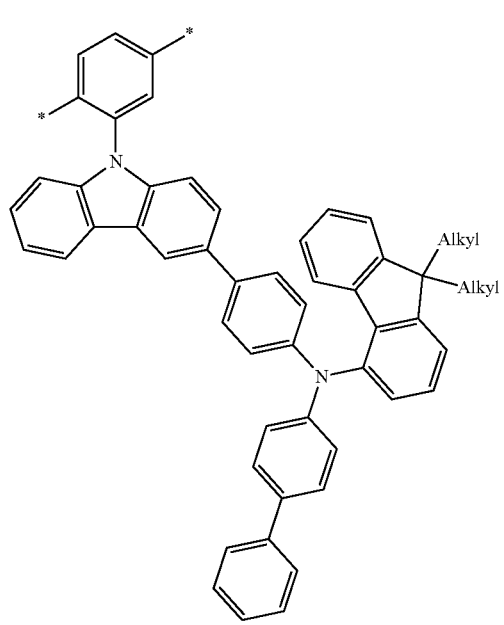

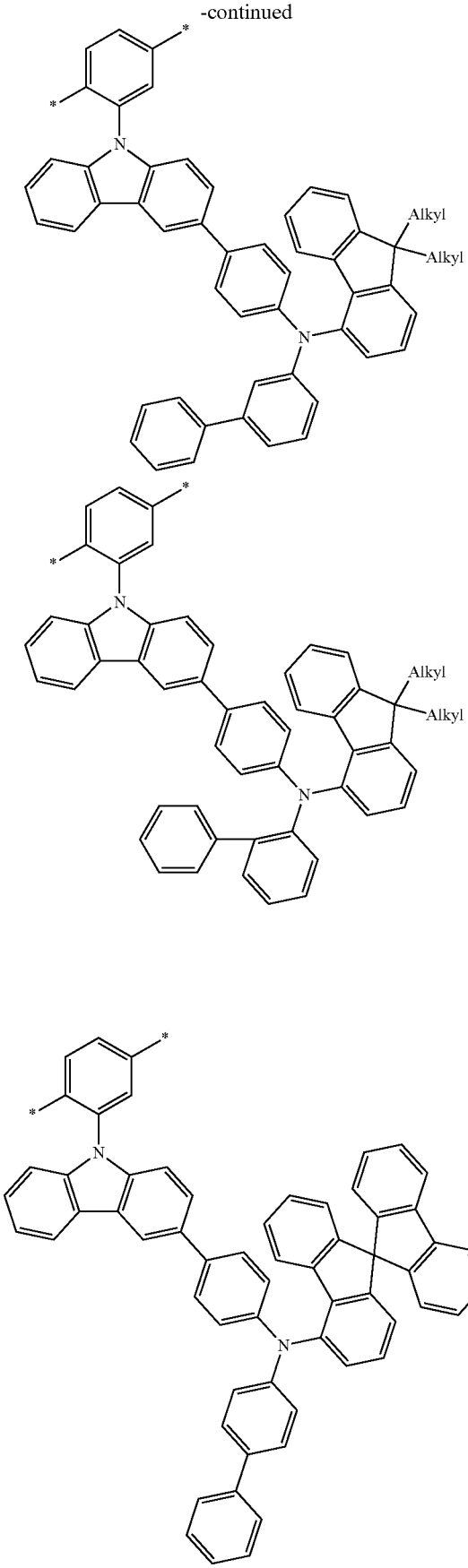
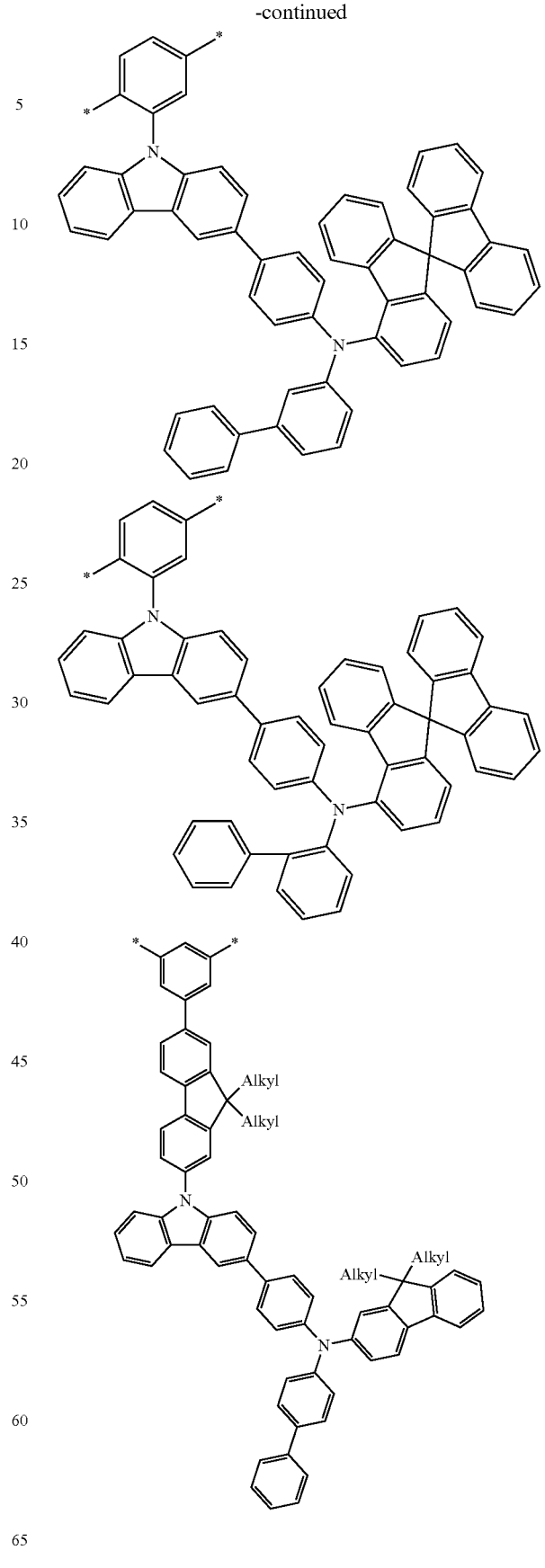

49
-continued
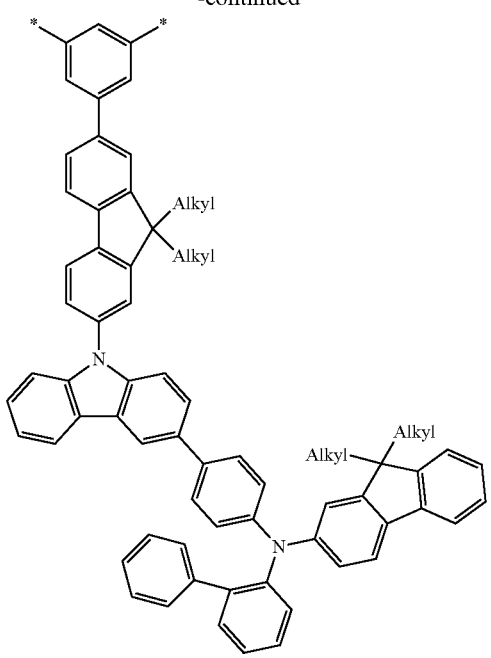
50
-continued
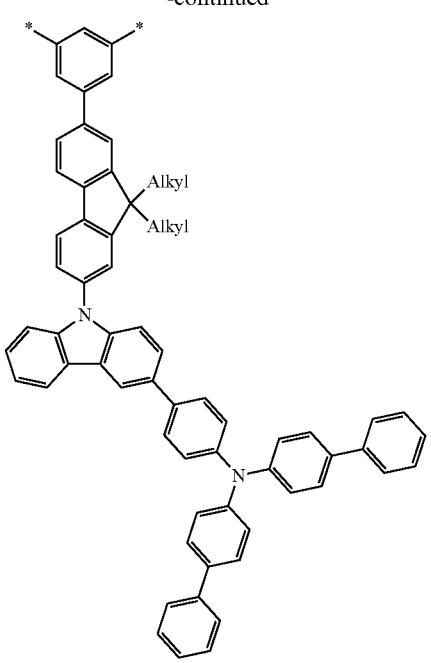
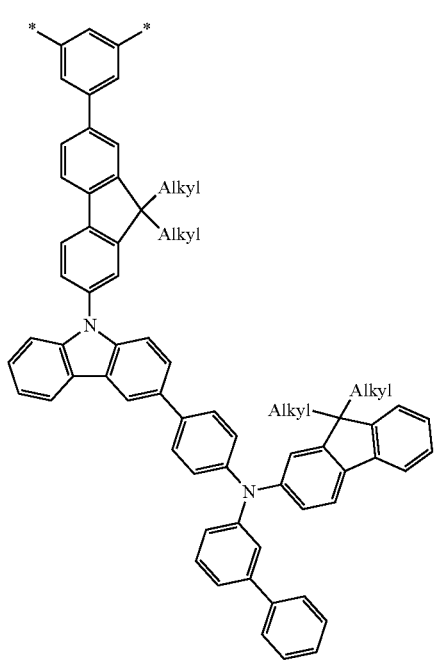
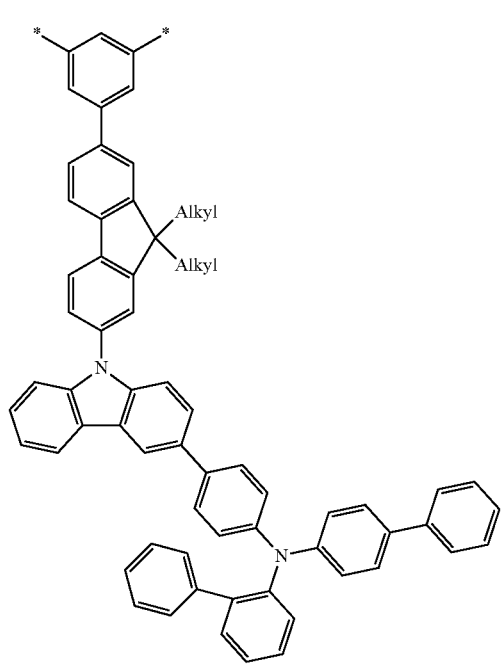

51
-continued
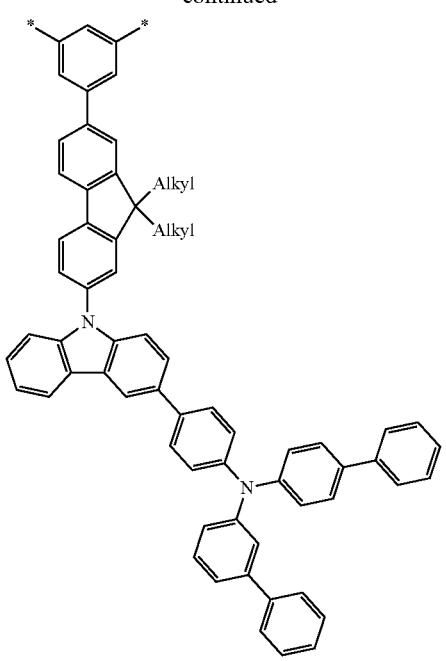
52
-continued
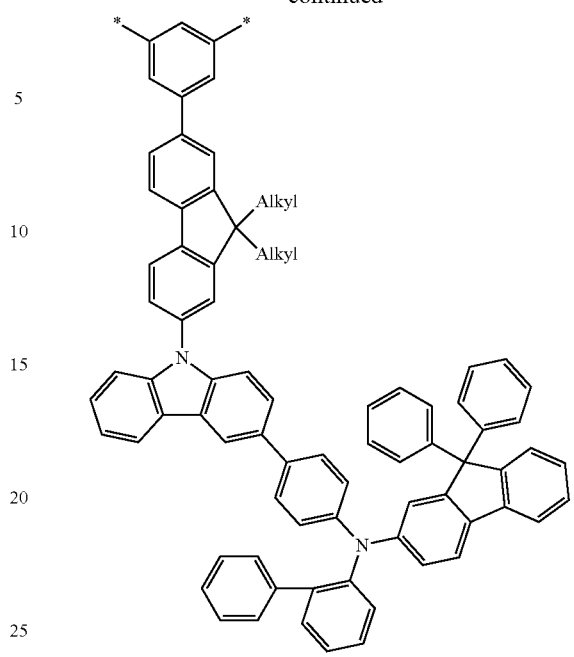
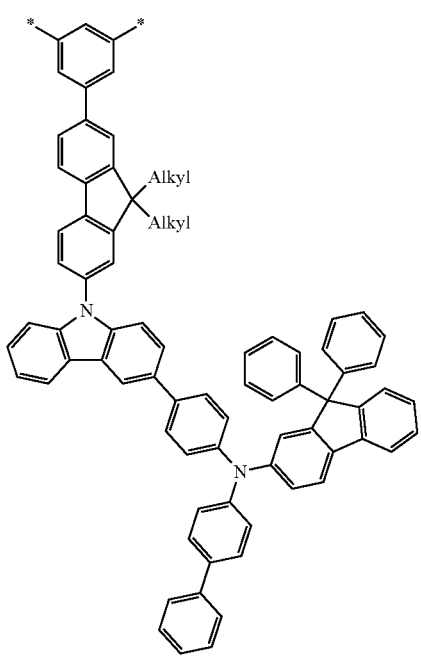

53
-continued
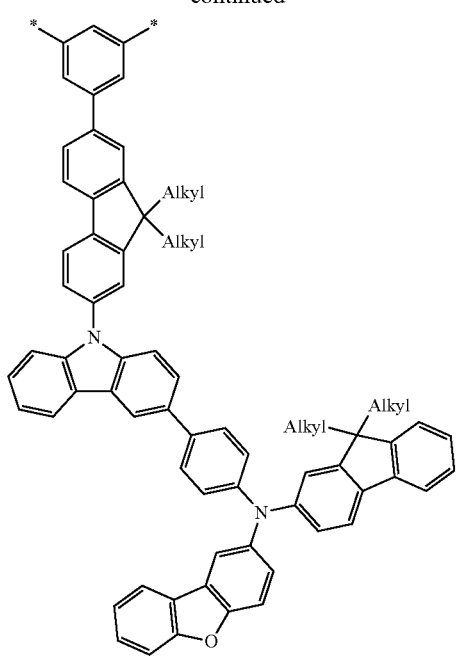
54
-continued
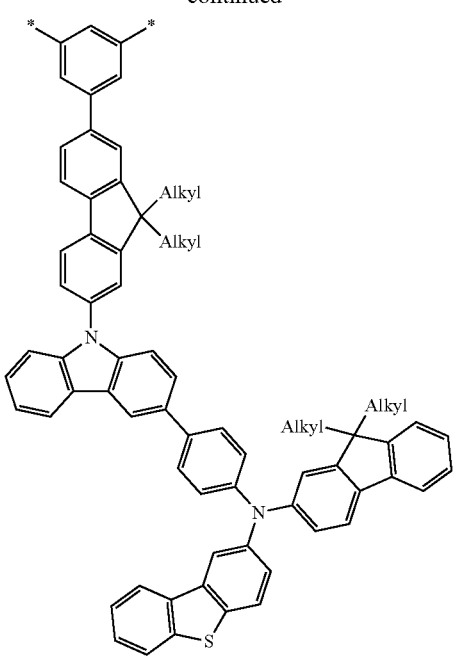
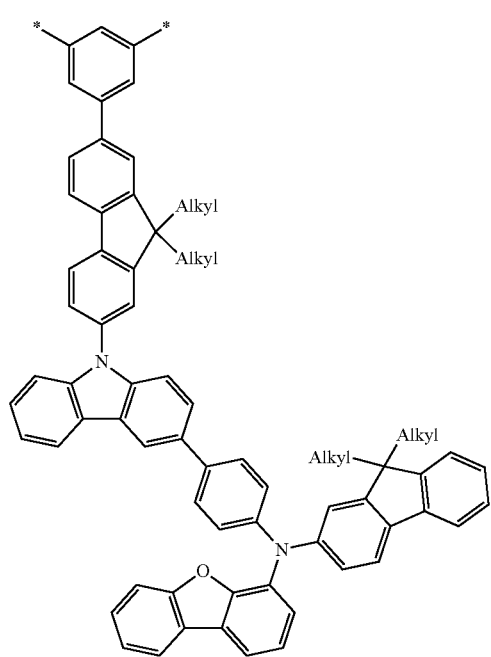
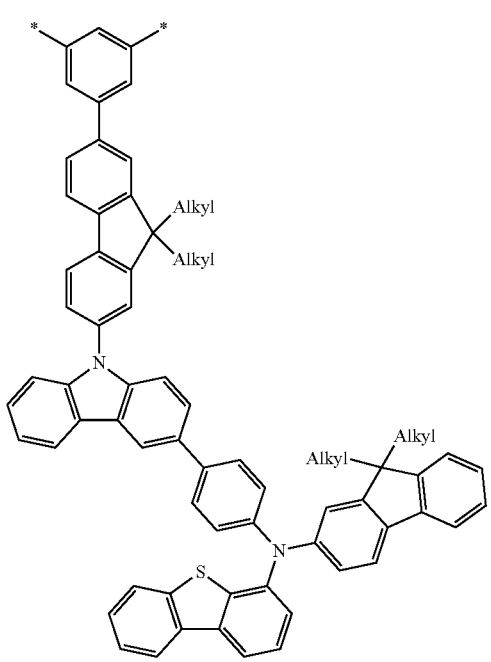

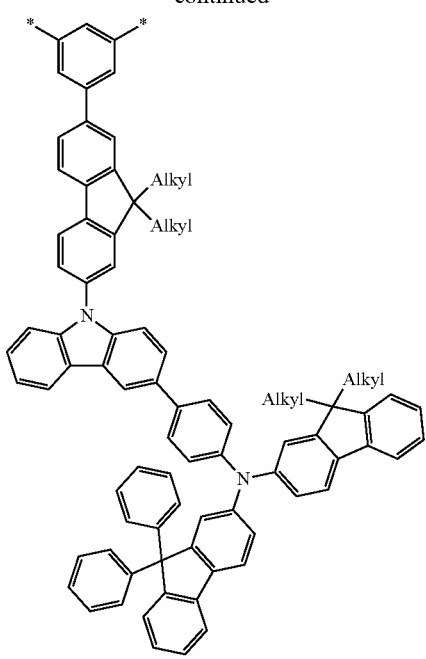
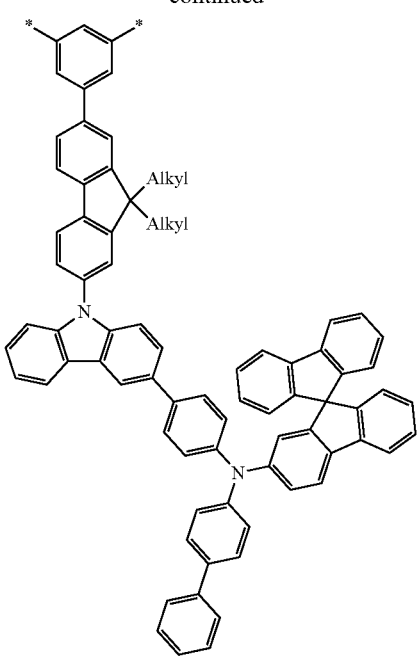
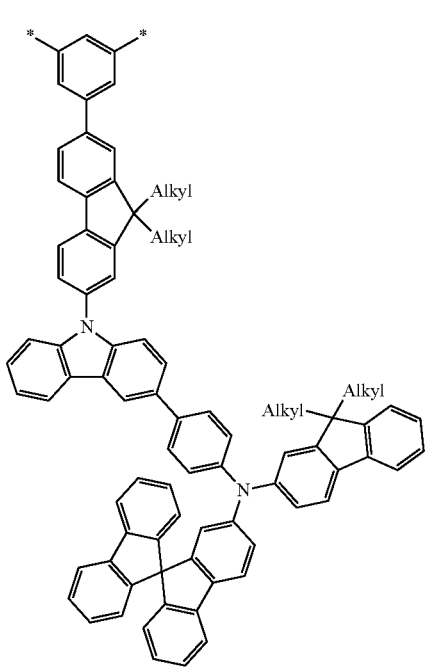
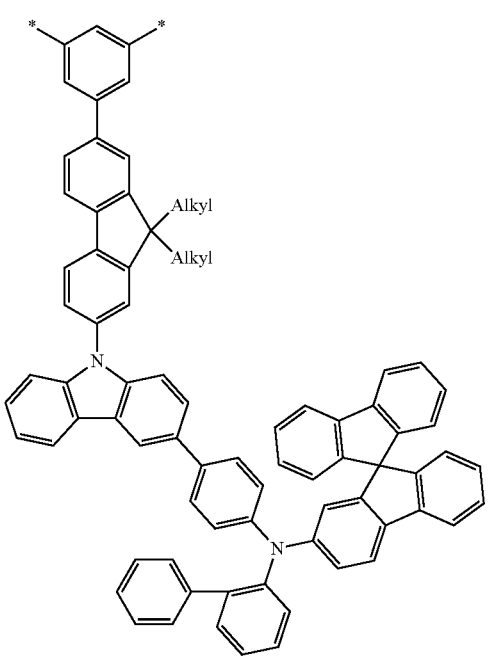

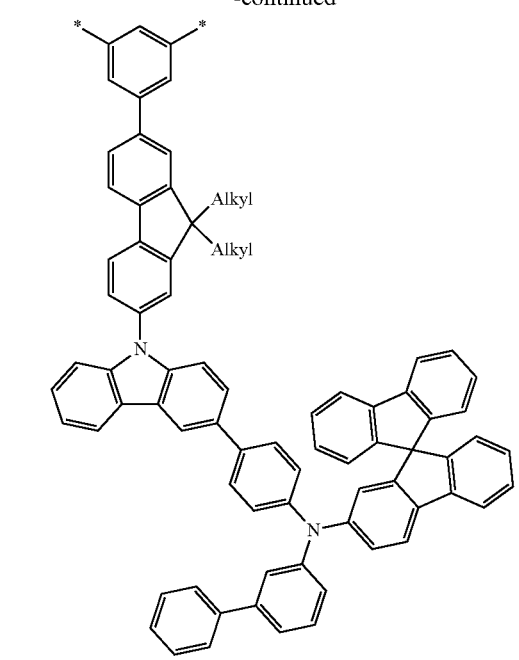
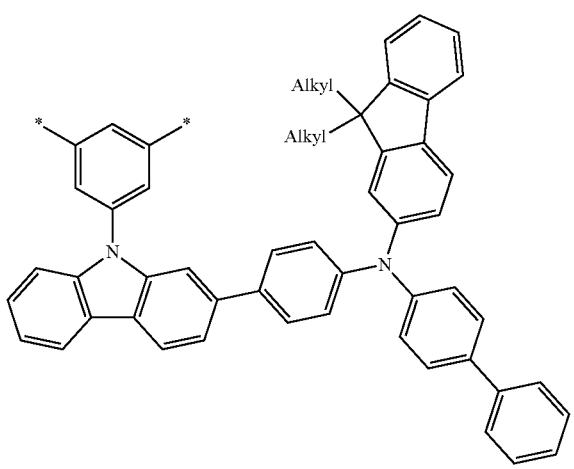
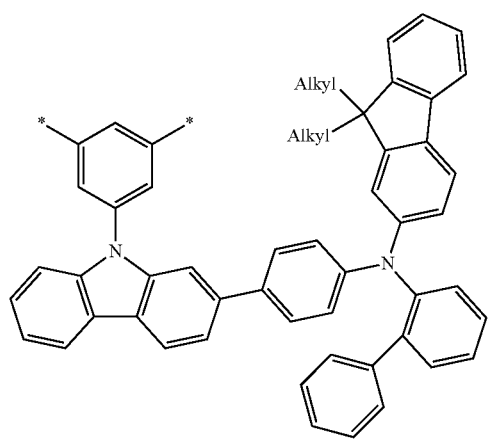
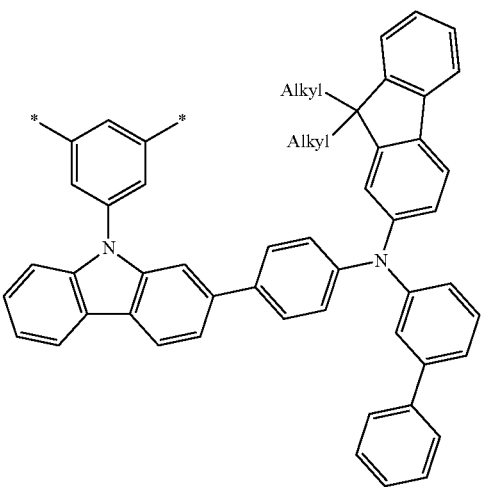
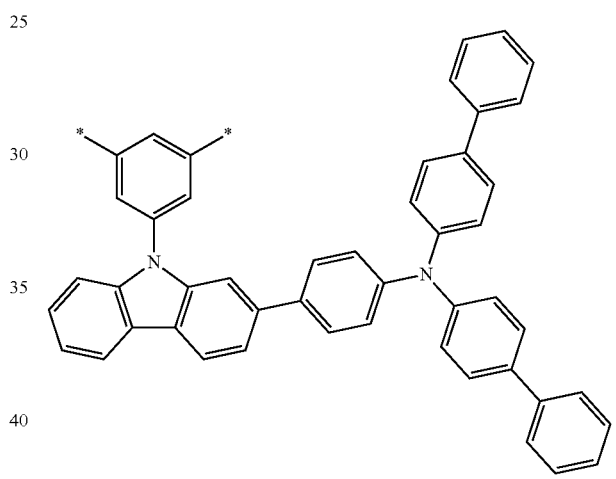
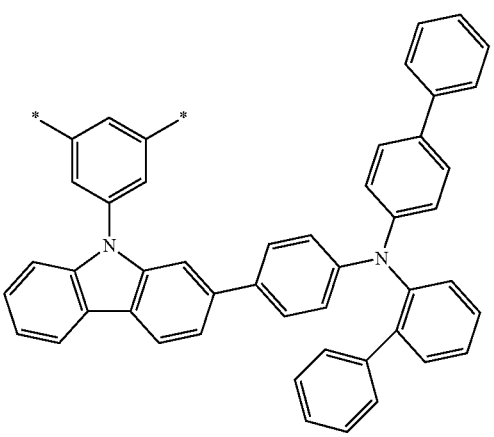

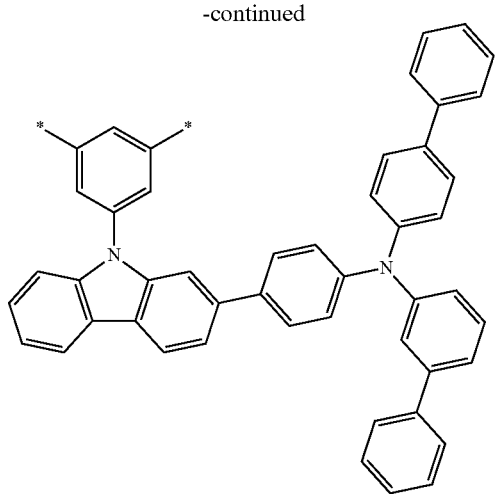
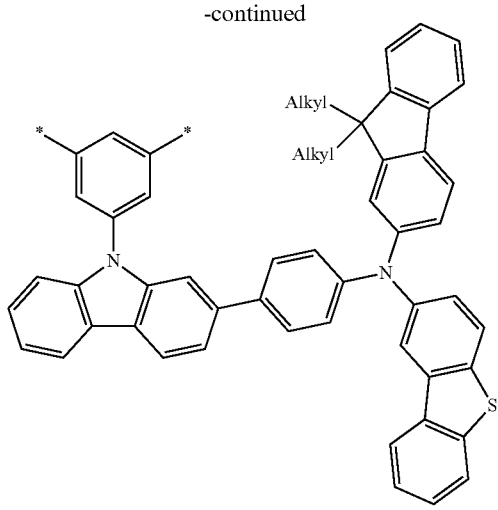
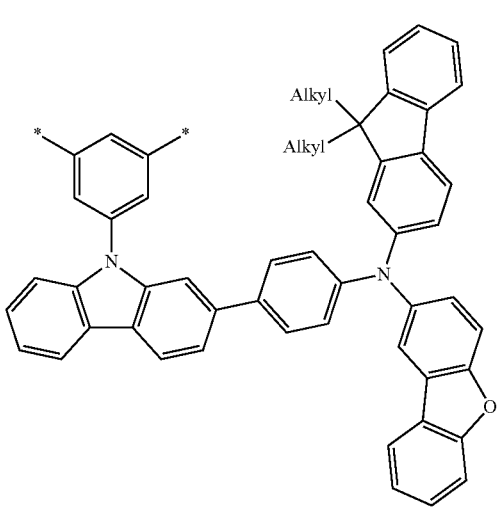
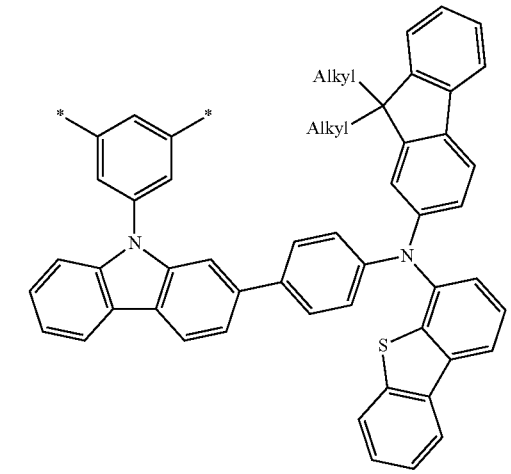
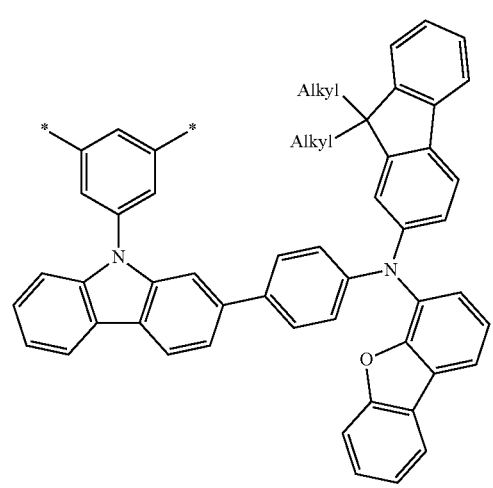
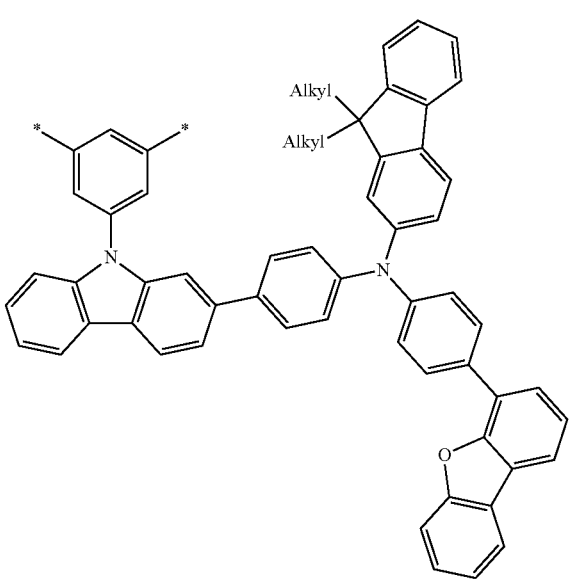

61
-continued
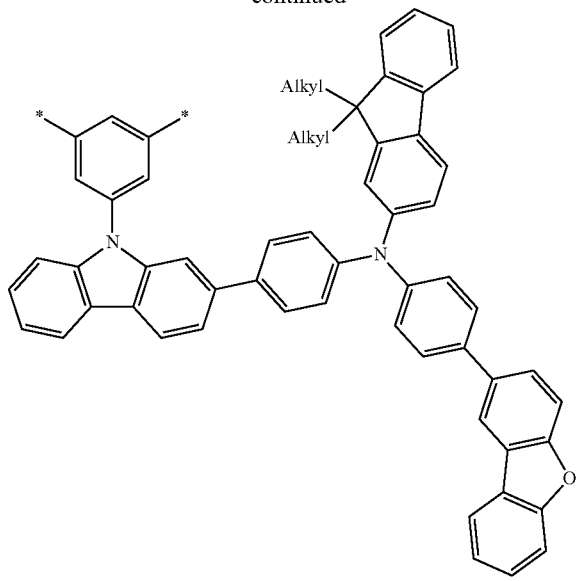
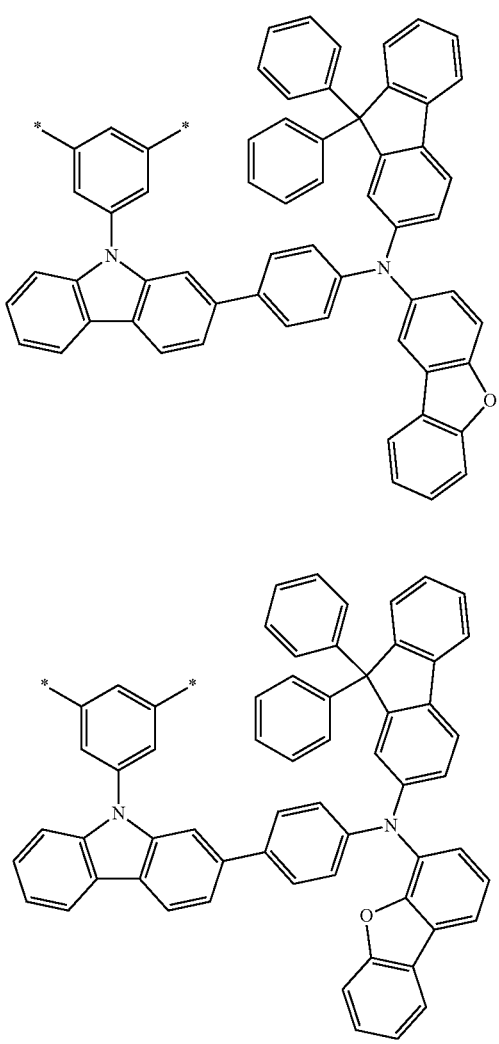
62
-continued
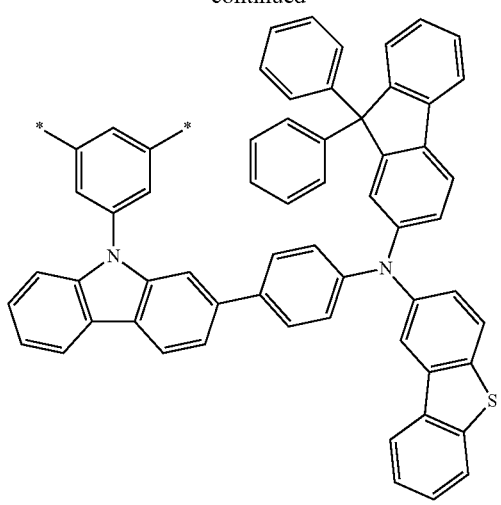
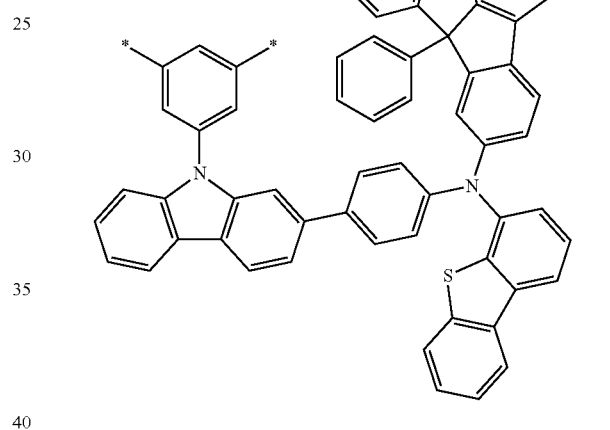
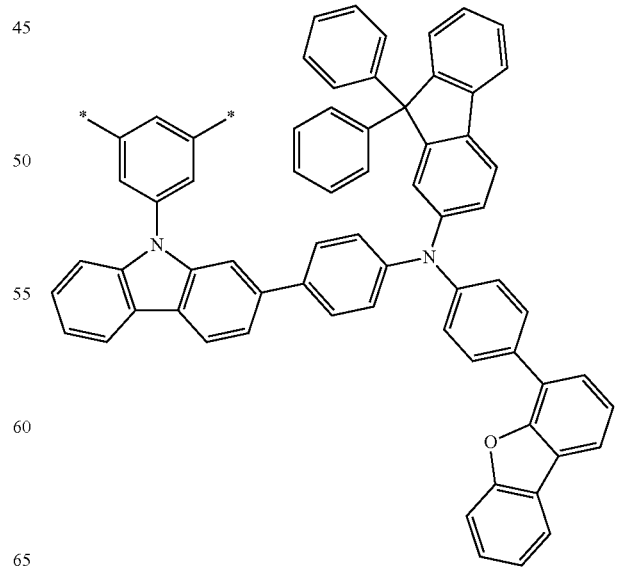

63
-continued
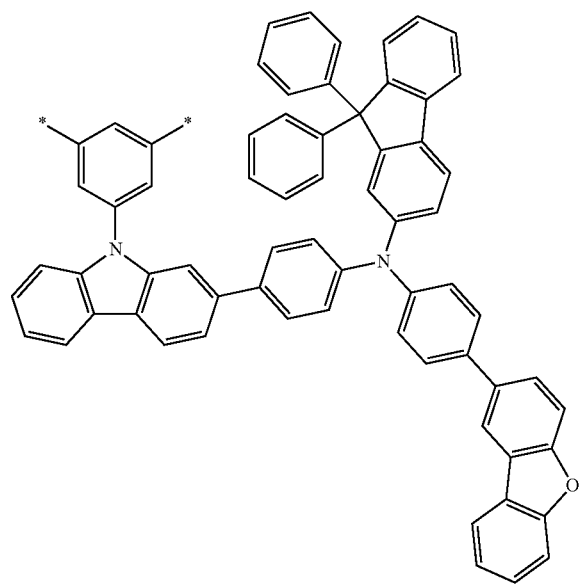
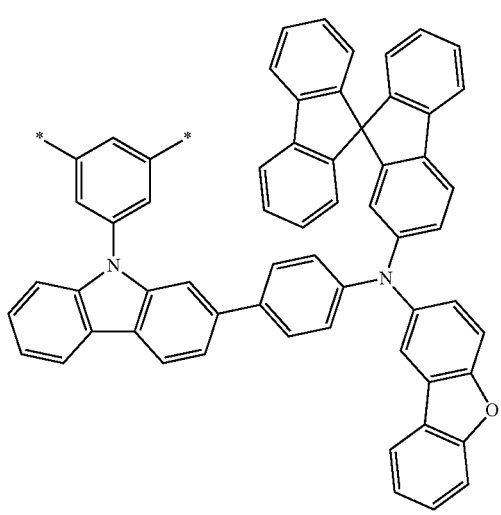
64
-continued
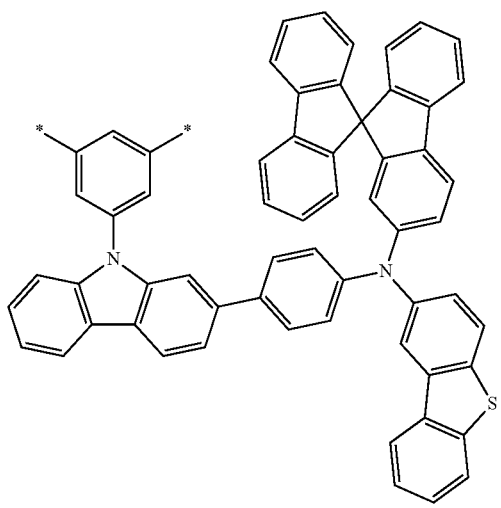
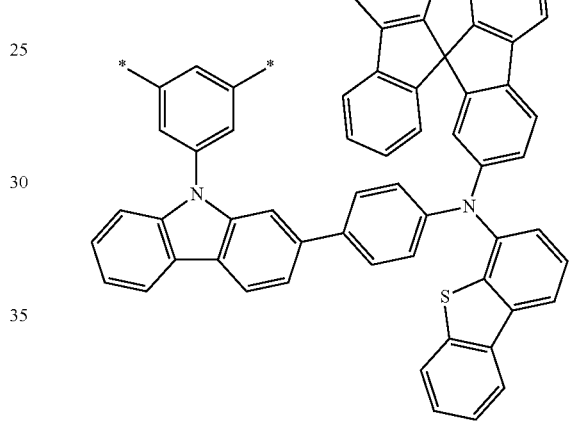
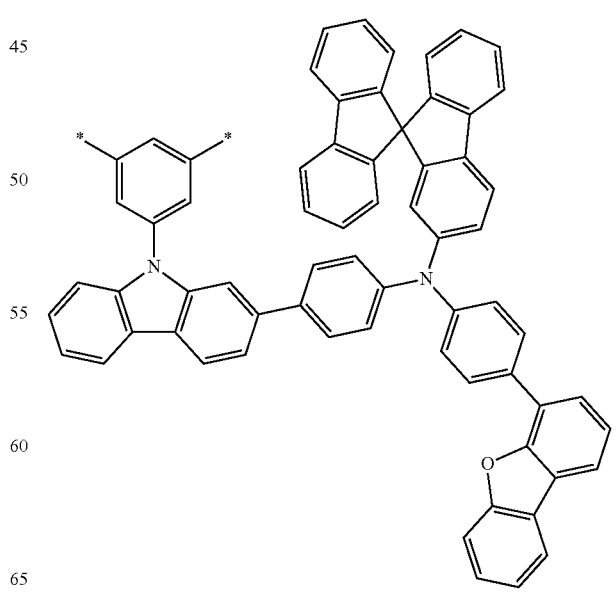

65
-continued
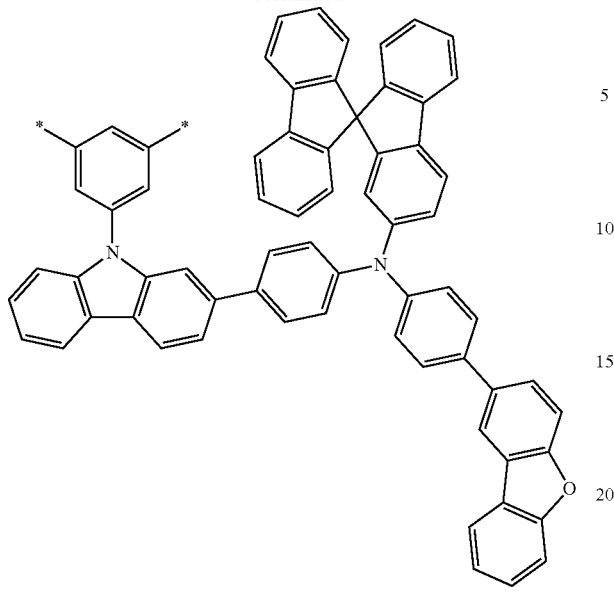
66
-continued
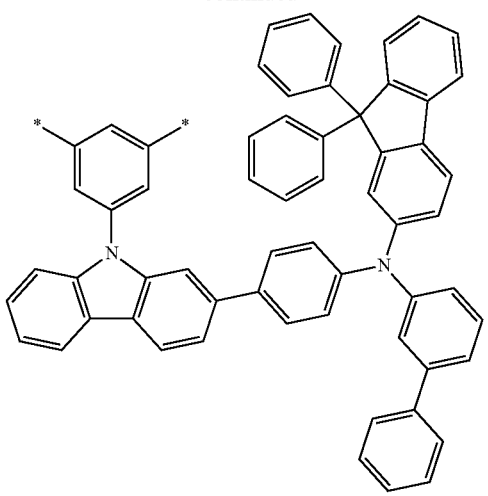
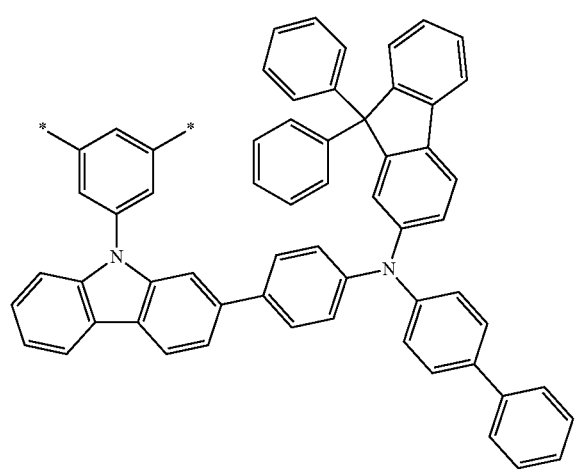
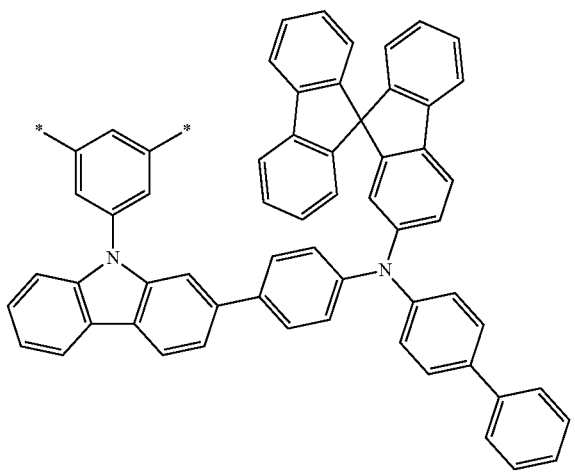
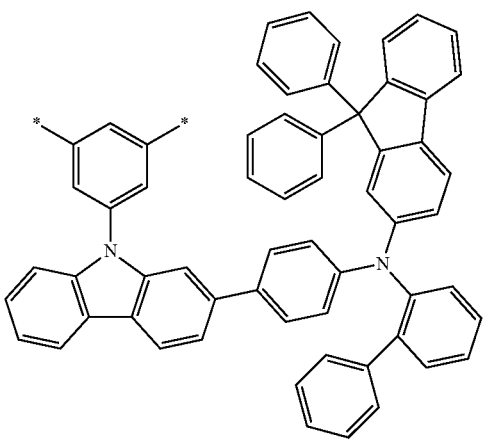
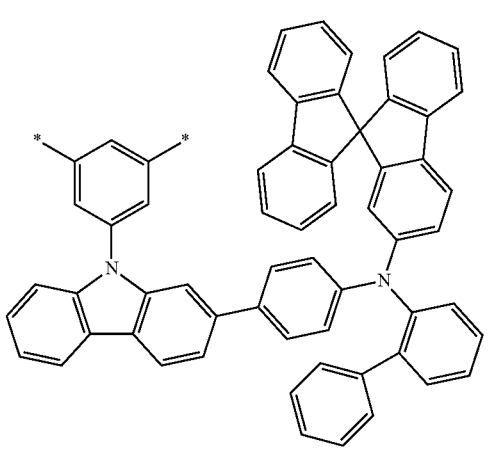

-continued
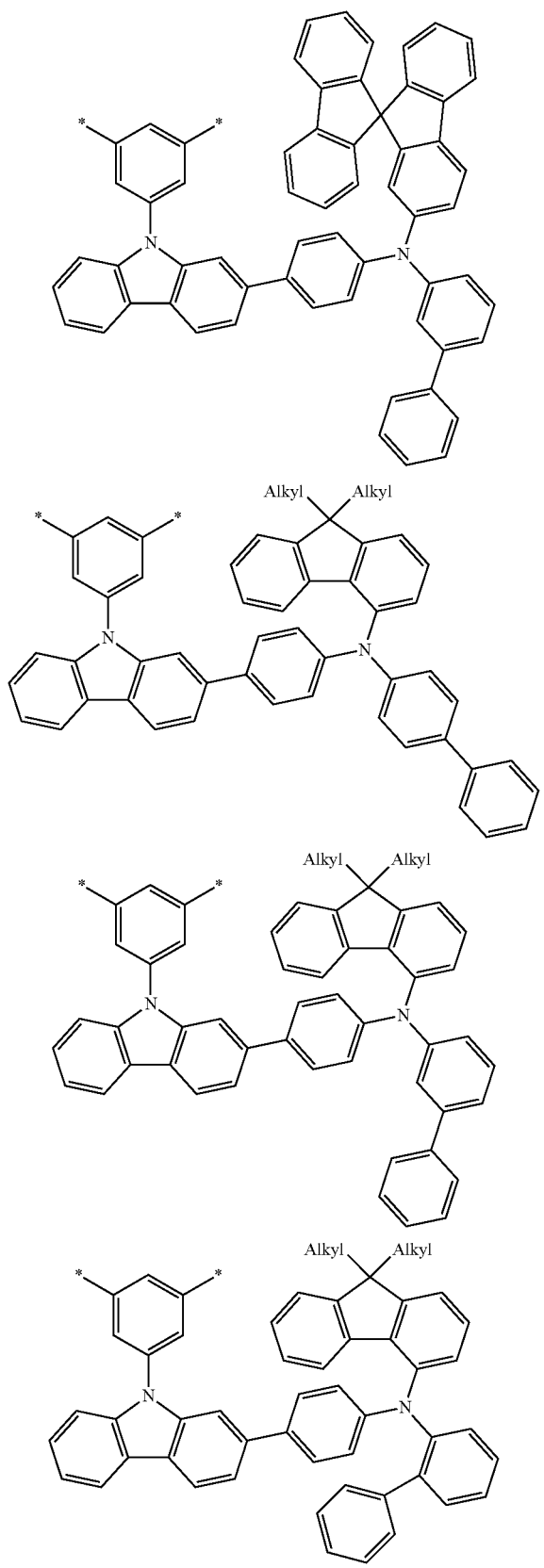
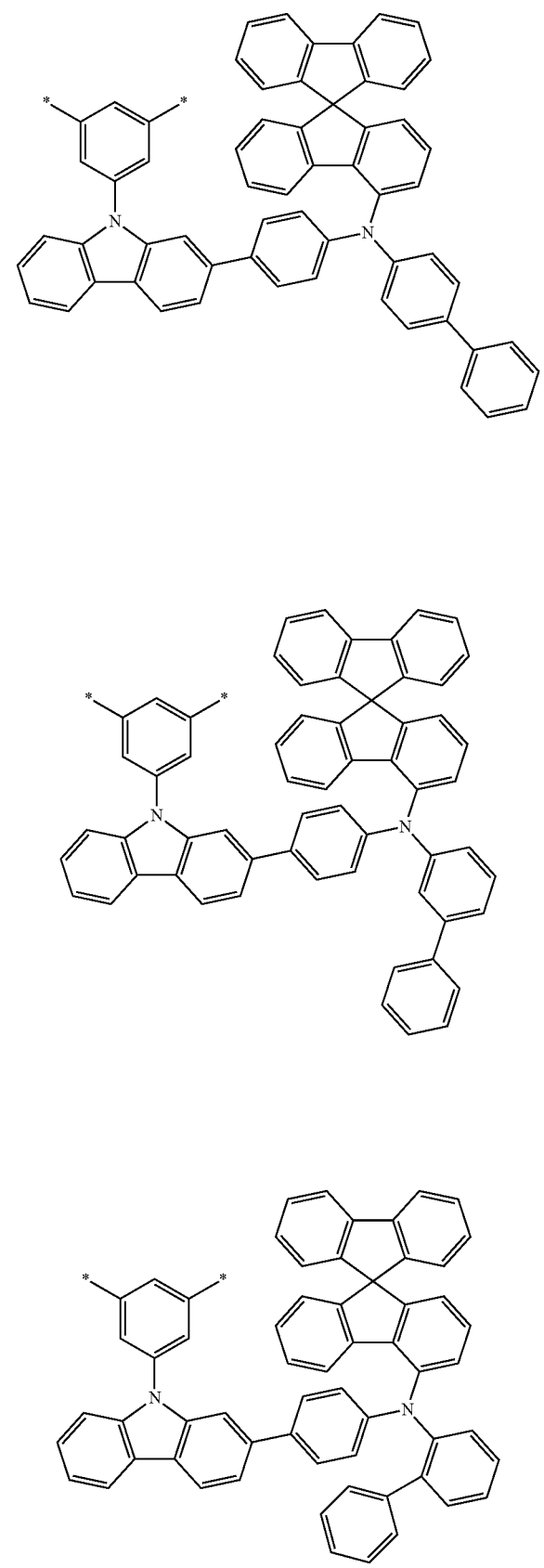

69
-continued
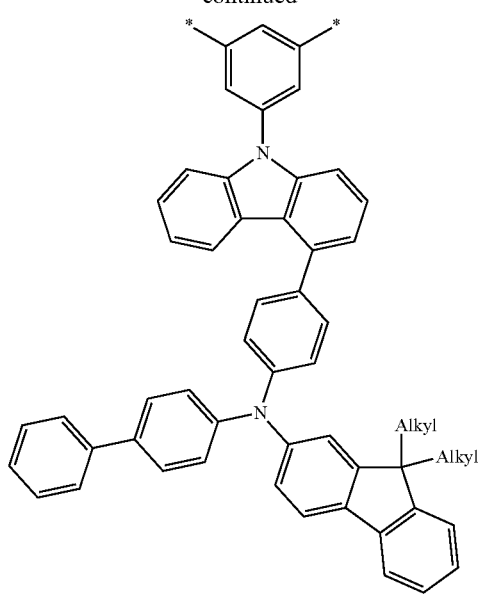
70
-continued
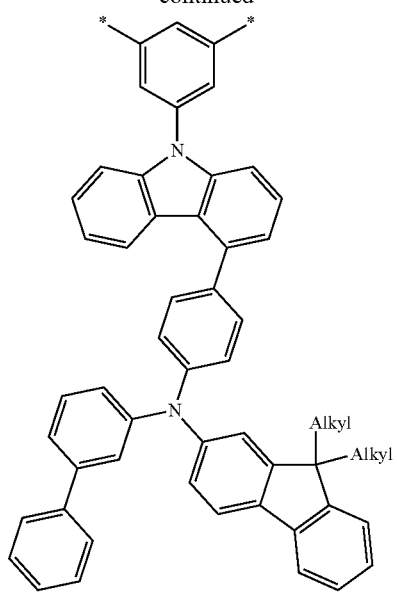
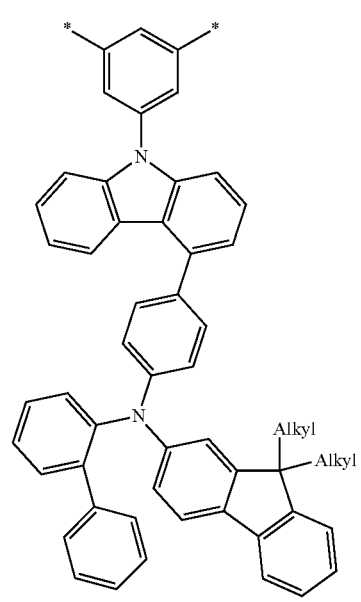
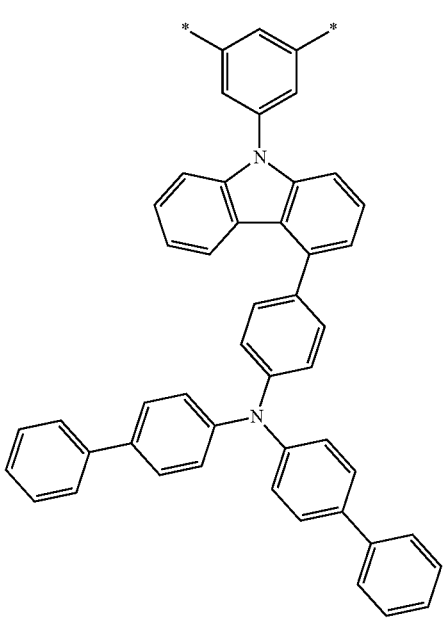

71
-continued
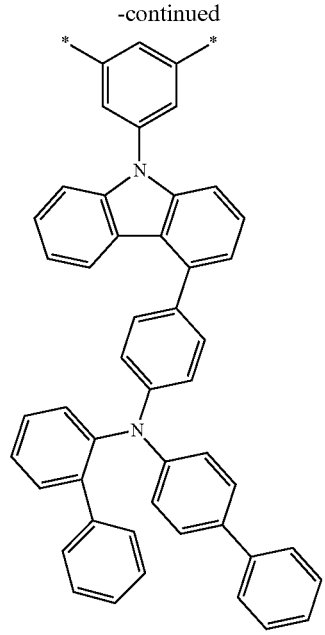
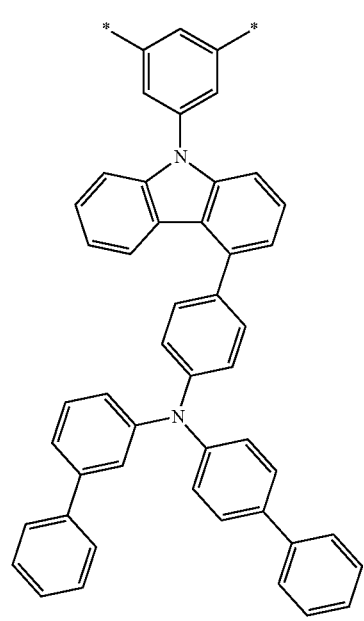
72
-continued
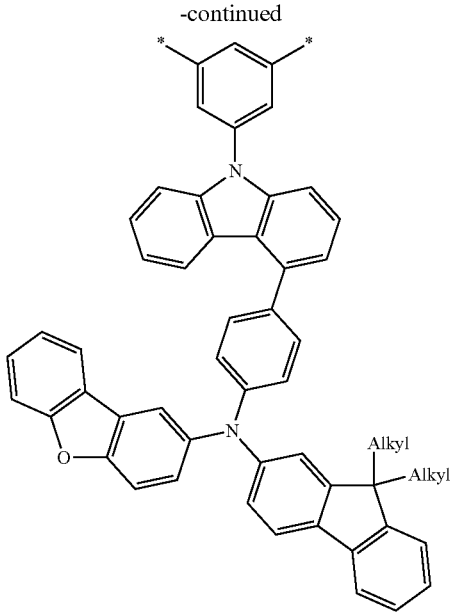
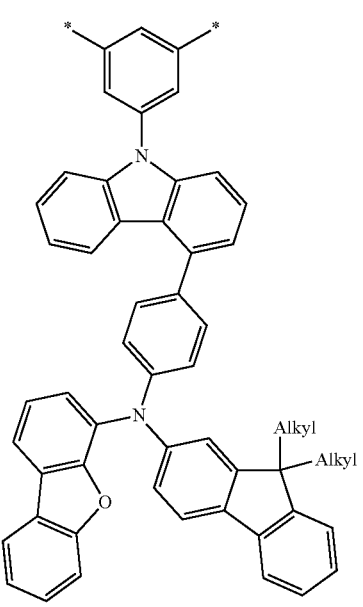

73
-continued
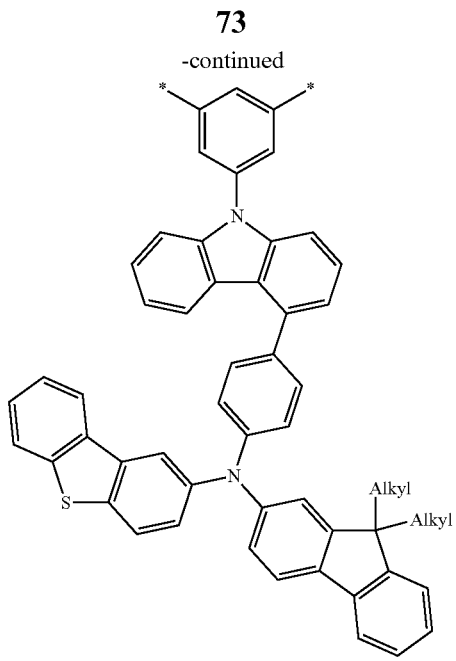
74
-continued
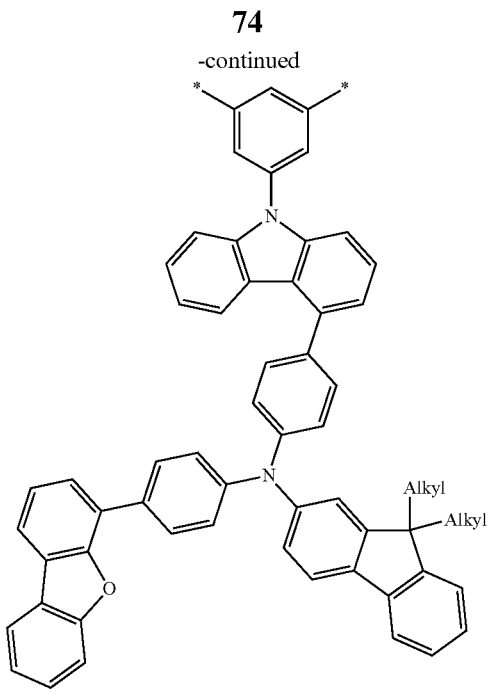
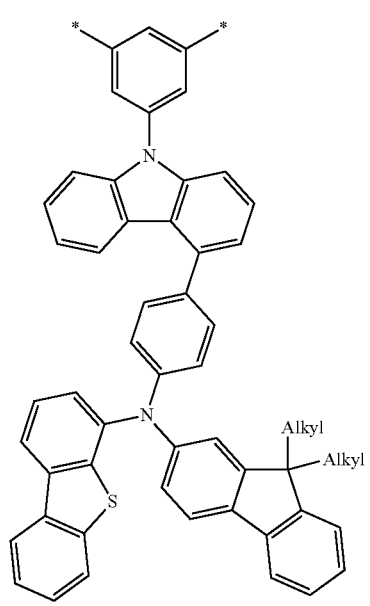
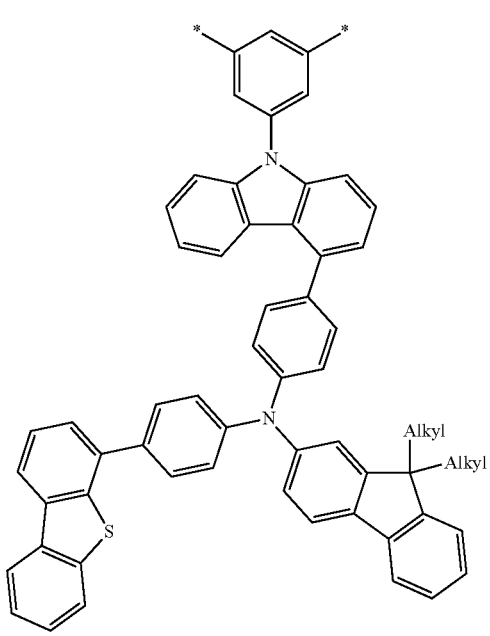

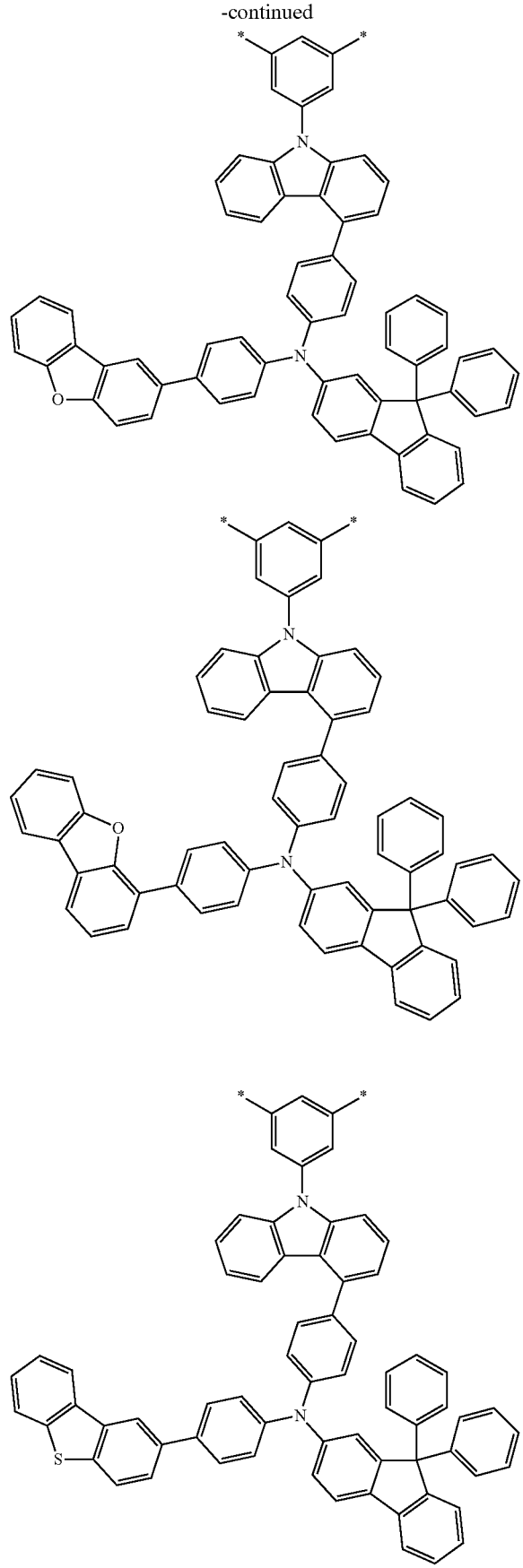
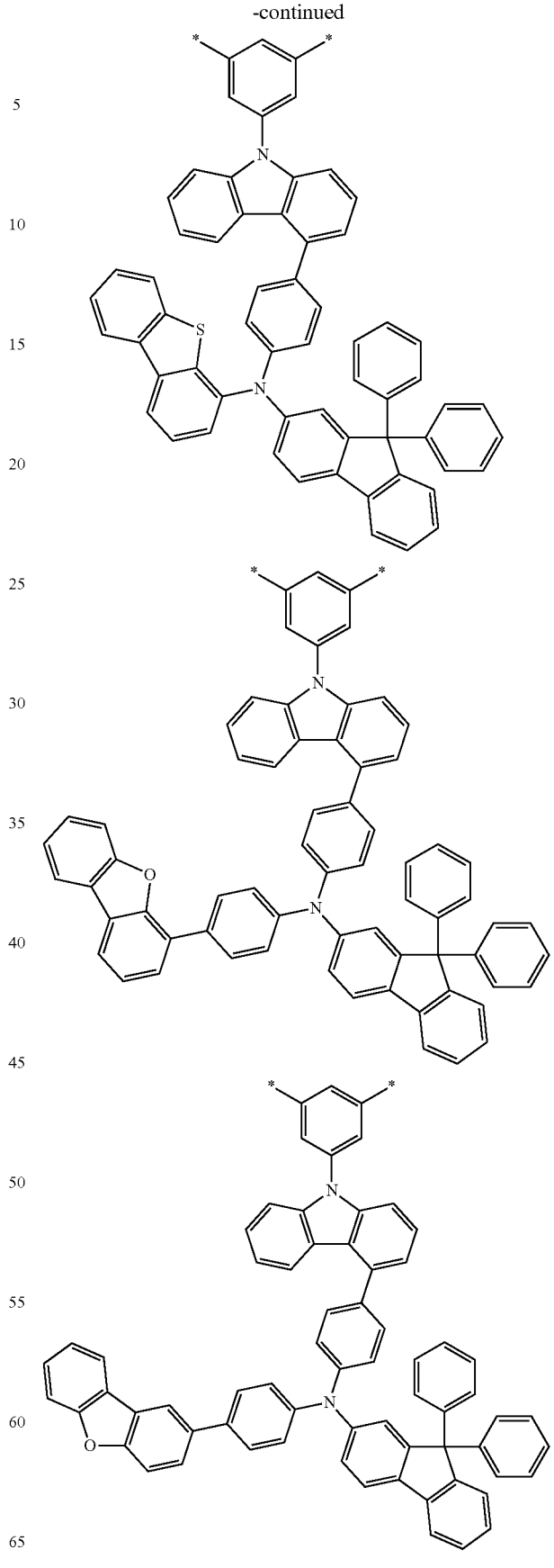

77
-continued
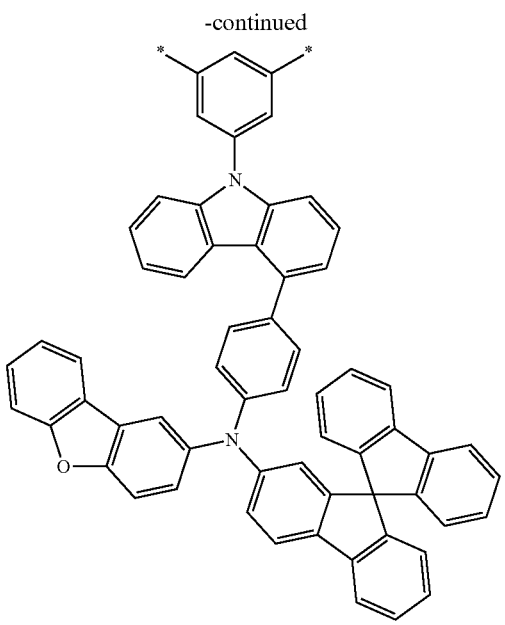
78
-continued
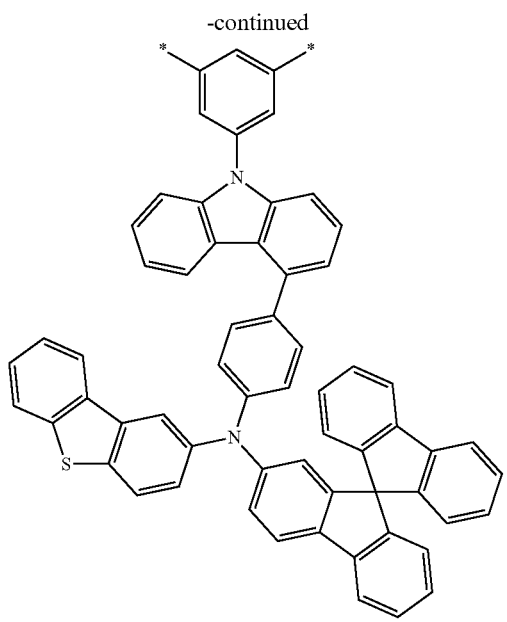
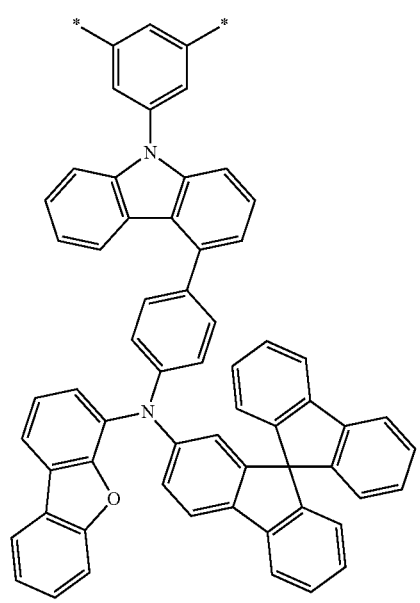
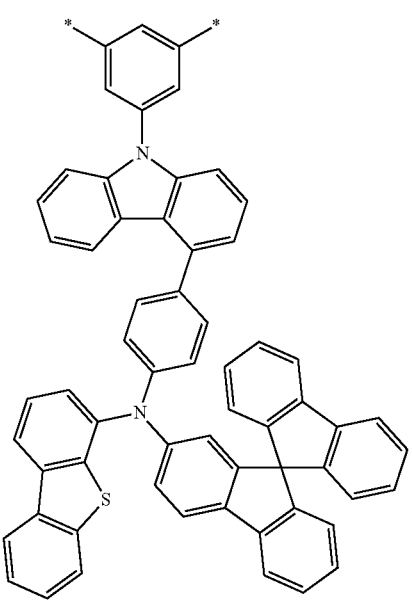

79
-continued
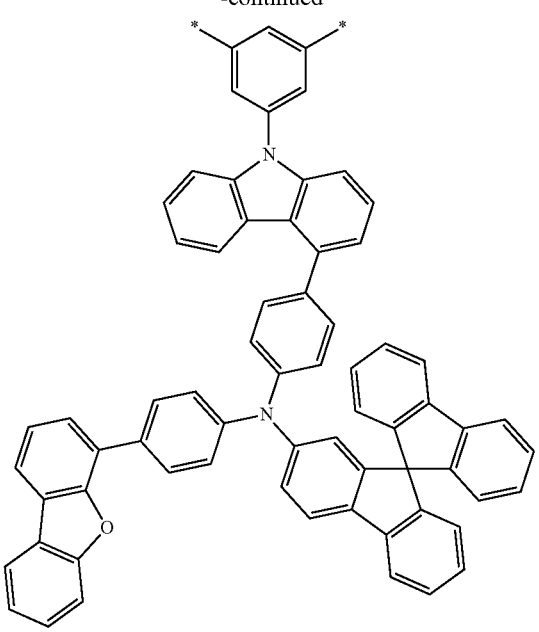
80
-continued
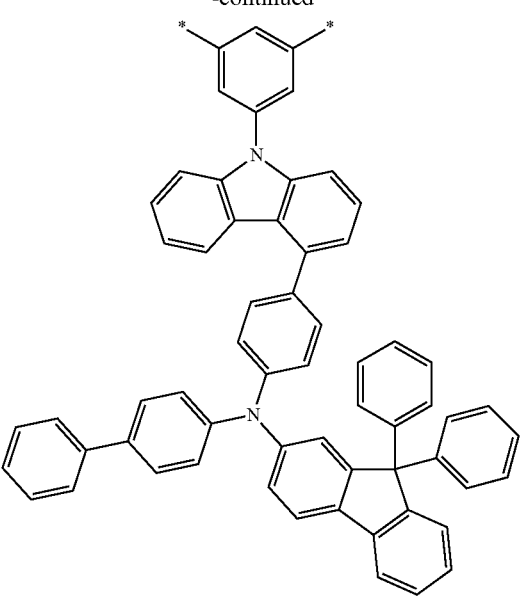
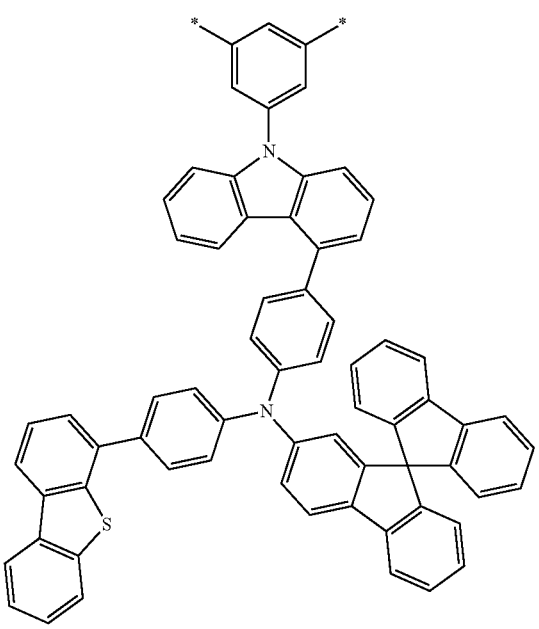
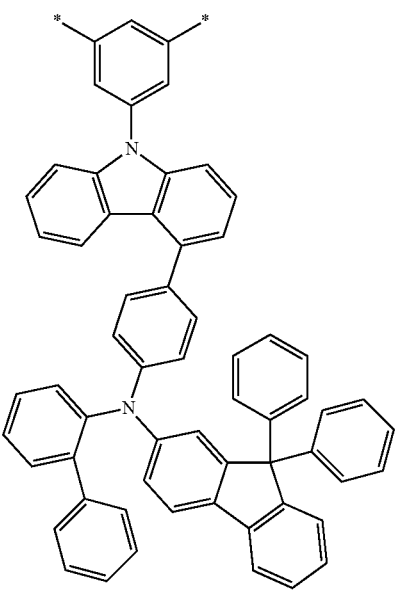

81
-continued
82
-continued
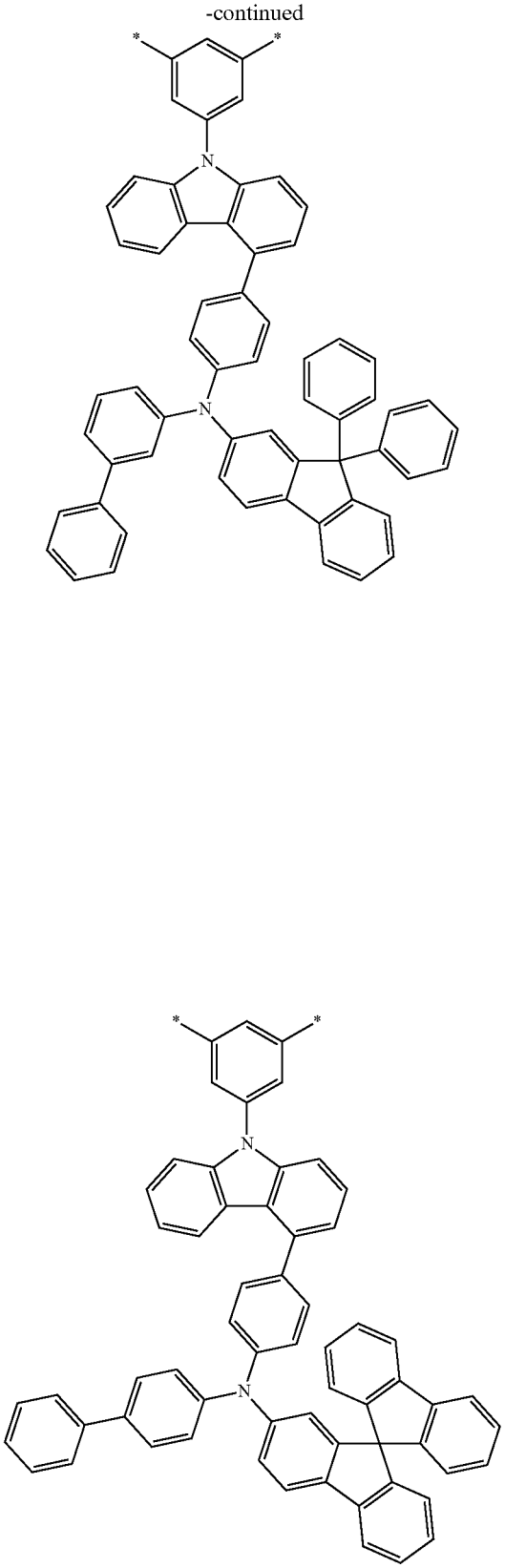
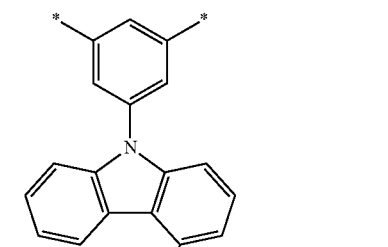
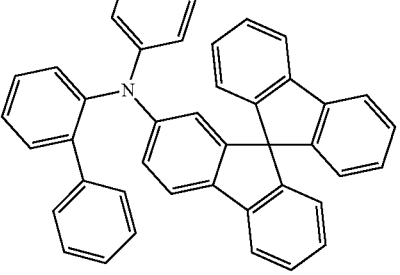
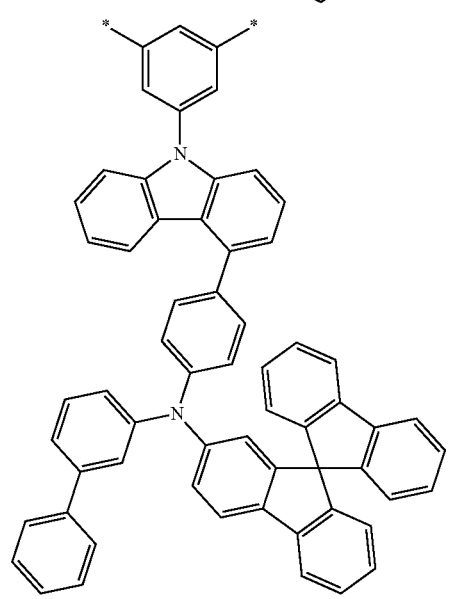
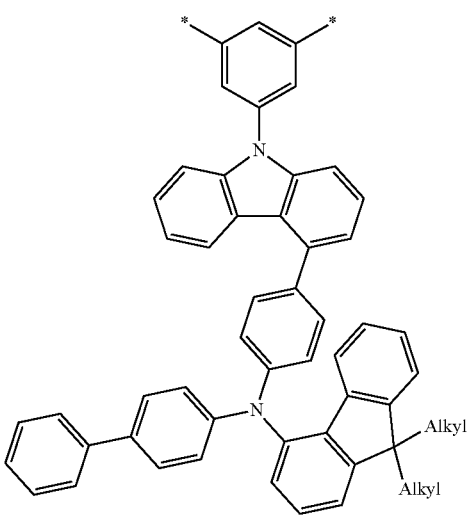

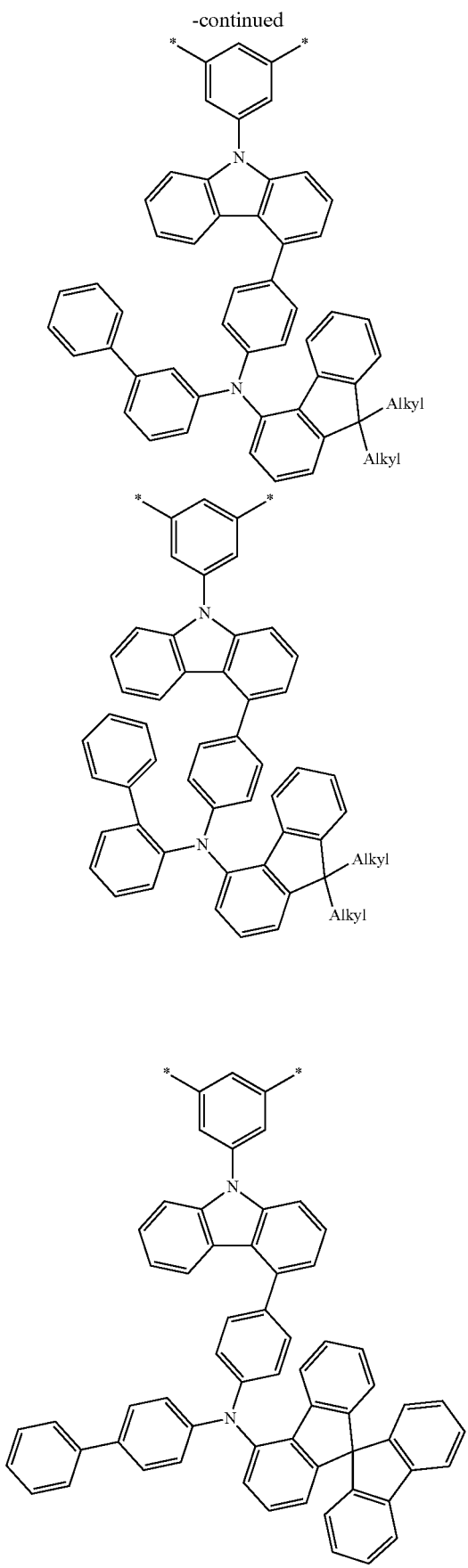
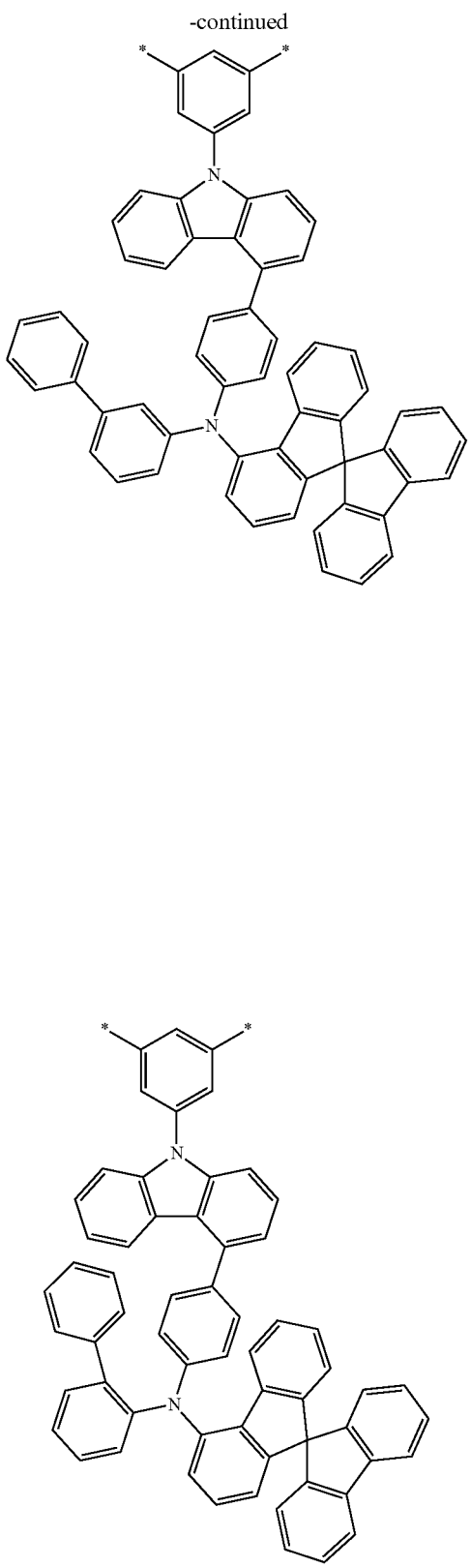

85
-continued
86
-continued
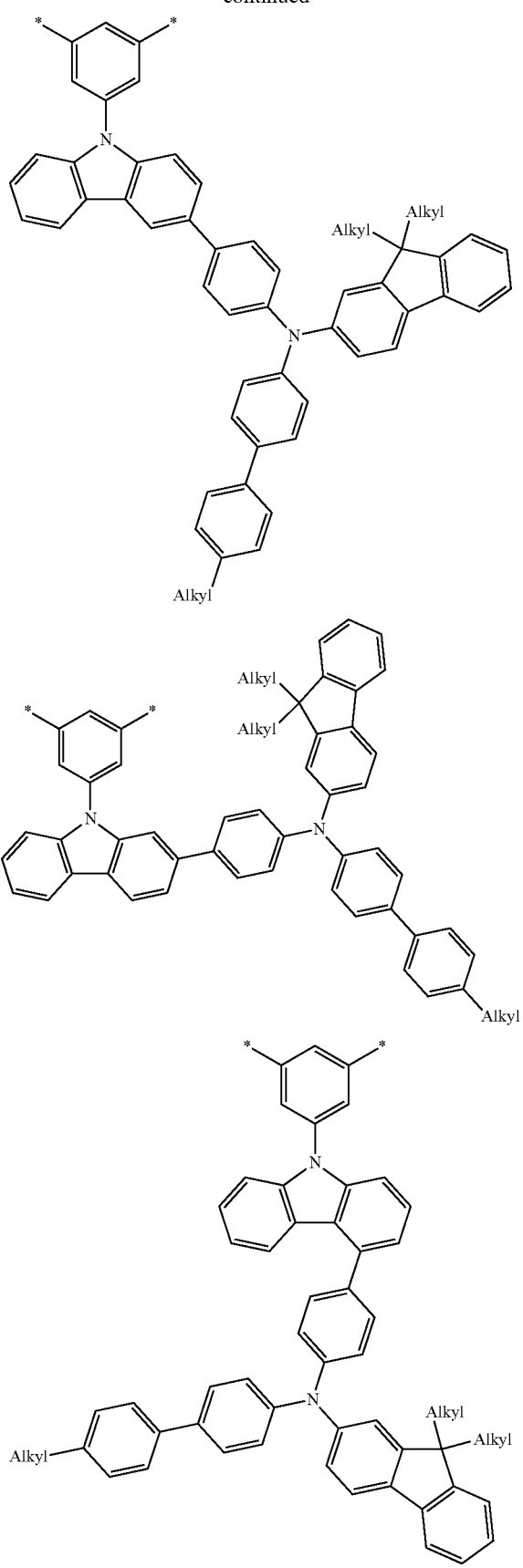
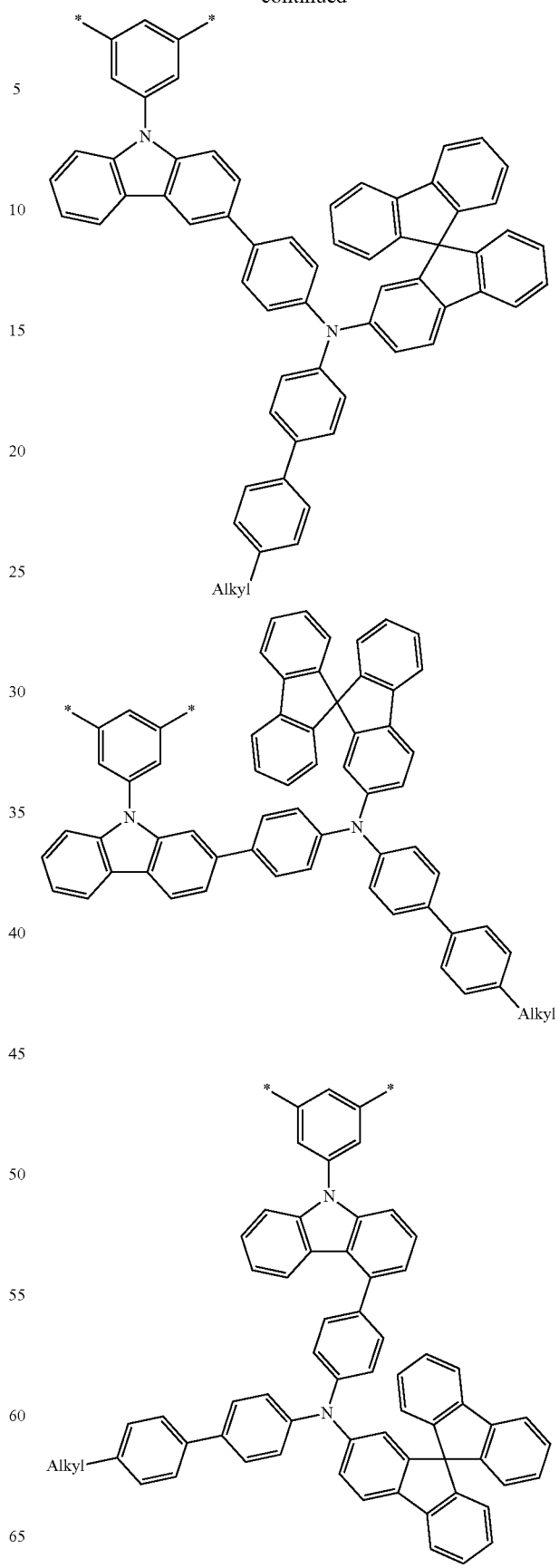

87
-continued
88
-continued
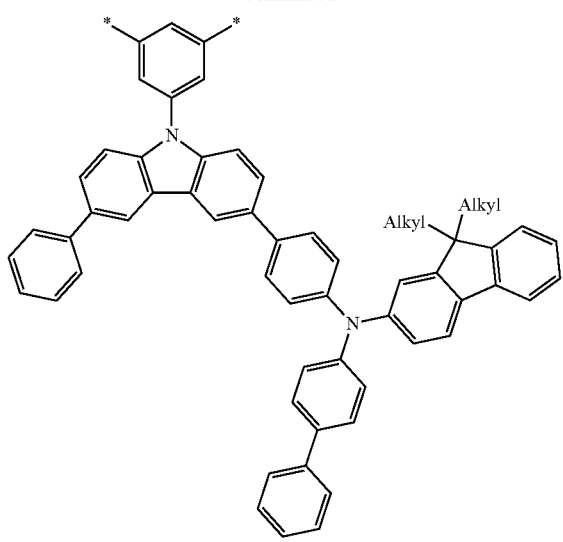
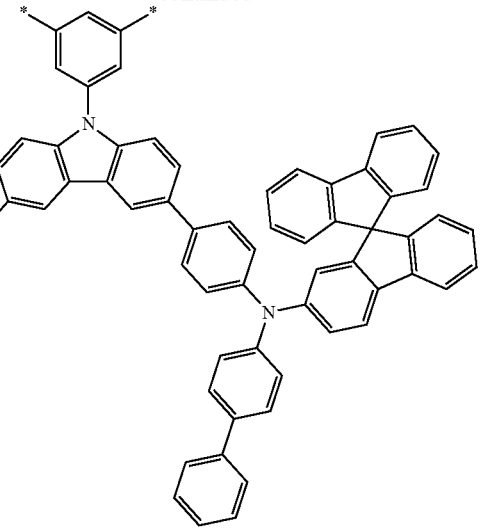
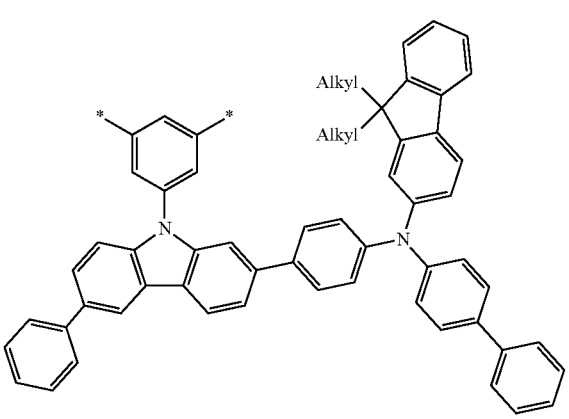
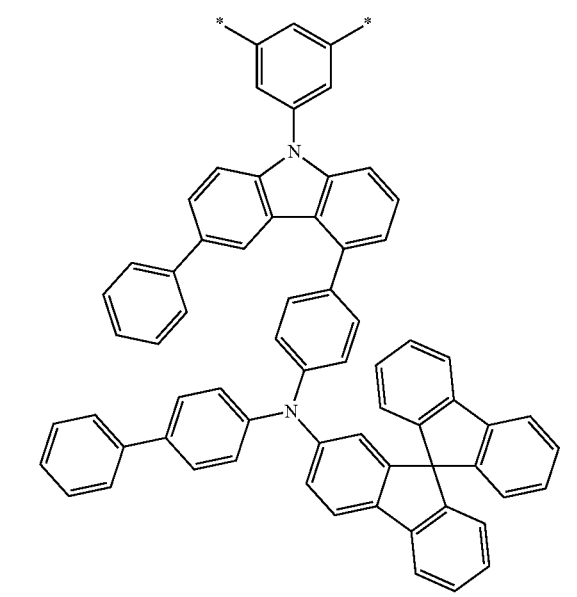

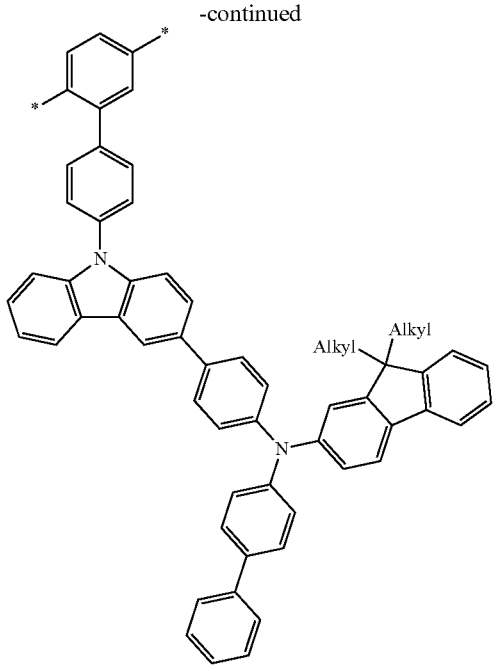

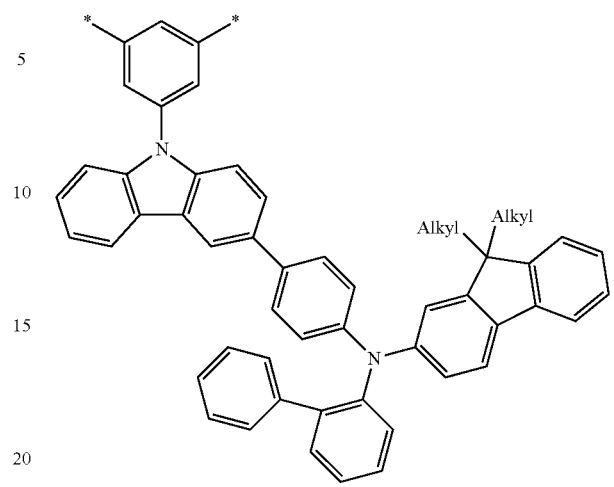

(X-2)

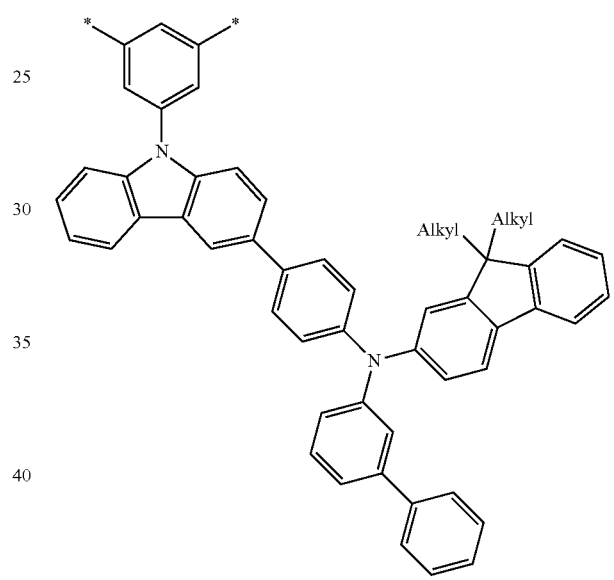

(X-3)

In the above formulas, * indicates a binding site to a main chain, and "Alkyl" means a substitution with an alkyl group.

Among these, specific examples of X include at least one of groups represented by Formula (X-1) to (X-11) from the viewpoint of improving a HOMO level, hole transportability, a hole injection property, solubility, and a coating property of the polymer material and improving a luminescence life-span. Moreover, specific examples of X may be a group represented by Formula (X-1), Formula (X-4), or Formula (X-7). Herein, each occurrence of X included in a plurality of structural units represented by Formula (1) may be same or different.

(X-1)

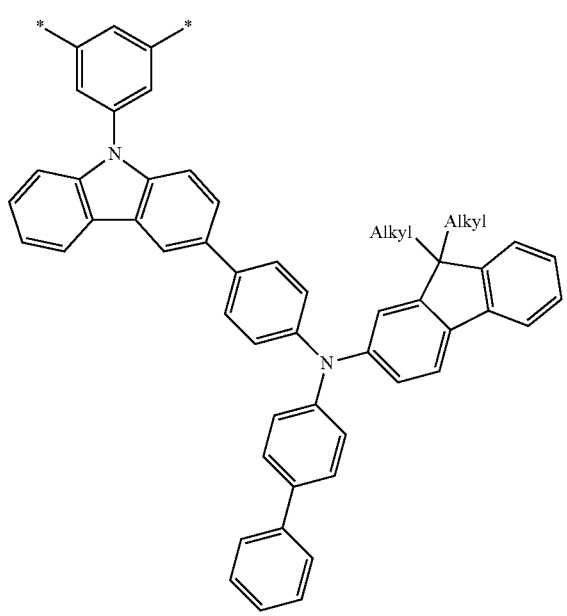

(X-4)

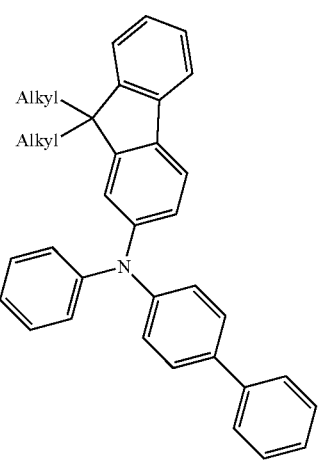

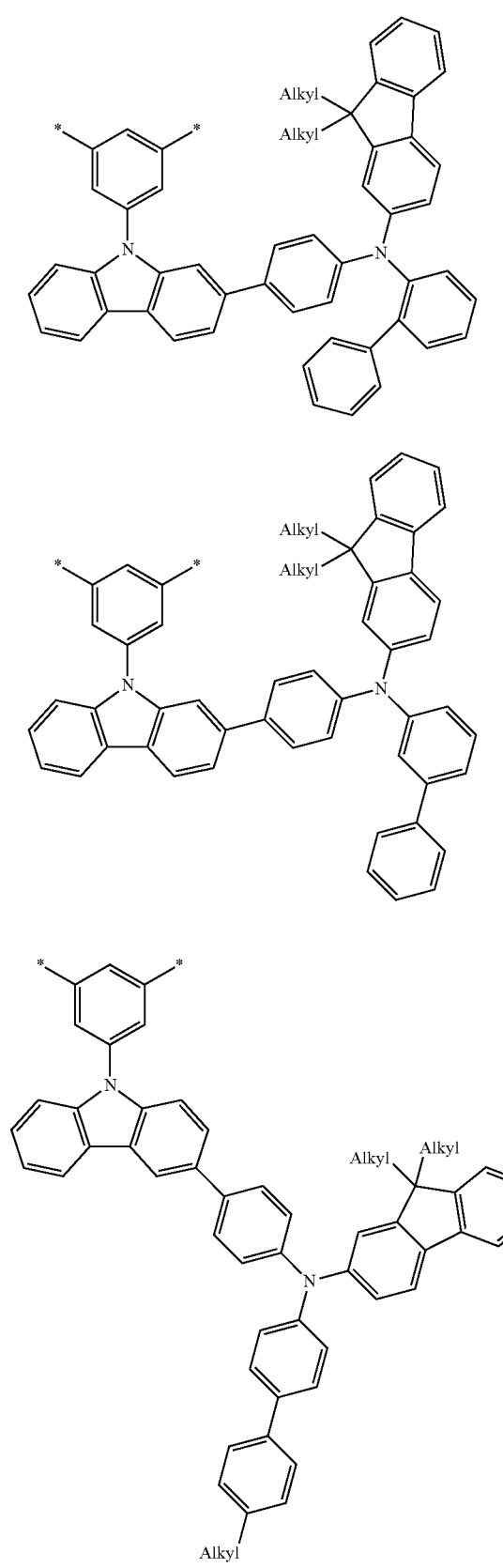
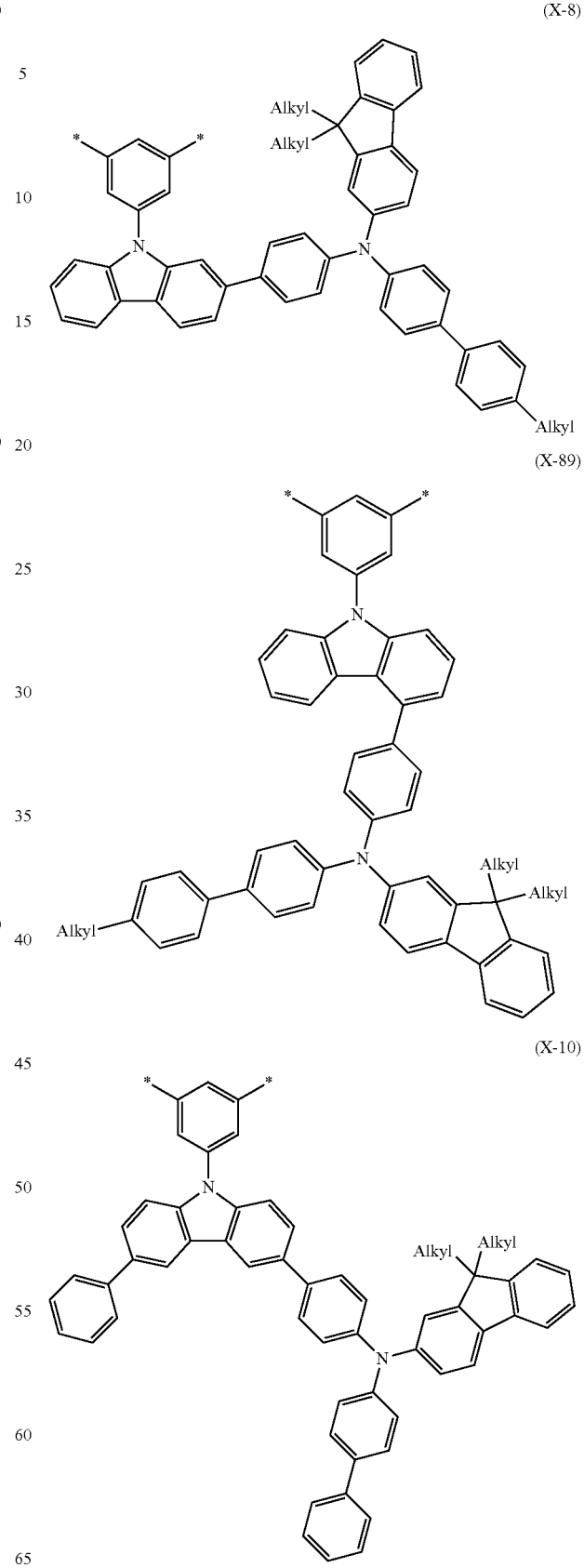

(X-11)

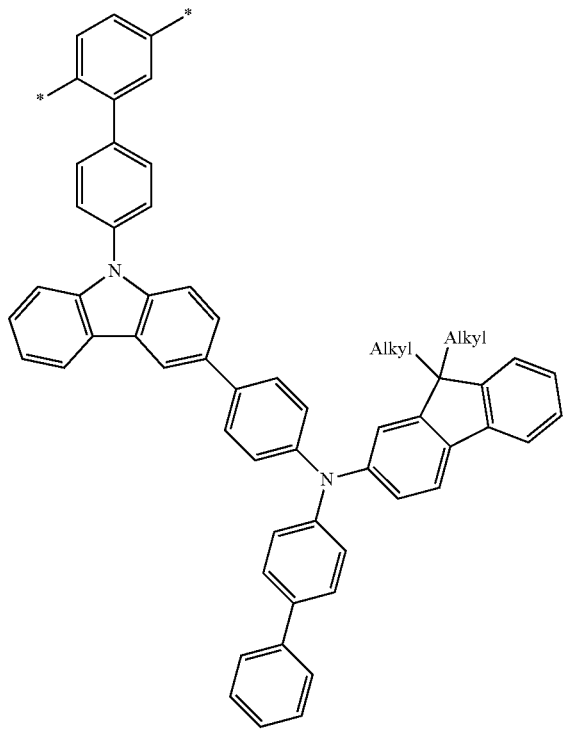

On the other hand, examples of "Alkyl" in the examples of X are the same as the alkyl group as a substituent in the case where the monovalent aromatic hydrocarbon group or the monovalent aromatic heterocyclic group in $Ar_2$ and $Ar_3$ is substituted.

[Y]

The polymer material according to the present embodiment may include one type of Y or may include two or more types of Y.

Since the polymer material according to the present embodiment includes Y as a structural unit, solubility is improved. For this reason, when the polymer material according to the present embodiment is used, a thin film may be easily formed by a coating method.

In Formula (1), Y is a substituted or unsubstituted divalent aromatic hydrocarbon group having 6 to 60 ring-forming carbon atoms, or a substituted or unsubstituted divalent aromatic heterocyclic group having 3 to 60 ring-forming atoms. Here, the "aromatic hydrocarbon group" is intended to be a group including at least one aromatic hydrocarbon ring, but may be a group composed of an aromatic hydrocarbon ring alone. Moreover, the "aromatic heterocyclic group" as Y is intended to be a group including at least one aromatic heterocyclic group, but may be a group composed of an aromatic heterocyclic ring alone or a group composed of an aromatic hydrocarbon ring and an aromatic heterocyclic ring. Herein, a typical structural example of the divalent aromatic hydrocarbon group is the same as $Ar_1$ in Formula (2-A) to Formula (2-D), except that the trivalent aromatic hydrocarbon group is changed into a divalent group, and thus the descriptions thereof are not repeated here. In addition, a typical structural example of the divalent aromatic heterocyclic group is the same as $Ar_1$ in Formula (2-A) to Formula (2-D), except that the trivalent aromatic hetero-cyclic group is changed into a divalent group, and thus the descriptions thereof are not repeated here.

Among these, from the viewpoint of improving solubility of the polymer material, Y may be a phenylene group, a fluorenylene group, a biphenylene group, a naphthylene group, an anthracenylene group, a phenanthroline group, a naphthacenylene group, a pyrenylene group, a terphenylene group, a tolylene group, a t-butyl phenylene group, a (phenylpropyl) phenylene group, or a thienylene group. In an embodiment, Y may be a phenylene group, a fluorenylene group, or a terphenylene group.

In addition, since the substituent in the case where the divalent aromatic hydrocarbon group or the divalent aromatic heterocyclic group is substituted is the same as the substituent in $Ar_1$ of Formula (2-A) to Formula (2-D), the descriptions thereof are not repeated here.

Among these, from the viewpoint of improving solubility of the polymer material according to the present embodiment and improving a luminescence life-span, when the divalent aromatic hydrocarbon group of Y or the divalent aromatic heterocyclic group of Y is substituted, a substituent may be a C1 to C60 alkyl group. Among these, from the viewpoint of further improving solubility, a substituent may be a C1 to C12 alkyl group, for example a C3 to C10 alkyl group or a C6 to C8 alkyl group. In addition, among these, from the viewpoint of further improving the luminescence life-span, a substituent may be a C14 to C60 alkyl group, a C14 to C40 alkyl group, or a C14 to C30 alkyl group. From the above, Y is a substituted divalent aromatic hydrocarbon group having 6 to 60 ring-forming carbons, or a substituted divalent aromatic heterocyclic group having 3 to 60 ring-forming atoms. When the divalent aromatic hydrocarbon group or the divalent aromatic heterocyclic group is substituted, at least one of the substituents may be a C14 to C60 alkyl group. The alkyl group as a substituent when the divalent aromatic hydrocarbon group or the divalent aromatic heterocyclic group is substituted in Y, may be linear, branched or cyclic. In an embodiment, the alkyl group may preferably be linear or branched and in another embodiment, the alkyl group may more preferably linear.

Y may be at least one of groups represented by Formula (2-7) to Formula (2-23) from the viewpoint of adjusting a HOMO level. Herein, exemplary Y groups included in the segment of the alternating copolymer of the structural unit represented by Formula (1) are shown below and may be the same or different.

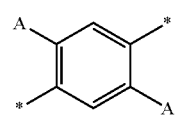

(2-7)

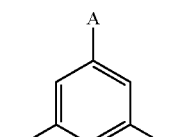

(2-8)

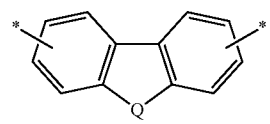

(2-9)

(2-10) 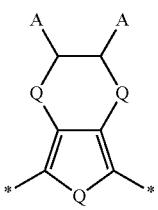

(2-11) 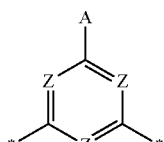

(2-12) 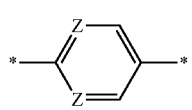

(2-13) 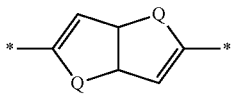

(2-14) 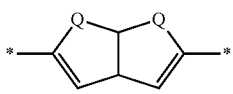

(2-15) 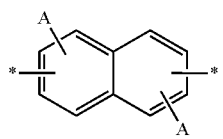

(2-16) 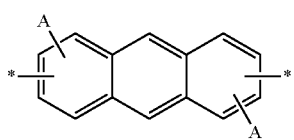

(2-17) 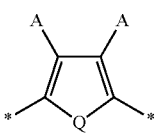

(2-18) 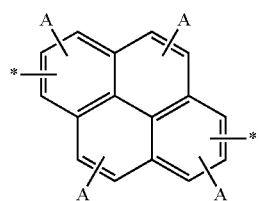

(2-19) 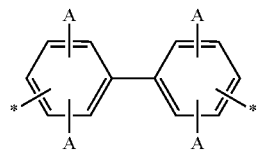

(2-20) 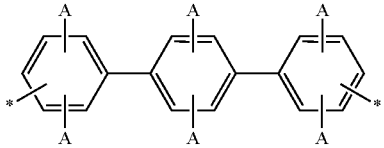

(2-21) 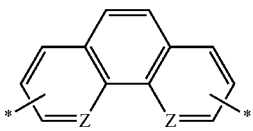

(2-22) 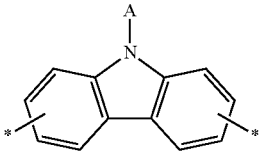

(2-23) 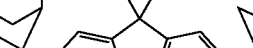

In Formula (2-7) to Formula 2-23, A is independently a substituted or unsubstituted monovalent aromatic hydrocarbon group having 6 to 60 ring-forming carbon atoms, a substituted or unsubstituted monovalent aromatic heterocyclic group having 3 to 60 ring-forming atoms, a C1 to C60 alkyl group, or a hydrogen atom, Q is independently —O—, —S—, —Se—, —CR$_7$R$_8$—, —SiR$_7$R$_8$— (wherein R$_7$ and R$_8$ are independently a hydrogen atom, a deuterium atom, a substituted or unsubstituted alkyl group, a substituted or unsubstituted aryl group, or a substituted or unsubstituted heteroaryl group), Z is independently —CR$_9$=, —N=, or —SiR$_9$= (wherein R$_9$ is hydrogen, a deuterium atom, a substituted or unsubstituted alkyl group, a substituted or unsubstituted aryl group, or a substituted or unsubstituted heteroaryl group), and

* indicates a binding site to the main chain.

Among these, in the polymer material, in Formula (1), Y may be at least one of groups represented by Formula (2-7), Formula (2-8), Formula (2-10), Formula (2-11), Formula (2-15) to Formula (2-20), Formula (2-22), and Formula (2-23), wherein at least one A may be C14 to C60 alkyl group.

Exemplary Y groups are shown below.
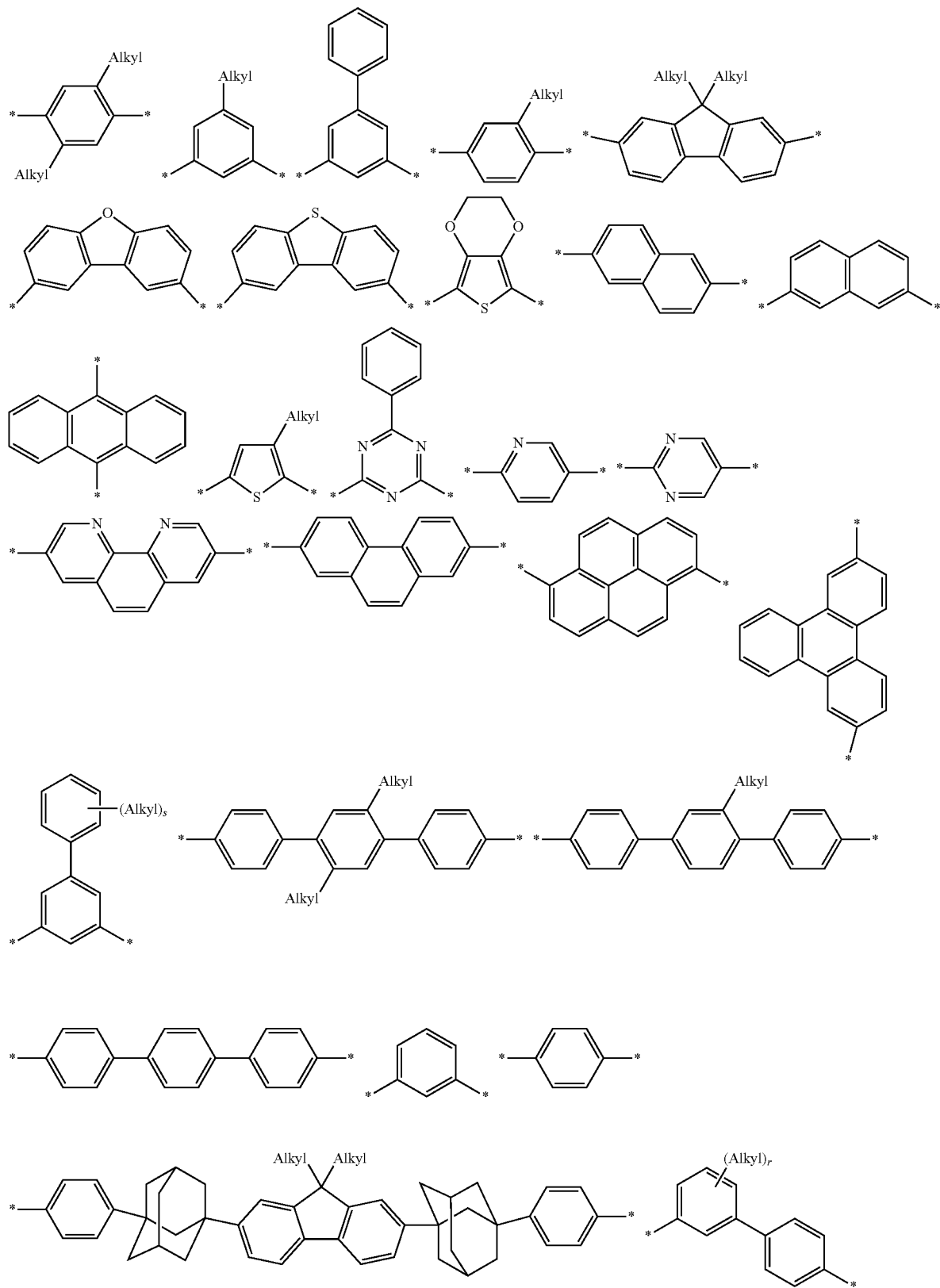

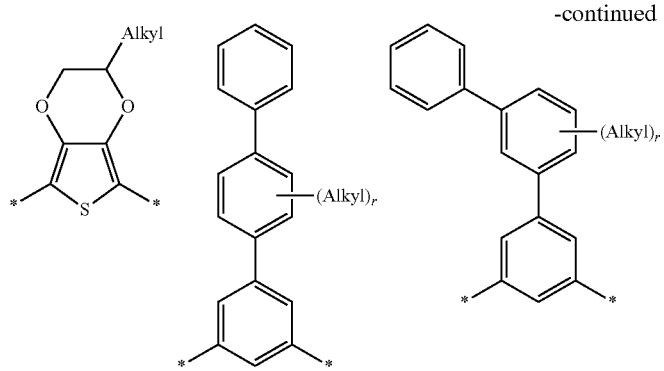

In the above formulas, * indicates a binding site to a main chain, and "Alkyl" means a substitution with an alkyl group. Moreover, r is an integer of 1 to 4 and s is an integer of 1 to 5.

Among these, Y may be at least one of groups represented by Formula (Y-1) to Formula (Y-9) from a viewpoint of improving luminescence life-span. Further, Y may be at least one of groups represented by one of Formula (Y-1), Formula (Y-2), Formula (Y-4), and Formula (Y-6) to Formula (Y-8). Herein, each occurrence of Y included in a plurality of structural units represented by Formula (1) may be the same or different.

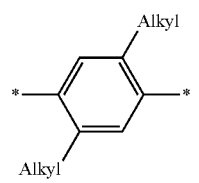
(Y-1)

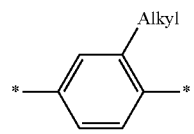
(Y-2)

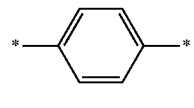
(Y-3)

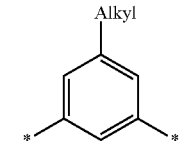
(Y-4)

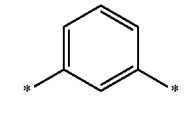
(Y-5)

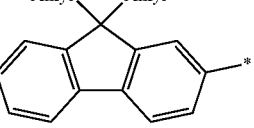
(Y-6)

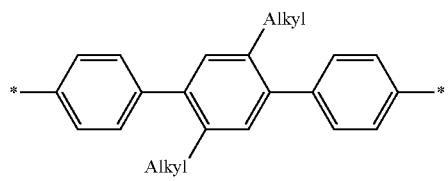
(Y-7)

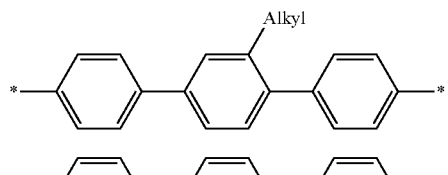
(Y-8)

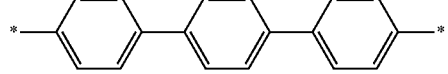
(Y-9)

In Y-1 to Y-9, "Alkyl" is the same as the description of the alkyl group which is a substituent when Y is a substituted divalent aromatic hydrocarbon group or a substituted divalent aromatic heterocyclic group.

Hereinafter, a structure of a particularly preferred polymer material is described from the viewpoint of improving luminescence life-span. However, the present disclosure is not limited thereto.

A particularly preferred polymer material may be a polymer material having a glass transition temperature of greater than or equal to about 50° C. and less than or equal to about 250° C. and including segments of alternating copolymers of structural units represented by Formula (1).

In a preferred embodiment of Formula (1), X may be a group represented by Formula (2-A) to Formula (2-D). In $Ar_2$ and $Ar_3$ in Formula (2-A) to Formula (2-D), at least one of $Ar_2$ and $Ar_3$ of Formula (2-A) to Formula (2-D) may be a substituted monovalent aromatic hydrocarbon group or a substituted monovalent aromatic heterocyclic group, and at least one of the substituents for the monovalent aromatic hydrocarbon group or a monovalent aromatic heterocyclic group of $Ar_2$ and $Ar_3$ may be an alkyl group, and the alkyl group may have 1 to 8 carbon atoms, and Y may be a substituted divalent aromatic hydrocarbon group having 6 to 60 ring-forming carbons, or a substituted divalent aromatic heterocyclic group having 3 to 60 ring-forming atoms, and when the divalent aromatic hydrocarbon group or the divalent aromatic heterocyclic group of Y is substituted, at least one substituent may be an alkyl group having 14 to 60 carbon atoms.

In a preferred embodiment of Formula (1), X may be a group represented by Formula (2-E) to Formula (2-H), at least one of $Ar_2$ and $Ar_3$ of Formula (2-E) to Formula (2-H) may be a substituted monovalent aromatic hydrocarbon group or a substituted monovalent aromatic heterocyclic group, and at least one of the substituents for the monovalent aromatic hydrocarbon group or the monovalent aromatic heterocyclic group of $Ar_2$ and $Ar_3$ may be an alkyl group having 10 to 60 carbon atoms.

In an embodiment, X may be a group exemplified above, Y may be a group exemplified above, and at least one "Alkyl" that X includes may be an alkyl group having 10 to 60 carbon atoms or at least one "Alkyl" that Y includes may be an alkyl group having 14 to 60 carbon atoms. Herein, X may be preferably a group represented by Formula (X-1) to Formula (X-11) and may be more preferably a group represented by Formula (X-1), Formula (X-4), or Formula (X-7). Moreover, Y may be preferably a group represented by Formula (Y-1) to Formula (Y-9), and may be more preferably a group represented by Formula (Y-1), Formula (Y-2), Formula (Y-4), or Formula (Y-6) to Formula (Y-8). The polymer material may more preferably include the segment of the alternating copolymer of the structural unit represented by Formula (1), wherein X may be a group represented by Formula (X-1) to Formula (X-11), Y may be a group represented by Formula (Y-1) to Formula (Y-9), and at least one "Alkyl" that X includes may be an alkyl group having 10 to 60 carbon atoms or at least one "Alkyl" that Y includes may be an alkyl group having 14 to 60 carbon atoms, or a combination thereof. In an embodiment, X may be represented by Formula (X-1), Formula (X-4), or Formula (X-7), Y may be a group represented by one of Formula (Y-1), Formula (Y-2), Formula (Y-4) and Formula (Y-6) to Formula (Y-8), and at least one "Alkyl" that X includes may be an alkyl group having 10 to 60 carbon atoms or at least one "Alkyl" that Y includes may be an alkyl group having 14 to 60 carbon atoms, or a combination thereof.

In preferred embodiments, combinations of X and Y ([X, Y]) are as follows, wherein at least one "Alkyl" that X includes may be an alkyl group having 10 to 60 carbon atoms, at least one "Alkyl" that Y includes may be an alkyl group having 14 to 60 carbon atoms, or a combination thereof.

[X-1, Y-1], [X-1, Y-2], [X-1, Y-3], [X-1, Y-4], [X-1, Y-5], [X-1, Y-6], [X-1, Y-7], [X-1, Y-8], [X-1, Y-9], [X-2, Y-1], [X-2, Y-2], [X-2, Y-3], [X-2, Y-4], [X-2, Y-5], [X-2, Y-6], [X-2, Y-7], [X-2, Y-8], [X-2, Y-9], [X-3, Y-1], [X-3, Y-2], [X-3, Y-3], [X-3, Y-4], [X-3, Y-5], [X-3, Y-6], [X-3, Y-7], [X-3, Y-8], [X-3, Y-9], [X-4, Y-1], [X-4, Y-2], [X-4, Y-3], [X-4, Y-4], [X-4, Y-5], [X-4, Y-6], [X-4, Y-7], [X-4, Y-8], [X-4, Y-9], [X-5, Y-1], [X-5, Y-2], [X-5, Y-3], [X-5, Y-4], [X-5, Y-5], [X-5, Y-6], [X-5, Y-7], [X-5, Y-8], [X-5, Y-9], [X-6, Y-1], [X-6, Y-2], [X-6, Y-3], [X-6, Y-4], [X-6, Y-5], [X-6, Y-6], [X-6, Y-7], [X-6, Y-8], [X-6, Y-9], [X-7, Y-1], [X-7, Y-2], [X-7, Y-3], [X-7, Y-4], [X-7, Y-5], [X-7, Y-6], [X-7, Y-7], [X-7, Y-8], [X-7, Y-9], [X-8, Y-1], [X-8, Y-2], [X-8, Y-3], [X-8, Y-4], [X-8, Y-5], [X-8, Y-6], [X-8, Y-7], [X-8, Y-8], [X-8, Y-9], [X-9, Y-1], [X-9, Y-2], [X-9, Y-3], [X-9, Y-4], [X-9, Y-5], [X-9, Y-6], [X-9, Y-7], [X-9, Y-8], [X-9, Y-9], [X-10, Y-1], [X-10, Y-2], [X-10, Y-3], [X-10, Y-4], [X-10, Y-5], [X-10, Y-6], [X-10, Y-7], [X-10, Y-8], [X-10, Y-9], [X-11, Y-1], [X-11, Y-2], [X-11, Y-3], [X-11, Y-4], [X-11, Y-5], [X-11, Y-6], [X-11, Y-7], [X-11, Y-8], and [X-11, Y-9].

More specific details of the polymer material according to the present embodiment include those including the following segments of the alternating copolymer, but the present disclosure is not limited thereto.

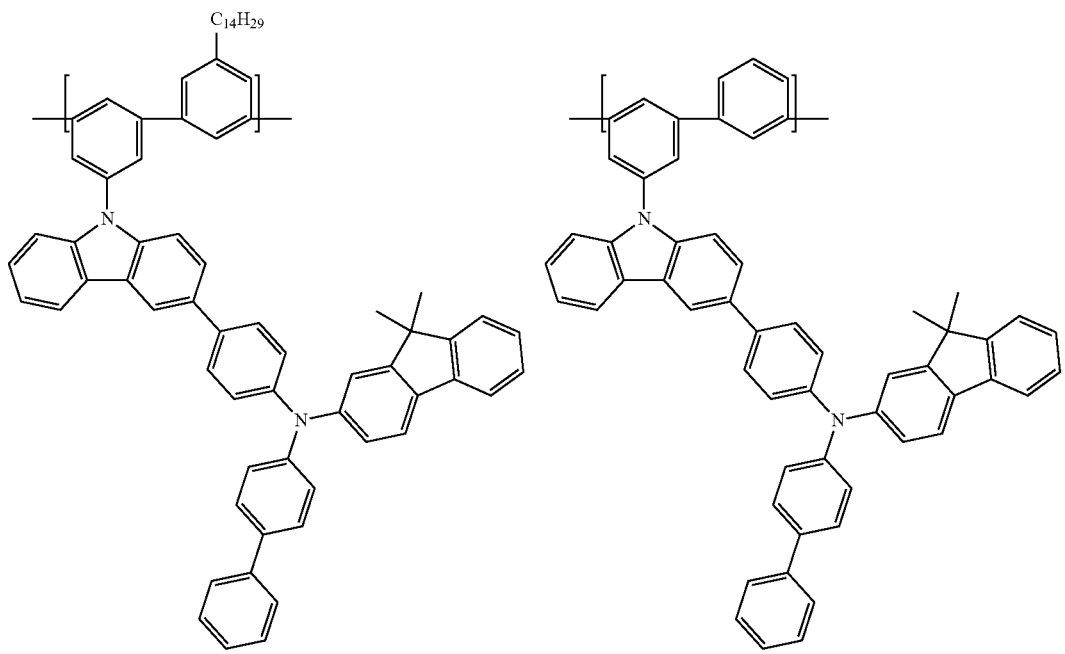

-continued
103
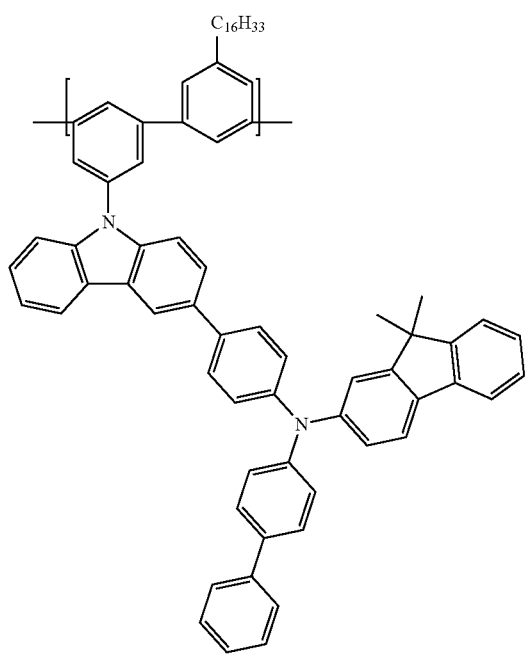
104
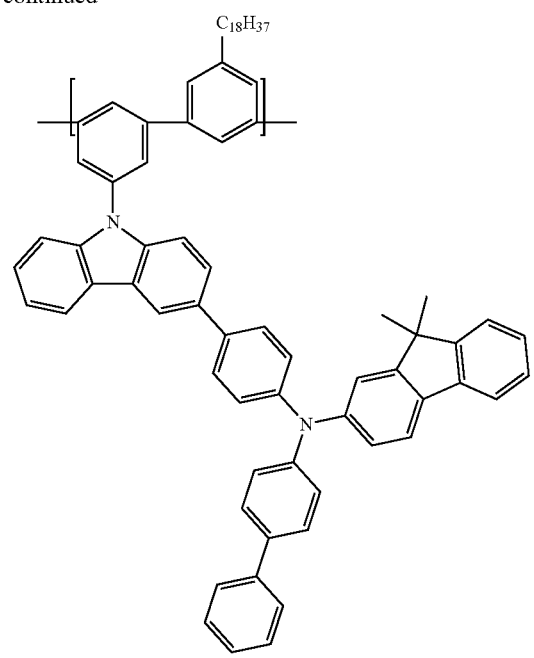
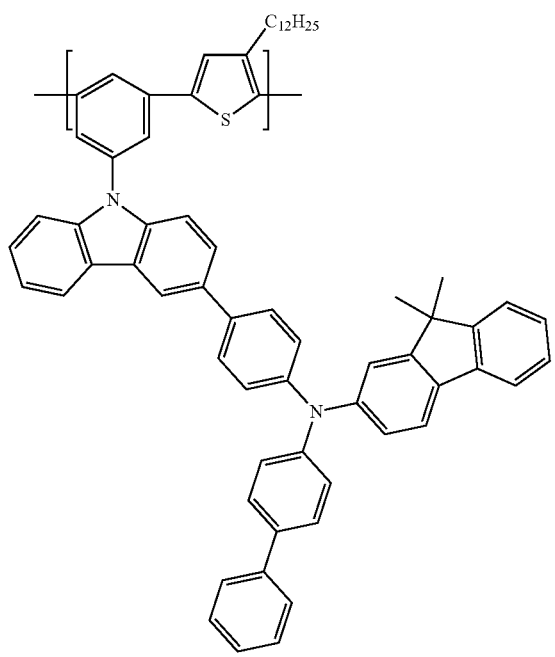
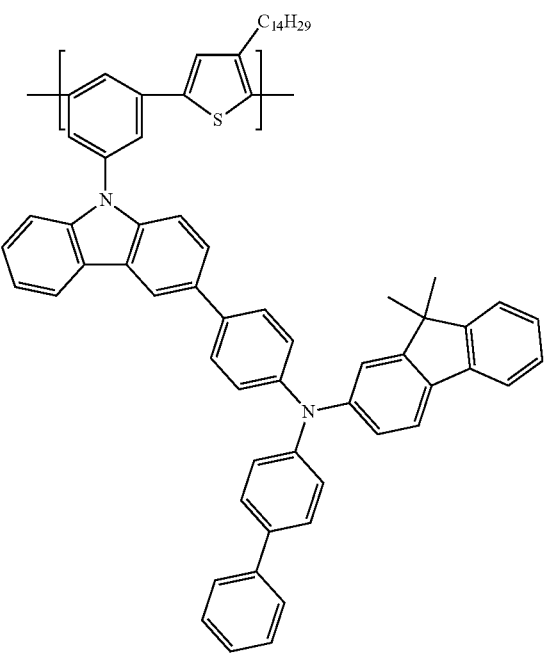

105
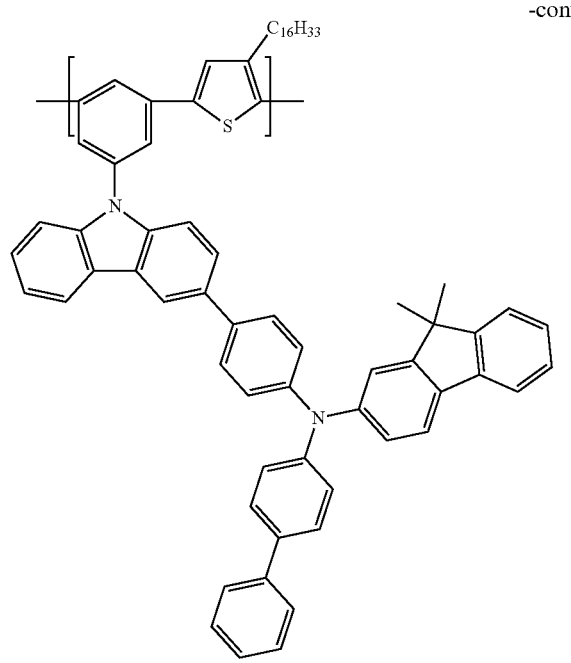
106
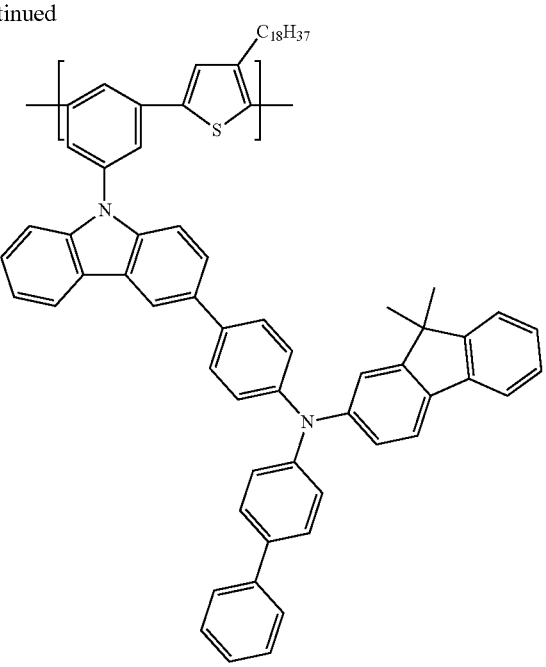
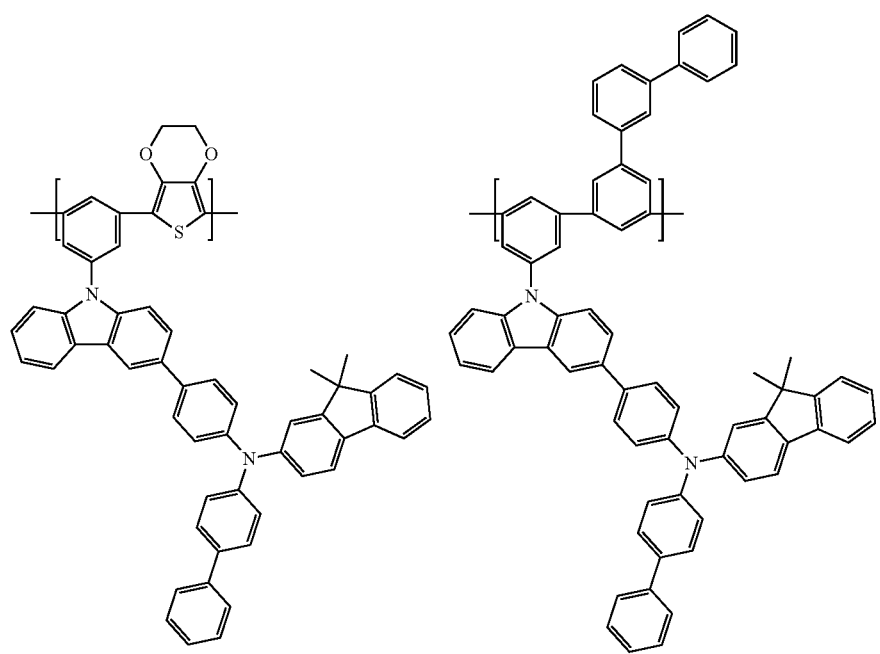

-continued
107
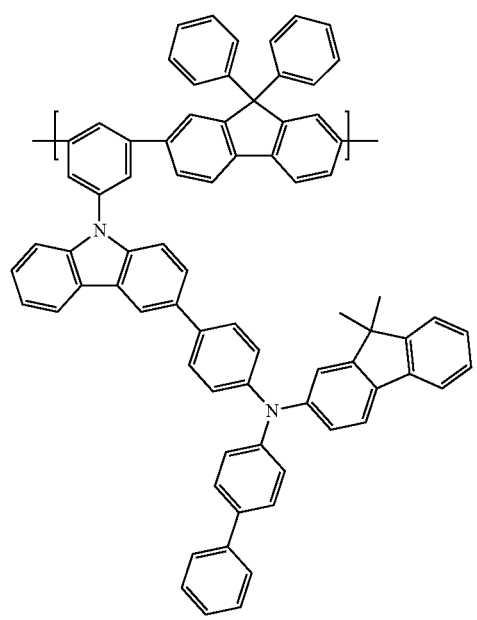
108
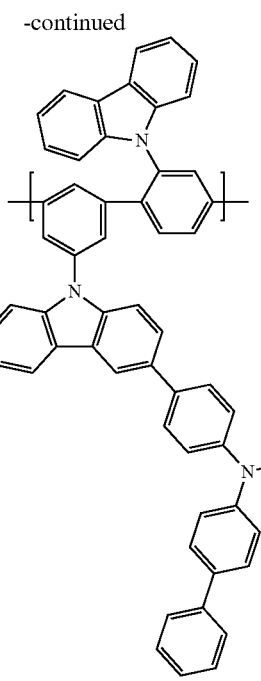
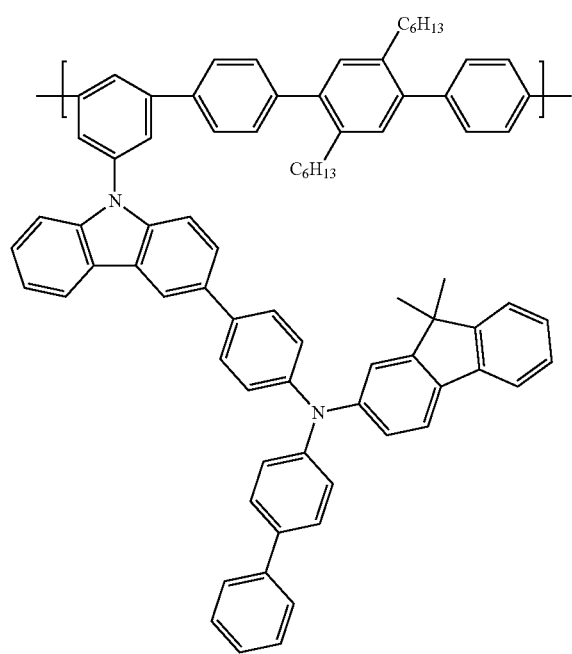
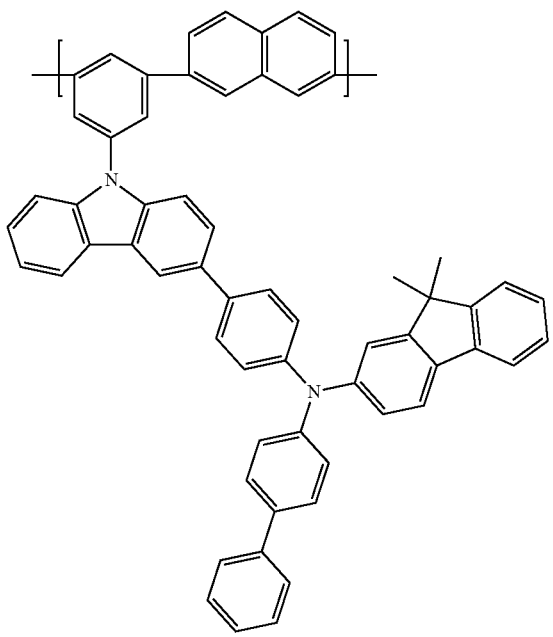

-continued
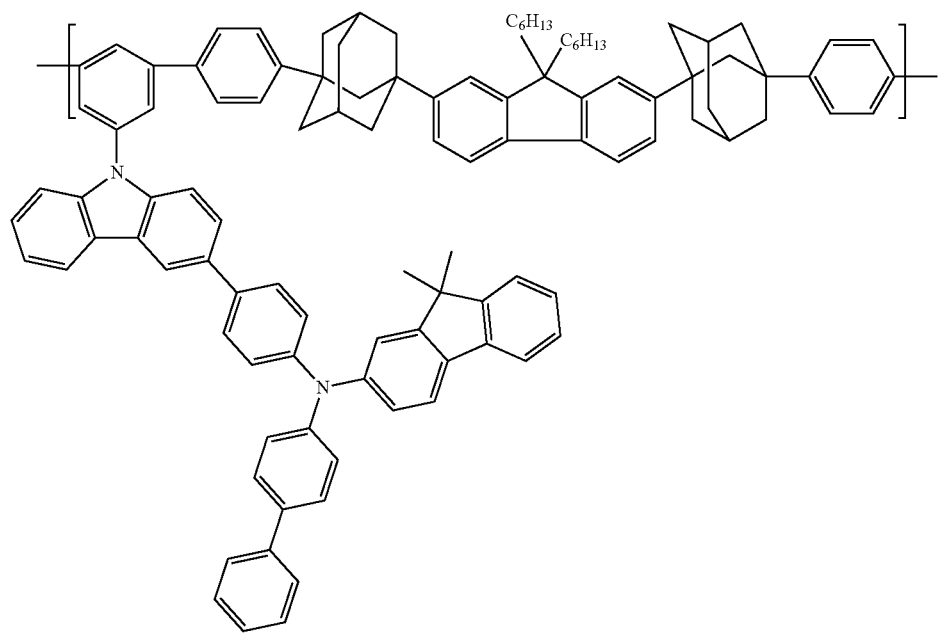
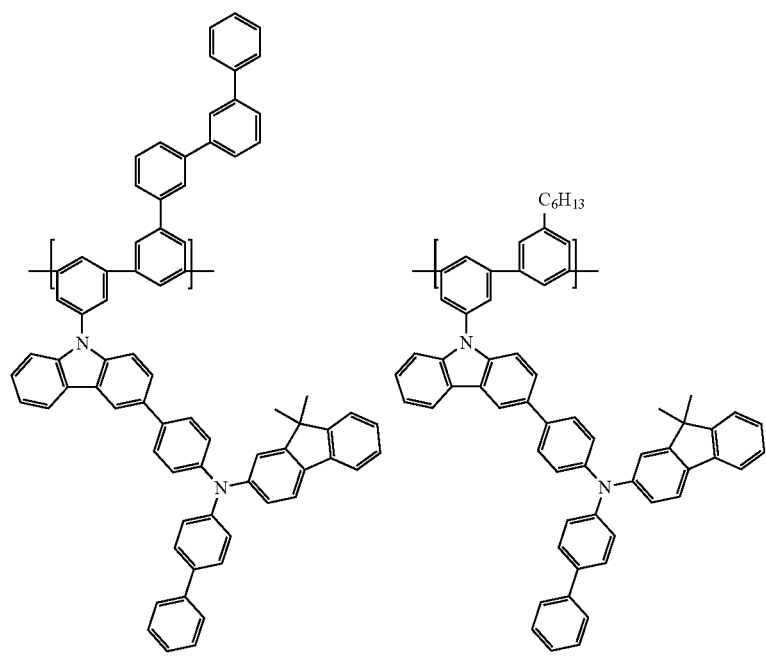

111
112
-continued
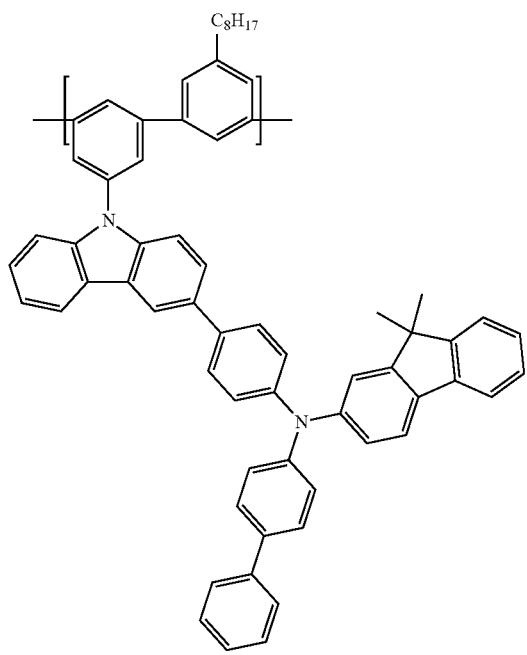
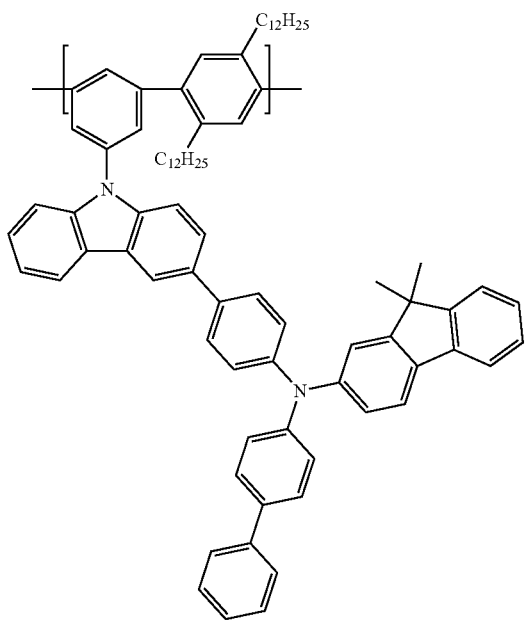
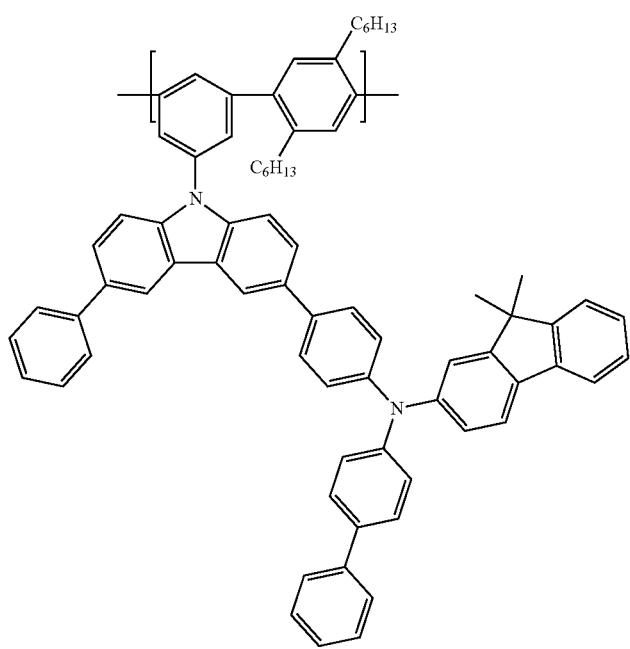

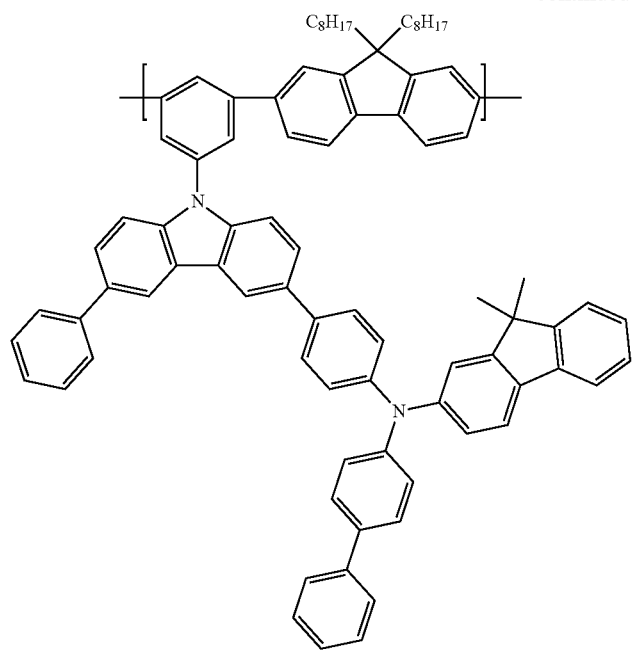
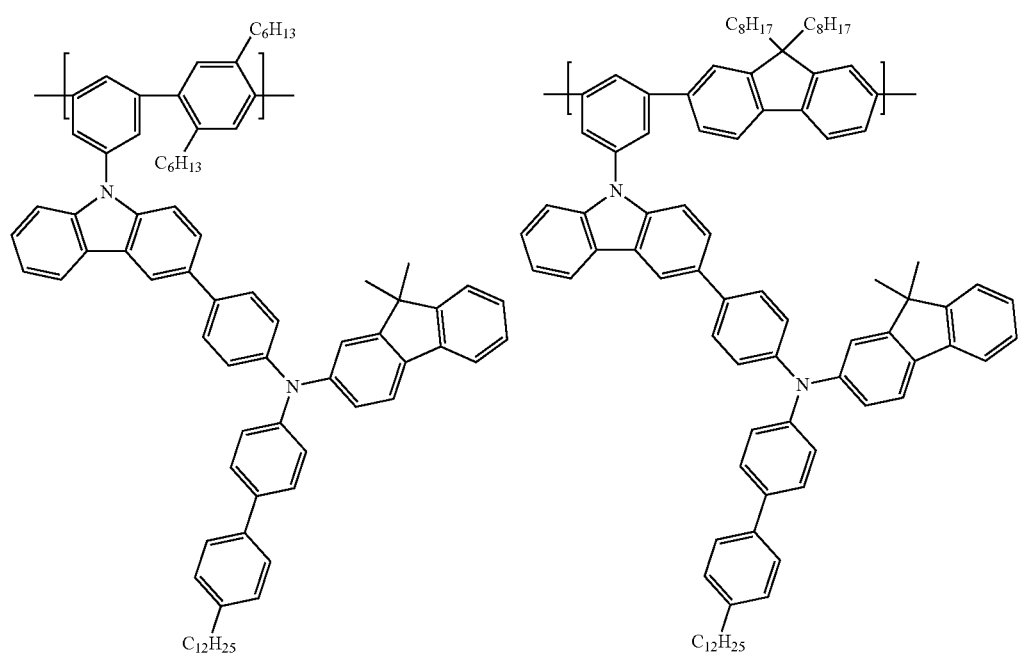

115
116
-continued
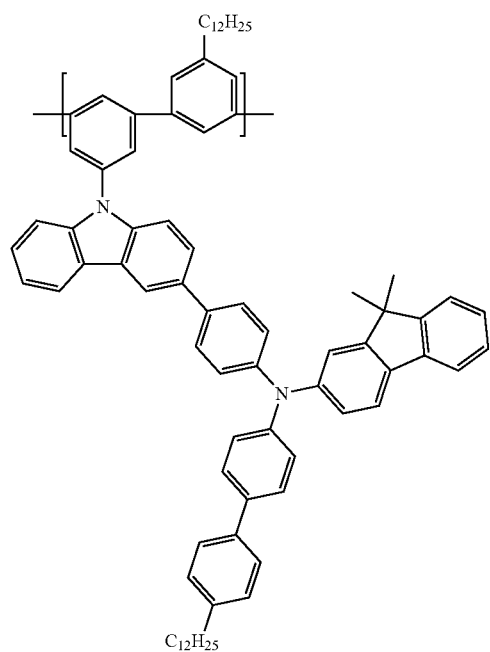
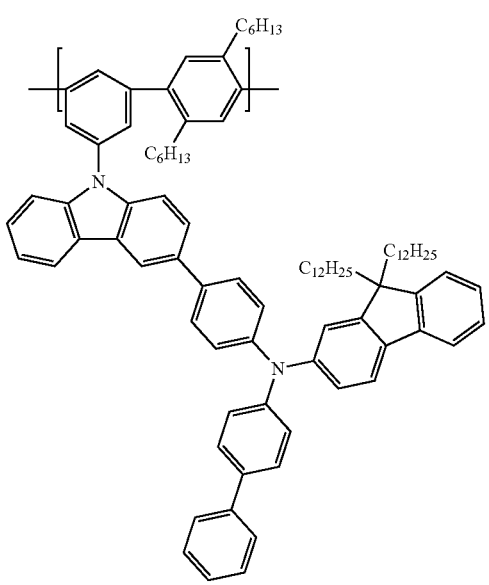
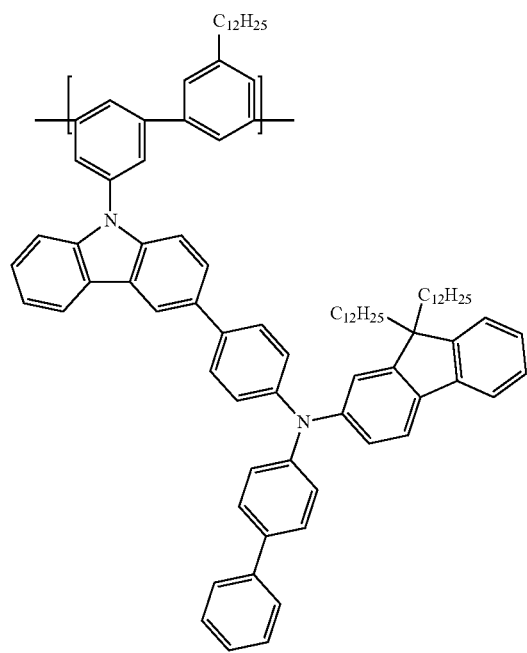
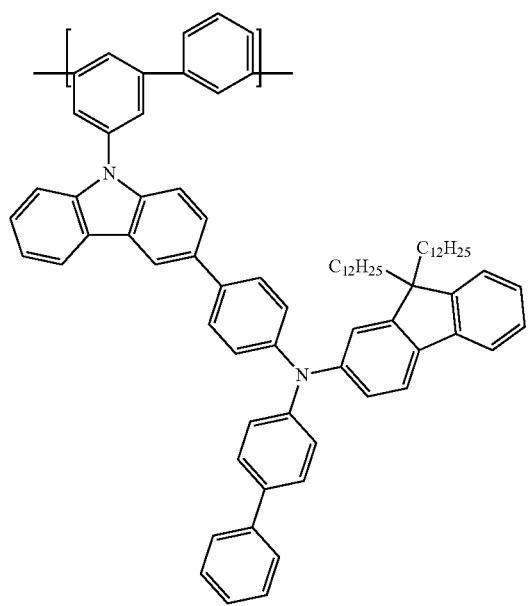

-continued
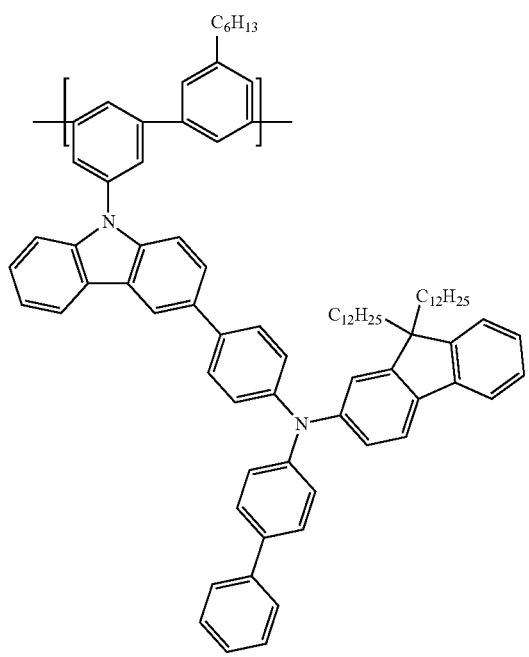
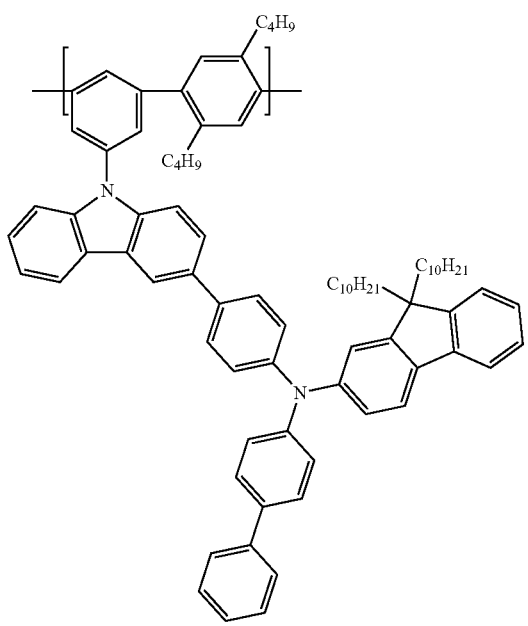
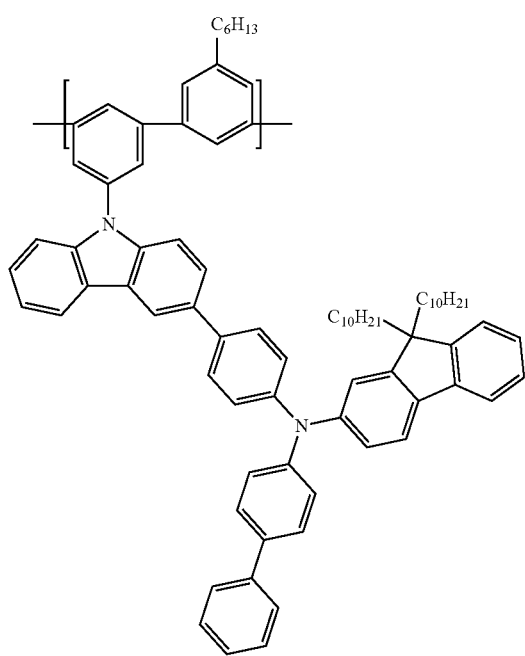

-continued
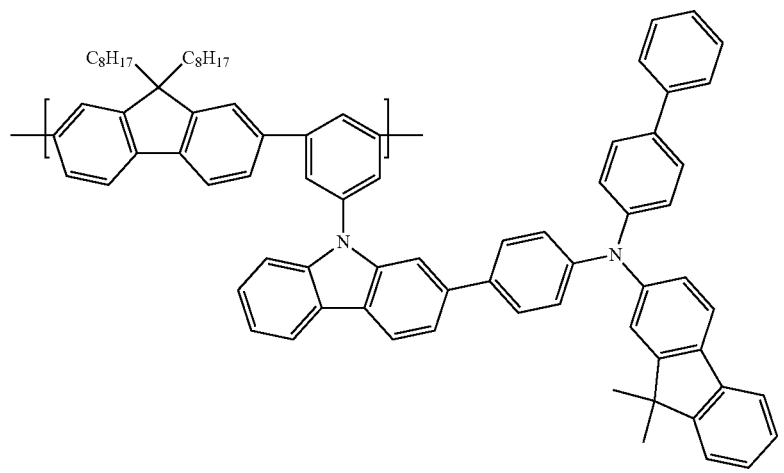
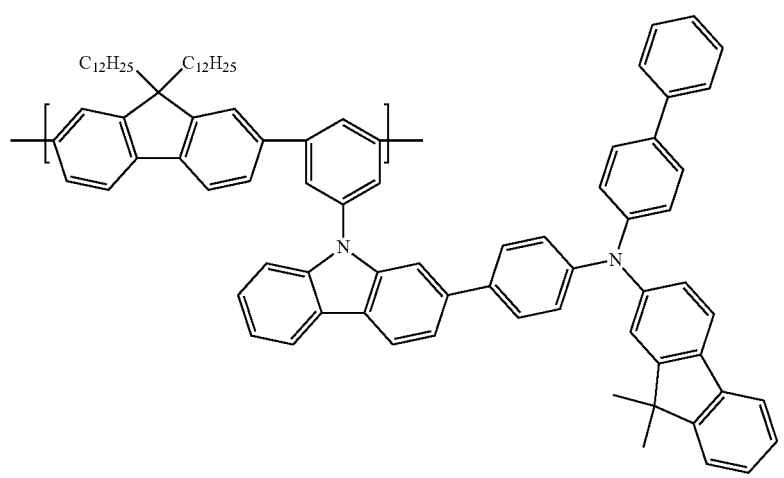
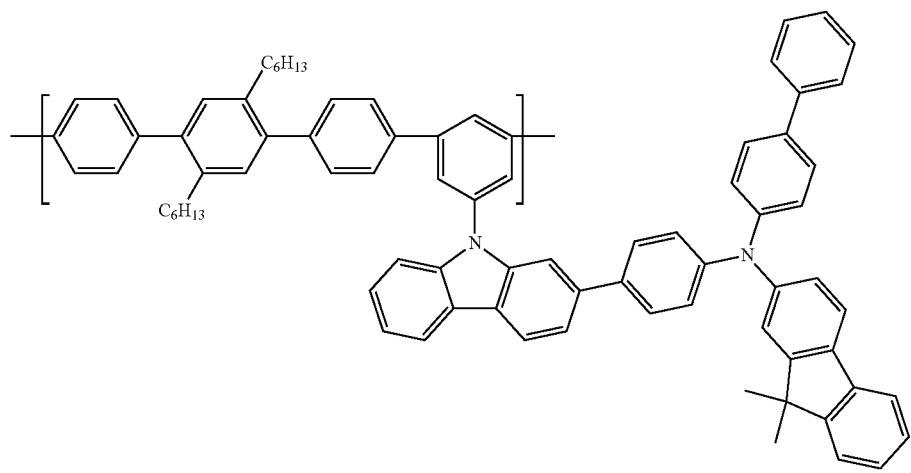

-continued
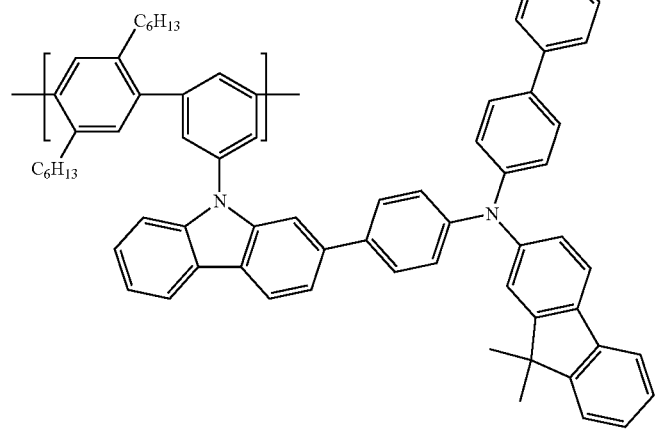
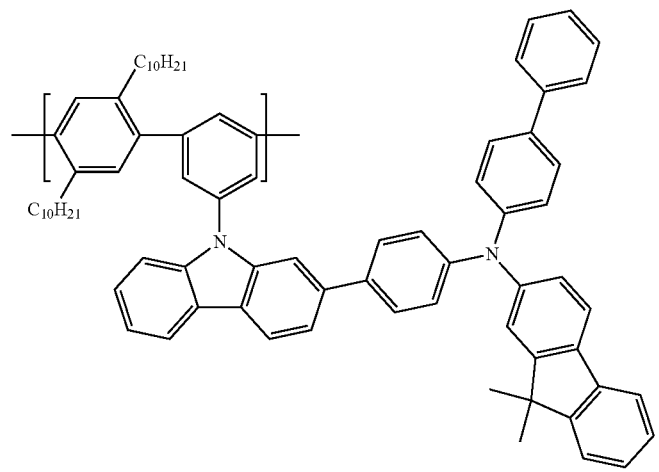
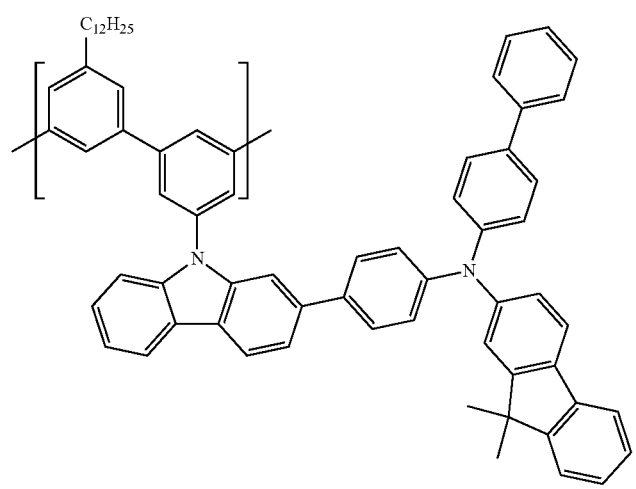

-continued
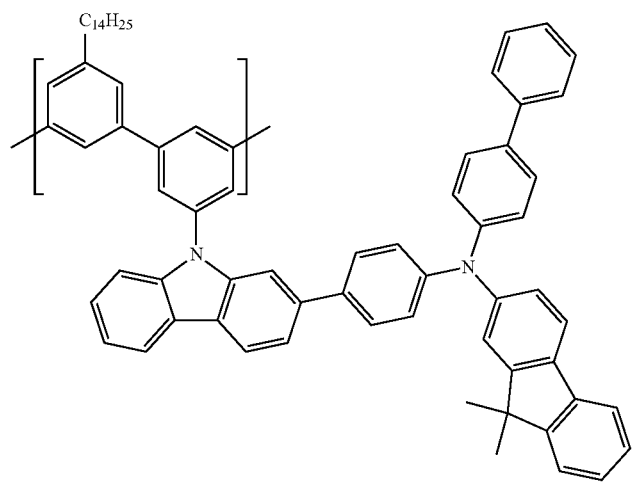
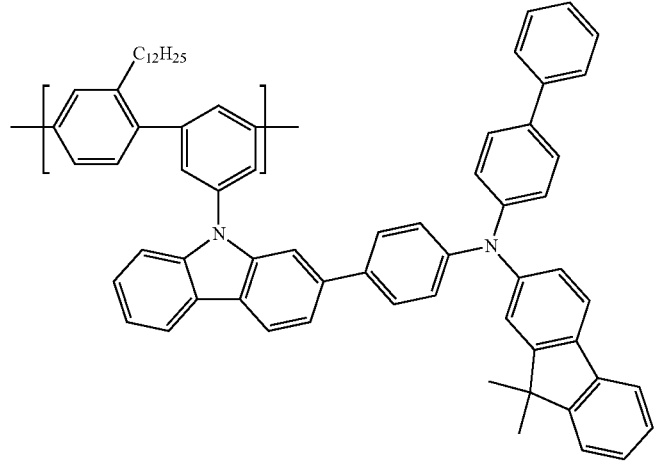
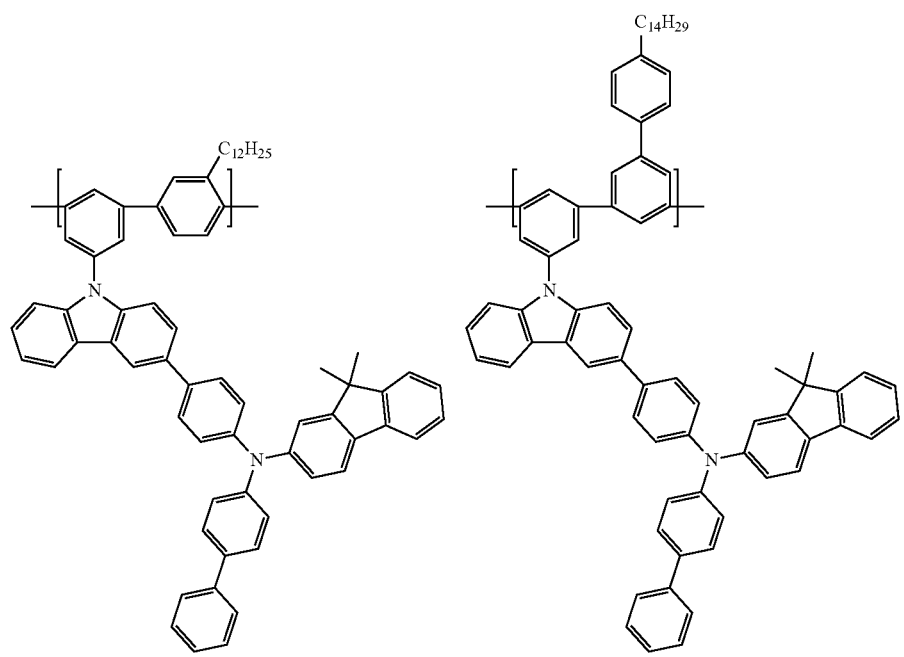

-continued
125
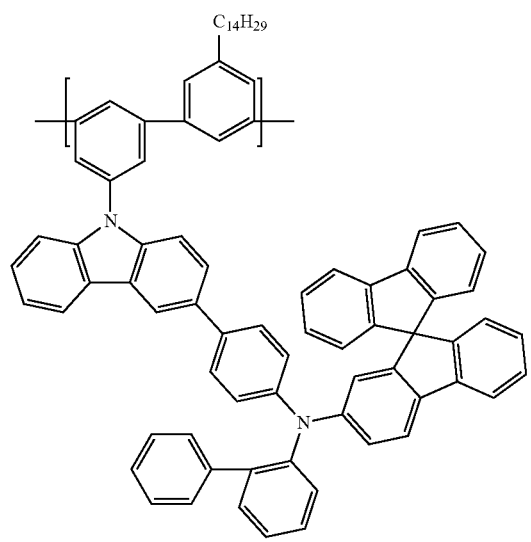
126
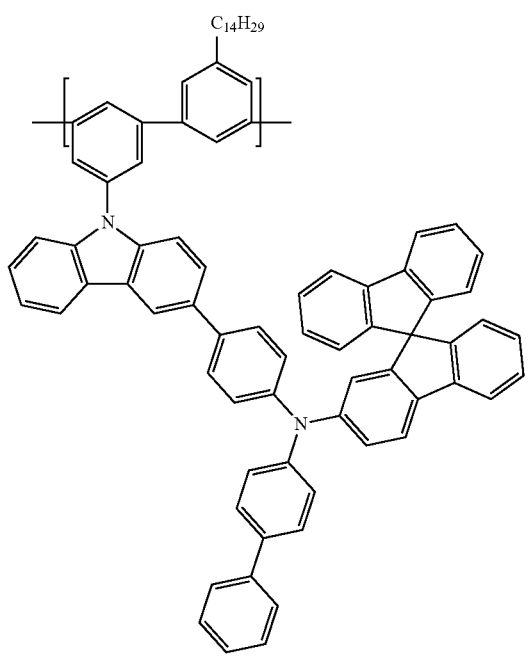
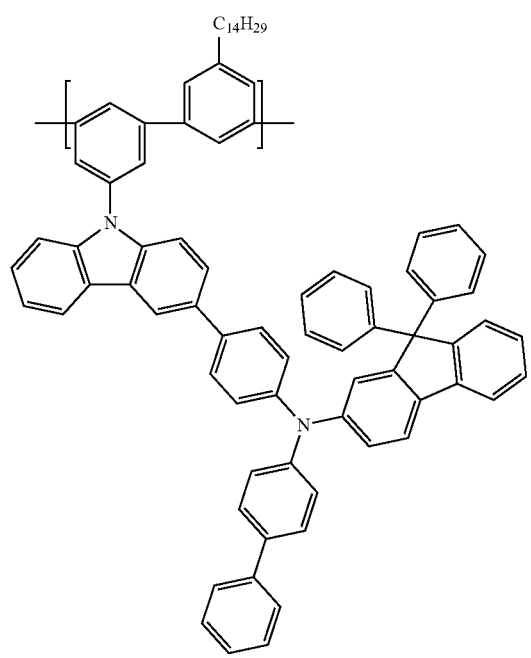
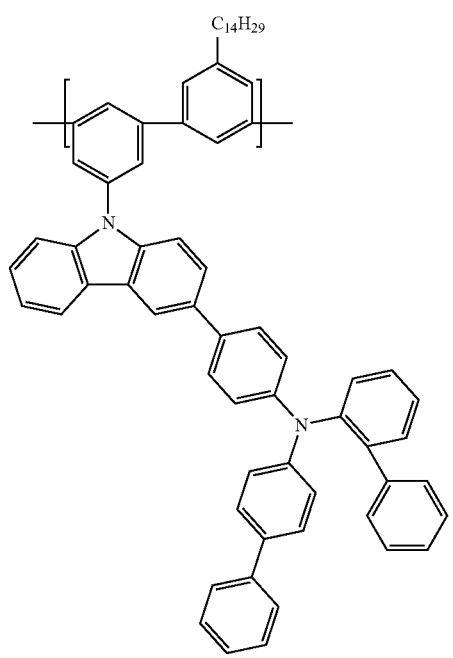

-continued
127
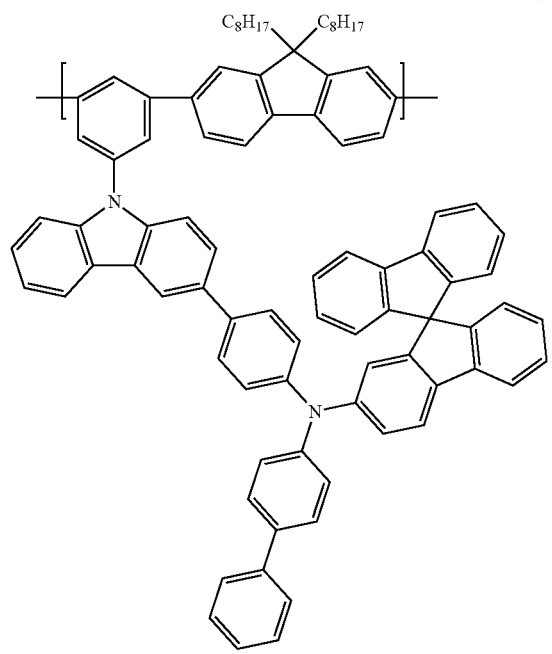
128
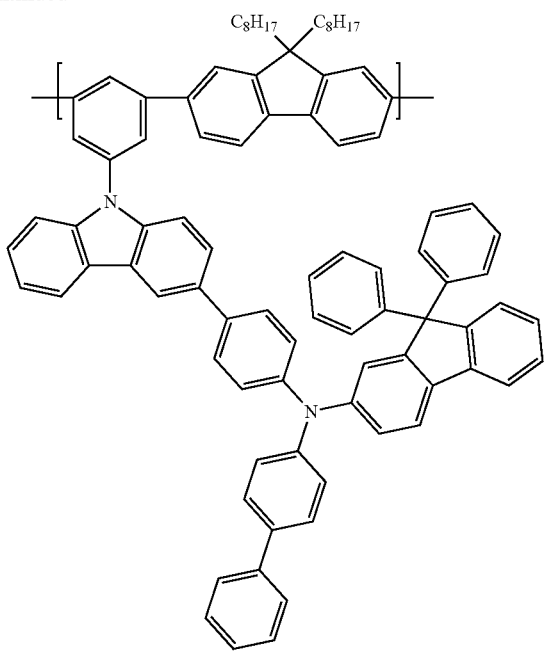
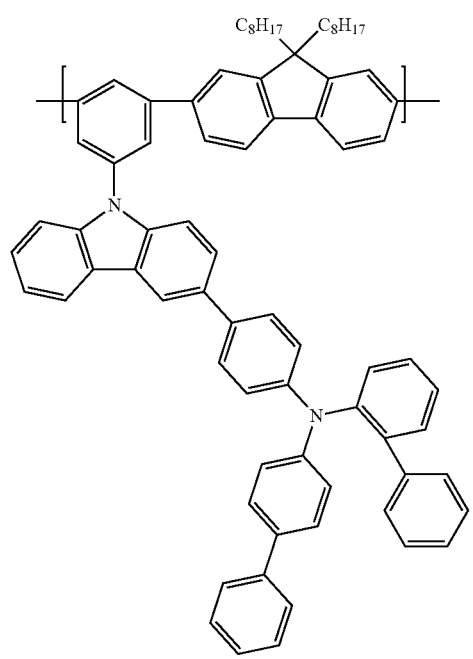
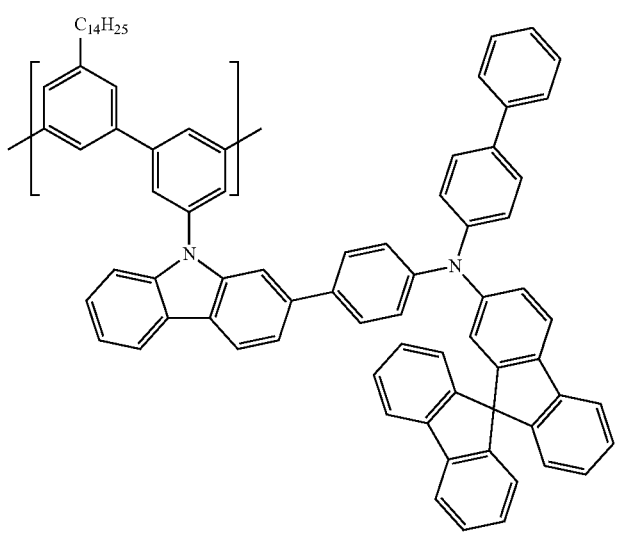

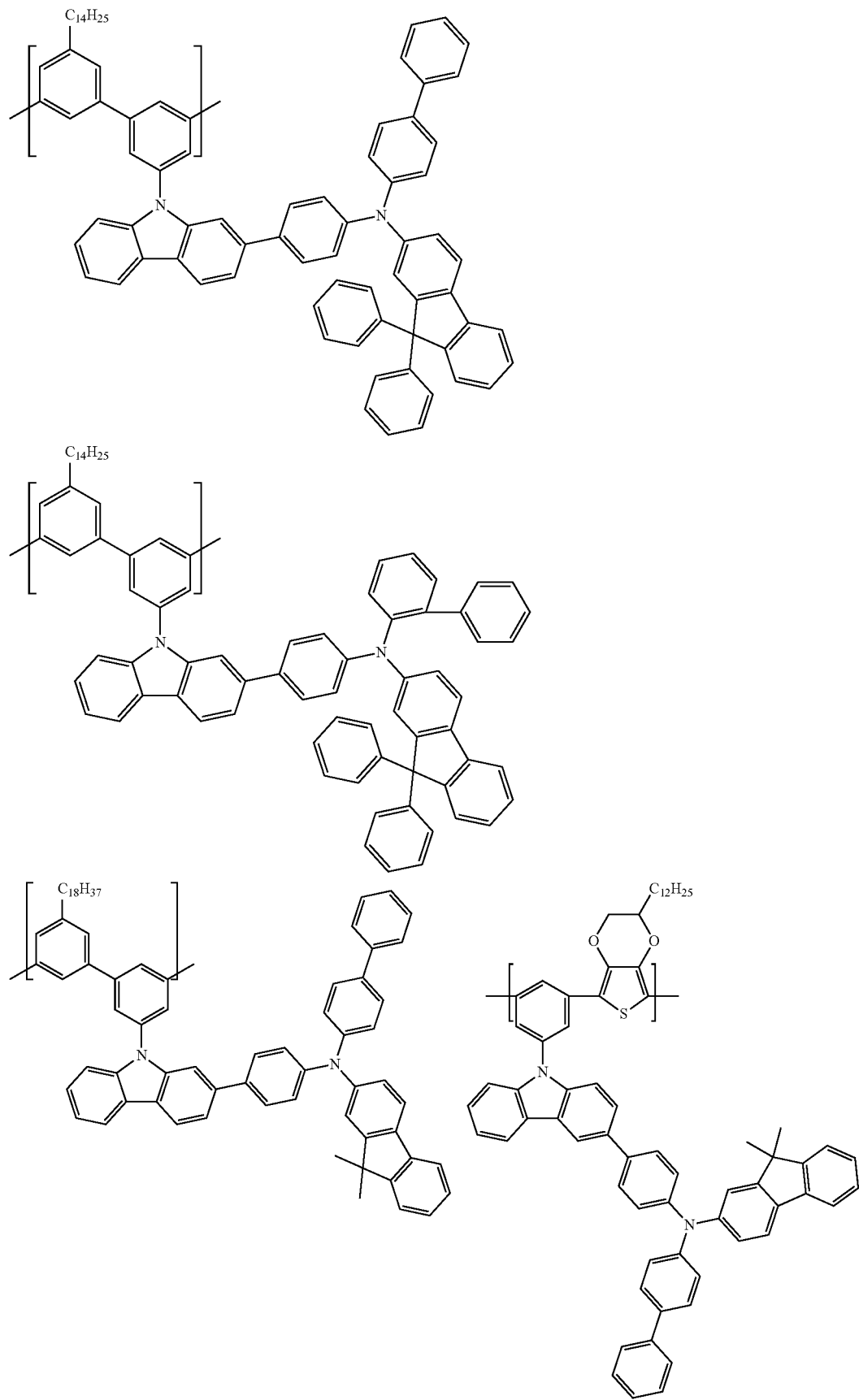

-continued
131
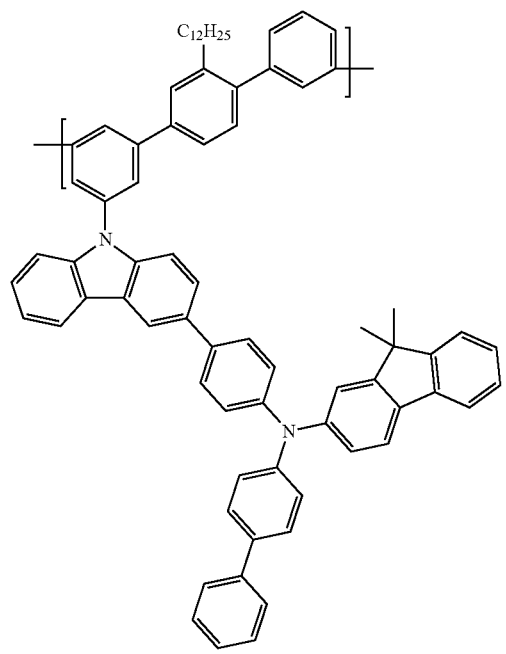
132
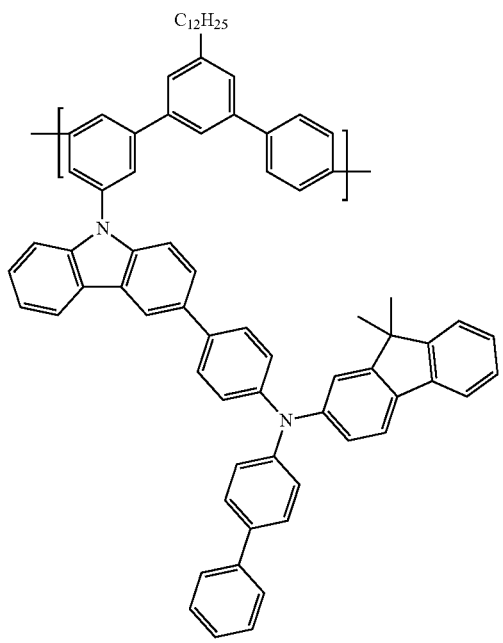
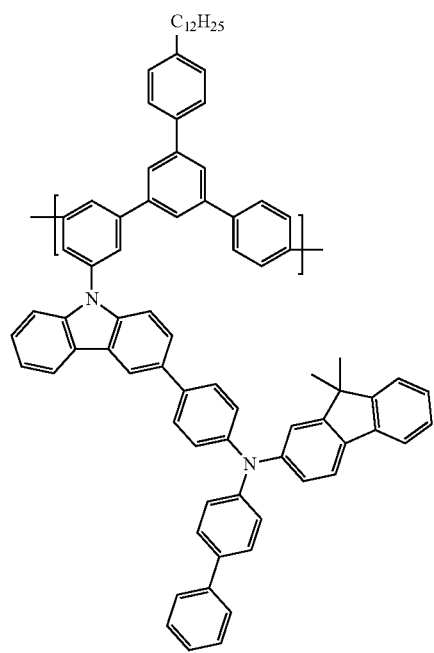
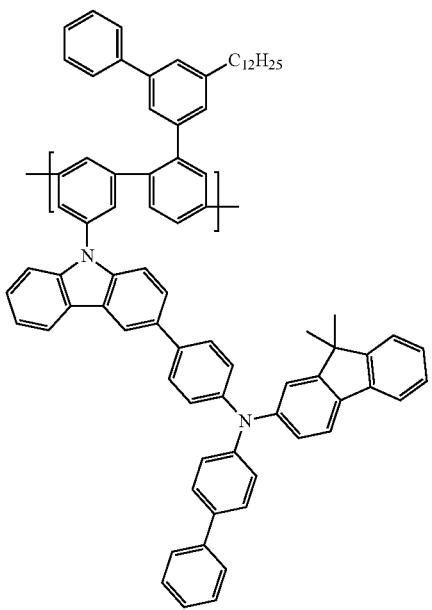

-continued
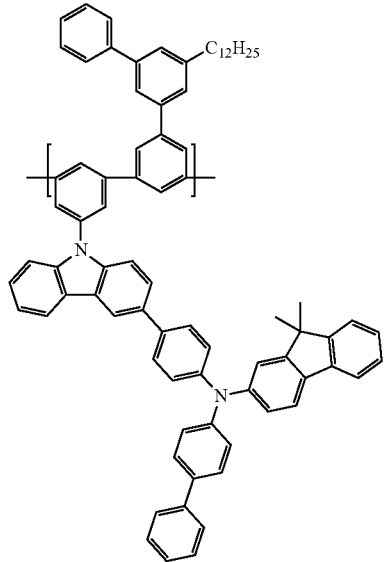
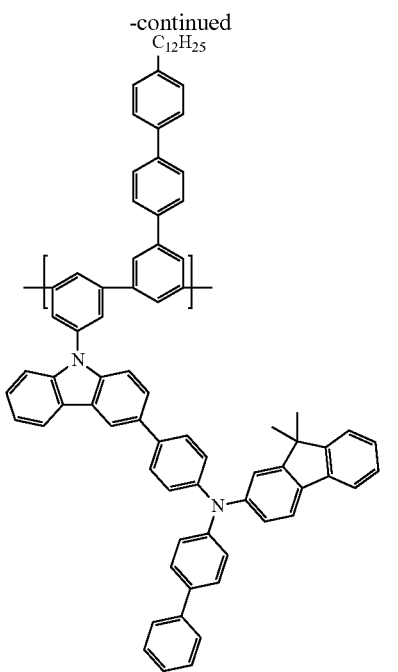
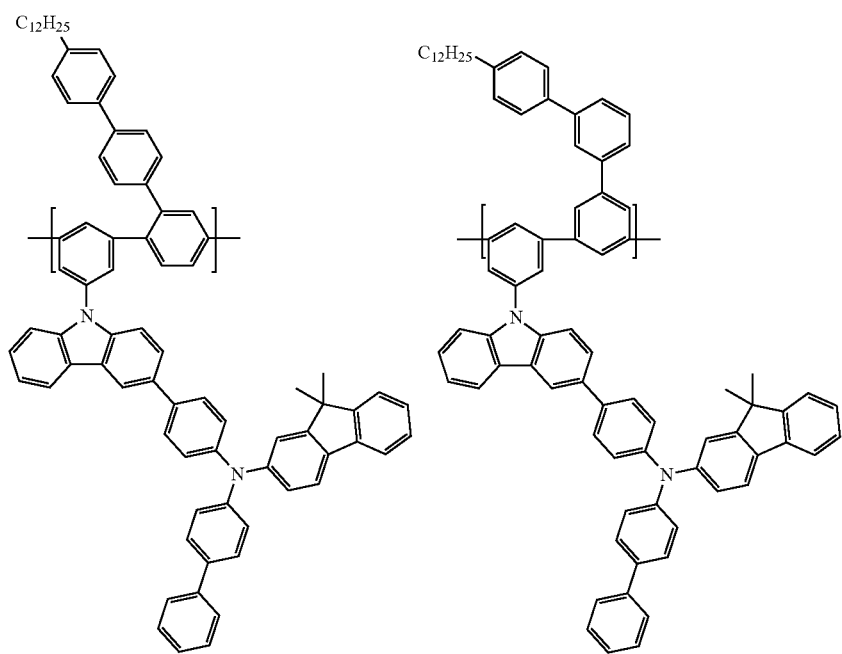

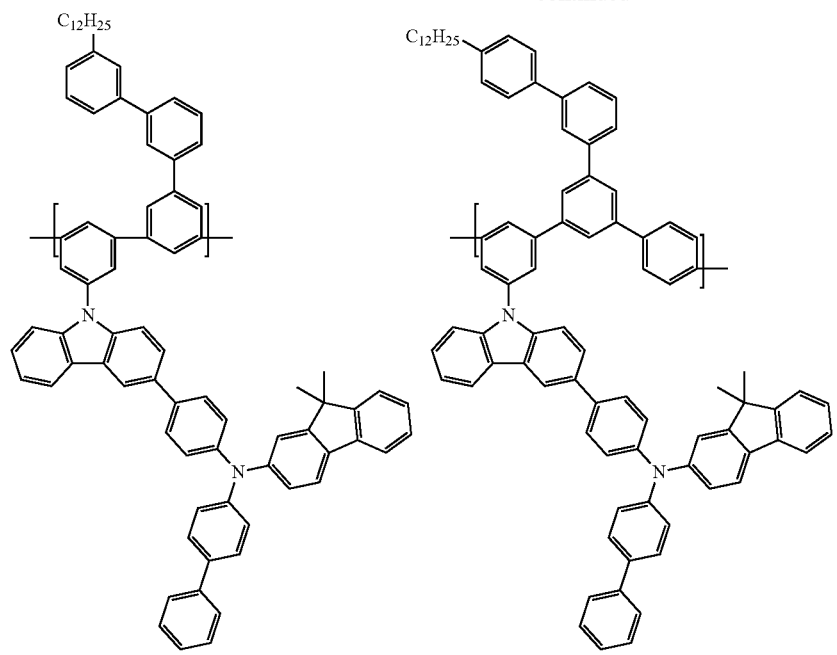
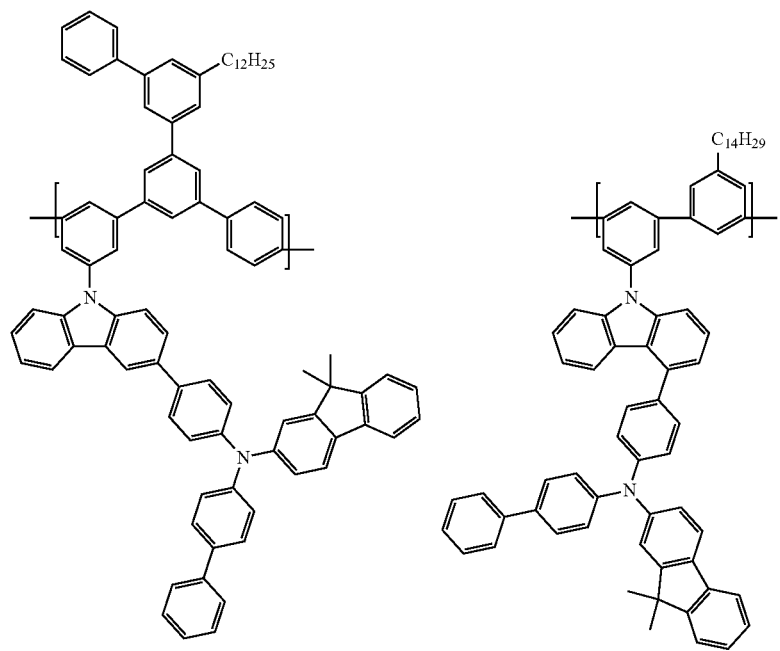

-continued
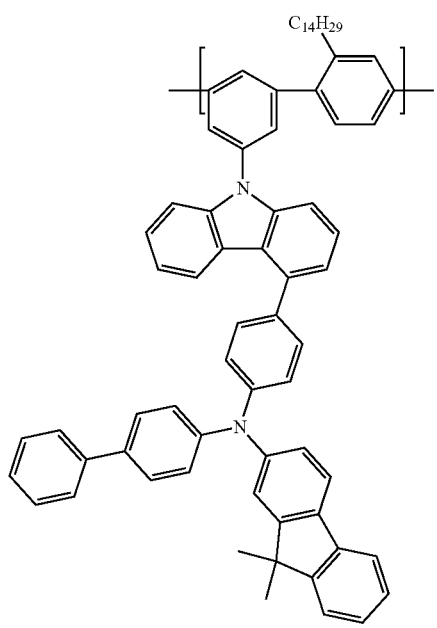
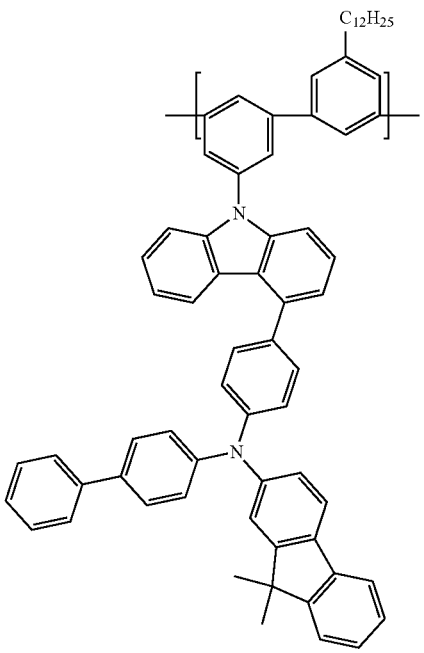
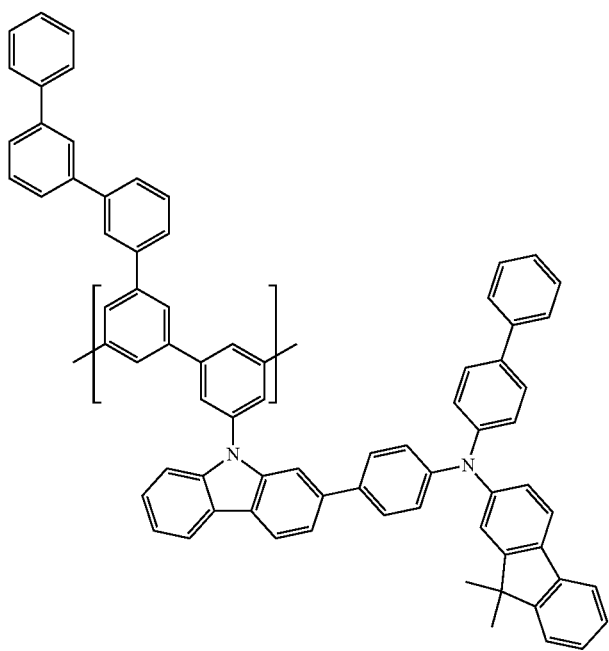

-continued

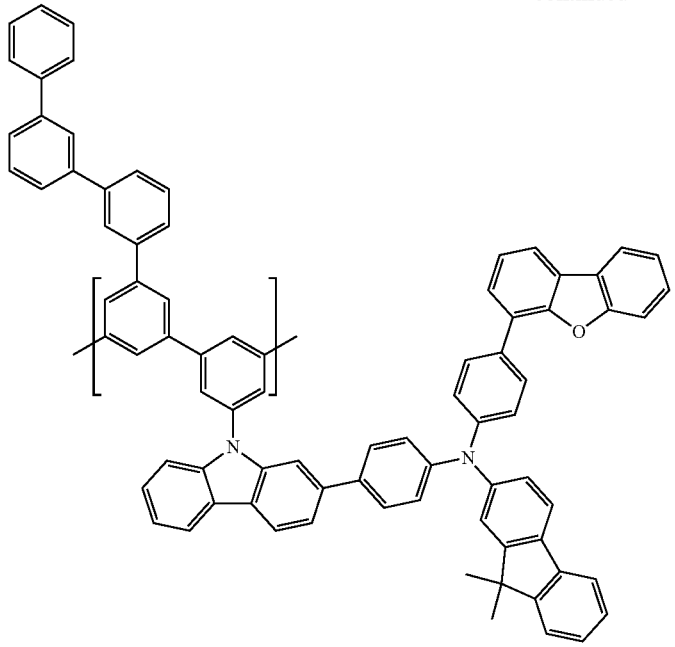

The polymer material according to this embodiment may be represented by Formula (3). Thereby, the luminescence life-span of quantum dot light emitting device may be improved,

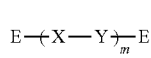
(3)

In Formula (3), E is a substituted or unsubstituted monovalent aromatic hydrocarbon group having 6 to 60 ring-forming carbon atoms, or a substituted or unsubstituted monovalent aromatic heterocyclic group having 3 to 60 ring-forming atoms, m is an integer of 2 or more, and each occurrence of X and Y may independently be the same or different.

Herein, the monovalent aromatic hydrocarbon group and the monovalent aromatic heterocyclic group are the same as the same as $Ar_1$ of Formula (2-A) to Formula (2-D) except that the trivalent aromatic hydrocarbon group and the trivalent aromatic heterocyclic group are changed into divalent groups, and thus the descriptions thereof are not repeated here. In addition, since a substituent in the case where the monovalent aromatic hydrocarbon group or monovalent aromatic heterocyclic group is substituted is the same as the substituent in $Ar_1$ of Formula (2-A) to Formula (2-D), the descriptions thereof are not repeated here.

Some specific examples of E (terminal group) in Formula (3) are shown below.

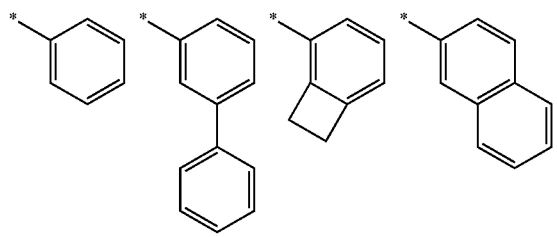

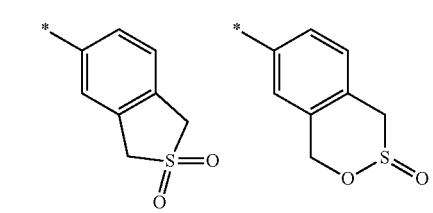

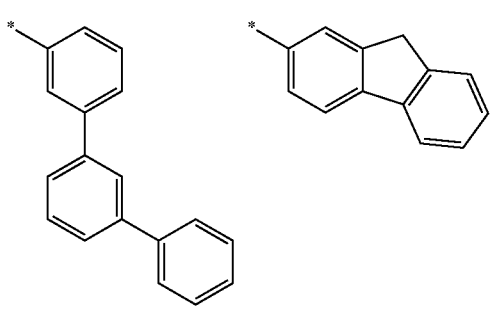

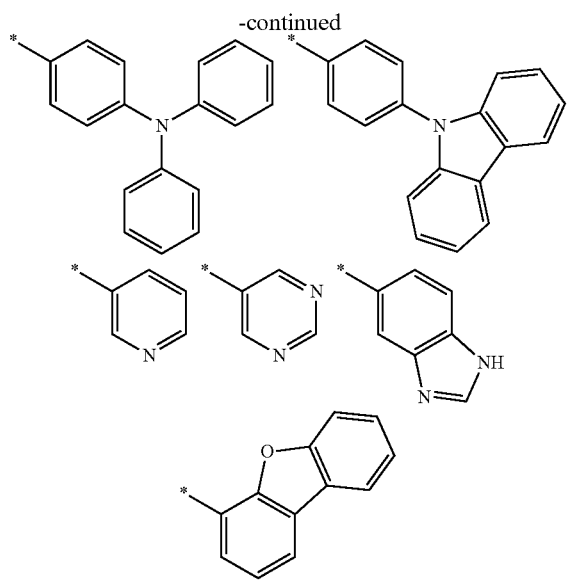

In the above formula, * indicates a binding site to the main chain.

The polymer material according to the present embodiment may be used as a material for an electroluminescence (EL) device.

[Glass Transition Temperature (Tg) of Polymer Material]

The glass transition temperature of the polymer material according to the present embodiment may be greater than or equal to about 50° C. and less than or equal to about 250° C. When the glass transition temperature is less than about 50° C., the film may be cracked at a heating temperature for drying the thin film, and sufficient luminescence properties may not be obtained. In addition, when the glass transition temperature is greater than about 250° C., a process temperature for drawing the performance of the hole transport material may become high, and a thermal load on the device may be applied, so that sufficient device life-span may not be obtained.

The lower limit of the glass transition temperature of the polymer material is not particularly limited as long as it is greater than or equal to about 50° C., but may be preferably greater than or equal to about 100° C., and more preferably greater than or equal to about 130° C. In addition, the upper limit of the glass transition temperature of the polymer material is not particularly limited as long as it is less than or equal to about 250° C., but may be preferably less than or equal to about 240° C., and more preferably less than or equal to about 230° C. The glass transition temperature may be measured using a differential scanning calorimeter (DSC) (manufactured by Seiko Instruments, product name: DSC6000). Meanwhile, details of the measurement method are described in examples.

[HOMO Level (eV) of Polymer Material]

The absolute value of the HOMO level of the polymer material according to the present embodiment is not particularly limited, but may be preferably greater than or equal to about 5.5 eV and less than or equal to about 6.0 eV from the viewpoint of further improving a luminescence life-span. Moreover, it may be preferably greater than or equal to about 5.5 eV and less than or equal to about 5.9 eV. On the other hand, the HOMO level usually has a negative value. The HOMO level of the polymer material may be measured using an air photoelectron spectroscopy device (AC-3 manufactured by Riken Instruments Co., Ltd.). Meanwhile, details of the measurement method are described in examples.

[Number Average Molecular Weight (Mn) and Weight Average Molecular Weight (Mw) of Polymer Material]

The number average molecular weight (Mn) of the polymer material according to the present embodiment may be preferably greater than or equal to about 2,000 and less than or equal to about 1,000,000, and more preferably greater than or equal to about 3,000 and less than or equal to about 500,000. Thereby, it is possible to appropriately adjust a viscosity of a coating solution for forming a thin film (for example, a hole injection layer and a hole transport layer) including the polymer material, and thus a thin film of uniform thickness may be formed.

In addition, the weight average molecular weight (Mw) of the polymer material according to the present embodiment is preferably greater than or equal to about 4,000 and more preferably greater than or equal to about 5,000. Thereby, it is possible to appropriately adjust the viscosity of the coating solution for forming a thin film (for example, a hole injection layer and a hole transport layer) including the polymer material, and thus a thin film of uniform thickness may be formed.

Herein, the number average molecular weight (Mn) and the weight average molecular weight (Mw) are not particularly limited and may be measured by using a known method or by appropriately modifying a known method. As used herein, the number average molecular weight (Mn) and the weight average molecular weight (Mw) may adopt the values measured by the following method.

The number average molecular weight (Mn) and the weight average molecular weight (Mw) of the polymer material are measured under the following conditions by using polystyrene as a standard material and by SEC (Size Exclusion Chromatography).

Analysis device (GPC): Shimadzu Corporation, Prominence

Column: Polymer Laboratories, PLgel MIXED-B

Column temperature: 40° C.

Flow rate: 1.0 mL/min

Injection volume of sample solution: 20 μL (concentration: about 0.05 mass %)

Eluent: Tetrahydrofuran (THF)

Detector (UV-VIS detector): Shimadzu Corporation, SPD-10AV

Standard sample: Polystyrene

[Synthesis Method of Polymer Material]

The polymer material according to the present embodiment may be synthesized by appropriately combining known organic synthesis reactions. The specific method of synthesizing the polymer material according to the present embodiment may be easily understood by those skilled in the art with reference to examples described later. Specifically, the polymer material according to the present embodiment may be synthesized by copolymerizing a monomer (α) which is at least one monomer of Monomers (α-1) to Monomers (α-4) represented by Formula (4), and one or more monomers (β) represented by Formula (5) at a mole ratio of about 1:1. On the other hand, the monomers (α) and (β) may be synthesized by appropriately combining known organic synthesis reactions. In addition, the monomers (α) and (β) may be identified using known analytical methods (e.g., NMR, LC-MS, etc.).

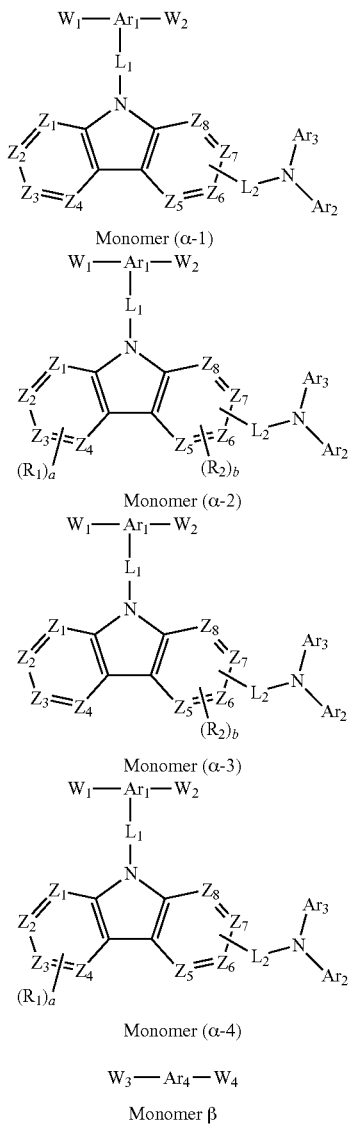

Monomer (α-1)

Monomer (α-2)

Monomer (α-3)

Monomer (α-4)

$$W_3—Ar_4—W_4 \quad (5)$$

Monomer β

(In Formulas (4) and (5), $Ar_1$, $Ar_2$, $Ar_3$, $L_1$, $L_2$, $R_1$, $R_2$, $Z_1$, $Z_2$, $Z_3$, $Z_4$, $Z_5$, $Z_6$, $Z_7$, $Z_8$, a, and b are the same as Formula (2-A) to Formula (2-D). In addition, $Ar_4$ is the same as Y in Formula (1). $W_1$ to $W_4$ may independently be a halogen atom (a fluorine atom, a chlorine atom, a bromine atom, an iodine atom, particularly a bromine atom) or the group represented below).

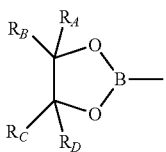

In the above formula, $R_A$ to $R_D$ are independently a C1 to C3 alkyl group.

[Material for EL Device and EL Device]

The material for the EL device according to the present embodiment includes the polymer material according to the present embodiment.

The EL device according to the present embodiment includes a pair of electrodes and one or more organic layers including the polymer material according to the present embodiment disposed between the pair of electrodes. At this time, the EL device further includes a layer including quantum dots. Moreover, at least one layer of one or more layers of the EL device may be formed by a coating method.

The EL device may include a quantum dot light emitting device, an organic EL device, an organic inorganic perovskite light emitting device etc.

[Liquid Composition and Thin Film]

The liquid composition according to the present embodiment includes the polymer material according to the present embodiment and a solvent or dispersion medium. In addition, the thin film according to the present embodiment includes the polymer material according to the present embodiment.

Since the polymer material according to the present embodiment has improved solubility, it may be particularly preferably used when producing an EL device (especially a thin film) by a coating method (wet process).

Since the polymer material according to the present embodiment has improved charge mobility, it may be used when forming organic layers such as a hole injection layer, a hole transport layer, and a light emitting layer. At this time, the polymer material according to the present embodiment may be preferably used when forming a hole injection layer and/or a hole transport layer from the viewpoint of hole transportability, and particularly preferably when forming a hole transport layer.

[Electroluminescence Device]

The present embodiment provides an electroluminescent device including the polymer material. Herein, the electroluminescent device according to the present embodiment includes a pair of electrodes and at least one organic layer including the polymer material disposed between the pair of electrodes. The electroluminescent device according to the present embodiment is not particularly limited, but as described above, the polymer material has improved solubility, so that at least one of the organic layers may be preferably formed by a coating method. In addition, the electroluminescent device according to the present embodiment is not particularly limited, but from the viewpoint of further improving luminescence life-span, a layer including quantum dots may be further provided, and the quantum dots may be preferably inorganic nanoparticles.

Next, a quantum dot light emitting device will be described as one example of the EL device according to the present embodiment.

[Quantum Dot Light Emitting Device]

FIG. 1 shows one example of the quantum dot light emitting device according to the present embodiment.

The quantum dot light emitting device 100 essentially includes the light emitting layer 150. For example, the first electrode 120, the light emitting layer 150, and the second electrode 180 are sequentially disposed on the substrate 110. In addition, for example, on the substrate 110, the first electrode 120, the hole injection layer 130, the hole transport layer 140, the light emitting layer 150, the electron transport layer 160, the second electrode 180 are sequentially disposed. For example, on the substrate 110, the first electrode 120, the hole injection layer 130, the hole transport layer 140, the light emitting layer 150, the electron transport layer 160, the electron injection layer 170, and the second electrode 180 may sequentially disposed.

Herein, the polymer material according to the present embodiment is included, for example, in one or more organic layers disposed between the first electrode 120 and the second electrode 180. Specifically, the polymer material according to the present embodiment is preferably included in the hole injection layer 130, the hole transport layer 140, or the light emitting layer 150 as a hole injection material, a hole transport material, or a light emitting material. Further, the polymer material according to the present embodiment is more preferably included in the hole injection layer 130 or the hole transport layer 140 as a hole injection material or a hole transport material. In addition, the polymer material according to the present embodiment is particularly preferably included in the hole transport layer 140 as a hole transport material.

In addition, the organic layer including the polymer material according to the present embodiment is formed by a coating method (solution coating method).

The coating method (solution coating method) is not particularly limited, but may be a spin coating method, a casting method, a microgravure coating method, a gravure coating method, a bar coating method, a roll coating method, a wire barcode method, a dip coating method, a spray coating method, a screen printing method, a flexo printing method, an offset method, an inkjet printing method, and the like.

On the other hand, the solvent used in the solution coating method is not particularly limited as long as it may dissolve the polymer material according to the present embodiment, but may be toluene, xylene, diethylether, chloroform, ethyl acetate, methylene chloride, tetrahydrofuran, acetone, acetonitrile, N,N-dimethyl formamide, dimethyl sulfoxide, anisole, hexamethyl phosphoric acid triamide, 1,2-dichloroethane, 1,1,2-trichloroethane, chlorobenzene, o-dichloro benzene, dioxane, cyclohexane, n-pentane, n-hexane, n-heptane, n-octane, n-nonane, n-decane, methylethylketone, cyclohexanone, butyl acetate, ethylcellosolve acetate, ethylene glycol, ethylene glycol monobutylether, ethylene glycol monoethylether, ethylene glycol monomethylether, dimethoxy ethane, propylene glycol, diethoxy methane, triethylene glycol monoethylether, glycerine, 1,2-hexanediol, methanol, ethanol, propanol, isopropanol, cyclohexanol, N-methyl-2-pyrrolidone, and the like.

Herein, considering an ease of coating, a concentration of the polymer material in the solution may be preferably greater than or equal to about 0.1 mass % and less than or equal to about 10 mass %, and more preferably greater than or equal to about 0.5 mass % and less than or equal to about 5 mass %.

On the other hand, a method for forming a layer other than the organic layer including the polymer material according to the present embodiment is not particularly limited, and examples thereof include a vacuum deposition method and a solution coating method.

The substrate 110 is not particularly limited, and substrates used in general EL devices may be used. The substrate 110 may be a glass substrate, a semiconductor substrate such as a silicon substrate, and a transparent plastic substrate.

The first electrode 120 may be an anode, and may be formed using a material having a large work function among materials such as a metal, an alloy, and a conductive compound. The first electrode 120 may be formed by depositing a transparent conductive material such as indium tin oxide ($In_2O_3$—$SnO_2$:ITO), indium zinc oxide ($In_2O$—ZnO), tin oxide ($SnO_2$), zinc oxide (ZnO), and so on, and may be formed as a transmissive electrode. In addition, the first electrode 120 may be formed as a reflective electrode by depositing a reflective material such as magnesium (Mg) or aluminum (Al) with respect to the transmissive electrode.

The hole injection layer 130 may facilitate injection of holes from the first electrode 120.

A thickness of the hole injection layer 130 may be preferably greater than or equal to about 10 nm and less than or equal to about 1000 nm, and more preferably greater than or equal to about 10 nm and less than or equal to about 100 nm.

The hole injection layer 130 may be formed by a vacuum deposition method, a spin coating method, an inkjet method, or the like, using a known hole injection material.

Examples of the hole injection material may include tiphenylamine-containing polyether ketone, 4-isopropyl-4'-methyldiphenyl iodonium trakis (pentafluorophenyl) borate, N,N'-diphenyl-N,N'-bis-[4-(phenyl-m-tolyl-amino)-phenyl]-biphenyl-4,4'-diamine, copper phthalocyanine, 4,4',4"-tris(3-methylphenylphenylamino) triphenylamine, N,N'-di (1-naphthyl)-N,N'-diphenyl benzidine, 4,4',4"-tris(diphenyl amino) triphenylamine, 4,4',4"-tris(N,N-2-naphthylphenylamino) triphenylamine, polyaniline/dodeylbenzenesulfonic acid, poly(3,4-ethylenedioxythiophene)/poly(4-styrenesulfonate) (PEDOT/PSS), polyaniline/10-camphorsulfonic acid, and the like.

The hole transport layer 140 is a layer having a function of transporting holes.

A thickness of the hole transport layer 140 may be preferably greater than or equal to about 10 nm and less than or equal to about 150 nm.

The hole transport layer 140 may be preferably formed by a solution coating method using the polymer material according to the present embodiment. Accordingly, the polymer material capable of improving luminous efficiency of the quantum dot light emitting device 100 may be efficiently formed into a large area.

However, when the organic layer other than the quantum dot light emitting device 100 includes the polymer material according to the present embodiment, the hole transport layer 140 may be formed using a known hole transport material.

Examples of the hole transport material may include a carbazole derivative such as 1,1-bis[(di-4-tolylamino) phenyl] cyclohexane, N-phenyl carbazole, and polyvinyl carbazole, N,N'-bis(3-methylphenyl)-N,N'-diphenyl-[1,1-biphenyl]-4,4'-diamine, 4,4',4"-tris(N-carbazolyl) triphenyl amine, N,N'-di (1-naphthyl)-N,N'-diphenyl benzidine, and the like.

The light emitting layer 150 may be a layer that emits light such as fluorescence and phosphorescence.

A thickness of the light emitting layer 150 may be is preferably greater than or equal to about 10 nm and less than or equal to about 60 nm.

In the light emitting layer 150, a plurality of quantum dots may be arranged in one layer, or may be arranged in a plurality of layers. Herein, quantum dots may be inorganic nanoparticles having a quantum confinement effect. A diameter of the inorganic nanoparticles may be greater than or equal to about 1 nm and less than or equal to about 10 nm.

The quantum dots arranged in the light emitting layer 150 may be synthesized by a wet chemical method, an organometallic chemical vapor deposition method, a molecular beam epitaxy method, or the like.

The wet chemical method is a method in which a precursor is put in an organic solvent to grow particles. At this time, the organic solvent is naturally coordinated to the surface of the quantum dot crystal, acting as a dispersing agent, and controlling the growth of the crystal. For this reason, the wet chemical method may control the growth of particles more easily and at a lower cost than vapor deposition methods such as organometallic chemical vapor deposition (MOCVD) and molecular beam epitaxy (MBE). At this time, by adjusting the size of the quantum dot, the energy band gap may be adjusted, and as a result, the light emitting layer 150 may emit light of various wavelengths. Therefore, by using a plurality of quantum dots of different sizes, a display emitting light of a plurality of wavelengths may be produced. The sizes of the quantum dots may be appropriately selected so as to emit red light, green light, and blue light to provide a color display. Further, the sizes of the quantum dots may be combined such that various color lights emit white light.

Although the materials constituting the quantum dots are not particularly limited, a semiconductor material of a Group II-VI compound, a Group III-V compound, a Group IV-VI compound, or a Group IV element or compound may be used. Two or more types may be used in combination.

The Group II-VI compound may be, for example, a binary compound of CdSe, CdTe, ZnS, ZnSe, ZnTe, ZnO, HgS, HgSe, HgTe, and the like; a ternary compound of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, and the like; a quaternary compound of CdZnSeS, CdZnSeTe, CdZnSTe, CdHgSeS, CdHgSeTe, CdHgSTe, HgZnSeS, HgZnSeTe, HgZnSTe, and the like.

The Group III-V compound may be, for example, a binary compound of GaN, GaP, GaAs, GaSb, AlN, AlP, AlAs, AlSb, InN, InP, InAs, InSb, and the like; a ternary compound of GaNP, GaNAs, GaNSb, GaPAs, GaPSb, AlNP, AlNAs, AlNSb, AlPAs, AiPSb, InNP, InNAs, InNSb, InPAs, InPSb, GaAlNP, and the like; a quaternary compound of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the like.

The Group IV-VI compound may be, for example, a binary compound of SnS, SnSe, SnTe, PbS, PbSe, PbTe, and the like; a ternary compound of SnSeS, SnSeTe, SnSTe, PbSeS, PbSeTe, PbSTe, SnPbS, SnPbSe, SnPbTe, and the like; a quaternary compound of SnPbSSe, SnPbSeTe, SnPbSTe, and the like, and the like.

The Group IV element or compound may be, for example, a single-element compound of Si or Ge; a binary compound of SiC or SiGe, and the like.

The quantum dots may have a homogeneous structure or may have a core-shell structure.

The core-shell structure may include different materials, and the materials constituting the core and the shell may be different semiconductor materials. However, the semiconductor material constituting the shell may have a larger energy band gap than the semiconductor material constituting the core.

For example, production of a quantum dot having a core (CdSe)-shell (ZnS) structure is described. First, crystals may be grown by injecting precursors of core (CdSe) such as $(CH_3)_2Cd$ (dimethyl cadmium), TOPSe (trioctylphosphine selenide) into TOPO (trioctylphosphine oxide), as an organic solvent (dispersing agent). Herein, the crystals are grown to a constant size, and then maintained at a high temperature for a certain time, and then a precursor material of the shell (ZnS) is injected to form a shell on the surface of the core. Thereby, quantum dots of CdSe/ZnS capped by TOPO may be produced.

Moreover, the quantum dots of a core-shell structure may include InP/ZnSe/ZnS three-layered quantum dots which use InP as a core.

The electron transport layer 160 may be a layer having a function of transporting electrons.

A thickness of the electron transport layer 160 may be preferably greater than or equal to about 15 nm and less than or equal to about 50 nm.

The electron transport layer 160 may be formed by using a known electron transport material and using a vacuum deposition method, a spin coating method, an inkjet method, or the like.

Examples of the electron transporting material may include ZnMgO, (8-) lithium, tris(8-) aluminum, and a compound having a nitrogen-containing aromatic heterocycle.

Specific examples of the compound having the nitrogen-containing aromatic heterocycle may include a compound including a pyridine ring such as 1,3,5-tri[(3-pyridyl)-phen-3-yl] benzene, a compound including a triazine ring such as 2,4,6-tris(3'-(pyridin-3-yl) biphenyl-3-yl)-1,3,5-triazine, a compound including an imidazole ring such as 2-(4-(N-phenylbenzoimidazolyl-1-yl-phenyl)-9,10-dinaphthylanthracene, and the like.

The electron injection layer 170 is a layer having a function to facilitate injection of electrons from the second electrode 180.

A thickness of the electron injection layer 170 may be preferably greater than or equal to about 0.3 nm and less than or equal to about 9 nm.

The electron injection layer 170 may be formed by using a known electron injection material and vacuum deposition.

Examples of the electron injection material include a lithium compound such as (8-) lithium and lithium fluoride (LiF), sodium chloride (NaCl), cesium fluoride (CsF), lithium oxide ($Li_2O$), and barium oxide (BaO).

The second electrode 180 may be a cathode and may be formed using a metal, an alloy, or a conductive compound having a small work function. The second electrode 180 may be formed as a reflective electrode by using a metal such as lithium (Li), magnesium (Mg), aluminum (Al), or calcium (Ca), an alloy such as aluminum-lithium (Al—Li), magnesium-indium (Mg—In), magnesium-silver (Mg—Ag). In addition, the second electrode 180 may be formed as a transmissive electrode having a thickness of less than or equal to about 20 nm using the metal. In addition, the second electrode 180 may be formed as a transmissive electrode using a transparent conductive material such as indium tin oxide ($In_2O_3$—$SnO_2$) and indium zinc oxide ($In_2O_3$—ZnO).

Meanwhile, a stacked structure of the EL device according to the present embodiment is not limited to the stacked structure of the quantum dot light emitting device 100. The EL element according to the present embodiment may have other well-known stacked structures. For example, in the quantum dot light emitting device 100, one or more of the hole injection layer 130, the hole transport layer 140, the electron transport layer 160, and the electron injection layer 170 may be omitted. Further, the quantum dot light emitting device 100 may further include another layer. In addition, in the quantum dot light emitting device 100, each layer may be formed in a multi-layer stacked structure.

For example, the quantum dot light emitting device 100 may further include a hole blocking layer between the hole transport layer 140 and the light emitting layer 150 in order to prevent the excitons or holes from diffusing in the electron transport layer 160.

The hole blocking layer may be formed using an oxadiazole derivative, a triazole derivative, or a phenanthroline derivative.

EXAMPLES

Hereinafter, examples of the present disclosure are described. However, the technical scope of the present disclosure is not limited to the following examples. In the following Examples, unless specifically described, each operation was performed at room temperature (25° C.). In addition, unless specifically stated, % and a part mean mass % and a part by mass, respectively.

Synthesis of Polymer Material (Polymer Compound)

Example 1

(Synthesis of Compound RM1-1)
Compound RM1-1 is synthesized according to the following reaction scheme.

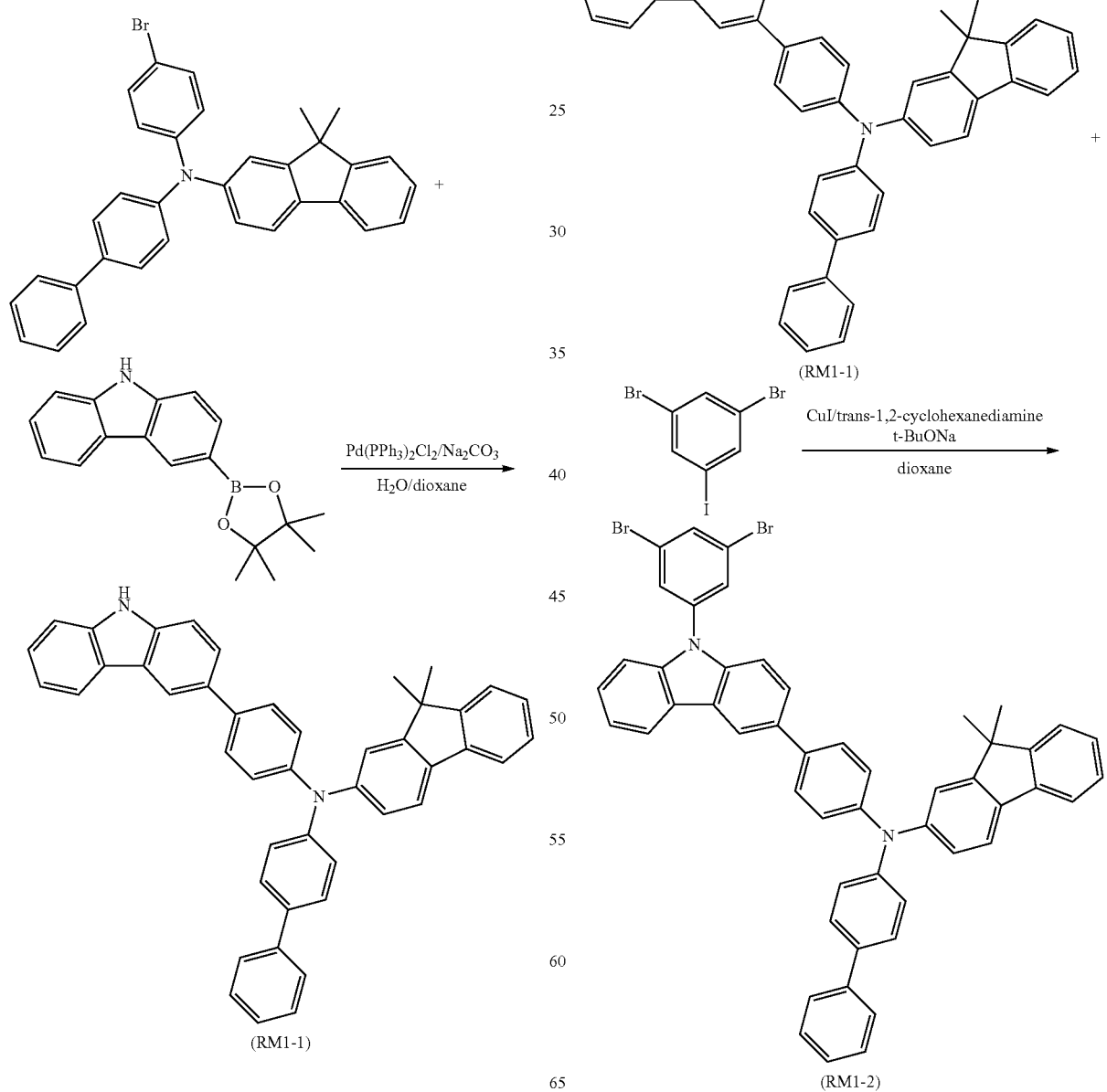

Specifically, under an argon atmosphere, 2-amino-N-[(1,1'-biphenyl)-4-yl]-N-(4-bromophenyl)-9,9-dimethyl fluorene (15.00 g, 29.04 mmol), 3-(4,4,5,5,-tetramethyl-1,3,2-dioxaborolan-2-yl) carbazole (7.66 g, 26.14 mmol), bis(triphenylphosphine) palladium (II) dichloride (0.41 g, 0.58 mmol), sodium carbonate (7.70 g, 72.61 mmol), dioxane (290 ml), and water (145 ml) are added in a reaction vessel, and then mixed. Then, the mixture is stirred at 85° C. for 4 hours, and after the reaction is completed, the mixed reaction solution is allowed to cool to room temperature. Then, the mixed reaction solution is filtered using CELITE, and impurities are filtered off. Then, the solvent is distilled off from the filtrate, and then purified by column chromatography to obtain Compound RM1-1 (12.7 g).

(Synthesis of Compound RM1-2)
Compound RM1-2 is synthesized according to the following reaction scheme.

Specifically, under an argon atmosphere, Compound RM1-1 (7.00 g, 11.6 mmol), 1,3-dibromo-5-iodo benzene (4.62 g, 12.77 mmol), copper iodide (I) (0.11 g, 0.58 mmol), trans-1,2-cyclohexanediamine (0.29 g, 2.55 mmol), sodium tert-butoxide (2.23 g, 23.23 mmol), and dioxane (35 ml) are added in a reaction vessel, and then mixed. Then, the mixture is stirred at 90° C. for 6 hours, and after the reaction is completed, the reaction mixture is allowed to cool to room temperature. Then, the mixed reaction solution is filtered using CELITE, and impurities are filtered off. Then, the solvent is distilled off from the filtrate, and then purified by column chromatography to obtain Compound RM1-2 (6 g).

(Synthesis of Compound RM1-3)

Compound RM1-3 is synthesized according to the following reaction scheme.

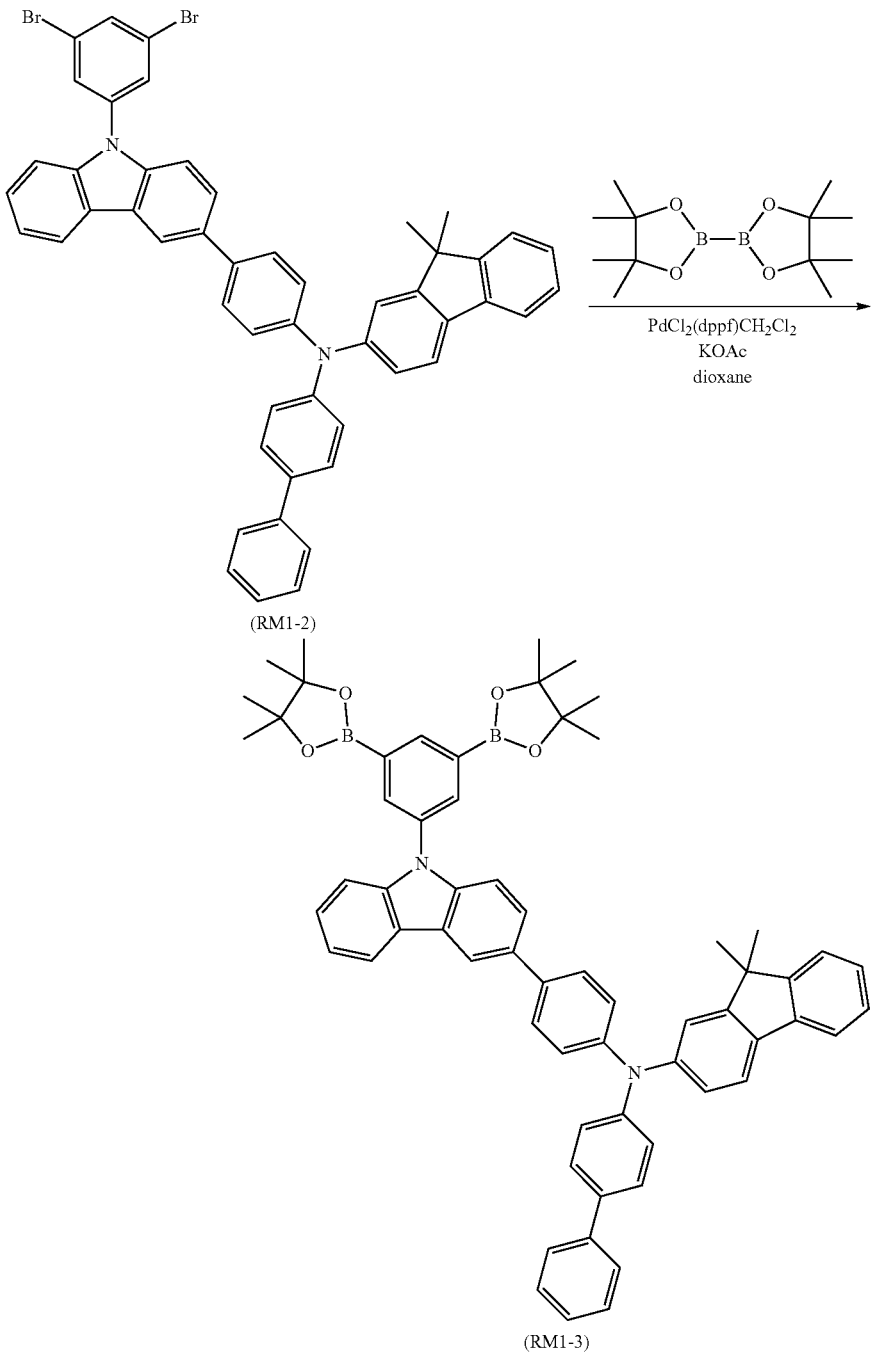

Specifically, under an argon atmosphere, Compound RM1-2 (4.00 g, 4.78 mmol), bis(pinacolato)diboron (3.64 g, 14.34 mmol), potassium acetate (2.82 g, 28.69 mmol), [bis(diphenyl phosphino)ferrocene]dichloro palladium (0.11 g, 0.13 mmol), and dioxane (50 ml) are added in a reaction vessel, and then mixed. Then, the mixture is stirred at 90° C. for 6 hours, and after the reaction is completed, the reaction mixture is allowed to cool to room temperature. Then, the mixed reaction solution is filtered using CELITE, and impurities are filtered off. Then, the solvent is distilled off from the filtrate, and then purified by column chromatography to obtain Compound RM1-3 (3 g).

(Synthesis of Polymer Compound A-1)

1,3-dibromo-5-tetradecylbenzene (0.869 g), RM1-3 (2.00 g), palladium acetate (4.8 mg), tris(2-methoxy phenyl)phosphine (45.4 mg), toluene (55 mL), and a 20 mass % tetraethyl ammonium hydroxide aqueous solution (6.33 g) are put in a reaction vessel under an argon atmosphere and then, refluxed for 6 hours. Subsequently, phenyl boronic acid (0.023 g), palladium acetate (4.3 mg), tris(2-methoxy phenyl)phosphine (27.0 mg), and a 20 mass % tetraethyl ammonium hydroxide aqueous solution (6.33 g) are added thereto, and then, the obtained mixed solution is heated and refluxed for 3 hours. Then, N,N-sodium diethyldithiocarbamate trihydrate (5.0 g) and ion exchange water (50 mL) are added to the obtained mixed solution except for a water layer and then, stirred at 85° C. for 3 hours. An organic layer is separated from the water layer and then, washed with water, a 3 mass % acetic acid aqueous solution, and water. The organic layer is added dropwise in methanol to precipitate a polymer compound, and the compound is filtered and dried to obtain a solid. This solid is dissolved in toluene and passed through column chromatography filled with silica gel/alumina, and the solvent is distilled off under a reduced pressure. The obtained liquid is added dropwise in methanol to precipitate a solid, and the solid is filtered and dried to obtain Polymer Compound A-1 (0.50 g). The number average molecular weight and polydispersity of the obtained polymer compound measured by SEC are respectively Mn=6,000 and Mw/Mn is 1.77.

Polymer Compound A-1 is presumed to be a polymer compound having the following repeating units and a mole ratio of the structural unit of X:the structural unit of Y=1:1 from the preparation ratio of the monomers, and including the structural unit of X and the structural unit of Y which are alternately polymerized.

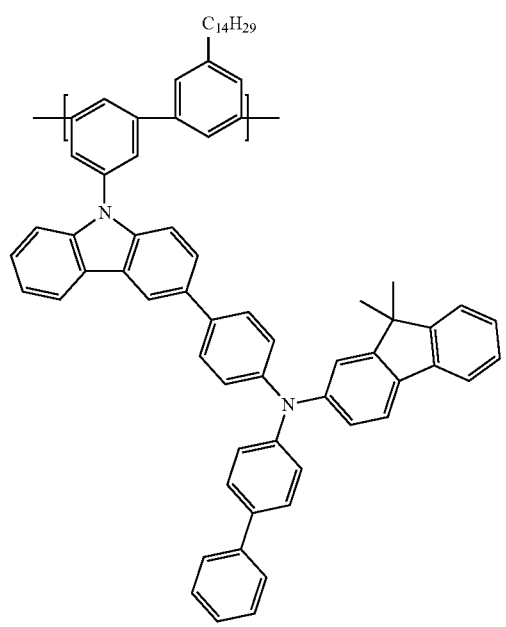

(A-1)

Example 2

(Synthesis of Polymer Compound A-2)

Subsequently, the same polymerization as in Example 1 is performed except that 1,3-dibromo benzene is used instead of the 1,3-dibromo-5-tetradecylbenzene, to obtain Polymer Compound A-2 (0.60 g).

The number average molecular weight and polydispersity of the obtained polymer compound measured by SEC are respectively Mn=16,000, and Mw/Mn is 1.8.

Polymer Compound A-2 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

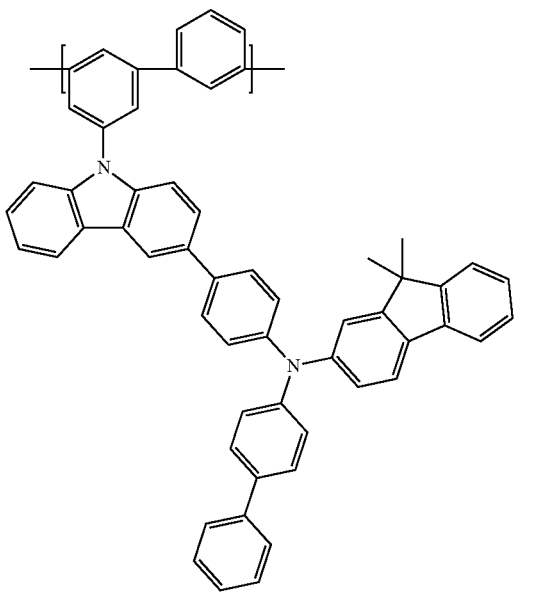

(A-2)

Example 3

Synthesis of Polymer Compound A-3

Subsequently, the same polymerization as in Example 1 is performed except that 2,5-dibromo-3-dodecyl thiophene is used instead of the 1,3-dibromo-5-tetradecylbenzene, to obtain Polymer Compound A-3 (0.45 g).

The number average molecular weight and polydispersity of the obtained polymer compound measured by SEC are respectively Mn=8,500, and Mw/Mn is 1.48.

Polymer Compound A-3 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

(A-3)

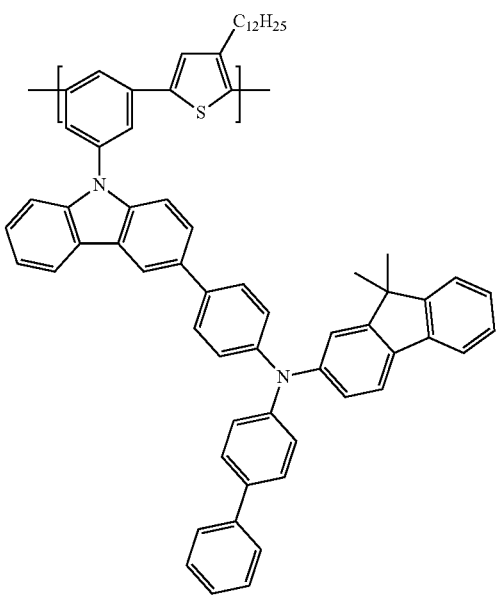

Example 4

(Synthesis of Polymer Compound A-4)

Subsequently, the same polymerization as in Example 1 is performed except that 2,5-dibromo-3,4-ethylenedioxythiophene is used instead of the 1,3-dibromo-5-tetradecylbenzene, to obtain Polymer Compound A-4 (0.42 g).

When the number average molecular weight and polydispersity of the obtained polymer compound are measured by SEC, Mn is 6,000 and Mw/Mn is 1.4.

Polymer Compound A-4 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

(A-4)

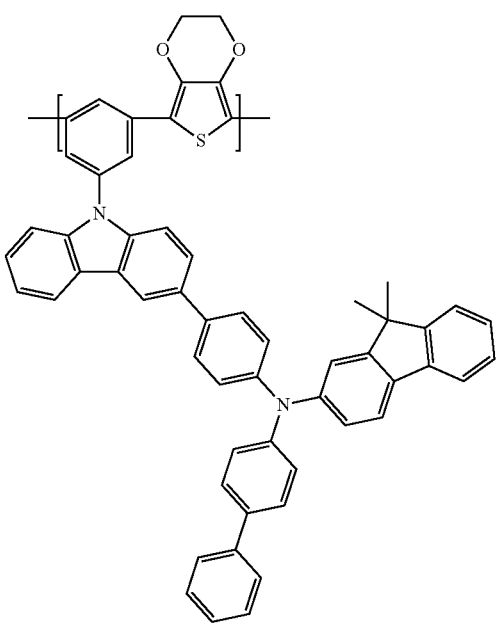

Example 5

(Synthesis of Comonomer-2)

Comonomer-2 is synthesized according to the following reaction scheme.

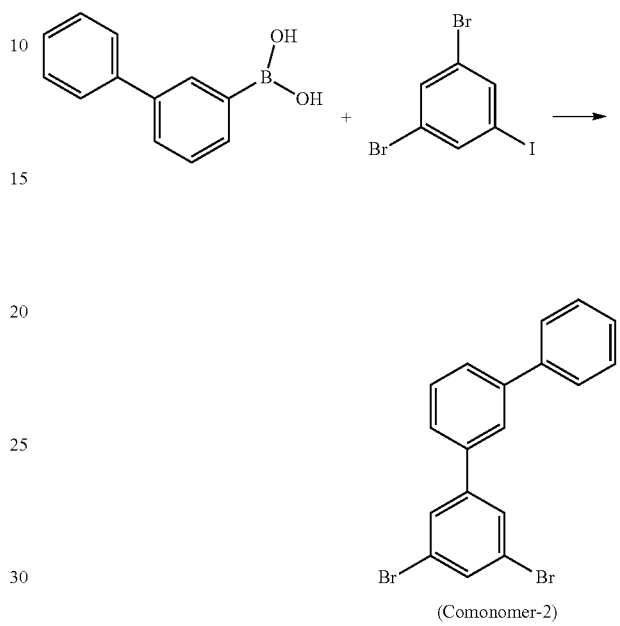

(Comonomer-2)

Specifically, 3-biphenyl boronic acid (10.0 g, 50.5 mmol), 1,3-dibromo-5-iodo benzene (18.3 g, 50.5 mmol), bis(triphenyl phosphine) palladium (II) dichloride (0.248 g, 0.353 mmol), sodium carbonate (2.24 g, 21.1 mmol), dioxane (40 ml), and water (20 ml) are added and mixed in a reaction vessel under an argon atmosphere. Then, the mixture is stirred at 85° C. for 4 hours, and after the reaction is completed, the mixed reaction solution is allowed to cool down to room temperature. Then, the mixed reaction solution is filtered by using CELITE, and impurities are filtered off. After distilling the solvent off, the filtrate is purified by column chromatography to obtain Comonomer-2 (12.7 g).

(Synthesis of Polymer Compound A-5)

Subsequently, the same polymerization as in Example 1 is performed except that Comonomer-2 is used instead of the 1,3-dibromo-5-tetradecylbenzene, to obtain Polymer Compound A-5 (0.77 g).

When the number average molecular weight and polydispersity of the obtained polymer compound are measured by SEC, Mn is 5,500 and Mw/Mn is 1.42.

Polymer Compound A-5 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

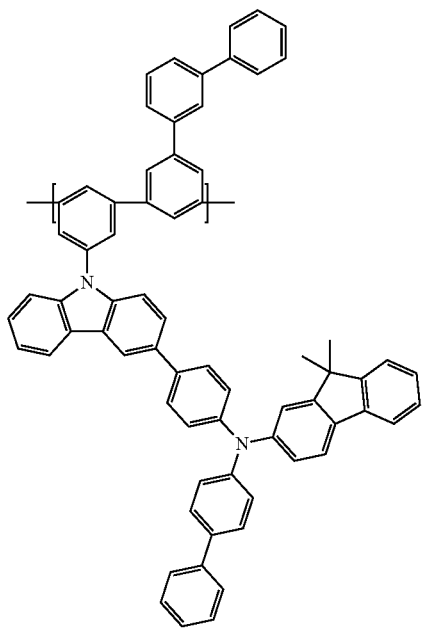

(A-5)

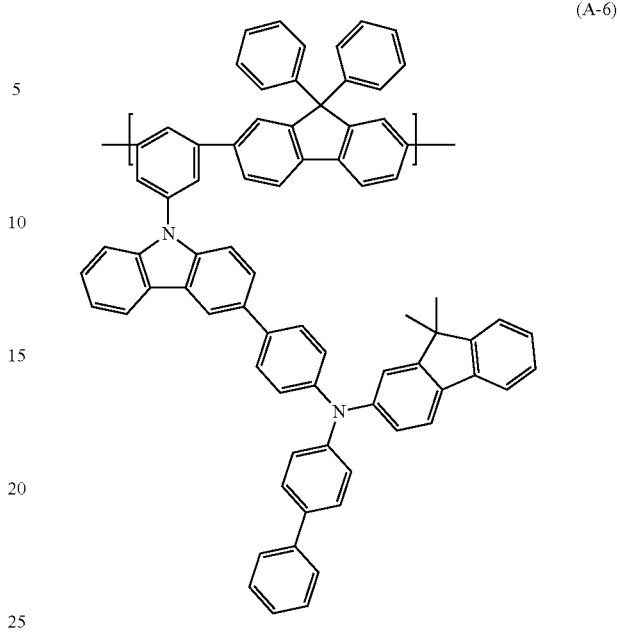

(A-6)

Example 6

(Synthesis of Polymer Compound A-6)

Subsequently, the same polymerization as in Example 1 is performed except that 2,7-dibromo-9,9-diphenyl fluorene is used instead of the 1,3-dibromo-5-tetradecylbenzene, to obtain Polymer Compound A-6 (0.19 g).

When the number average molecular weight and polydispersity of the obtained polymer compound are measured by SEC, Mn is 10,000 and Mw/Mn is 1.72.

Polymer Compound A-6 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

Example 7

(Synthesis of Comonomer-1)

Comonomer-1 is synthesized according to the following reaction scheme.

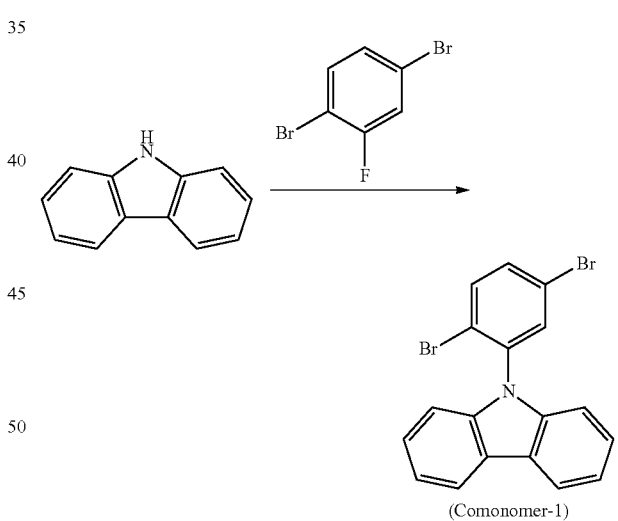

(Comonomer-1)

Specifically, carbazole (15.0 g, 89.7 mmol), 1,4-dibromo-2-fluorobenzene (25.1 g, 98.7 mmol), sodium hydride (2.05 g, 85.2 mmol), and NMP (10 ml) are added and then, mixed in a reaction vessel under an argon atmosphere. Then, the mixture is stirred at 120° C. for 2 hours, and after the reaction is completed, the mixed reaction solution is cooled to room temperature. Then, 50 mL of water and 50 mL of toluene are added to wash an organic layer. After 3 times repeating this, magnesium sulfate is added to the organic layer, followed by filtration separation. After distilling off the solvent, the filtrate was purified by column chromatography to obtain Comonomer-1 (21.5 g).

(Synthesis of Polymer Compound A-7)

Subsequently, the same polymerization as in Example 1 is performed except that Comonomer-1 is used instead of the 1,3-dibromo-5-tetradecylbenzene, to obtain Polymer Compound A-7 (1.00 g).

When the number average molecular weight and polydispersity of the obtained polymer compound are measured by SEC, Mn is 6,700 and Mw/Mn is 1.54.

Polymer Compound A-7 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

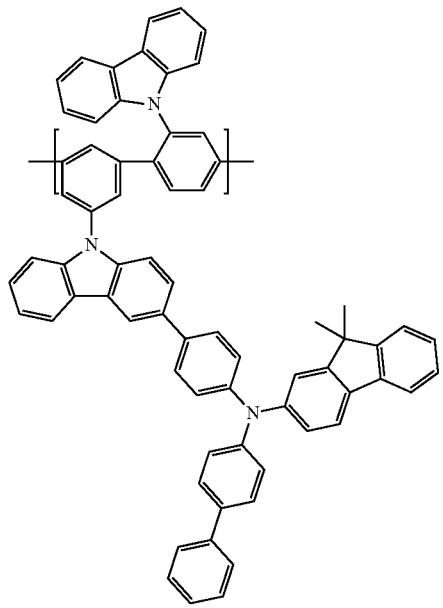

(A-7)

Example 8

(Synthesis of Polymer Compound A-8)

The same polymerization as in Example 1 is performed except that the following compound is used instead of the 1,3-dibromo-5-tetradecylbenzene, and Compound RM1-2 is used instead of Compound RM1-3, to obtain Polymer Compound A-8 (1.20 g).

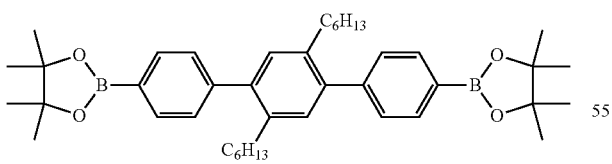

When the number average molecular weight and polydispersity of the obtained polymer compound are measured by SEC, Mn is 136,000 and Mw/Mn is 3.20.

Polymer Compound A-8 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

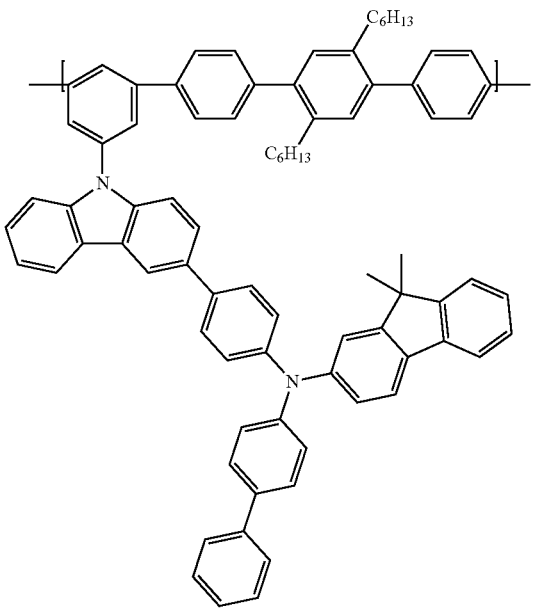

(A-8)

Example 9

(Synthesis of Polymer Compound A-9)

The same polymerization as in Example 1 is performed except that 2,7-dibromo naphthalene is used instead of the 1,3-dibromo-5-tetradecylbenzene, to obtain Polymer Compound A-9 (0.78 g).

When the number average molecular weight and polydispersity of the obtained polymer compound are measured by SEC, Mn is 20,100 and Mw/Mn is 1.93.

Polymer Compound A-9 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

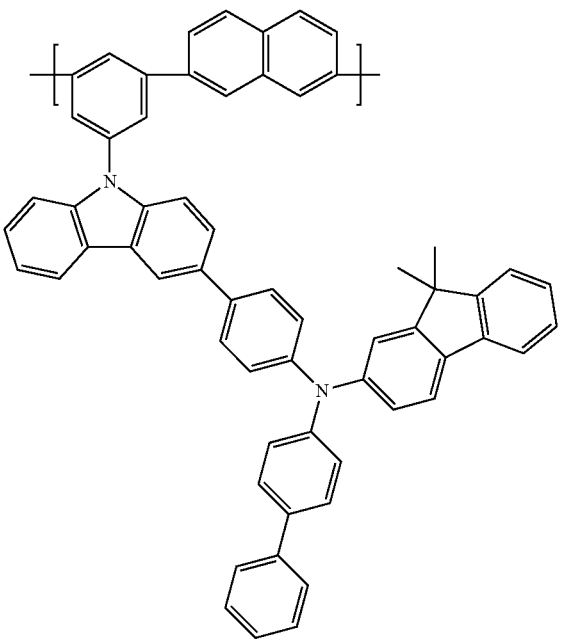

(A-9)

Example 10

(Synthesis of Polymer Compound A-10)

The same polymerization as in Example 1 is performed except that the following compound is used instead of the 1,3-dibromo-5-tetradecylbenzene, to obtain Polymer Compound A-10 (0.35 g).

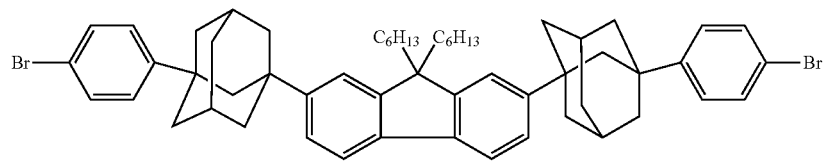

When the number average molecular weight and polydispersity of the obtained polymer compound are measured by SEC, Mn is 15,400 and Mw/Mn is 2.77.

Polymer Compound A-10 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

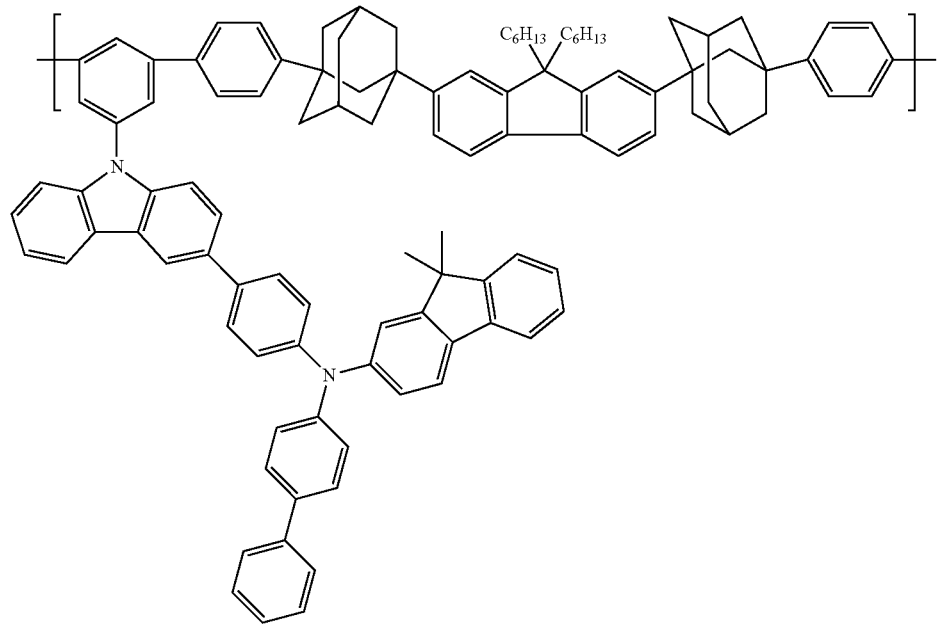

(A-10)

Example 11

(Synthesis of Comonomer-3)

Comonomer-3 is synthesized according to the following reaction scheme.

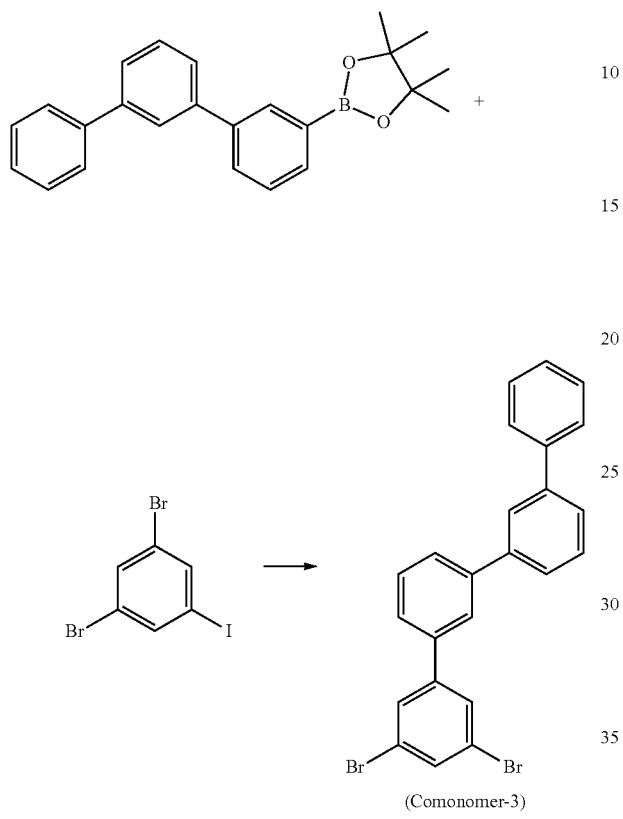

(Comonomer-3)

Specifically 2-((1,1'-3'1-terphenyl boron 3-yl)4,4,5,5-tetramethyl 1,3,2-dioxaborolane) (7.00 g, 19.6 mmol), 1-iodo-3,5-dibromo benzene (7.11 g, 19.6 mmol), [bis(diphenyl phosphino)ferrocene]dichloro palladium (0.138 g, 0.196 mmol), sodium carbonate (6.25 g, 58.9 mmol), dioxane (70 ml), and water (40 ml) are added in a reaction vessel under an argon atmosphere and then, mixed. Then, the mixture is stirred at 85° C. for 4 hours, and after the reaction is completed, the mixed reaction solution is allowed to cool to room temperature. Then, the mixed reaction solution is filtered by using CELITE, and impurities are filtered off. After distilling the solvent off, the filtrate is purified by column chromatography to obtain Comonomer-3 (5.80 g).

(Synthesis of Polymer Compound A-11)

Subsequently, the same polymerization as in Example 1 is performed except that Comonomer-3 is used instead of the 1,3-dibromo-5-tetradecylbenzene, to obtain Polymer Compound A-11 (0.38 g).

When the number average molecular weight and polydispersity of the obtained polymer compound are measured by SEC, Mn is 10,000 and Mw/Mn is 1.57.

Polymer Compound A-11 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

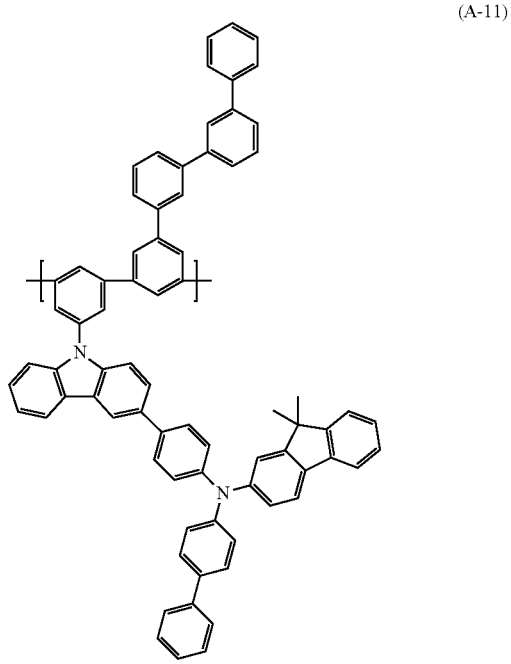

(A-11)

Example 12

(Synthesis of Polymer Compound A-12)

The same polymerization as in Example 1 is performed except that 1,3-dibromo-5-hexylbenzene is used instead of the 1,3-dibromo-5-tetradecylbenzene, to obtain Polymer Compound A-12 (0.40 g).

When the number average molecular weight and polydispersity of the obtained polymer compound are measured by SEC, Mn is 22,000 and Mw/Mn is 1.34.

Polymer Compound A-12 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

(A-12)

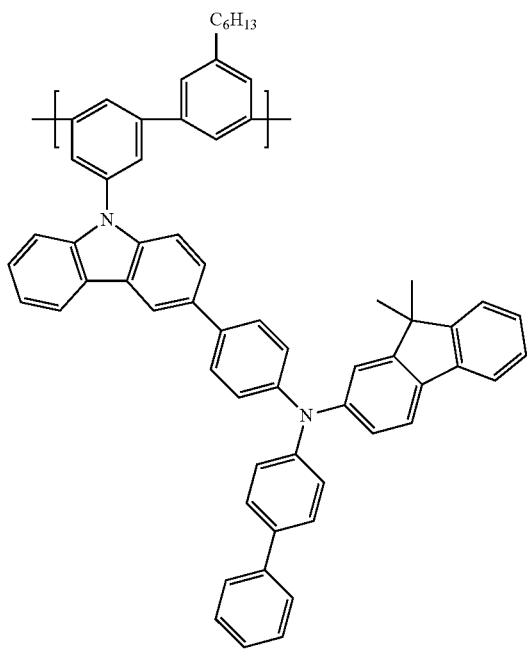

(A-13)

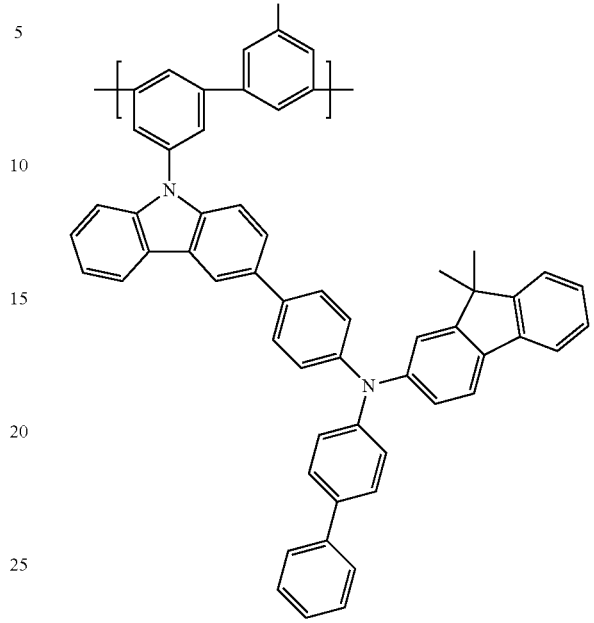

Example 13

(Synthesis of Polymer Compound A-13)

The same polymerization as in Example 1 is performed except that 1,3-dibromo-5-octyl benzene is used instead of the 1,3-dibromo-5-tetradecylbenzene, to obtain Polymer Compound A-13 (0.45 g).

When the number average molecular weight and polydispersity of the obtained polymer compound are measured by SEC, Mn is 23,000 and Mw/Mn is 1.67.

Polymer Compound A-13 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

Example 14

(Synthesis of Polymer Compound A-14)

The same polymerization as in Example 1 is performed except that 1,4-dibromo-2,5-didodecylbenzene is used instead of the 1,3-dibromo-5-tetradecylbenzene, to obtain Polymer Compound A-14 (0.82 g).

When the number average molecular weight and polydispersity of the obtained polymer compound are measured by SEC, Mn is 19,000 and Mw/Mn is 1.65.

Polymer Compound A-14 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

(A-14)

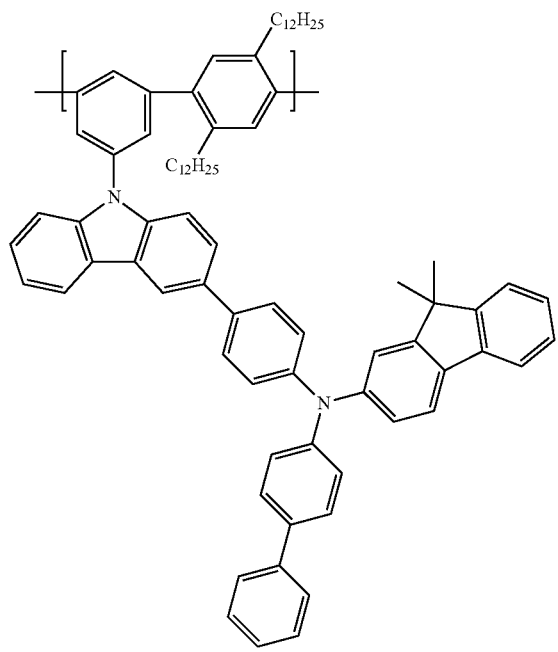

Example 15

(Synthesis of compound RM15-1)
Compound RM15-1 is synthesized according to the following reaction scheme.

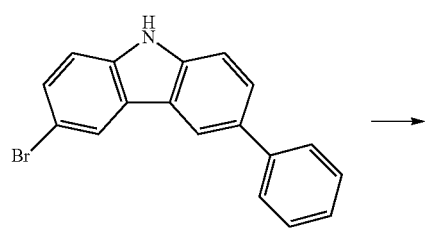 →

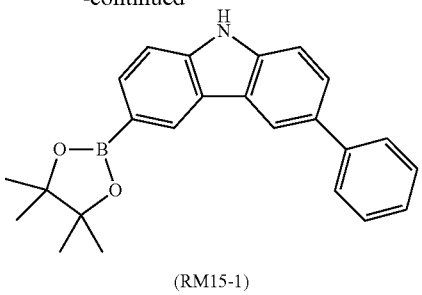

(RM15-1)

Specifically, 3-bromo-6-phenyl-9H-carbazole (10.0 g, 31.0 mmol), bis(pinacolato)diboron (10.2 g, 40.3 mmol), potassium acetate (19.7 g, 186 mmol), [bis(diphenyl phosphino)ferrocene]dichloro palladium (0.218 g, 0.310 mmol), and DMF (30 ml) are added in a reaction vessel under an argon atmosphere and then, mixed. Then, the mixture is stirred at 90° C. for 6 hours, and after the reaction is completed, the mixed reaction solution is cooled down to room temperature. Then, 200 mL of toluene is added, and then 300 mL of water is added to wash the organic layer. After repeating this 3 times, magnesium sulfate is added to the organic layer, followed by filtration separation. After distilling off the solvent is distilled off, the filtrate is purified by column chromatography to obtain Compound RM15-1 (10.2 g).

(Synthesis of Compound RM15-2)
Compound RM15-2 is synthesized according to the following reaction scheme.

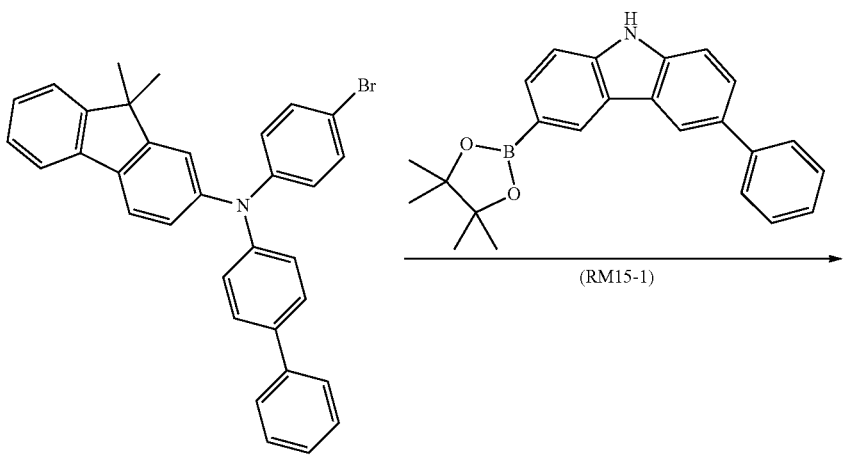

(RM15-1)

-continued

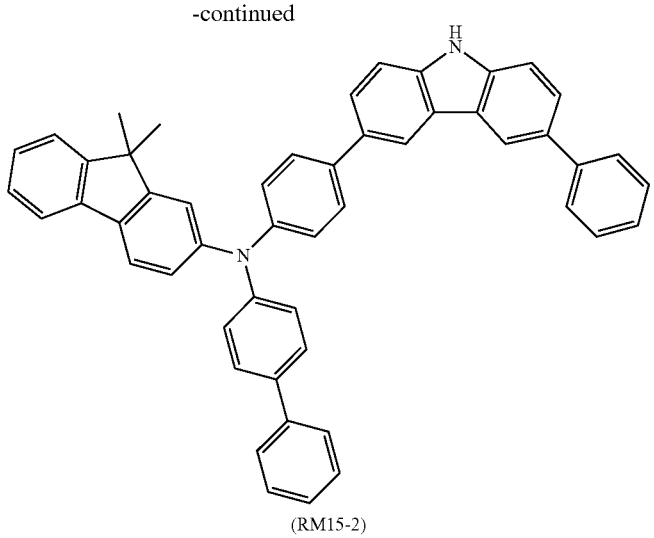
(RM15-2)

Specifically, 2-amino-N-[(1,1'-biphenyl)-4-yl]-N-(4-bromophenyl)-9,9-dimethyl fluorene (13.00 g, 25.2 mmol), Compound RM15-1 (9.76 g, 26.4 mmol), bis(triphenylphosphine)palladium (II) dichloride (0.177 g, 0.252 mmol), sodium carbonate (8.00 g, 75.5 mmol), dioxane (100 ml), and water (80 ml) are added in a reaction vessel under an argon atmosphere and then, mixed. Then, the mixture is stirred at 85° C. for 4 hours, and after the reaction is completed, the mixed reaction solution is allowed to cool to room temperature. Then, the mixed reaction solution is filtered by using CELITE, and impurities are filtered off. After distilling off the solvent, the filtrate is purified by column chromatography to obtain Compound RM15-2 (12.7 g).

(Synthesis of Compound RM15-3)

Compound RM15-3 is synthesized according to the following reaction scheme.

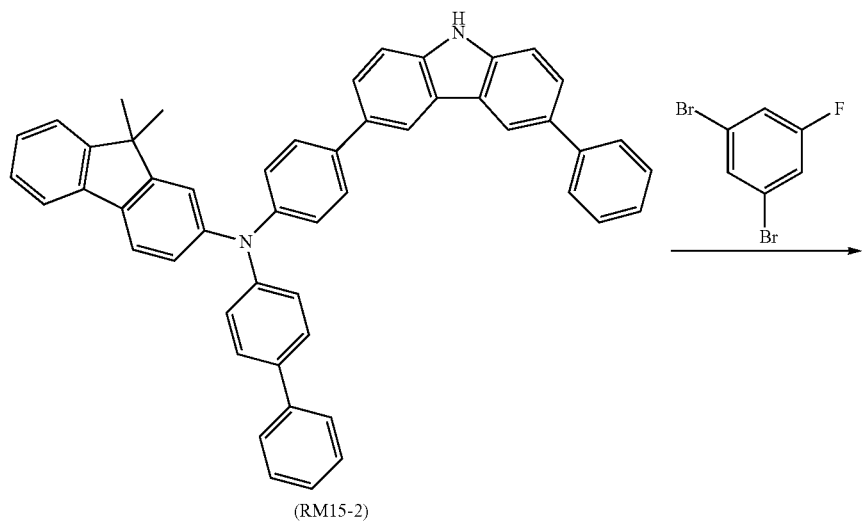
(RM15-2)

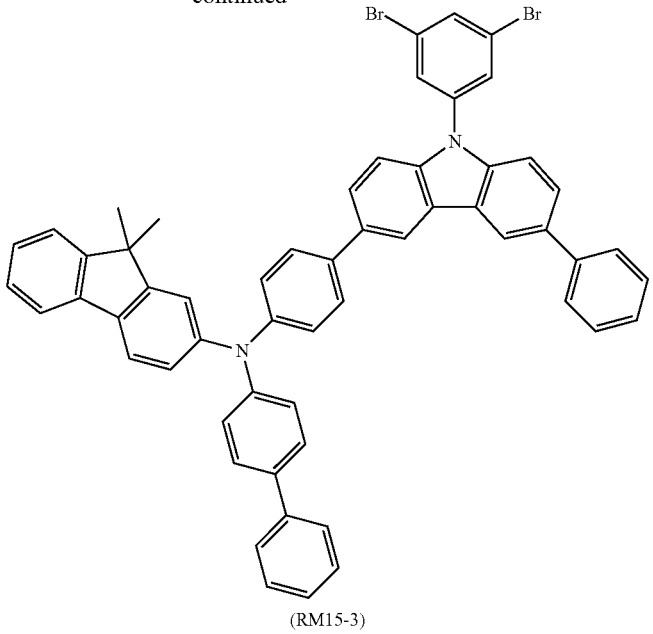

(RM15-3)

Specifically, Compound RM15-2 (4.70 g, 6.92 mmol), 1,3-dibromo-5-fluorobenzene (1.93 g, 7.61 mmol), sodium hydride (0.33 g, 13.8 mmol), and NMP (5 ml) are added in a reaction vessel under an argon atmosphere and then, mixed. Then, the mixture is stirred at 120° C. for 2 hours, and after the reaction is completed, the mixed reaction solution is cooled to room temperature. Then, 50 mL of water and 50 mL of toluene are added to wash the organic layer. After repeating this 3 times, magnesium sulfate is added to the organic layer, followed by filtration separation. After distilling off the solvent, the filtrate is purified by column chromatography to obtain Compound RM15-3 (4.19 g).

(Synthesis of Polymer Compound A-15)

Continuously, 2,2'-(2,5-dihexyl-1,4-phenylene)bis[4,4,5,5-tetramethyl-1,3,2-dioxaborolane] (0.644 g), Compound RM15-3 (1.500 g), palladium acetate (3.7 mg), tris(2-methoxy phenyl)phosphine (29.0 mg), toluene (30 mL), and a 20 mass % tetraethyl ammonium hydroxide aqueous solution (4.84 g) are put in a reaction vessel under an argon atmosphere and then, refluxed for 6 hours. Subsequently, phenyl boronic acid (0.100 g), palladium acetate (3.0 mg), tris(2-methoxy phenyl)phosphine (28.0 mg), and a 20 mass % tetraethylammonium hydroxide aqueous solution (4.84 g) are added to the obtained mixed solution and then, heated and refluxed for 3 hours. Then, N,N-sodium diethyldithio-carbamate trihydrate (5.00 g) and ion exchange water (45 mL) are added the obtained mixed solution except for a water layer, and then, stirred at 85° C. An organic layer is separated from the water layer and then, washed with water, a 3 mass % acetic acid aqueous solution, and water. The organic layer is added dropwise in methanol to precipitate a polymer compound, and the polymer compound is filtered and dried to obtain a solid. This solid is dissolved in toluene and passed through column chromatography filled with silica gel/alumina, and the solvent is distilled off under a reduced pressure. The obtained liquid is added dropwise to methanol, and the precipitates therefrom are filtered and dried to obtain Polymer Compound A-15 (0.55 g).

When the number average molecular weight and polydispersity of the obtained polymer compound are measured by SEC, Mn is 12,000 and Mw/Mn is 1.85.

Polymer Compound A-15 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

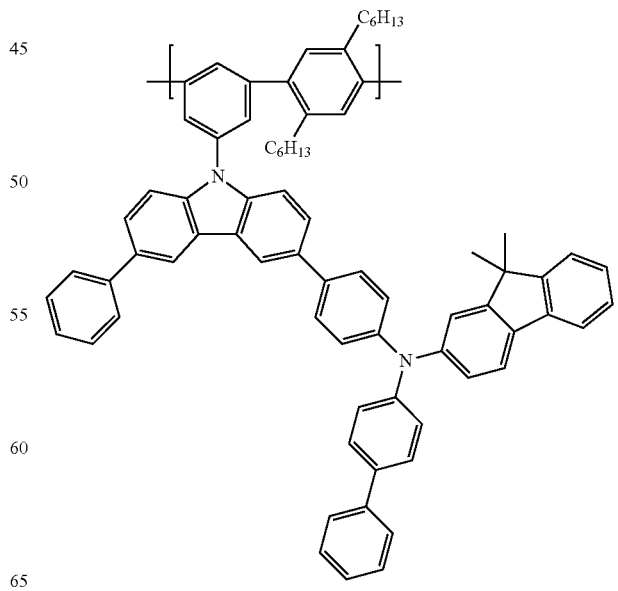

(A-15)

Example 16

(Synthesis of Polymer Compound A-16)

The same polymerization as in Example 15 is performed except that 2,2'-(9,9-dioctyl-9H-fluorene-2,7-diyl)bis (4,4,5,5-tetramethyl-1,3,2-dioxaborolane) is used instead of the 2,2'-(2,5-dihexyl-1,4-phenylene)bis[4,4,5,5-tetramethyl-1,3,2-dioxaborolane], to obtain Polymer Compound A-16 (0.82 g).

When the number average molecular weight and polydispersity of the obtained polymer compound are measured by SEC, Mn is 11,000 and Mw/Mn is 1.52.

Polymer Compound A-16 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

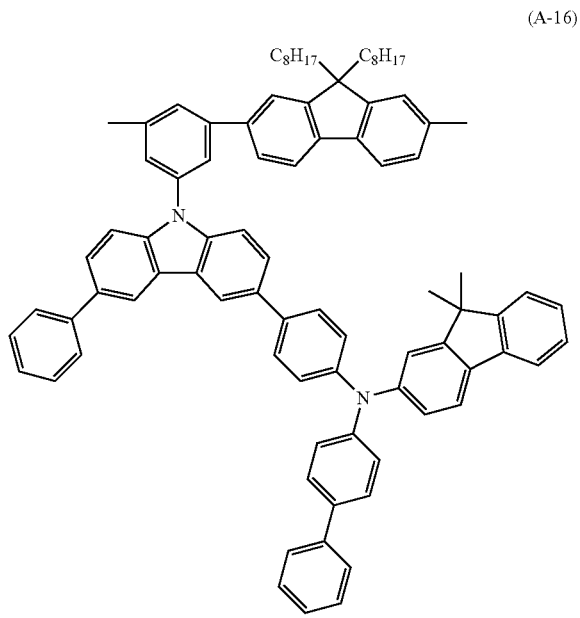

(A-16)

Example 17

(Synthesis of Compound RM17-1)

Comonomer RM17-1 is synthesized according to the following reaction scheme.

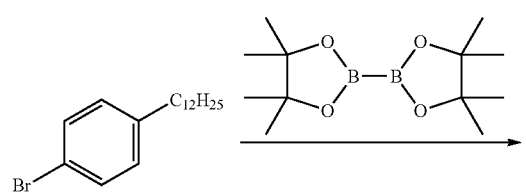

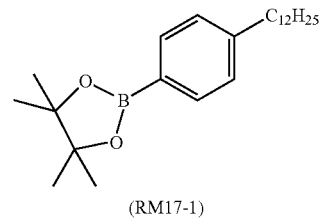

(RM17-1)

Specifically, under an argon atmosphere, 1-bromo-4-dodecyl benzene (50.0 g, 154 mmol), bis(pinacolato)diboron (46.8 g, 184 mmol), potassium acetate (45.3 g, 461 mmol), [bis(diphenyl phosphino)ferrocene]dichloro palladium (3.37 g, 4.61 mmol), and DMF (230 ml) are added in a reaction vessel and then, mixed. Then, the mixture is stirred at 90° C. for 6 hours, and after the reaction is completed, the mixed reaction solution is cooled to room temperature. Then, 200 mL of toluene and 300 mL of water is added to wash the organic layer. After repeating this 3 times, magnesium sulfate is added to the organic layer, followed by filtration separation. After distilling off the solvent, the filtrate is purified by column chromatography to obtain Compound RM17-1 (45.9 g).

(Synthesis of Compound RM17-2)

Compound RM17-2 is synthesized according to the following reaction scheme.

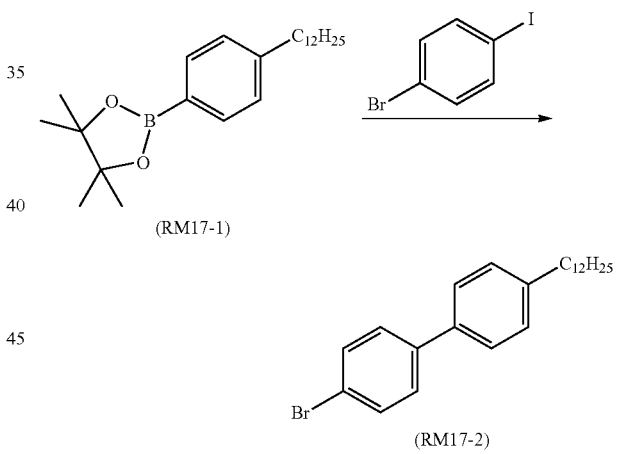

Specifically, under an argon atmosphere, Compound RM17-1 (40.0 g, 107 mmol), 1-iodine-4-bromo benzene (33.4 g, 118 mmol), [bis(diphenyl phosphino)ferrocene] dichloro palladium (1.57 g, 2.15 mmol), sodium carbonate (34.2 g, 322 mmol), dioxane (200 ml), and water (160 ml) are added in a reaction vessel and then, mixed. Then, the mixture is stirred at 85° C. for 3 hours, and after the reaction is completed, the mixed reaction solution is cooled to room temperature. Then, the mixed reaction solution is filtered by using CELITE, and impurities are filtered off. After distilling off the solvent, the filtrate is purified by column chromatography to obtain Compound RM17-2 (30.3 g).

(Synthesis of Compound RM17-3)

Compound RM17-3 is synthesized according to the following reaction scheme.

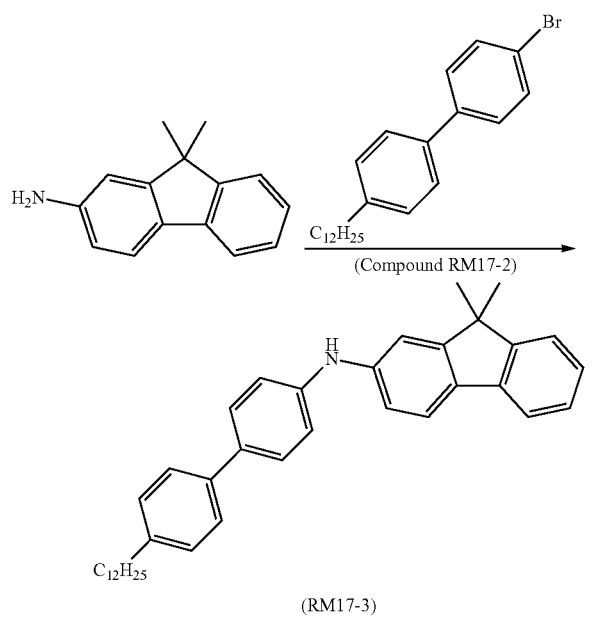

(Compound RM17-2)

(RM17-3)

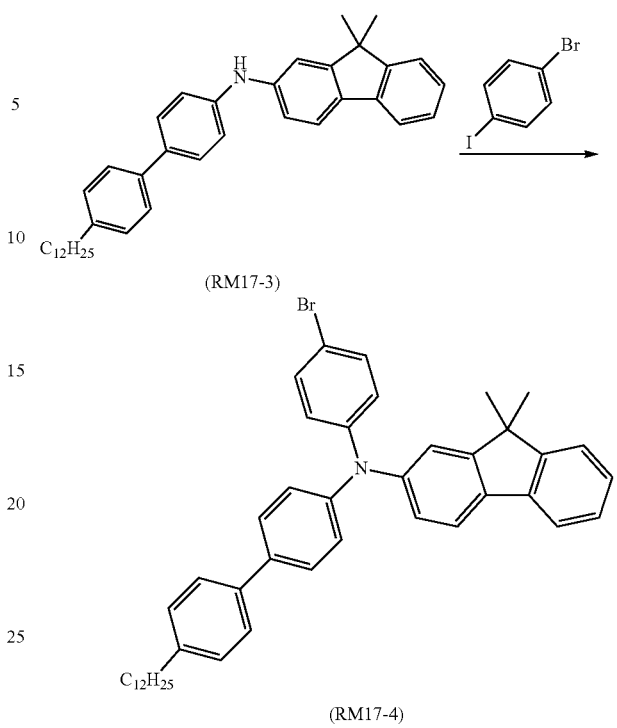

(RM17-3)

(RM17-4)

Specifically, under an argon atmosphere, 9,9-dimethyl-9H-fluorene-2-amine (15.0 g, 71.7 mmol), Compound RM17-2 (28.2 g, 70.2 mmol), [bis(diphenyl phosphino)ferrocene]dichloro palladium (1.05 g, 1.43 mmol), sodium tert-butoxide (20.0 g, 215 mmol), and toluene (150 ml) are added in a reaction vessel and then, mixed. Then, the mixture is stirred at 85° C. for 3 hours, and after the reaction is completed, the mixed reaction solution is cooled to room temperature. Then, the mixed reaction solution is filtered by using CELITE, and impurities are filtered off. After distilling off the solvent, the filtrate is purified by column chromatography to obtain Compound RM17-3 (22.7 g).

(Synthesis of Compound RM17-4)

Compound RM17-4 is synthesized according to the following reaction scheme.

Specifically, under an argon atmosphere, Compound RM17-3 (22.0 g, 41.5 mmol), 1-iodine-4-bromo benzene (12.9 g, 45.7 mmol), bis(triphenylphosphine)palladium(II) dichloride (0.668 g, 0.914 mmol), sodium tert-butoxide (12.0 g, 125 mmol), and toluene (150 ml) are added in a reaction vessel and then, mixed. Then, the mixture is stirred at 85° C. for 4 hours, and after the reaction is completed, the mixed reaction solution is allowed to cool to room temperature. Then, the mixed reaction solution is filtered by using CELITE, and impurities are filtered off. After distilling off the solvent, the filtrate is purified by column chromatography to obtain Compound RM17-4 (20.6 g).

(Synthesis of Compound RM17-5)

Compound RM17-5 is synthesized according to the following reaction scheme.

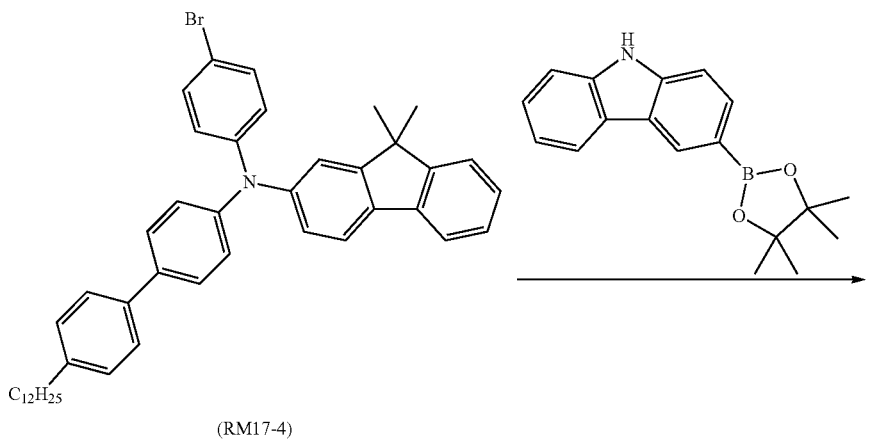

(RM17-4)

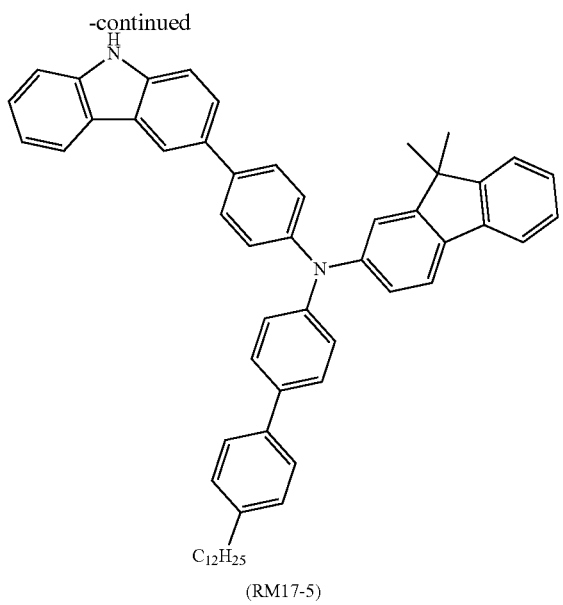

(RM17-5)

Specifically, under an argon atmosphere, Compound RM17-4 (20.0 g, 29.04 mmol), 3-(4,4,5,5,-tetramethyl-1,3,2-dioxaborolan-2-yl)carbazole (8.99 g, 30.7 mmol), bis(triphenylphosphine)palladium(II)dichloride (0.431 g, 0.613 mmol), sodium carbonate (9.28 g, 87.61 mmol), dioxane (260 ml), and water (110 ml) are added in a reaction vessel and then, mixed. Then, the mixture is stirred at 85° C. for 4 hours, and after the reaction is completed, the mixed reaction solution is allowed to cool to room temperature. Then, the mixed reaction solution is filtered by using CELITE, and impurities are filtered off. After distilling off the solvent, the filtrate is purified by column chromatography to obtain Compound RM17-5 (15.5 g).

(Synthesis of Compound RM17-6)

Compound RM17-6 is synthesized according to the following reaction scheme.

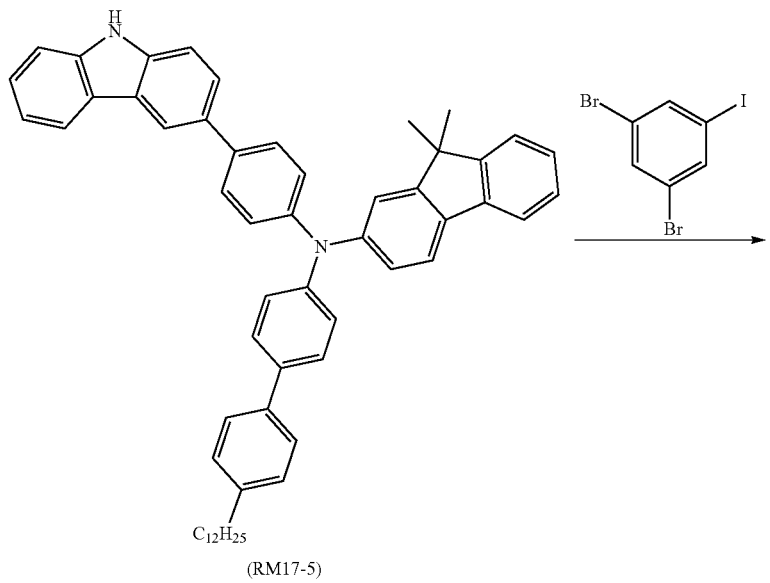

(RM17-5)

-continued

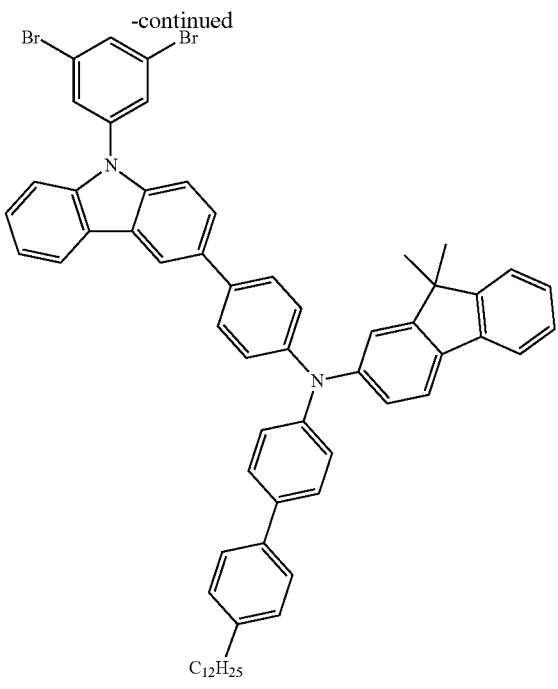

(RM17-6)

Specifically, under an argon atmosphere, Compound RM17-5 (12.0 g, 15.6 mmol), 1, 3-dibromo-5-iodo benzene (6.19 g, 17.1 mmol), copper (I) iodide (0.163 g, 0.856 mmol), trans-1,2-cyclohexanediamine (0.355 g, 3.11 mmol), sodium tert-butoxide (2.99 g, 31.1 mmol), and dioxane (70 ml) are added in a reaction vessel, and then mixed. Then, the mixture is stirred at 90° C. for 9 hours, and after the reaction is completed, the mixed reaction solution is allowed to cool to room temperature. Then, the mixed reaction solution is filtered by using CELITE, and impurities are filtered off. After distilling off the solvent, the filtrate is purified by column chromatography to obtain Compound RM17-6 (11.8 g).

(Synthesis of Polymer Compound A-17)

Continuously, 2,2'-(2,5-dihexyl-1,4-phenylene)bis[4,4,5,5-tetramethyl-1,3,2-dioxaborolane (0.992 g), Compound RM17-6 (2.000 g), palladium acetate (4.5 mg), tris(2-methoxy phenyl)phosphine (35.1 mg), toluene (50 mL), and a 20 mass % tetraethylammonium hydroxide aqueous solution (5.86 g) are put in a reaction vessel under an argon atmosphere and then, refluxed for 6 hours. Then, phenyl boronic acid (0.1 g), palladium acetate (4.5 mg), tris(2-methoxy phenyl)phosphine (35.1 mg), and a 20 mass % tetraethyl ammonium hydroxide aqueous solution (5.86 g) are added thereto and then, heated and refluxed for 3 hours. Subsequently, N,N-sodium diethyldithiocarbamate trihydrate (5.00 g) and ion exchange water (45 mL) are added to the obtained mixed solution except for a water layer and then, stirred at 85° C. for 3 hours. An organic layer is separated from the water layer and then, washed with water, a 3 mass % acetic acid aqueous solution, and water. The organic layer is added dropwise in methanol to precipitate a polymer compound, and the polymer compound is filtered and dried to obtain a solid. This solid is dissolved in toluene and passed through column chromatography filled with silica gel/alumina, and the solvent is distilled off under a reduced pressure. The obtained liquid is added dropwise in methanol, and precipitates therefrom are filtered and dried to obtain Polymer Compound A-17 (0.32 g).

When the number average molecular weight and polydispersity of the obtained polymer compound are measured by SEC, Mn is 38,000 and Mw/Mn is 1.35.

Polymer Compound A-17 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

(A-17)

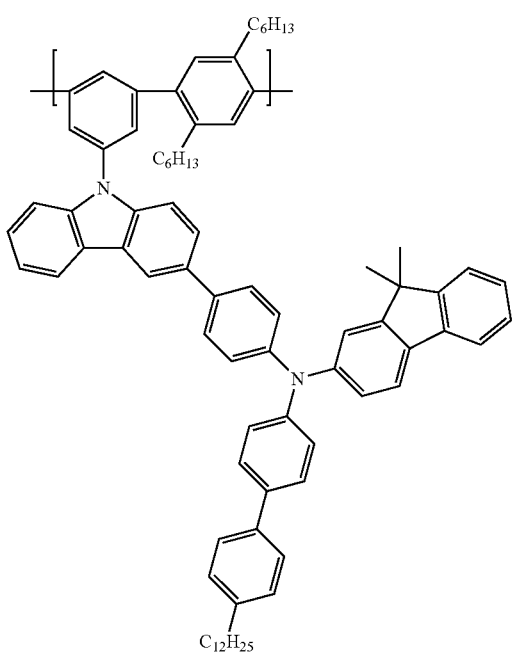

Example 18

(Synthesis of Polymer Compound A-18)

The same polymerization as in the synthesis of Polymer Compound A-17 of Example 17 is performed except that 2,2'-(9,9-dioctyl-9H-fluorene-2,7-diyl)bis(4,4,5,5-tetramethyl-1,3,2-dioxaborolane) is used instead of the 2,2'-(2,5-dihexyl-1,4-phenylene)bis[4,4,5,5-tetramethyl-1,3,2-dioxaborolane], to obtain Polymer Compound A-18 (0.96 g).

When the number average molecular weight and polydispersity of the obtained polymer compound are measured by SEC, Mn is 46,000 and Mw/Mn is 2.12.

Polymer Compound A-18 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

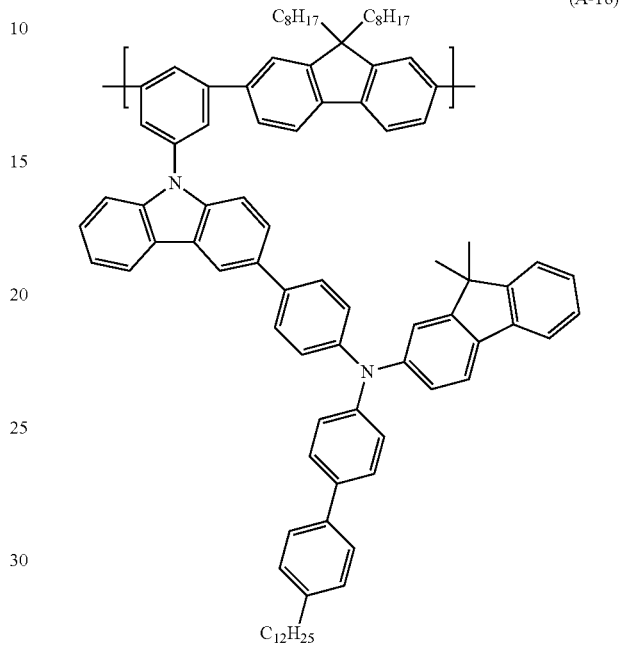
(A-18)

Example 19

(Synthesis of Compound RM19-1)

Compound RM19-1 is synthesized according to the following reaction scheme.

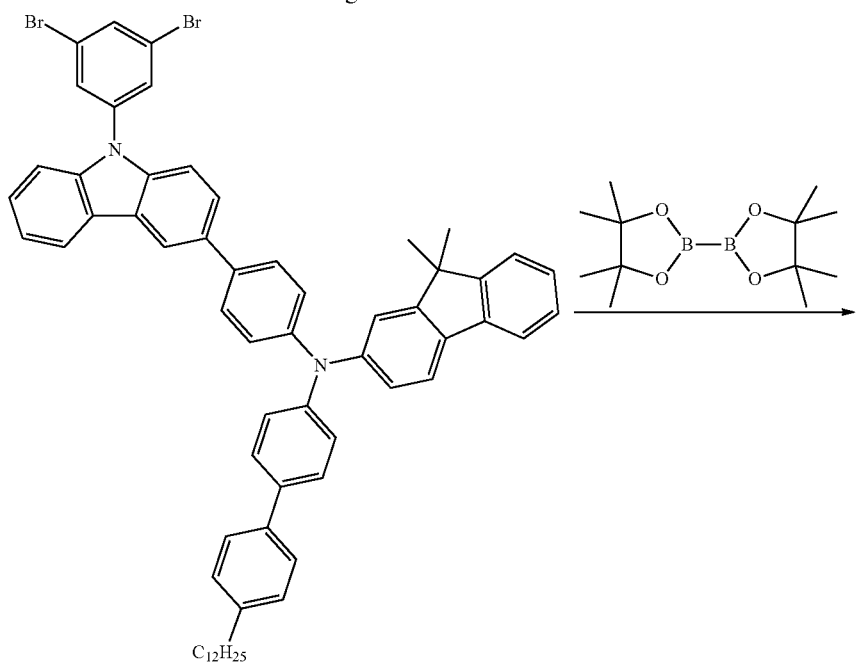
(RM17-6)

-continued

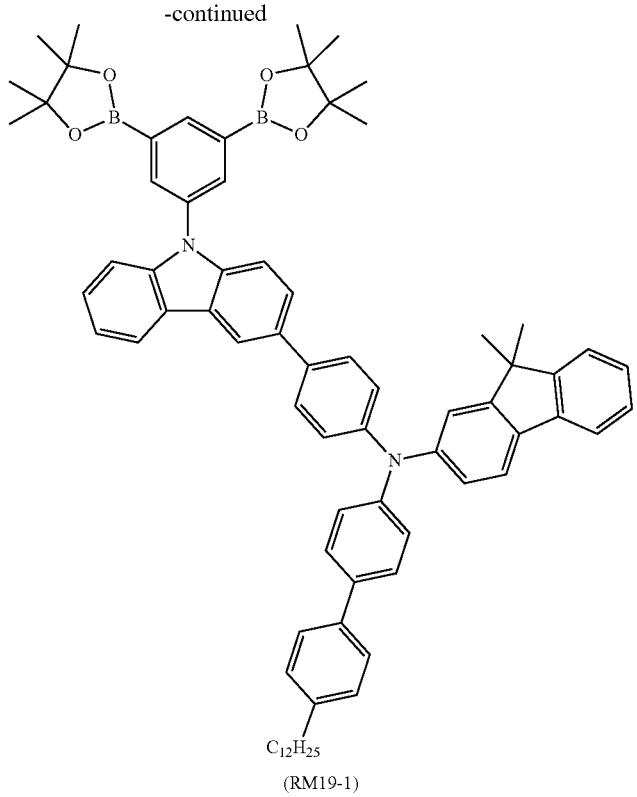

(RM19-1)

Specifically, under an argon atmosphere, Compound RM17-6 (4.00 g, 3.98 mmol), bis(pinacolato)diboron (3.03 g, 11.9 mmol), potassium acetate (2.34 g, 23.9 mmol), [bis(diphenyl phosphino)ferrocene]dichloropalladium dichloromethane (91.0 mg, 0.111 mmol), and dioxane (50 ml) are added in a reaction vessel and then, mixed. Then, the mixture is stirred at 90° C. for 6 hours, and after the reaction is completed, the mixed reaction solution is cooled to room temperature. Then, the mixed reaction solution is filtered by using CELITE, and impurities are filtered off. After distilling off the solvent, the filtrate is purified by column chromatography to obtain Compound RM19-1 (3.62 g).

(Synthesis of Polymer Compound A-19)

Subsequently, the same polymerization as in the synthesis of Polymer Compound A-17 of Example 17 is performed except that Compound RM19-1 is used instead of Compound RM17-6, and 1,3-dibromo-5-dodecylbenzene is used instead of the 2,2'-(2,5-dihexyl-1,4-phenylene)bis[4,4,5,5-tetramethyl-1,3,2-dioxaneborolane], to obtain Polymer Compound A-19 (0.38 g).

When the number average molecular weight and polydispersity of the obtained polymer compound are measured by SEC, Mn is 17,000 and Mw/Mn is 1.56.

Polymer Compound A-19 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

(A-19)

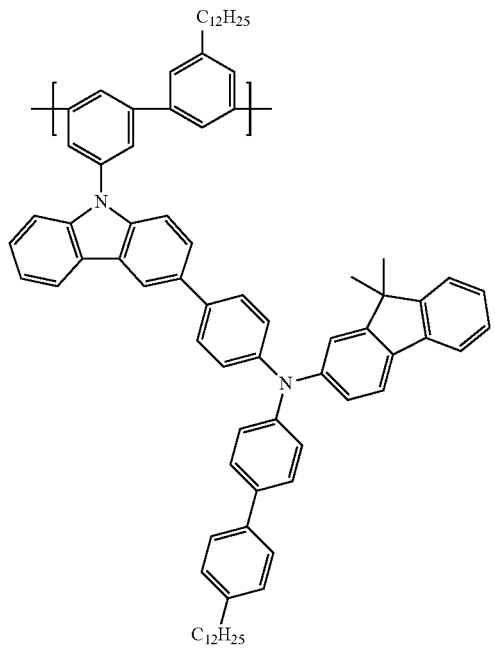

Example 20

(Synthesis of Compound RM20-1)

Compound RM20-1 is synthesized according to the following reaction scheme.

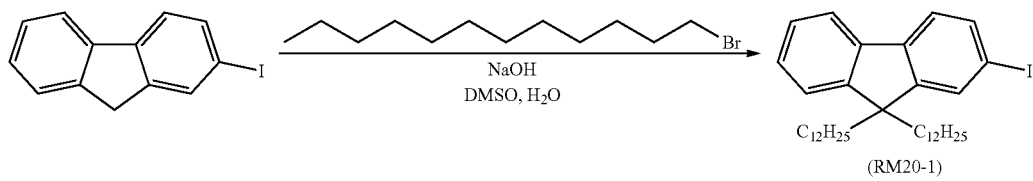

(RM20-1)

Specifically, 2-iodo fluorene (50.0 g, 171.1 mmol), sodium hydroxide (36.2 g, 377.6 mmol), dimethyl sulfoxide (263 ml), and pure water (33 ml) are put in a reaction vessel under an argon atmosphere and then, cooled down to 0° C. 1-bromododecane (108.8 g, 436.5 mmol) is added dropwise thereto, and the obtained mixture is stirred at room temperature. After the reaction is completed, the mixed reaction solution is allowed to cool to room temperature, and impurities are filtered by using CELITE. After distilling off the solvent, it is purified by column chromatography to obtain Compound RM20-1 (100.5 g, a yield: 93%).

(Synthesis of Compound RM20-2)

Compound RM20-2 is synthesized according to the following reaction scheme.

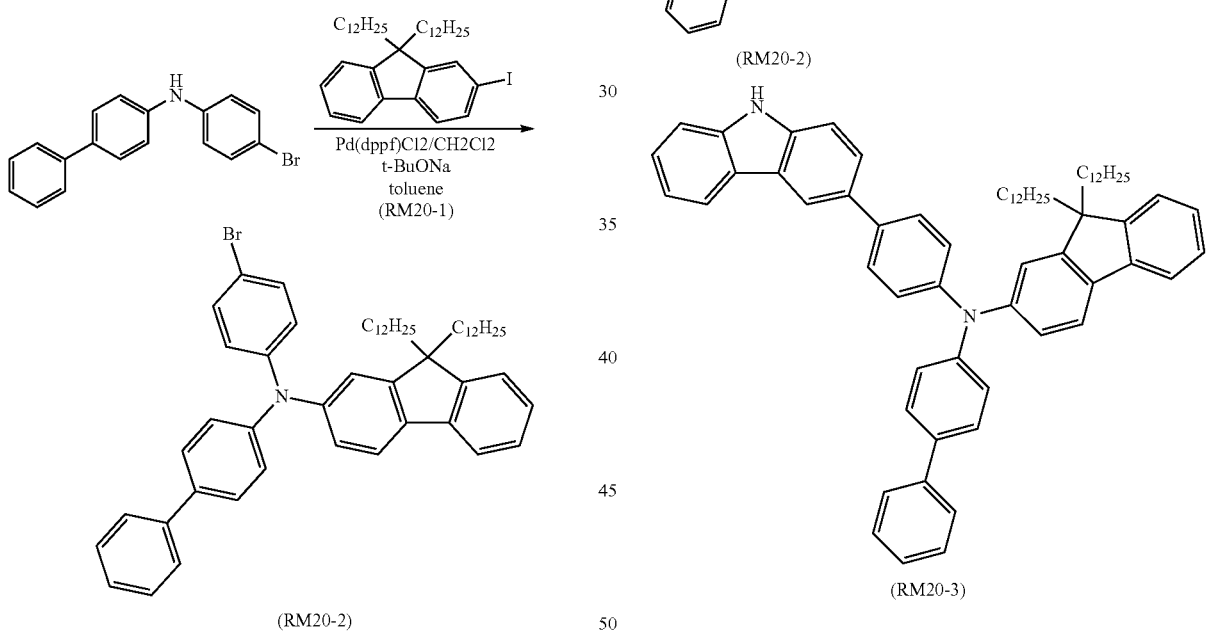

(RM20-2)

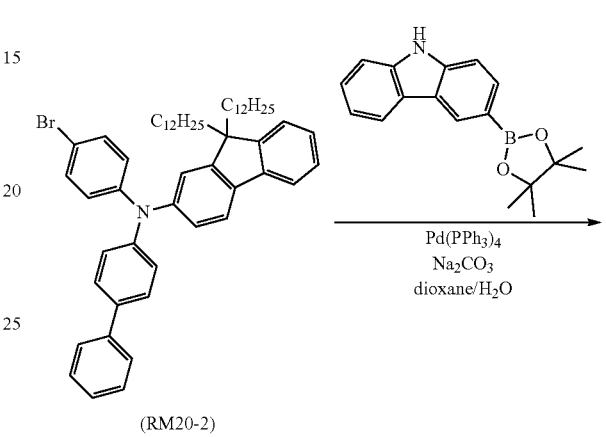

(RM20-2)

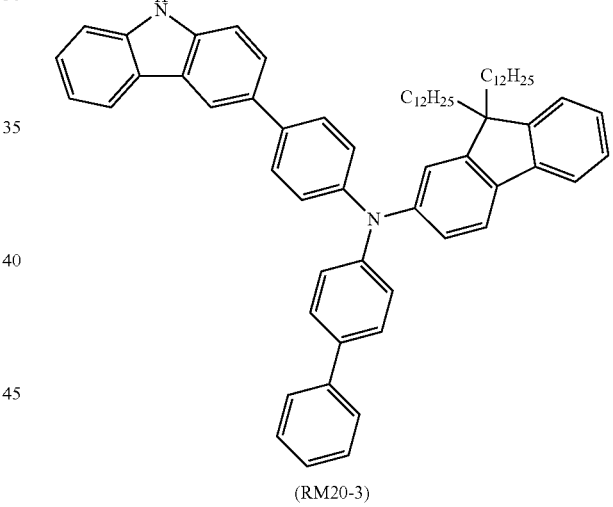

(RM20-3)

Specifically, Compound RM20-1 (113.5 g, 180.4 mmol), N-(4-bromophenyl)-[1,1'-biphenyl]-4-amine (45.0 g, 138.8 mmol), a [1,1'-bis(diphenyl phosphino)ferrocene]palladium (II)dichloridedichloromethane addition product (2.27 g, 2.78 mmol), sodium-tert-butoxide (26.7 g, 278 mmol), and toluene (463 ml) are put in a reaction vessel under an argon atmosphere and then, stirred at 90° C. for 5 hours. After the reaction is completed, the mixed reaction solution is allowed to cool to room temperature, and impurities are filtered using CELITE. After distilling off the solvent, it is purified by column chromatography to obtain Compound RM20-2 (106.5 g, a yield: 93%).

(Synthesis of Compound RM-3)

Compound RM20-3 is synthesized according to the following reaction scheme.

Specifically, Compound RM20-2 (55.0 g, 66.7 mmol), 3-(4,4,4,5,5-tetramethyl-1,3,2-dioxaborolan-2-yl)-9H-carbazole (19.6 g, 66.7 mmol), dichloro bis(triphenylphosphine)palladium (11)(0.94 g, 1.31 mmol), sodium carbonate (17.6 g, 166 mmol), 1,4-dioxane (360 ml), and pure water (180 ml) are put in a reaction vessel under an argon atmosphere and stirred at 90° C. for 7 hours. After the reaction is completed, the mixed reaction solution is allowed to cool to room temperature, and impurities are filtered by using CELITE. After distilling off the solvent, it is purified by column chromatography to obtain Compound RM20-3 (37.0 g, yield: 61%).

(Synthesis of Compound RM20-4)

Compound RM20-4 is synthesized according to the following reaction scheme.

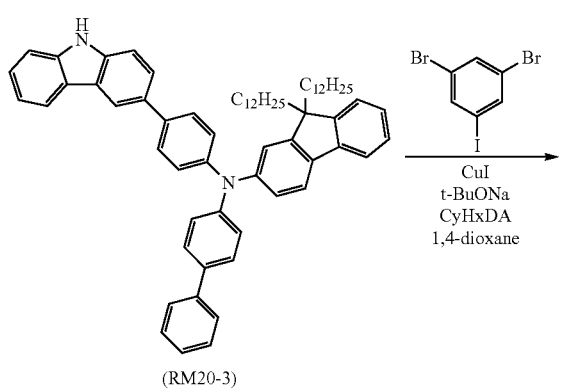

(RM20-3)

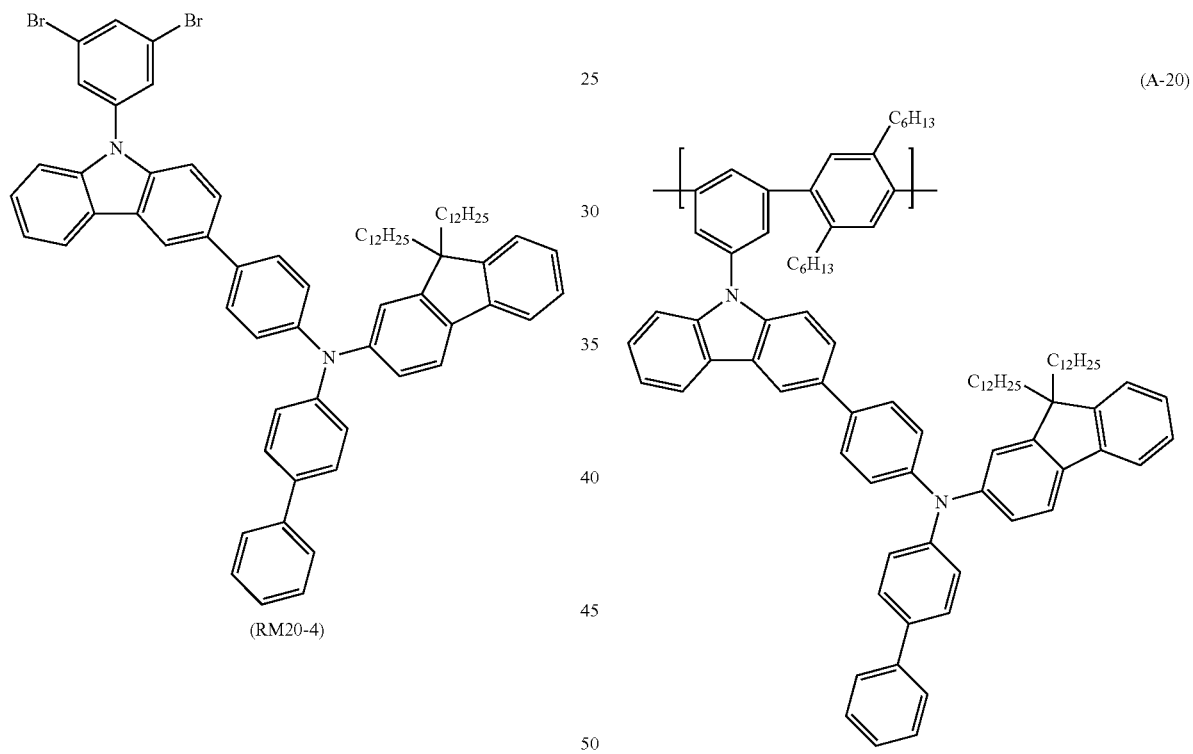

(RM20-4)

Specifically, under an argon atmosphere. Compound RM20-3 (22.0 g, 24.1 mmol), 1,3-dibromo-5-iodo benzene (9.61 g, 26.6 mmol), copper (I) iodide (0.23 g, 1.21 mmol), trans-1,2-cyclohexanediamine (0.55 g, 4.83 mmol), sodium tert-butoxide (4.64 g, 48.3 mmol), and dehydrated 1,4-dioxane (120 ml) are added in a reaction vessel, and then, the mixture is stirred at 9° C. for 7 hours. After the reaction is completed, the mixed reaction solution is allowed to cool to room temperature, and impurities are filtered by using CELITE. After distilling off the solvent, it is purified by column chromatography to obtain Compound RM20-4 (18.3 g, yield: 66%).

(Synthesis of Polymer Compound A-20)

Similarly, the same polymerization as in the synthesis of Polymer Compound A-17 of Example 17 is performed except that Compound RM20-4 is used instead of Compound RM17-6, to obtain Polymer Compound A-20 (1.3 g).

When the number average molecular weight and polydispersity of the obtained polymer compound are measured by SEC, Mn is 25,000 and Mw/Mn is 1.55.

Polymer Compound A-20 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

(A-20)

Example 21

(Synthesis of compound RM21-1)

Compound RM21-1 is synthesized according to the following reaction scheme.

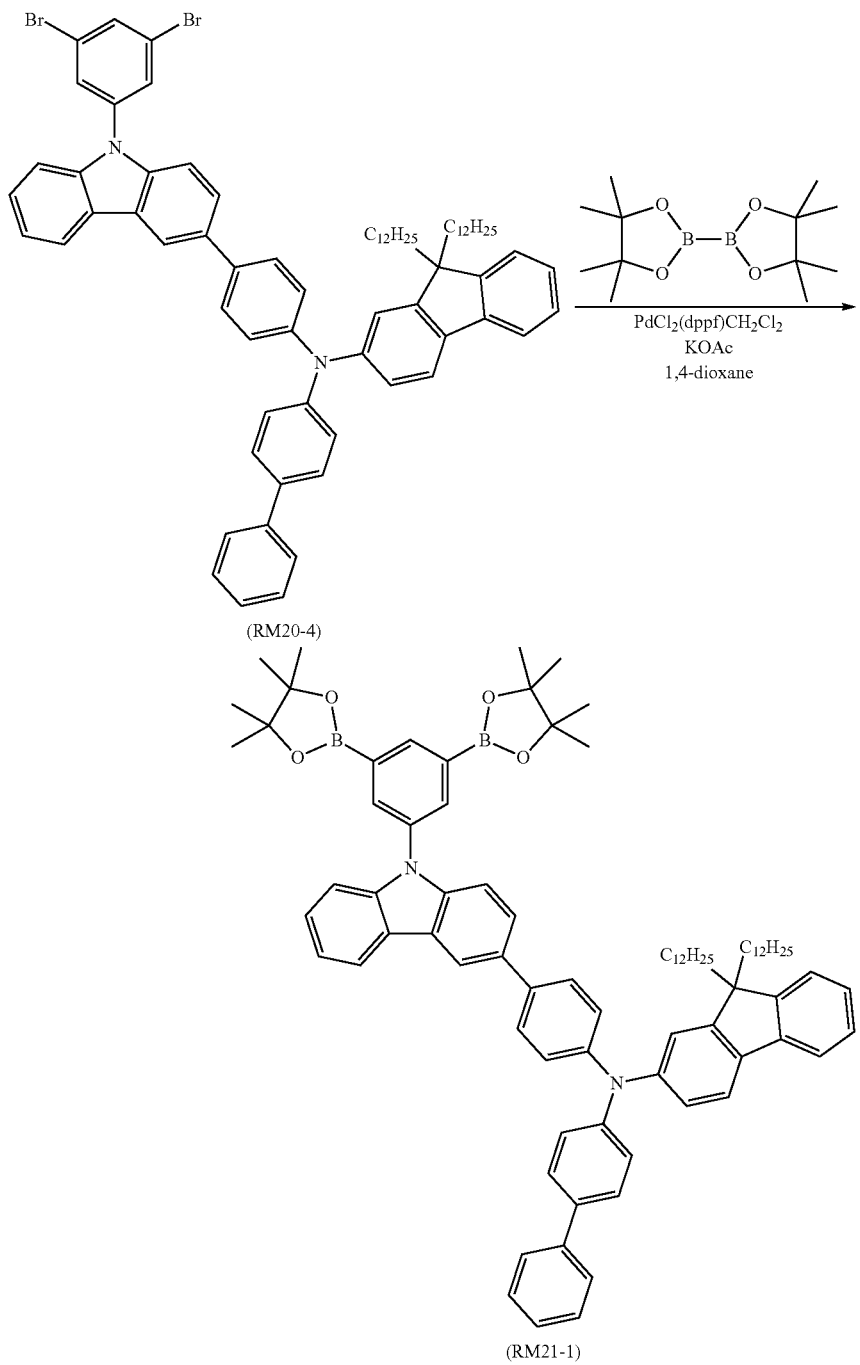

(RM20-4)

(RM21-1)

Specifically, Compound RM20-4 (2.0 g, 1.75 mmol), bis(pinacolato)diboron (1.33 g, 5.24 mmol), potassium acetate (1.03 g, 10.5 mmol), [bis(diphenyl phosphino)ferrocene]dichloro palladium (0.043 g, 0.05 mmol), and dioxane (17 ml) are put in a reaction vessel under an argon atmosphere. Then, the mixture is stirred for 6 hours while refluxed, and when the reaction is complete, the mixed reaction solution is cooled down to room temperature. Then, the mixed reaction solution is filtered by using CELITE, and impurities are filtered off. Subsequently, after distilling off the solvent, the filtrate is recrystallized and purified by using toluene/acetonitrile to obtain Compound RM21-1 (1.8 g, a yield: 83%).

(Synthesis of Polymer Compound A-21)

Similarly, the same polymerization as in the synthesis of Polymer Compound A-20 of Example 20 is performed except that 1,3-dibromo-5-dodecyl benzene is used instead of the 2,2'-(2,5-dihexyl-1,4-phenylene)bis[4,4,5,5-tetramethyl-1,3,2-dioxaborolane], and Compound RM21-1 is used instead of Compound RM20-4, to obtain Polymer Compound A-21 (1.3 g).

When the number average molecular weight and polydispersity of the obtained polymer compound are measured by SEC, Mn is 6,500 and Mw/Mn is 1.33.

Polymer Compound A-21 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

(A-21)

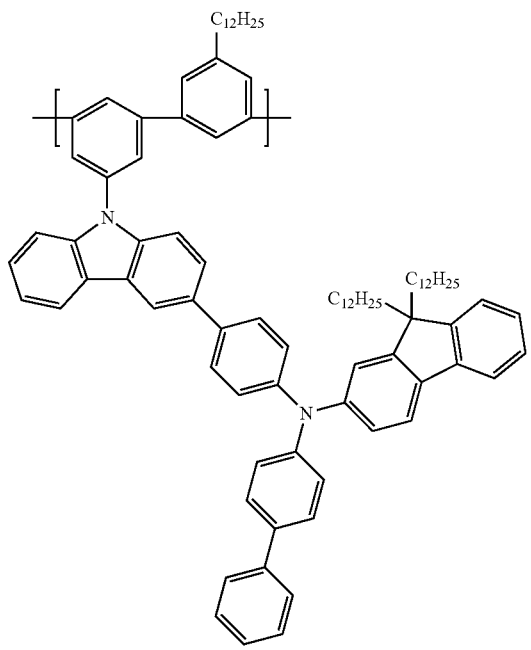

(A-22)

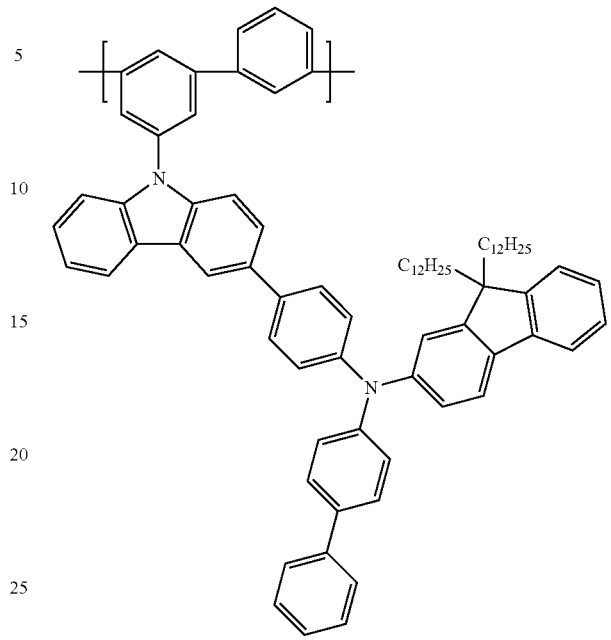

Example 22

(Synthesis of Polymer Compound A-22)

The same polymerization as in the synthesis of Polymer Compound A-20 of Example 20 is performed except that 1,3-dibromo benzene is used instead of the 2,2'-(2,5-dihexyl-1,4-phenylene)bis[4,4,5,5-tetramethyl-1,3,2-dioxaborolane], and Compound RM21-1 is used instead of Compound RM20-4, to obtain Polymer Compound A-22 (1.3 g).

When the number average molecular weight and polydispersity of the obtained polymer compound are measured by SEC, Mn is 8,200 and Mw/Mn is 1.64.

Polymer Compound A-22 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

Example 23

(Synthesis of Polymer Compound A-23)

The same polymerization as in the synthesis of Polymer Compound A-20 of Example 20 is performed except that 1,3-dibromo-5-hexyl benzene is used instead of the 2,2'-(2,5-dihexyl-1,4-phenylene)bis[4,4,5,5-tetramethyl-1,3,2-dioxaborolane], and Compound RM21-1 is used instead of Compound RM20-4, to obtain Polymer Compound A-23 (1.3 g).

When the number average molecular weight and polydispersity of the obtained polymer compound are measured by SEC, Mn is 6,900 and Mw/Mn is 1.66.

Polymer Compound A-23 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

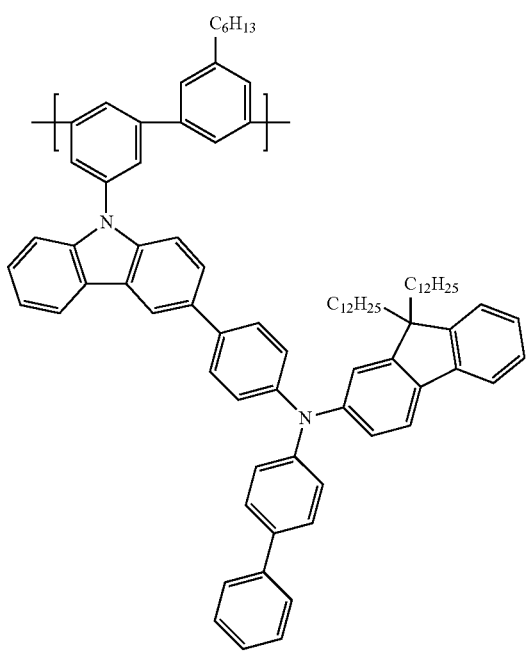

Example 24

(Synthesis of Compound RM24-1)
Comonomer RM24-1 is synthesized according to the following reaction scheme.

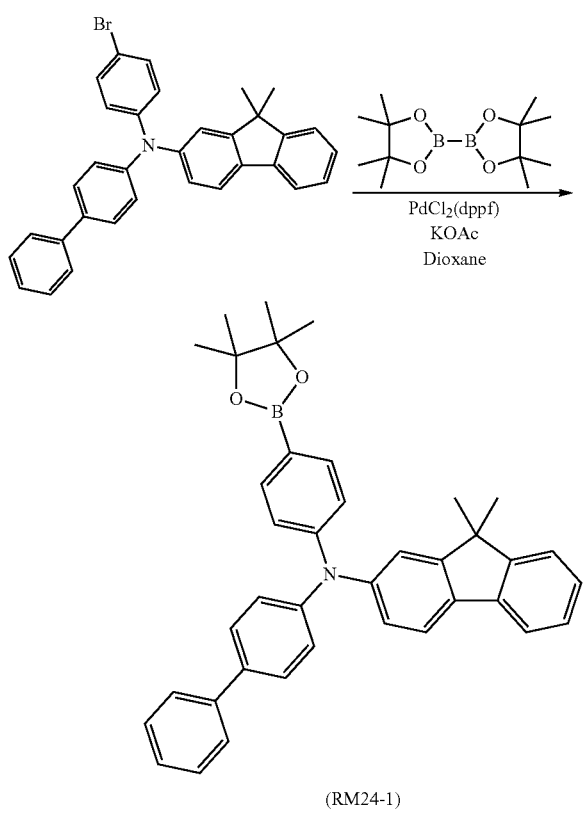

Specifically, under an argon atmosphere, 2-amino-N-[(1,1'-biphenyl)-4-yl]-N-(4-bromophenyl)-9,9-dimethyl fluorene (10.0 g, 19.36 mmol), bis(pinacolato)diboron (7.38 g, 29.04 mmol), potassium acetate (5.70 g, 58.09 mmol), and dehydrated 1,4-dioxane (195 mL) are added in a reaction vessel and then, stirred for 30 minutes. Subsequently, bis[(diphenyl phosphino)ferrocene]dichloro palladium (0.22 g, 0.27 mmol) is added thereto and then, heated and stirred under reflux for 3 hours. After the reaction is completed, the mixed reaction solution is cooled to room temperature and filtered through CELITE, and the filtrate is concentrated. The concentrate residue is washed with methanol to obtain 9.1 g of a solid (Compound RM24-1, a yield of 79%).

(Synthesis of Compound RM24-2)
Comonomer RM24-2 is synthesized according to the following reaction scheme.

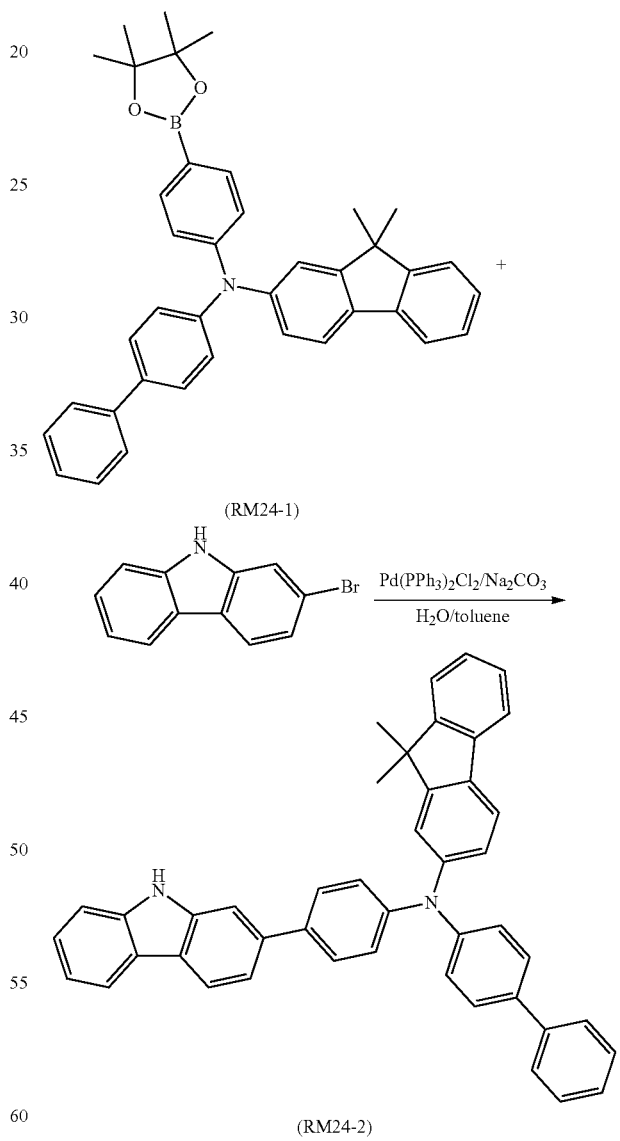

Specifically, Compound RM24-1 (4.0 g, 7.1 mmol), 2-bromo carbazole (1.6 g, 6.5 mmol), bis(triphenylphosphine)palladium(II)dichloride (0.025 g, 0.036 mmol), sodium carbonate (0.75 g, 7.1 mmol), toluene (40 ml), and water (20 ml) are put in a reaction vessel under an argon atmosphere, and then, the mixture is stirred at 85° C. for 4 hours. After the reaction is completed, the mixed reaction solution is allowed to cool to room temperature, and impurities are filtered by using CELITE. After distilling off the solvent, by column chromatography to obtain Compound RM24-2 (5.4 g, a yield: 67%).

(Synthesis of Compound RM24-3)

Comonomer RM24-3 is synthesized according to the following reaction scheme.

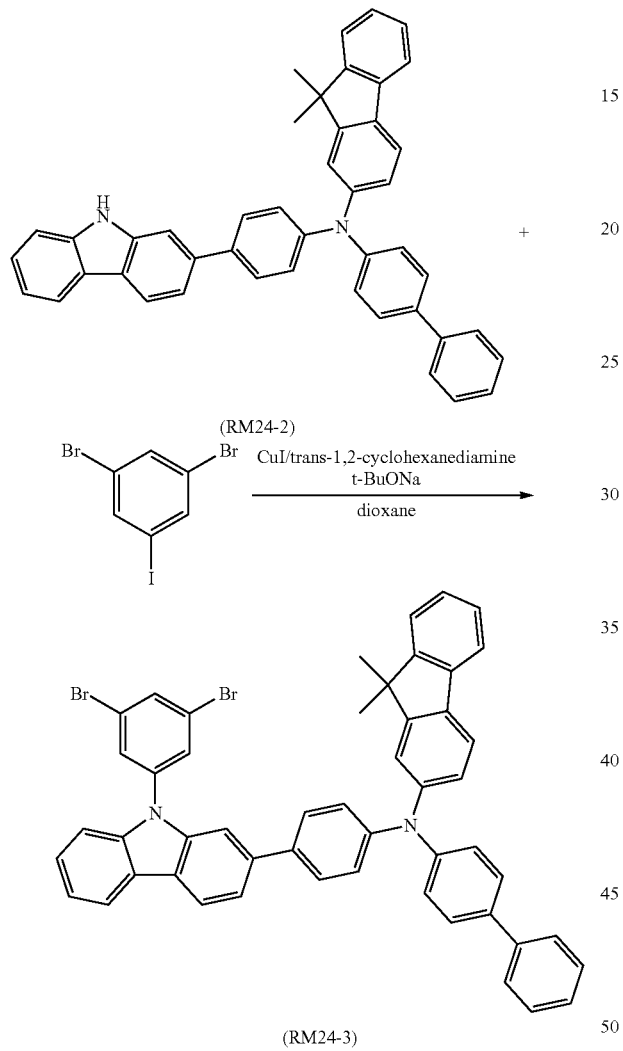

Specifically, Compound RM24-2 (8.5 g, 14.1 mmol), 1,3-dibromo-5-iodo benzene (6.1 g, 16.9 mmol), copper(I) iodide (0.13 g, 0.70 mmol), trans-1,2-cyclohexanediamine (0.32 g, 2.82 mmol), sodium tert-butoxide (2.71 g, 28.2 mmol), and dehydrated 1,4-dioxane (50 ml) are put in a reaction vessel under an argon atmosphere, and then, the mixture is stirred at 90° C. for 7 hours. After the reaction is completed, the mixed reaction solution is allowed to cool to room temperature, and impurities are filtered by using CELITE. After distilling off the solvent, it is purified by column chromatography to obtain Compound RM24-3 (6.6 g, a yield: 56%).

(Synthesis of Polymer Compound A-24)

Compound RM24-3 (1.37 g), 2,2'-(2,5-dihexyl-1,4-phenylene)bis[4,4,5,5-tetramethyl-1,3,2-dioxaborolane] (0.816 g), palladium acetate (7.8 mg), tris(2-methoxy phenyl)phosphine (33.8 mg), toluene (22 mL), and a 20 mass % tetraethylammonium hydroxide aqueous solution (8.39 g) are put in a reaction vessel under an argon atmosphere and then, refluxed for 8 hours. Then, phenyl boronic acid (134 mg), bis(triphenylphosphine)palladium(II)dichloride (51.6 mg), and a 20 mass % tetraethylammonium hydroxide aqueous solution (8.39 g) are added thereto and then, heated and refluxed for 7 hours. Subsequently, N,N-sodium diethyldithiocarbamate trihydrate (11.0 g) and ion exchange water (88 mL) are added to the obtained mixed solution except for a water layer and then, stirred at 85° C. for 2 hours. An organic layer is separated from the water layer and then, washed with water and a 3 mass % acetic acid aqueous solution and rewashed with water. The organic layer is added dropwise in methanol to precipitate a polymer compound, and the polymer compound is filtered and dried to obtain a solid. This solid is dissolved in toluene and passed through column chromatography filled with silica gel/alumina, and the solvent is distilled off under a reduced pressure. The obtained liquid is added dropwise in methanol, and precipitates therefrom are filtered and dried to obtain Polymer Compound A-24 (1.18 g).

When the number average molecular weight and polydispersity of the obtained polymer compound are measured by SEC, Mn is 19,000 and Mw/Mn is 1.57.

Polymer Compound A-24 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

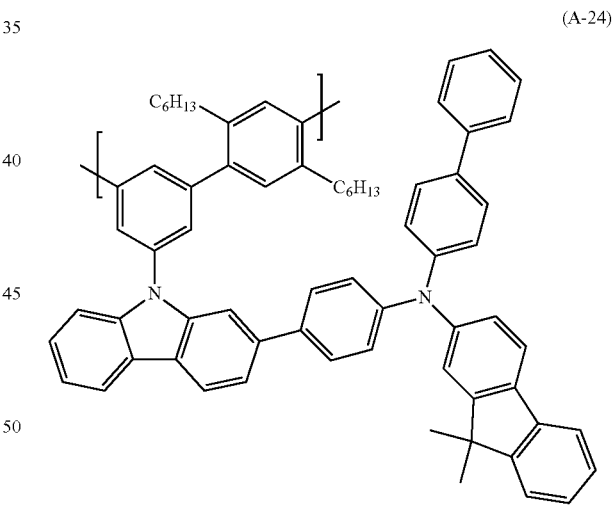

Example 25

(Synthesis of Polymer Compound A-25)

The same polymerization as in the synthesis of Polymer Compound A-24 of Example 24 is performed except that 2,7-bis(4,4,5,5-tetramethyl-1,3,2-dioxaborolan-2-yl)-9,9-di-N-octylfluorene is used instead of the 2,2'-(2,5-dihexyl-1,4-phenylene)bis[4,4,5,5-tetramethyl-1,3,2-dioxaborolane], to obtain Polymer Compound A-24 (1.18 g).

When the number average molecular weight and polydispersity of the obtained polymer compound are measured by SEC, Mn is 41,000 and Mw/Mn is 1.85.

Polymer Compound A-25 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

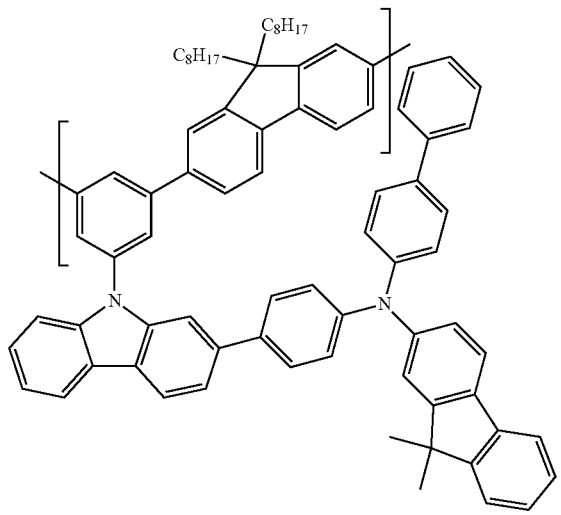
(A-25)

Example 26

(Synthesis of Polymer Compound A-26)

The same polymerization as in the synthesis of Polymer Compound A-24 of Example 24 is performed except that the following compound is used instead of the 2,2'-(2,5-dihexyl-1,4-phenylene)bis[4,4,5,5-tetramethyl-1,3,2-dioxaborolane], to obtain Polymer Compound A-26 (0.88.

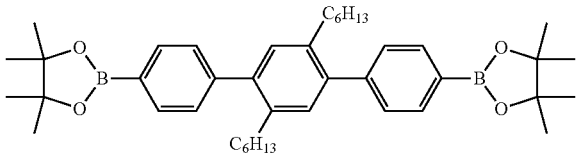

When the number average molecular weight and polydispersity of the obtained polymer compound are measured by SEC, Mn is 87,000 and Mw/Mn is 3.21.

Polymer Compound A-26 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

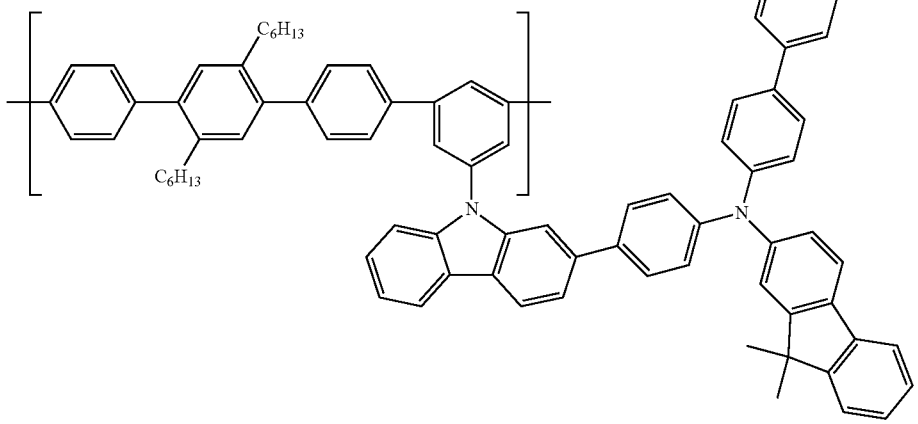
(A-26)

Example 27

(Synthesis of Compound RM27-1)

Comonomer RM27-1 is synthesized according to the following reaction scheme.

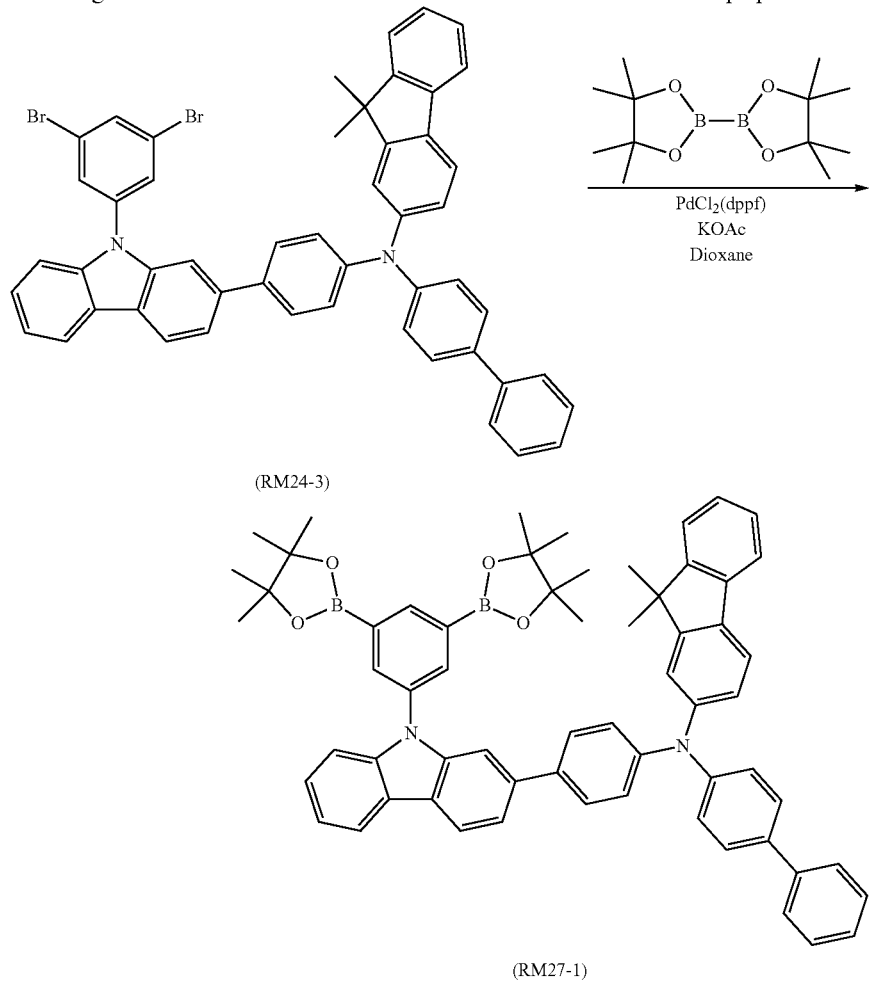

Specifically, Compound RM24-3 (5.0 g, 5.98 mmol), bis(pinacolato)diboron (6.1 g, 23.9 mmol), potassium acetate (3.5 g, 35.8 mmol), [bis(diphenyl phosphino)ferrocene]dichloro palladium (0.22 g, 0.3 mmol), and dioxane (50 ml) are mixed in a reaction vessel under an argon atmosphere. Subsequently, the mixture is reflux-stirred for 6 hours, and when the reaction is complete, the mixed reaction solution is allowed to cool to room temperature. Then, the mixed reaction solution is filtered by using CELITE, and impurities are filtered off. After distilling off the solvent, the filtrate is purified by column chromatography to obtain Compound RM27-1 (4.4 g, a yield: 79%).

(Synthesis of Polymer Compound A-27)

The same polymerization as in the synthesis of Polymer Compound A-24 of Example 24 is performed except that 1,3-dibromo-5-dodecyl benzene is used instead of the 2,2'-(2,5-dihexyl-1,4-phenylene)bis[4,4,5,5-tetramethyl-1,3,2-dioxaborolane], and Compound RM27-1 is used instead of Compound RM24-3, to obtain Polymer Compound A-27 (1.19 g).

When the number average molecular weight and polydispersity of the obtained polymer compound are measured by SEC, Mn is 4,410 and Mw/Mn is 1.75.

Polymer Compound A-27 is presumed to be a polymer compound having the following repeating units and a mole ratio of the structural units of X:the structural units of Y=1:1 from the preparation ratio of the monomers, and including the structural unit of X and the structural unit of Y which are alternately polymerized.

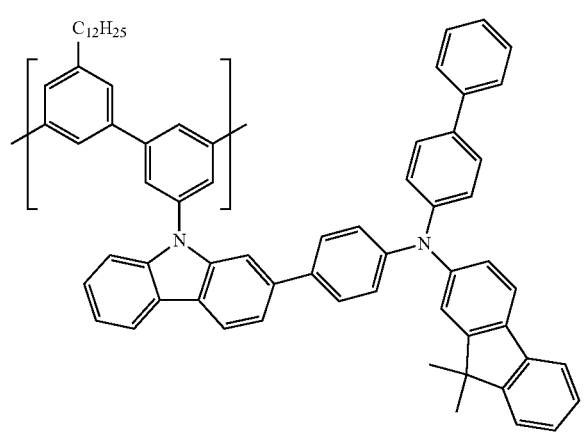

Subsequently, HOMO levels and glass transition temperatures of Polymer Compounds A-1 to A-27 of Examples 1 to 8 and poly[(9,9-dioctyl fluorenyl-2,7-diyl)-co-(4,4'-(N-(4-sec-butyl phenyl)diphenyl amine)] having the following structural unit (TFB) (Luminescence Technology Corp.) (the polymer material of Comparative Example 1) are measured.

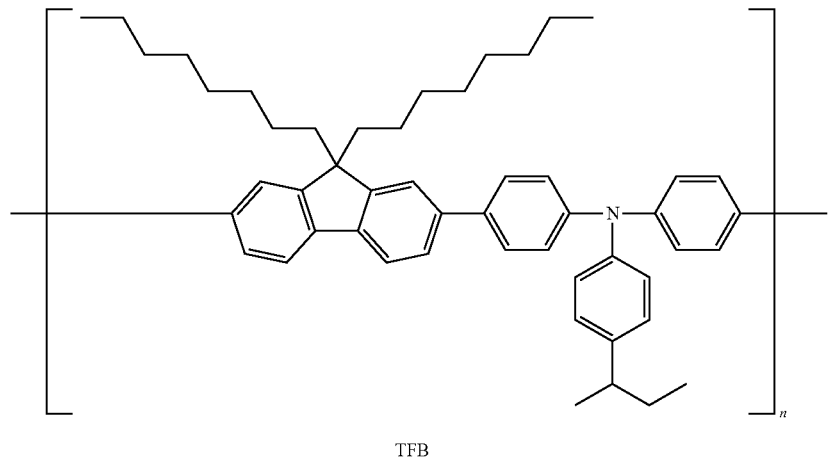

TFB (Measurement Method of HOMO Level)

Each polymer material is dissolved in xylene so that the concentration is 1 mass %, and each coating solution is prepared.

Onn ITO-adhered glass substrate which is UV-cleaned, the coating solutions are respectively spin-coated at 2000 rpm to form films, and then, the films are dried on a hot plate at 150° C. for 30 minutes to obtain samples.

HOMO levels of the samples are measured by using an optoelectronic spectrometer (AC-3 manufactured by Riken Keiki Korea Co., Ltd.) in the air. Herein, the measurement results are used to calculate increasing tangential intersections to obtain the HOMO levels.

On the other hand, the HOMO levels are usually negative values.

(Measurement Method of LUMO Level)

Each polymer material is dissolved in toluene at a concentration of 3.2 mass % to prepare coating solutions.

On an ITO-adhered glass substrate which is UV-cleaned, the coating solutions are respectively spin-coated at 1600 rpm to form films, and the films are dried on a hot plate at 250° C. for 60 minutes to obtain samples. Herein, the films have a film thickness of about 70 nm. The obtained samples are cooled down to 77K (−196° C.), and photo luminance (PL) spectra thereof are measured. Peaks of the PL spectra at the shortest wavelength are used to calculate the LUMO levels [eV].

(Measurement Method of Glass Transition Temperature (Tg))

Each polymer material is measured with respect to a glass transition temperature (Tg) by using differential scanning calorimetry (DSC) (DSC6000 manufactured by Seiko Instruments Inc.), heating the samples up to 300° C. at 10° C./min and holding them for 10 minutes, cooling them down to 25° C. at 10° C./min and holing them for 10 minutes, and then, heating them up to 300° C. at 10° C./min. When the measurement is complete, the samples are cooled down to room temperature (25° C.) at 10° C./min.

The HOMO levels and glass transition temperatures (Tg) of the polymer materials are shown in Table 1.

TABLE 1

(HOMO Level and Glass Transition Temperature (Tg) of Each Polymer Material)

| | Polymer material | Absolute value of HOMO level [eV] | Tg [° C.] |
|---|---|---|---|
| Example 1 | A-1 | 5.60 | 141 |
| Example 2 | A-2 | 5.60 | 224 |
| Example 3 | A-3 | 5.57 | 154 |
| Example 4 | A-4 | 5.58 | 235 |
| Example 5 | A-5 | 5.57 | 230 |
| Example 6 | A-6 | 5.58 | 229 |
| Example 7 | A-7 | 5.60 | 222 |
| Example 8 | A-8 | 5.65 | 193 |
| Example 9 | A-9 | 5.59 | 236 |
| Example 10 | A-10 | 5.55 | 232 |
| Example 11 | A-11 | 5.56 | 217 |
| Example 12 | A-12 | 5.55 | 216 |
| Example 13 | A-13 | 5.55 | 197 |
| Example 14 | A-14 | 5.60 | 93 |
| Example 15 | A-15 | 5.66 | 185 |
| Example 16 | A-16 | 5.65 | 192 |
| Example 17 | A-17 | 5.56 | 110 |
| Example 18 | A-18 | 5.62 | 133 |
| Example 19 | A-19 | 5.55 | 99 |
| Example 20 | A-20 | 5.64 | 74 |
| Example 21 | A-21 | 5.62 | 76 |
| Example 22 | A-22 | 5.63 | 142 |
| Example 23 | A-23 | 5.62 | 128 |
| Example 24 | A-24 | 5.65 | 166 |
| Example 25 | A-25 | 5.69 | 181 |
| Example 26 | A-26 | 5.73 | 196 |
| Example 27 | A-27 | 5.58 | 143 |
| Comparative Example 1 | TFB | 5.48 | 155 |

Referring to the results of Table 1, Polymer Compounds A-1 to A-27 of Examples 1 to 27 have a deeper HOMO level than that of a conventional polymer material (TFB) of Comparative Example 1.

Examples 28 to 30 and Comparative Example 2:
Production and Evaluation 1 of
Electroluminescence Device

[Production of Quantum Dot Light Emitting Device]

As for a first electrode (an anode), an ITO-adhered glass substrate in which indium tin oxide (ITO) is formed into a 150 nm-thick stripe-shaped film is washed with a neutral detergent, deionized water, water, and isopropyl alcohol in order and treated with a UV-ozone. Subsequently, on the ITO-adhered glass substrate, poly(thieno[3,4-b]thiopene (PEDOT/PSS) (Sigma-Aldrich Co., Ltd.) is spin-coated and dried. As a result, a hole injection layer (HIL) having a thickness (a dried film thickness) of 30 nm is formed on the ITO-adhered glass substrate.

Subsequently, Polymer Compound A-1 of Example 1 (a hole transport material) is dissolved in xylene (a solvent) at a concentration of 1.0 mass % to prepare a coating solution for forming a hole transport layer (HTL). On the hole injection layer (HIL), the coating solution for a hole transport layer (HTL) is spin-coated and heat-treated at 150° C. for 1 hour to form a hole transport layer (HTL). As a result, the hole transport layer (HTL) having a thickness (a dried film thickness) of 30 nm is formed on the hole injection layer (HIL).

Figure 2:
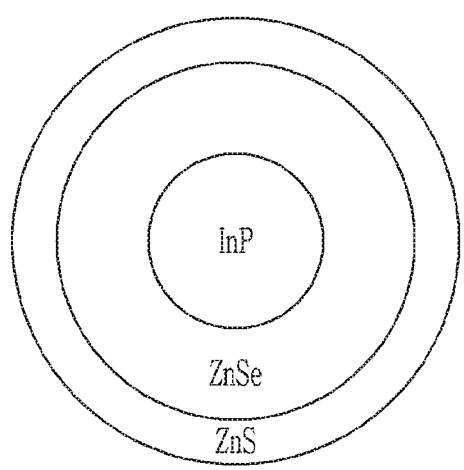
FIG. 2 is a cross-sectional view showing a structure of the quantum dot of Example 28.
Figure 3:
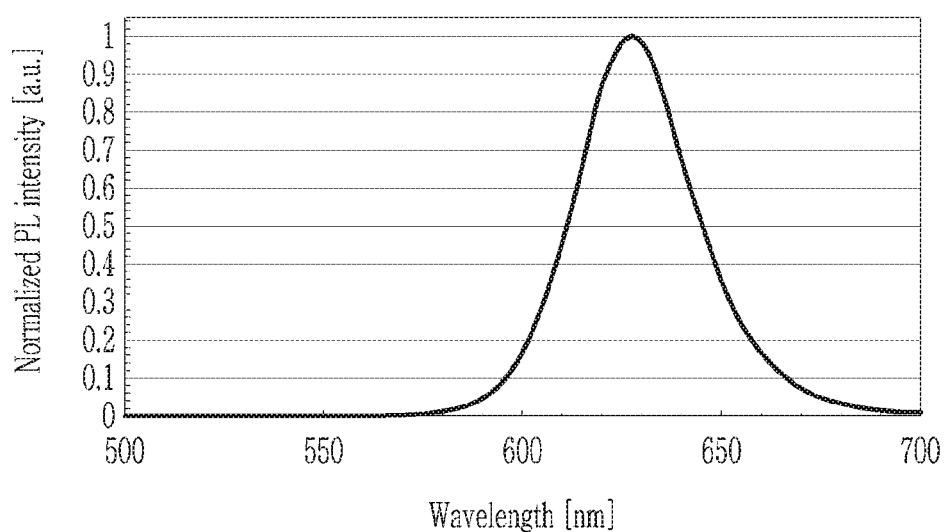
FIG. 3 is a photoluminescence spectrum of the quantum dot of Example 28.

On the hole transport layer (HTL), quantum dots of InP/ZnSe/ZnS (core/shell/shell) (refer to FIG. 2) are dispersed in n-octane not dissolving the hole transport layer (HTL) at 1.0 mass % to prepare dispersion, and the dispersion is spin-coated and then, dried. As a result, a quantum dot light emitting layer having a thickness (a dried film thickness) of 30 nm is formed on the hole transport layer (HTL). On the other hand, light emitted by irradiating the dispersion of the quantum dots with ultraviolet (UV) has a center wavelength of 627 nm and a full width at half maximum (FWHM) of 34 nm (refer to FIG. 3).

After completely drying the quantum dot light emitting layer, ZnMgO is dispersed in ethanol at 1.5 mass % to prepare dispersion for an electron transport layer (ETL). This dispersion is spin-coated on the quantum dot light emitting layer to have a dried film thickness of 60 nm and then, dried. As a result, the electron transport layer (ETL) having a dried film thickness of 60 nm is formed on the quantum dot light emitting layer.

A vacuum deposition device is used to deposit aluminum (Al) on the electron transport layer (ETL). As a result, a 100 nm-thick second electrode (a cathode) is formed on the electron transport layer (ETL), obtaining a quantum dot light emitting device 101 of Example 28.

In addition, quantum dot light emitting devices 102 and 113 of Examples 29 and 30 are obtained according to the same method as Example 28 except that Polymer Compounds A-2 and A-13 of Examples 2 and 13 are respectively used to form hole transport layers (HTL) instead of Polymer Compound A-1.

In addition, a quantum dot light emitting device C1 of Comparative Example 2 is manufactured according to the same method as Example 28 except that the polymer material (TFB) of Comparative Example 1 is used to form a hole transport layer (HTL) instead of Polymer Compound A-1.

Figure 4:
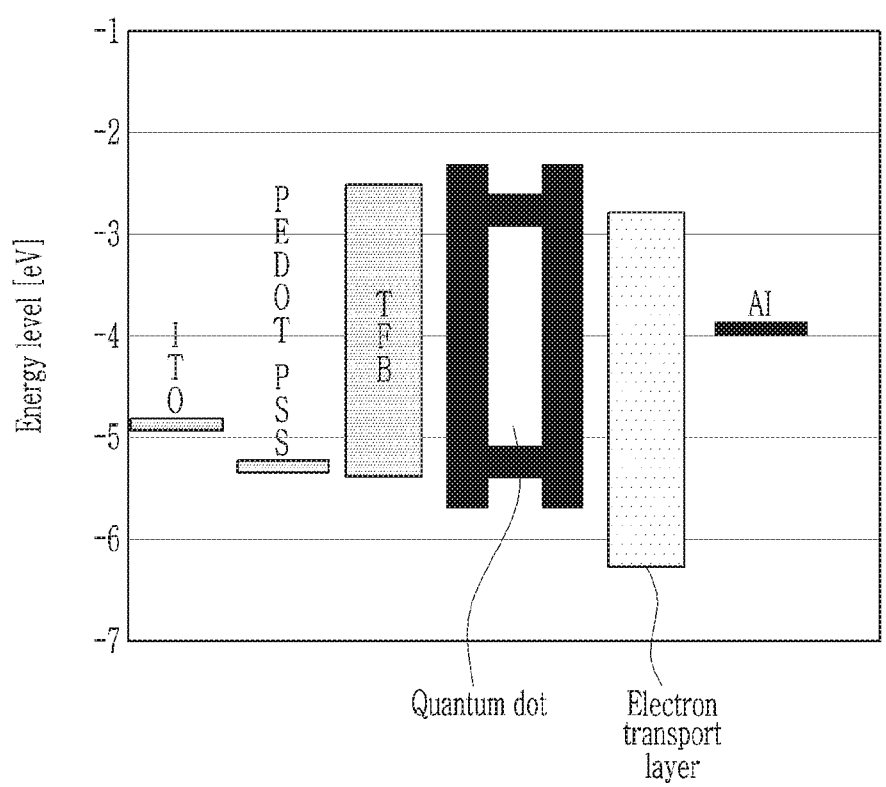
FIG. 4 is an energy diagram of the quantum dot light emitting device C1 of Comparative Example 2.
Figure 5:
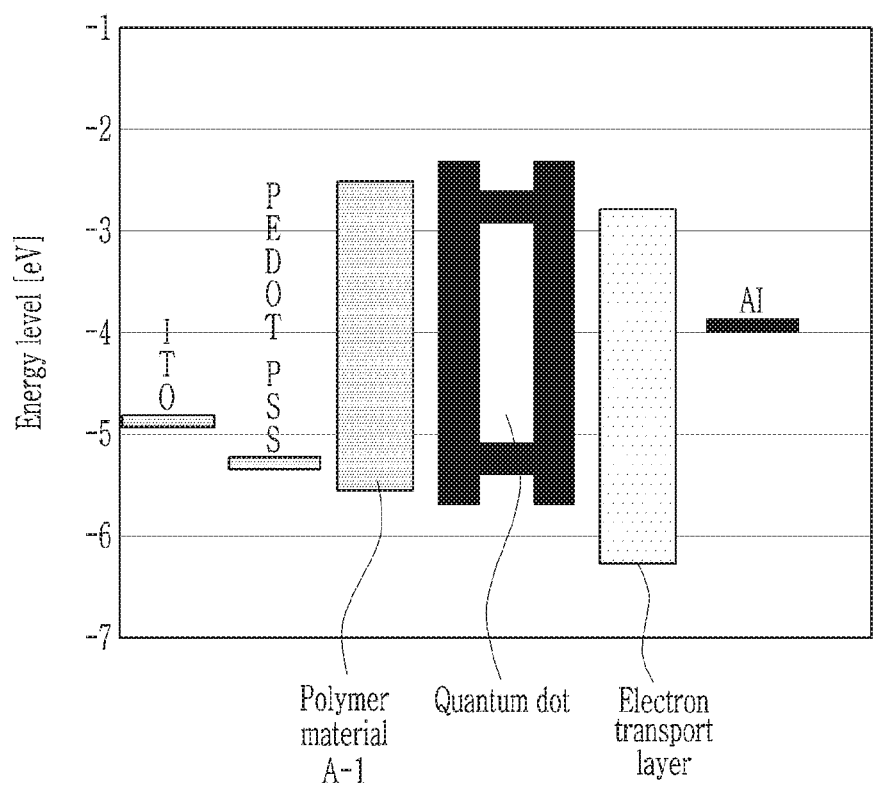
FIG. 5 is an energy diagram of the quantum dot light emitting device 101 of Example 28.

FIGS. 4 and 5 show energy diagrams of the quantum dot light emitting devices of Comparative Example 2 and Example 28.

On the other hand, the energy diagrams of the quantum dot light emitting devices of Examples 29 and 30 respectively exhibit the same relationship as that of the energy diagram of the quantum dot light emitting device of Example 28 shown in FIG. 5.

[Evaluation of Quantum Dot Light Emitting Device]

Subsequently, in the quantum dot light emitting devices 101, 102, and 113 of Examples 28 to 30 and the quantum dot light emitting device C1 of Comparative Example 2, a driving voltage, quantum efficiency, and initial luminance measured by using a luminance-measuring device, and "LT50 (h)" of time when the initial luminance are slowly deteriorated and decreased down to 50% are evaluated.

(Evaluation of Quantum Dot Light Emitting Device Method)

When a DC constant voltage source (a source meter, Keyence Corp.) is used to apply a voltage to each quantum dot light emitting device, and a current starts to flow at a predetermined voltage, the quantum dot light emitting devices emit light Herein, a voltage at current density of 5 mA/cm$^2$ is regarded as a driving voltage (Vop) [V]. In addition, the current is slowly increased and constantly maintained at the luminance of 100 nits (cd/m$^2$) and then, allowed to stand. Herein, the measured spectral radiation luminance spectra are used, under assumption of Lambertian radiation, to calculate external quantum efficiency (EQE) at the luminance of 100 nits and thus evaluate luminous efficiency. In addition, the luminance is measured by using a luminance-measuring device of SR-3 manufactured by Topcom Technology Co., Ltd.

In Table 2, the driving voltage [V], quantum efficiency [%], and LT50 (h) results of the quantum dot light emitting devices are shown. On the other hand, LT50 (h) is obtained as a relative value based on 100 of the measurement of the quantum dot light emitting device C1 of Comparative Example 2.

TABLE 2

(Evaluation Result of Quantum Dot Light Emitting Device)

| | Quantum dot light emitting device | Hole transport material (polymer material) | Tg [° C.] | Driving voltage [V] | Quantum efficiency [%] | LT50 relative value |
|---|---|---|---|---|---|---|
| Example 28 | 101 | A-1 | 141 | 2.8 | 12.4 | 786 |
| Example 29 | 102 | A-2 | 224 | 3.0 | 11.4 | 242 |
| Example 30 | 113 | A-13 | 197 | 2.6 | 11.5 | 267 |
| Comparative Example 2 | C1 | TFB | 155 | 4.8 | 8.5 | 100 |

Examples 31 to 34: Production and Evaluation 2 of Electroluminescence Device

[Production of Quantum Dot Light Emitting Device]

Quantum dot light emitting devices of Examples 31 to 34 are respectively manufactured according to the same method as that of the quantum dot light emitting device 101 of Example 28 except that Polymer Compounds A-24 to A-27 of Examples 24 to 27 as a hole transport material are respectively used to form hole transport layers (HTL) instead of Polymer Compound A-1.

On the other hand, energy diagrams of the quantum dot light emitting devices of Examples 31 to 34 respectively exhibit the same relationship as that of the energy diagram of the quantum dot light emitting device of Example 28, which is shown in FIG. 5.

[Evaluation of Quantum Dot Light Emitting Device]

Subsequently, as for the quantum dot light emitting devices 124 to 127 of Examples 31 to 34, a luminance-measuring device is used to measure initial luminance and "LT50 (h)" of time when the initial luminance is slowly deteriorated and decreased down to 50%. On the other hand, a method of evaluating "LT50 (h)" LT50 (h) is the same as those of the quantum dot light emitting devices 101, 102, and 113 of Examples 28 to 30 and the quantum dot light emitting device C2 of Comparative Example 1.

In Table 2, the LT50 (h) evaluation results of the quantum dot light emitting devices are shown. On the other hand, LT50 (h) is a relative value based on 100 of the measurement of the quantum dot light emitting device C1 of Comparative Example 2.

TABLE 3

(Evaluation Result of Electroluminescence Device)

| Quantum dot light emitting device | Hole transport material (polymer material) | Tg [° C.] | LT50 relative value |
|---|---|---|---|
| Example 31 | 124 | A-24 | 166 | 786 |
| Example 32 | 125 | A-25 | 181 | 714 |
| Example 33 | 126 | A-26 | 196 | 607 |
| Example 34 | 127 | A-27 | 143 | 1110 |
| Comparative Example 2 | C1 | TFB | 155 | 100 |

Referring to Tables 2 and 3, the quantum dot light emitting devices of Examples 28 to 34 respectively use Polymer Compounds A-1, A-2, A-13, and A-24 to A-27, specific examples of a polymer material according to the present embodiment, as a hole transport material and accordingly, exhibit very long time that luminance becomes 50% of the initial luminance and thus a significantly long life-span.

On the contrary, the quantum dot light emitting device of Comparative Example 2 uses TFB as a hole transport material and thus exhibits short time that luminance becomes 50% of the initial luminance and thus a short life-span.

The reason of this difference, as shown in Table 1 and the like, is that since HOMO levels of Polymer Compounds A-1, A-2, A-13, and A-24 to A-27 are close to valence bands of quantum dots compared with the HOMO level of TFB, a barrier against injection of holes into the quantum dots from the hole transport layers (HTL) becomes smaller.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

100 quantum dot light emitting device
110 substrate
120 first electrode
130 hole injection layer
140 hole transport layer
150 light emitting layer
160 electron transport layer
170 electron injection layer
180 second electrode

What is claimed is:

1. A polymer material comprising
   a segment of an alternating copolymer comprising a structural unit represented by Formula (1) and having a glass transition temperature of greater than or equal to about 50° C. and less than or equal to about 250° C.:

(1)

wherein, in Formula (1), X is at least one of groups represented by Formula (2-A) to Formula (2-D) and Y is a substituted or unsubstituted divalent aromatic hydrocarbon group having 6 to 60 ring-forming carbon atoms, or a substituted or unsubstituted divalent aromatic heterocyclic group having 3 to 60 ring-forming atoms,

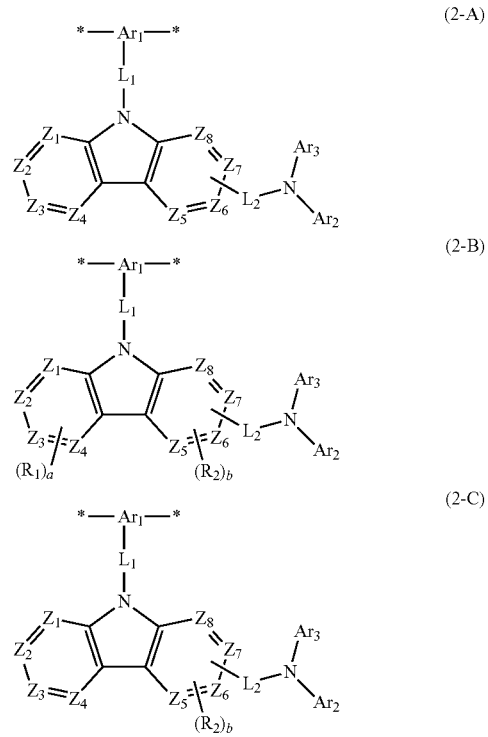

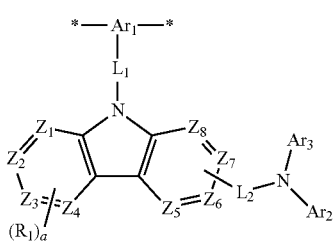
(2-D)

wherein, in Formula (2-A) to Formula (2-D),

Ar$_1$ is a substituted or unsubstituted trivalent aromatic hydrocarbon group having 6 to 60 ring-forming atoms or a substituted or unsubstituted trivalent aromatic heterocyclic group having 3 to 60 ring-forming atoms, Ar$_2$ and Ar$_3$ are independently a substituted or unsubstituted monovalent aromatic hydrocarbon group having 6 to 60 ring-forming carbon atoms or a substituted or unsubstituted monovalent aromatic heterocyclic group having 3 to 60 ring-forming atoms, L$_1$ and L$_2$ are independently a single bond, a substituted or unsubstituted divalent aromatic hydrocarbon group having 6 to 60 ring-forming carbon atoms, or a substituted or unsubstituted divalent aromatic heterocyclic group having 3 to 60 ring-forming atoms, Z$_1$ to Z$_8$ are independently N, C, or C(R$_3$), wherein each occurrence of R$_3$ is independently hydrogen, a substituted or unsubstituted C1-C20 alkyl group, a C1-C20 substituted or unsubstituted alkoxy group, a substituted or unsubstituted monovalent aromatic hydrocarbon group having 6 to 60 ring-forming carbon atoms, or a substituted or unsubstituted monovalent aromatic heterocyclic group having 3 to 60 ring-forming atoms,

* indicates a binding site to a main chain, in Formula (2-B) to Formula (2-D), R$_1$ and R$_2$ are independently a substituted or unsubstituted C1 to C20 alkyl group, a substituted or unsubstituted C1 to C20 alkoxy group, a substituted or unsubstituted monovalent aromatic hydrocarbon group having 6 to 60 ring-forming carbon atoms, or a substituted or unsubstituted monovalent aromatic heterocyclic group having 3 to 60 ring-forming atoms, wherein R$_1$ and R$_2$ are optionally combined with each other to form a ring, a is an integer of 1 to 4, and b is an integer of 1 to 3.

2. The polymer material of claim 1, wherein in Formula (1), X is at least one of groups represented by Formula (2-E) to Formula (2-H):

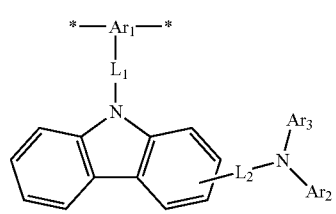
(2-E)

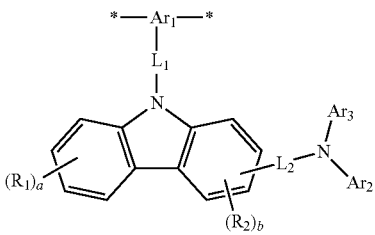
(2-F)

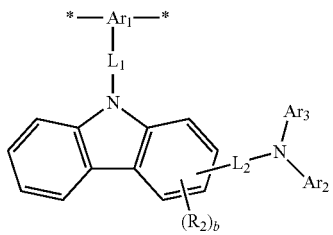
(2-G)

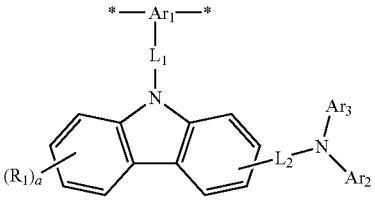
(2-H)

wherein, in Formula (2-E) to Formula (2-H), Ar$_1$, Ar$_2$, Ar$_3$, L$_1$, L$_2$, R$_1$, R$_2$, a, b, and * are the same as in Formula (2-A) to Formula (2-D).

3. The polymer material of claim 2, wherein in Formula (1), X is at least one of groups represented by Formula (2-I) to Formula (2-L):

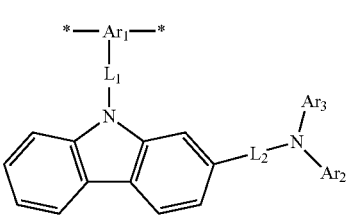
(2-I)

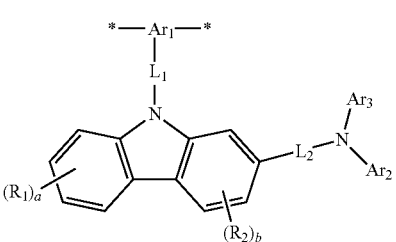
(2-J)

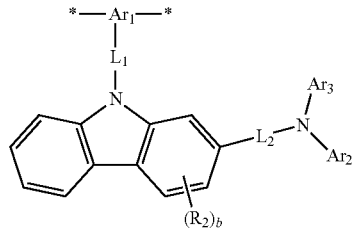
(2-K)

(2-L)

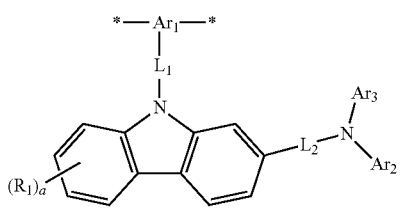

wherein, in Formula (2-I) to Formula (2-L), $Ar_1$, $Ar_2$, $Ar_3$, $L_1$, $L_2$, $R_1$, $R_2$, a, b, and * are the same as in Formula (2-A) to Formula (2-D) of claim 1.

4. The polymer material of claim 2, wherein in Formula (1), X is at least one of groups represented by Formula (2-1) to Formula (2-6):

(2-1)

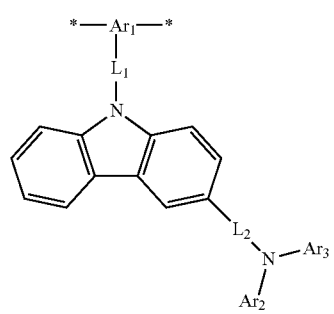

(2-2)

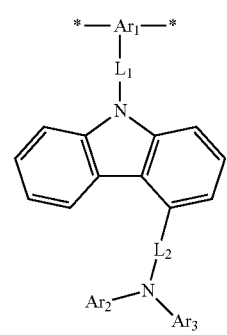

(2-3)

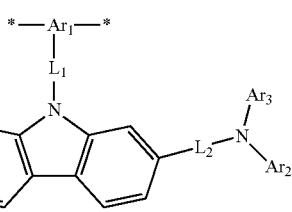

(2-4)

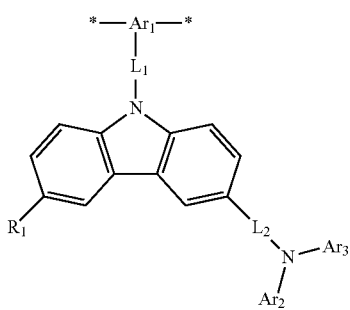

(2-5)

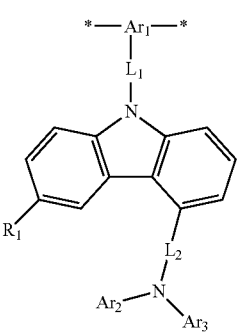

(2-6)

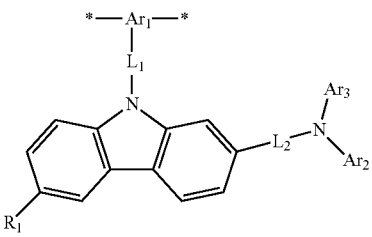

wherein, in Formula (2-1) to Formula (2-6), $Ar_1$, $Ar_2$, $Ar_3$, $L_1$, $L_2$, $R_1$, and * are the same as in Formula (2-A) to Formula (2-D) in claim 1.

5. The polymer material of claim 1, wherein at least one of $Ar_2$ and $Ar_3$ is a substituted monovalent aromatic hydrocarbon group having 6 to 60 ring-forming carbon atoms, or a substituted monovalent aromatic heterocyclic group having 3 to 60 ring-forming atoms, and in $Ar_2$ and $Ar_3$, at least one substituent of the substituted monovalent aromatic hydrocarbon group or the substituted monovalent aromatic heterocyclic group is an alkyl group having 10 to 60 carbon atoms.

6. The polymer material of claim 1, wherein Y is a substituted divalent aromatic hydrocarbon group having 6 to 60 ring-forming carbon atoms or a substituted divalent aromatic heterocyclic group having 3 to 60 ring-forming atoms, wherein at least one substituent of the substituted divalent aromatic hydrocarbon group or the substituted divalent aromatic heterocyclic group is an alkyl group having 14 to 60 carbon atoms.

7. The polymer material of claim 1, wherein in Formula (1), Y is at least one of groups represented by Formula (2-7) to Formula (2-23), (2-7)

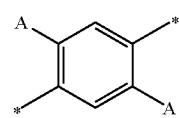

(2-8)

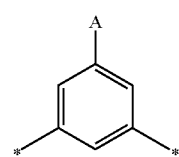

-continued

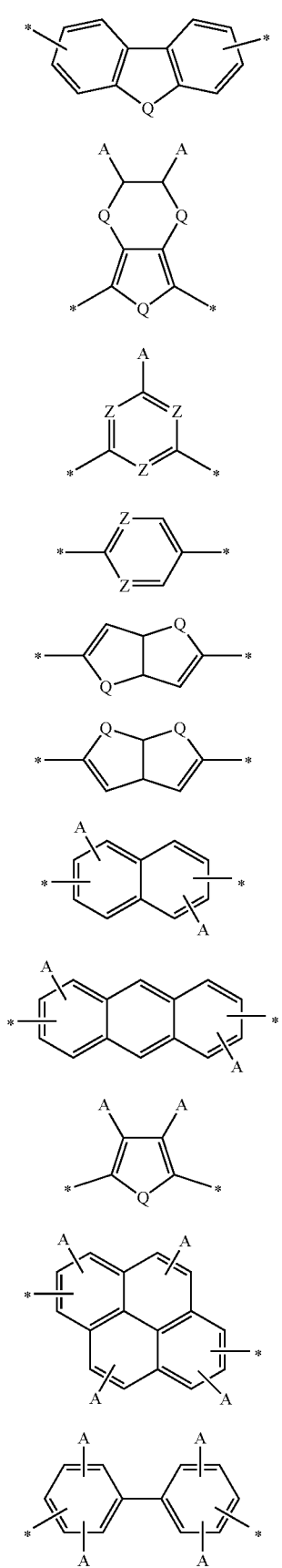

(2-9)
(2-10)
(2-11)
(2-12)
(2-13)
(2-14)
(2-15)
(2-16)
(2-17)
(2-18)
(2-19)

-continued

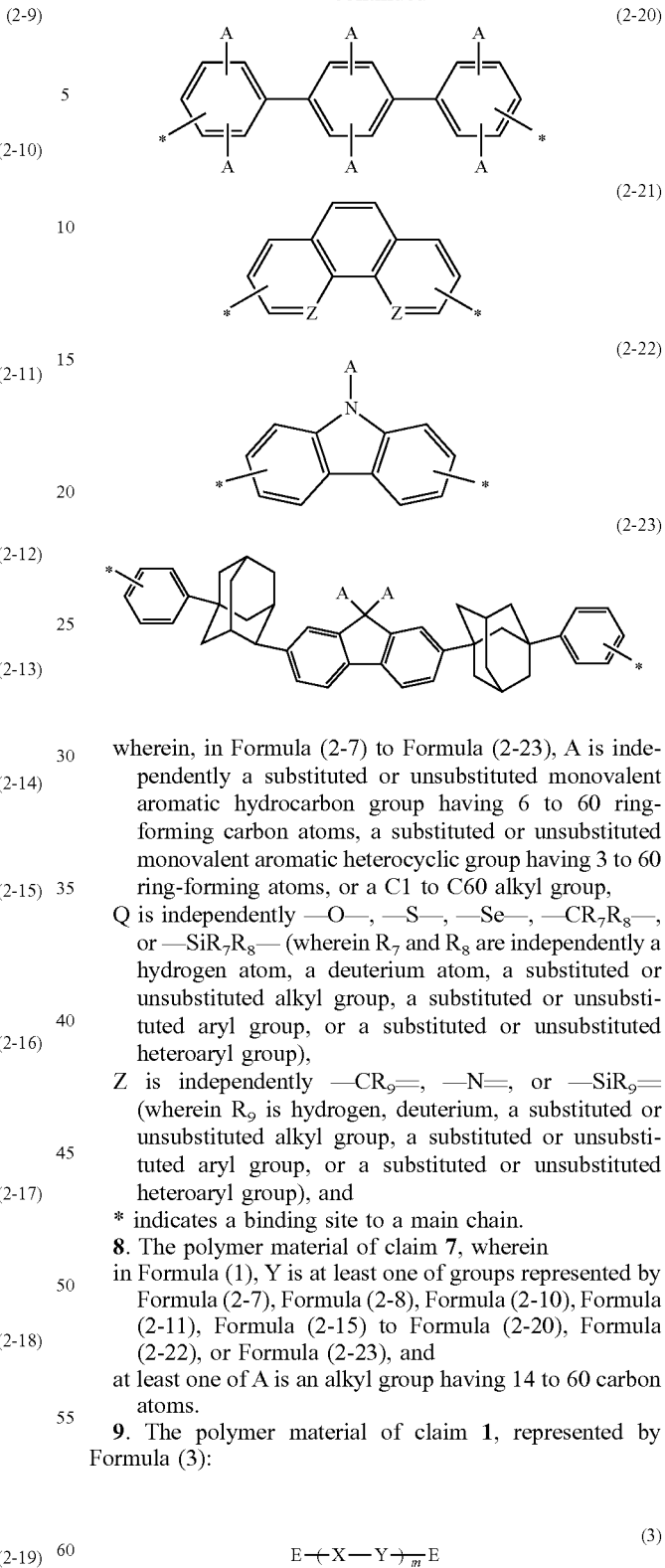

(2-20)
(2-21)
(2-22)
(2-23)

wherein, in Formula (2-7) to Formula (2-23), A is independently a substituted or unsubstituted monovalent aromatic hydrocarbon group having 6 to 60 ring-forming carbon atoms, a substituted or unsubstituted monovalent aromatic heterocyclic group having 3 to 60 ring-forming atoms, or a C1 to C60 alkyl group, Q is independently —O—, —S—, —Se—, —CR$_7$R$_8$—, or —SiR$_7$R$_8$— (wherein R$_7$ and R$_8$ are independently a hydrogen atom, a deuterium atom, a substituted or unsubstituted alkyl group, a substituted or unsubstituted aryl group, or a substituted or unsubstituted heteroaryl group), Z is independently —CR$_9$=, —N=, or —SiR$_9$= (wherein R$_9$ is hydrogen, deuterium, a substituted or unsubstituted alkyl group, a substituted or unsubstituted aryl group, or a substituted or unsubstituted heteroaryl group), and

* indicates a binding site to a main chain.

8. The polymer material of claim 7, wherein
in Formula (1), Y is at least one of groups represented by Formula (2-7), Formula (2-8), Formula (2-10), Formula (2-11), Formula (2-15) to Formula (2-20), Formula (2-22), or Formula (2-23), and
at least one of A is an alkyl group having 14 to 60 carbon atoms.

9. The polymer material of claim 1, represented by Formula (3):

(3)

wherein, in Formula (3), E is a substituted or unsubstituted monovalent aromatic hydrocarbon group having 6 to 60 ring-forming carbon atoms, or a substituted or unsubstituted monovalent aromatic heterocyclic group having 3 to 60 ring-forming atoms, m is an integer of greater than or equal to 2, and each occurrence of X and Y are the same or different.

10. A material for an electroluminescence device comprising the polymer material of claim 1.

11. A liquid composition comprising the polymer material of claim 1, a solvent, and a dispersing agent.

12. A thin film comprising the polymer material of claim 1.

13. An electroluminescence device comprising
a pair of electrodes, and
one or more organic layers disposed between the pair of electrodes and comprising the polymer material of claim 1.

14. The electroluminescence device of claim 13, wherein at least one of the organic layers is formed by a coating method.

15. The electroluminescence device of claim 13,
further comprising a layer comprising quantum dots,
wherein the quantum dots are inorganic nanoparticles.

* * * * *